(12) United States Patent
Fujiwara et al.

(10) Patent No.: US 10,131,730 B2
(45) Date of Patent: *Nov. 20, 2018

(54) RESIST COMPOSITION AND PATTERNING PROCESS

(71) Applicant: SHIN-ETSU CHEMICAL CO., LTD., Tokyo (JP)

(72) Inventors: Takayuki Fujiwara, Joetsu (JP); Masayoshi Sagehashi, Joetsu (JP); Koji Hasegawa, Joetsu (JP); Kenichi Oikawa, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/836,081

(22) Filed: Aug. 26, 2015

(65) Prior Publication Data
US 2016/0152755 A1    Jun. 2, 2016

(30) Foreign Application Priority Data
Sep. 4, 2014    (JP) ................. 2014-179953

(51) Int. Cl.
| | | |
|---|---|---|
| *G03F 7/039* | (2006.01) | |
| *G03F 7/038* | (2006.01) | |
| *G03F 7/30* | (2006.01) | |
| *G03F 7/32* | (2006.01) | |
| *C08F 220/18* | (2006.01) | |
| *C08F 224/00* | (2006.01) | |
| *G03F 7/004* | (2006.01) | |

(52) U.S. Cl.
CPC .......... *C08F 224/00* (2013.01); *C08F 220/18* (2013.01); *G03F 7/0045* (2013.01); *G03F 7/0046* (2013.01); *G03F 7/038* (2013.01); *G03F 7/0397* (2013.01); *G03F 7/30* (2013.01); *G03F 7/325* (2013.01)

(58) Field of Classification Search
None
See application file for complete search history.

(56) References Cited

U.S. PATENT DOCUMENTS

| | | | |
|---|---|---|---|
| 6,787,283 B1 * | 9/2004 | Aoai ............. | G03F 7/0397 430/270.1 |
| 7,537,880 B2 | 5/2009 | Harada et al. | |

(Continued)

FOREIGN PATENT DOCUMENTS

| | | | | |
|---|---|---|---|---|
| JP | 2001-33971 A | | 2/2001 | |
| JP | 2003-005375 | * | 1/2003 | ............. G03F 7/039 |

(Continued)

OTHER PUBLICATIONS

Machine translation of JP 2009-025707 (Feb. 2009).*

(Continued)

*Primary Examiner* — Martin J Angebranndt
(74) *Attorney, Agent, or Firm* — Westerman, Hattori, Daniels & Adrian, LLP

(57) ABSTRACT

A resist composition comprising a polymer comprising recurring units of lactone and a PAG is provided. The resist composition has a high dissolution contrast during organic solvent development, and improved resist properties including MEF and CDU and forms a fine hole pattern with improved roundness and size control.

12 Claims, 1 Drawing Sheet

(56) References Cited

U.S. PATENT DOCUMENTS

| | | | |
|---|---|---|---|
| 7,642,034 | B2 | 1/2010 | Hatakeyama et al. |
| 7,670,750 | B2 | 3/2010 | Harada et al. |
| 7,759,047 | B2 | 7/2010 | Hatakeyama et al. |
| 7,771,913 | B2 | 8/2010 | Kaneko et al. |
| 8,017,304 | B2 | 9/2011 | Tarutani et al. |
| 8,034,547 | B2 | 10/2011 | Tsubaki et al. |
| 8,114,571 | B2 | 2/2012 | Ohashi et al. |
| 8,241,840 | B2 | 8/2012 | Tsubaki et al. |
| 8,323,872 | B2 | 12/2012 | Hatakeyama et al. |
| 9,250,517 | B2 * | 2/2016 | Sagehashi ............... G03F 7/004 |
| 2008/0090172 | A1 | 4/2008 | Hatakeyama et al. |
| 2008/0153030 | A1 | 6/2008 | Kobayashi et al. |
| 2009/0306328 | A1 * | 12/2009 | Yamagishi ............... C08F 2/06 528/272 |
| 2011/0008735 | A1 * | 1/2011 | Ohsawa ............... C07C 381/12 430/326 |
| 2011/0171580 | A1 * | 7/2011 | Hatakeyama ........ C09D 125/18 430/285.1 |
| 2011/0177462 | A1 | 7/2011 | Hatakeyama et al. |
| 2012/0148945 | A1 | 6/2012 | Hasegawa et al. |
| 2013/0034444 | A1 | 2/2013 | Muderlak et al. |
| 2013/0034813 | A1 | 2/2013 | Ohsawa et al. |
| 2013/0344442 | A1 * | 12/2013 | Sagehashi ............... G03F 7/004 430/285.1 |
| 2014/0113236 | A1 | 4/2014 | Senzaki et al. |
| 2015/0126753 | A1 | 5/2015 | Ezoe et al. |
| 2015/0322027 | A1 * | 11/2015 | Fujiwara ............... C07D 307/20 549/265 |

FOREIGN PATENT DOCUMENTS

| | | |
|---|---|---|
| JP | 2007-25634 A | 2/2007 |
| JP | 3995575 B2 | 10/2007 |
| JP | 2007-297590 A | 11/2007 |
| JP | 2007-316448 A | 12/2007 |
| JP | 2008-3569 A | 1/2008 |
| JP | 2008-81716 A | 4/2008 |
| JP | 2008-111089 A | 5/2008 |
| JP | 2008-111103 A | 5/2008 |
| JP | 2008-122932 A | 5/2008 |
| JP | 2008-281974 A | 11/2008 |
| JP | 2008-281975 A | 11/2008 |
| JP | 2008-281980 A | 11/2008 |
| JP | 2009-25707 A | 2/2009 |
| JP | 2009-25723 A | 2/2009 |
| JP | 2009-53657 A | 3/2009 |
| JP | 2009-269953 A | 11/2009 |
| JP | 4631297 B2 | 2/2011 |
| JP | 2011-170316 A | 9/2011 |
| JP | 2011-197339 A | 10/2011 |
| JP | 2012-128067 A | 7/2012 |
| JP | 2013-37092 A | 2/2013 |
| JP | 2014-28926 A | 2/2014 |
| JP | 2014-71387 A | 4/2014 |
| TW | 201314365 A1 | 4/2013 |
| WO | 2013/183380 A1 | 12/2013 |

OTHER PUBLICATIONS

Machine translation of JP 2014-028926 (Feb. 2014).*
Office Action dated Jun. 27, 2016, issued in Taiwanese Patent Application No. 104128746. (4 pages).
Nakamura et al. "Contact Hole Formation by Multiple Exposure Technique in Ultra-low k1 Lithography", Proceedings of SPIE, vol. 5377, 2004, pp. 2005-2263.
Owe-Yang, et al. "Double exposure for the contact layer of the 65-nm node", Proceedings of SPIE, vol. 5753, 2005, pp. 171-180.

* cited by examiner

RESIST COMPOSITION AND PATTERNING PROCESS

CROSS-REFERENCE TO RELATED APPLICATION

This non-provisional application claims priority under 35 U.S.C. § 119(a) on Patent Application No. 2014-179953 filed in Japan on Sep. 4, 2014, the entire contents of which are hereby incorporated by reference.

TECHNICAL FIELD

This invention relates to a resist composition and a pattern forming process using the composition. More particularly, it relates to a pattern forming process involving exposure of a resist film, deprotection reaction with the aid of acid and heat, and development in an organic solvent to form a negative tone pattern in which the unexposed region of resist film is dissolved and the exposed region is not dissolved.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

Besides the positive tone resist by alkaline development, a highlight is recently put on the negative tone resist by organic solvent development. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkaline development and organic solvent development is under study.

As the ArF resist composition for negative tone development with organic solvent, positive ArF resist compositions of the prior art design may be used. Such pattern forming processes are described in Patent Documents 1 to 6.

These patent documents disclose resist materials for organic solvent development comprising a copolymer of hydroxyadamantane methacrylate, a copolymer of norbornane lactone methacrylate, a copolymer of methacrylate having acidic groups including carboxyl, sulfo, phenol, thiol and other groups substituted with two or more acid, labile groups, and a copolymer of methacrylate having a cyclic acid-stable group ester, and pattern forming processes using the same.

The ester unit having a carboxyl group protected with an acid labile group is one of predominant constituent units of base resins in currently available chemically amplified resist compositions. Patent Document 7 discloses a positive resist comprising units of hydroxyadamantane methacrylate having a hydroxyl group protected with a tertiary alkyl group. Also, Patent Document 8 discloses formation of a negative pattern via organic solvent development, using a base resin comprising those units having a hydroxyl group protected in acetal or tertiary ether form as the sole acid labile unit.

The positive tone development system involving deprotection reaction to generate a carboxyl group and subsequent neutralization reaction with aqueous alkaline developer to improve a dissolution rate achieves a high dissolution contrast in that the dissolution rate differs between the unexposed and exposed regions by a factor of more than 1,000. In contrast, the negative tone development system via organic solvent development provides a low contrast because the dissolution rate in the unexposed region due to solvation is low, and the dissolution rate thus differs between the unexposed and exposed regions by a factor of less than 100. For the negative tone development system via organic solvent development, it is desired to seek for a novel material which can enhance a dissolution contrast.

Polymerization units having an acid labile group are important as constituent units of the base resin in the chemically amplified resist compositions. In addition, polymerization units having an adhesive group are also important for forming patterns at high resolution when considered from the standpoints of dissolution contrast and acid diffusion control. These polymerization units include methacrylic compounds having lactone units of butyrolactone, valerolactone, norbornanelactone or cyclohexanelactone skeleton, and sultone units. Among others, adhesive units having butyrolactone skeleton which is a 5-membered ring lactone are mainly used, with a focus placed on α-methacryloyloxy-γ-butylrolactone and β-methacryloyloxy-γ-butyrolactone skeletons.

Patent Documents 9 to 12 disclose methods for the preparation of β-methacryloyloxy-γ-butyrolactone compounds having a substituent on lactone ring, and their use as resist material.

CITATION LIST

Patent Document 1: JP-A 2008-281974
Patent Document 2: JP-A 2008-281975
Patent Document 3: JP-A 2008-281980
Patent Document 4: JP-A 2009-053657
Patent Document 5: JP-A 2009-025707
Patent Document 6: JP-A 2009-025723
Patent Document 7: JP 4631297
Patent Document 3: JP-A 2011-197339
Patent Document 9: WO 2013/183380
Patent Document 10: JP-A 2001-033971
Patent Document 11: JP-A 2014-071387
Patent Document 12: JP-A 2014-028926

DISCLOSURE OF INVENTION

The organic solvent development is low in dissolution contrast, as compared with the positive tone resist system adapted to become dissolvable in alkaline developer when deprotection reaction takes place to produce acidic carboxyl or phenol groups. Specifically, in the case of alkaline developer, the alkali dissolution rate differs more than 1,000 times between unexposed and exposed regions, whereas the difference in the case of organic solvent development is at most 100 times, and only about 10 times for certain materials. No sufficient margin is available. In the case of aqueous alkaline development, the dissolution rate is improved by neutralization reaction with carboxyl groups. In the case of organic solvent development with no accompanying reaction, the dissolution rate is low because dissolution is solely due to solvation. It is necessary not only to improve the dissolution rate of the unexposed region, but also to reduce the dissolution rate of the exposed region that is a remaining portion of resist film. If the dissolution rate of the exposed region is high, the thickness of the remaining film is so reduced that the underlying substrate may not be processed by etching through the pattern as developed. Further it is important to enhance the gradient or gamma (γ) at the dose corresponding to dissolution/non-dissolution conversion. A low γ value is prone to form an inversely tapered profile and allows for pattern collapse in the case of a line pattern. To obtain a perpendicular pattern, the resist must have a dissolution contrast having a γ value as high as possible. It would be desirable to have a novel material having a significant difference in dissolution rate between the exposed and unexposed regions and capable of achieving a high dissolution contrast (γ) upon organic solvent development.

An object of the invention is to provide a resist composition which exhibits improved properties including dissolution contrast (γ), mask error factor and CD uniformity upon organic solvent development. Another object is to provide a pattern forming process using the resist composition.

The inventors have found that a resist composition comprising a polymer comprising recurring units of lactone having the general formula (1) and recurring units containing an acid labile group having the general formula (2A), (2B) or (2C), or a polymer comprising recurring units of lactone having the general formula (1) and a photoacid generator having the general formula (4) displays a high dissolution contrast when processed by exposure, PEB and organic solvent development.

When a monocyclic lactone having alkyl groups distributed on its ring like a recurring unit of formula (1), below, is used in negative pattern formation via organic solvent development, its solubility in developer is significantly improved due to the high lipophilicity of pendant alkyl groups. When this resin component is combined with a recurring unit having an acid labile group of high elimination ability or a photoacid generator having controlled acid diffusion, a high dissolution contrast is established. As a result, when patterns are formed via positive/negative reversal by organic solvent development, resist performance factors such as MEF and CDU are improved. Particularly when a hole pattern is formed, the pattern has improved roundness and CDU.

In one aspect, the invention provides a resist composition comprising a polymer comprising recurring units having the general formula (1) and recurring units of at least one type selected from the general formulae (2A), (2B) and (2C).

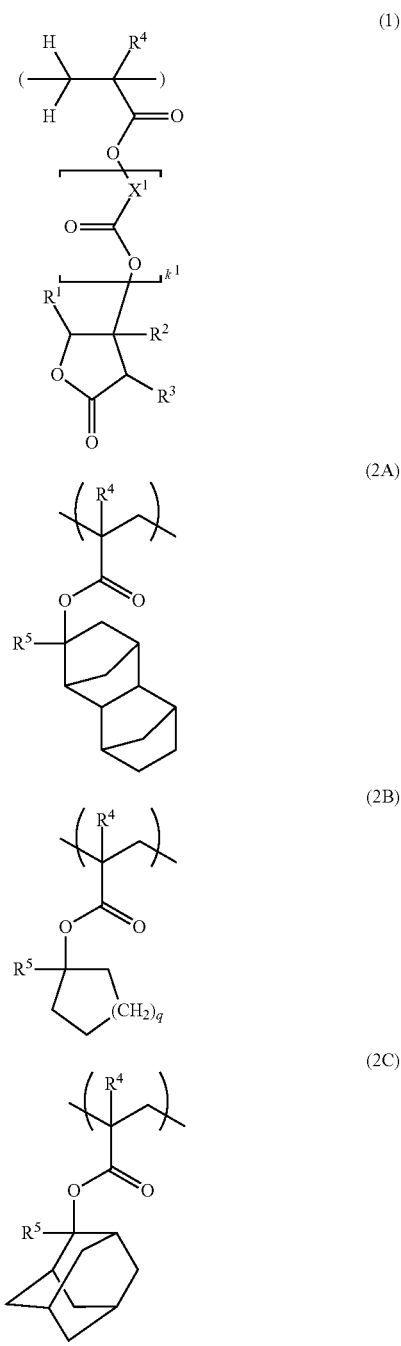

Herein $R^1$, $R^2$ and $R^3$ are each independently methyl, ethyl or at straight, branched or cyclic $C_3$-$C_{10}$ alkyl group, $R^4$ is hydrogen or methyl, $R^5$ is methyl, ethyl or a straight or branched $C_3$-$C_6$ alkyl group, $X^1$ is a $C_1$-$C_{10}$ alkylene group which may have an ether, ester, hydroxyl radical or lactone ring, or $C_6$-$C_{10}$ arylene group, $k^1$ is 0 or 1, and q is 1 or 2.

Another embodiment is a resist composition comprising (A) a polymer comprising recurring units having the general formula (1) and (B) a photoacid generator having the general formula (4).

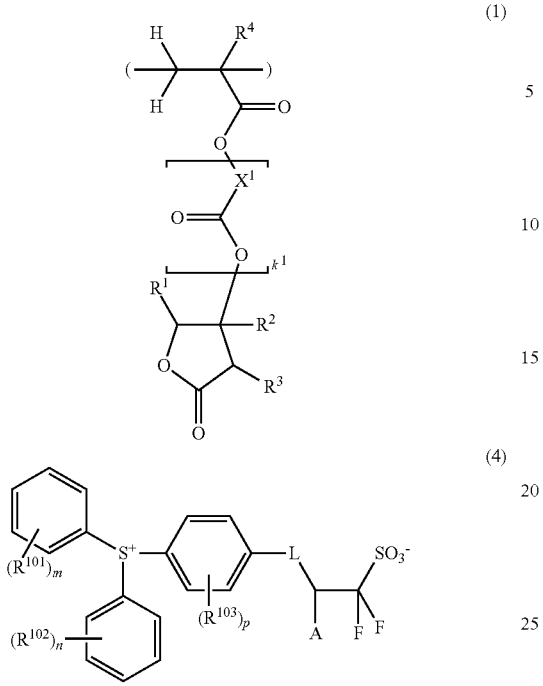

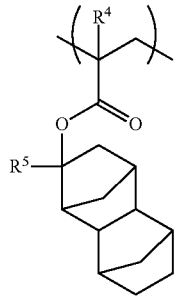

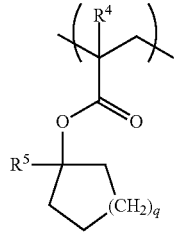

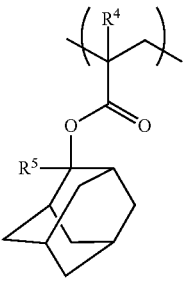

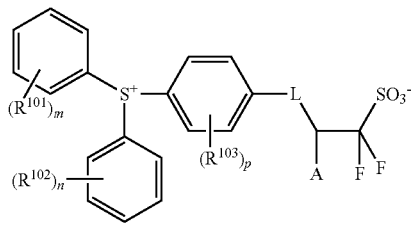

Herein $R^1$, $R^2$ and $R^3$ are each independently methyl, ethyl or a straight, branched or cyclic $C_3$-$C_{10}$ alkyl group, $R^4$ is hydrogen or methyl, $X^1$ is at $C_1$-$C_{10}$ alkylene group which way have an ether, ester, hydroxyl radical or lactone ring, or $C_6$-$C_{10}$ arylene group, $k^1$ is 0 or 1, A is hydrogen or trifluoromethyl, $R^{101}$, $R^{102}$ and $R^{103}$ are each independently hydrogen or a straight, branched or cyclic $C_1$-$C_{20}$ monovalent hydrocarbon group which may be substituted with or separated by a heteroatom, m and n each are an integer of 0 to 5, p is an integer of 0 to 4, and L is a single bond, oxygen atom or a straight, branched or cyclic $C_1$-$C_{20}$ divalent hydrocarbon group which may be substituted with or separated by a heteroatom.

A further embodiment is a resist composition comprising (A) a polymer comprising recurring units having the general formula (1) and recurring units of at least one type selected from the general formulae (2A), (2B) and (2C) and (B) a photoacid generator having the general, formula (4).

Herein $R^1$, $R^2$, $R^3$, $R^4$, $R^5$, $X^1$, $k^1$, A, $R^{101}$, $R^{102}$, $R^{103}$, m, n, p, and L are as defined above.

In a preferred embodiment, the recurring unit having formula (1) is selected from the following:

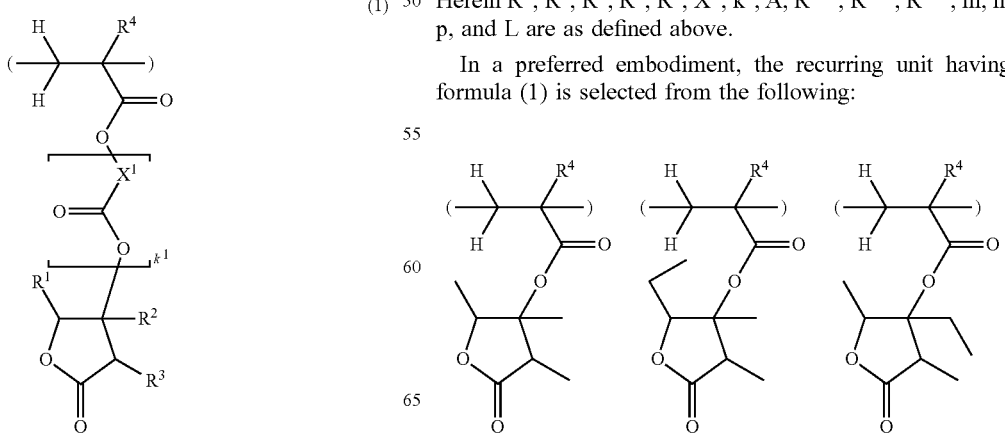

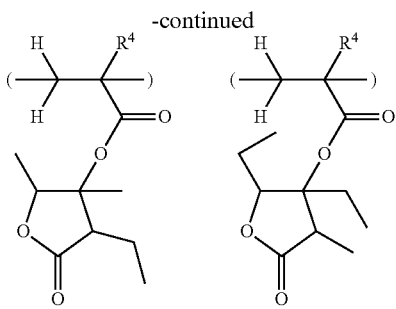

wherein R⁴ is as defined above.

In a preferred embodiment, the polymer further comprises recurring units containing a tertiary alkyl group, acetal structure, hydroxyadamantyl group, lactone ring, lactam ring, sultone ring, carboxyl group, fluoroalkyl group, oxetane ring, or oxirane ring.

In a preferred embodiment, the polymer further comprises recurring units of at least one type selected from sulfonium salt units (f1) to (f3) represented by the general, formula (F).

(F)

(f1)

(f2)

(f3)

Herein $R^9$, $R^{13}$, and $R^{17}$ each are hydrogen or methyl, $R^{10}$ is a single bond, phenylene, —O—$R^{21}$—, or —C(=O)—Y—$R^{21}$—, Y is oxygen or NH, $R^{21}$ is a straight, branched or cyclic $C_1$-$C_6$ alkylene group, alkenylene or phenylene group, which may contain a carbonyl (—CO—), ester (—COO—), ether (—O—) or hydroxyl radical, $R^{11}$, $R^{12}$, $R^{14}$, $R^{15}$, $R^{16}$, $R^{18}$, $R^{19}$, and $R^{20}$ are each independently a straight, branched or cyclic $C_1$-$C_{12}$ alkyl group which may contain a carbonyl, ester or ether radical, or a $C_6$-$C_{12}$ aryl or $C_7$-$C_{20}$ aralkyl group, $Z_0$ is a single bond, methylene, ethylene, phenylene, fluorophenylene, —O—$R^{22}$—, or —C(=O)—$Z_1$—$R^{22}$—, $Z_1$ is oxygen or NH, $R^{22}$ is a straight, branched or cyclic $C_1$-$C_6$ alkylene group, alkenylene or phenylene group, which may contain a carbonyl, ester, ether or hydroxyl radical, and M⁻ is a non-nucleophilic counter ion.

In another aspect, the invention provides a pattern forming process comprising the steps of coating the resist composition defined above onto a substrate, baking to form a resist film, exposing the resist film to high-energy radiation, baking, and developing the exposed film in an organic solvent-based developer to form a negative pattern wherein the unexposed region of film is dissolved away and the exposed region of film is not dissolved.

Typically, the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

Further preferably, the step of exposing the resist film to high-energy radiation includes KrF excimer laser lithography of wavelength 248 nm, ArF excimer laser lithography of wavelength 193 nm, EUV lithography of wavelength 13.5 nm or EB lithography.

Advantageous Effects of Invention

The resist composition displays a high dissolution contrast when processed by exposure, PEB and organic solvent development. Resist performance factors such as MEF and CDU are improved. A fine size hole pattern with improved roundness and CDU can be formed.

BRIEF DESCRIPTION OF DRAWINGS

FIGS. 1(A)-1 (C) are cross-sectional views of a patterning process according one embodiment of the invention. FIG. 1(A) shows a photoresist film disposed on a substrate.

DESCRIPTION OF EMBODIMENTS

Figure 1A:
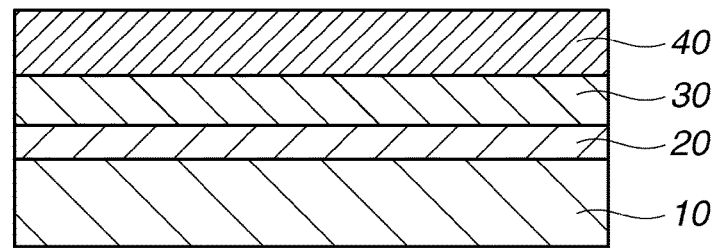

As used herein, the notation ($C_n$-$C_m$) means a group containing from n to m carbon atoms per group. As used herein, the term "film" is used interchangeably with "coating" or "layer." In the chemical formulae, Me stands for methyl, Ph for phenyl, and Ac for acetyl; and the broken line denotes a valence bond.

It is understood that for some structures represented by chemical formulae, there can exist enantiomers and diastereomers because of the presence of asymmetric carbon. In such a case, a single formula collectively represents all such isomers. The isomers may be used alone or in admixture.

The abbreviations and acronyms have the following meaning.
EB: electron beam
EUV: extreme ultraviolet
Mw: weight average molecular weight
Mn: number average molecular weight
Mw/Mn: molecular weight distribution or dispersity GPC: gel permeation chromatography
PEB: post-exposure bake
PAG: photoacid generator
MEF: mask error factor
CDU: critical dimension uniformity One embodiment of the invention is a resist composition comprising a polymer comprising recurring units having the general formula (1) as an essential unit of base resin.

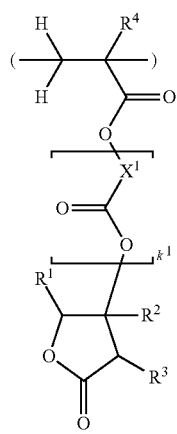

(1)

Herein $R^1$, $R^2$ and $R^3$ are each independently methyl, ethyl or a straight, branched or cyclic $C_3$-$C_{10}$ alkyl group, $R^4$ is hydrogen or methyl, $X^1$ is a $C_1$-$C_{10}$ alkylene group which may have an ether, ester, hydroxyl radical or lactone ring, or $C_6$-$C_{10}$ arylene group, and $k^1$ is 0 or 1.

Of the recurring units of formula (1), preferred are recurring units having the general formula (1a).

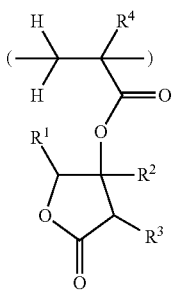

(1a)

Herein $R^1$, $R^2$ and $R^3$ are each independently methyl, ethyl or a straight, branched or cyclic $C_3$-$C_{10}$ alkyl group, and $R^4$ is hydrogen or methyl.

Examples of the straight, branched or cyclic $C_1$-$C_{10}$ alkyl group represented by $R^1$ to $R^3$ include, but are not limited to, alkyl groups such as methyl, ethyl, propyl, isopropyl, n-butyl, sec-butyl, tert-butyl, cyclopentyl, cyclohexyl, 2-ethylhexyl, n-octyl, norbornyl, tricyclodecanyl, and adamantyl.

In formula (1), $X^1$ is a $C_1$-$C_{10}$ alkylene group which may have an ether, ester, hydroxyl radical or lactone ring, or $C_6$-$C_{10}$ arylene group, examples of which are shown below.

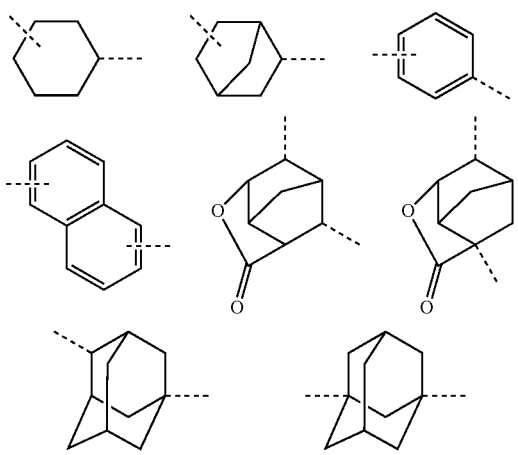

Illustrative, non-limiting examples of the recurring units having formulae (1) and (1a) are shown below.

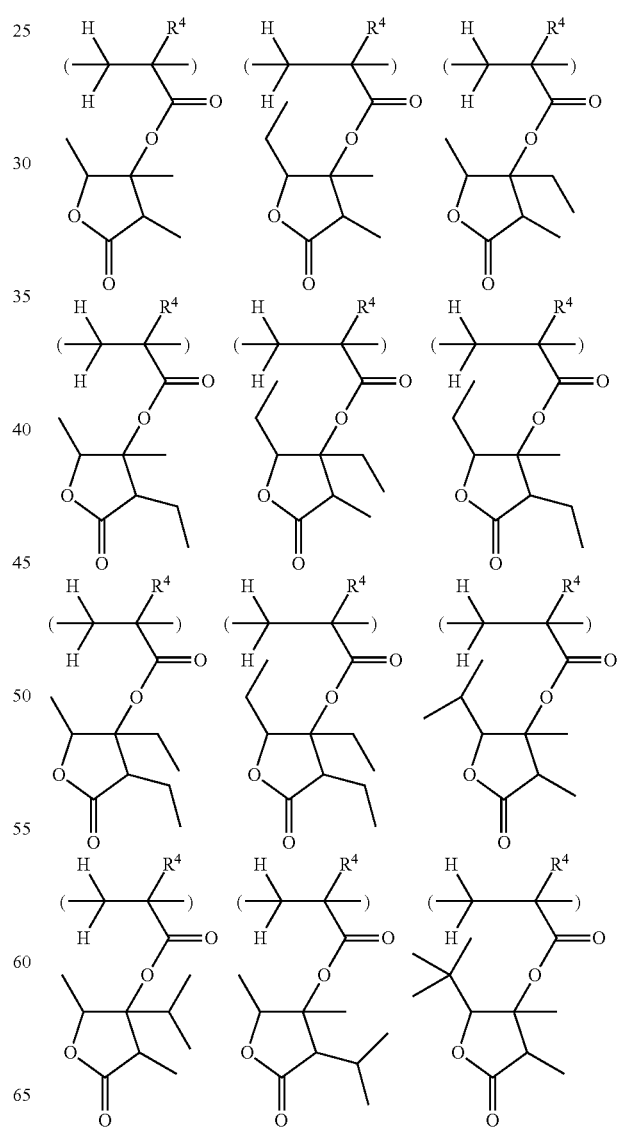

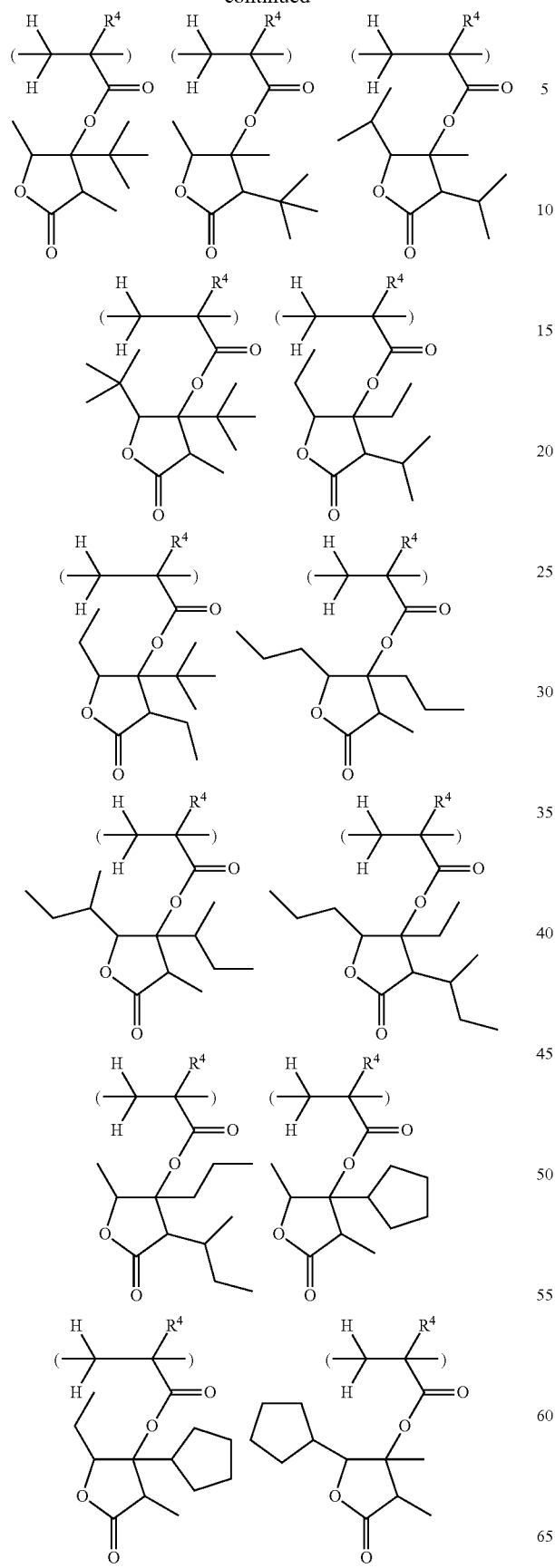
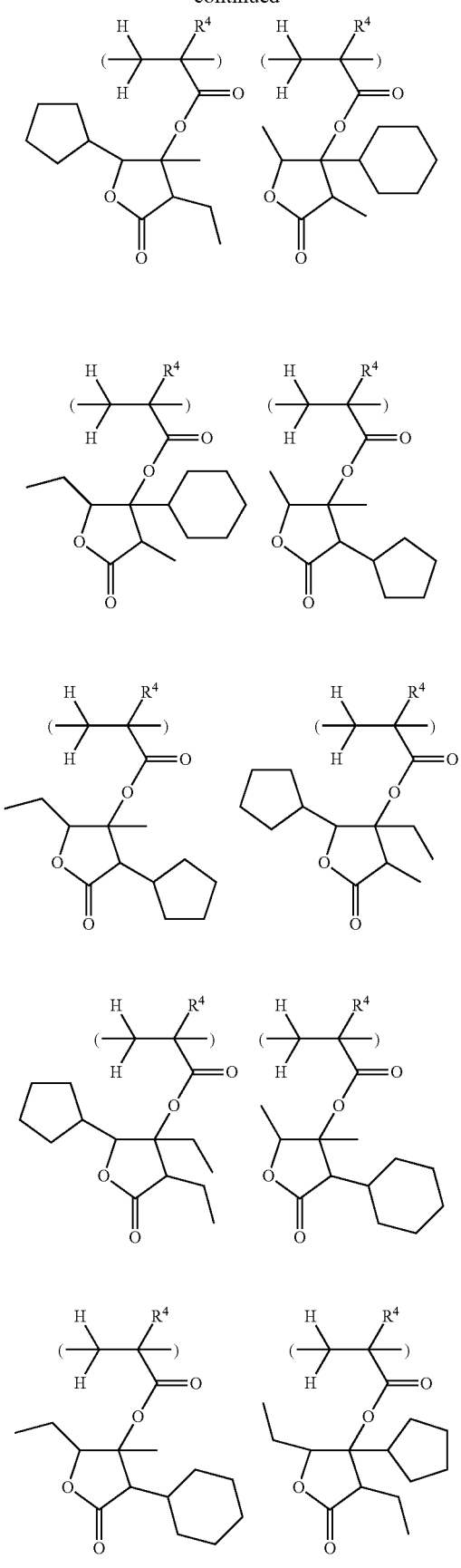

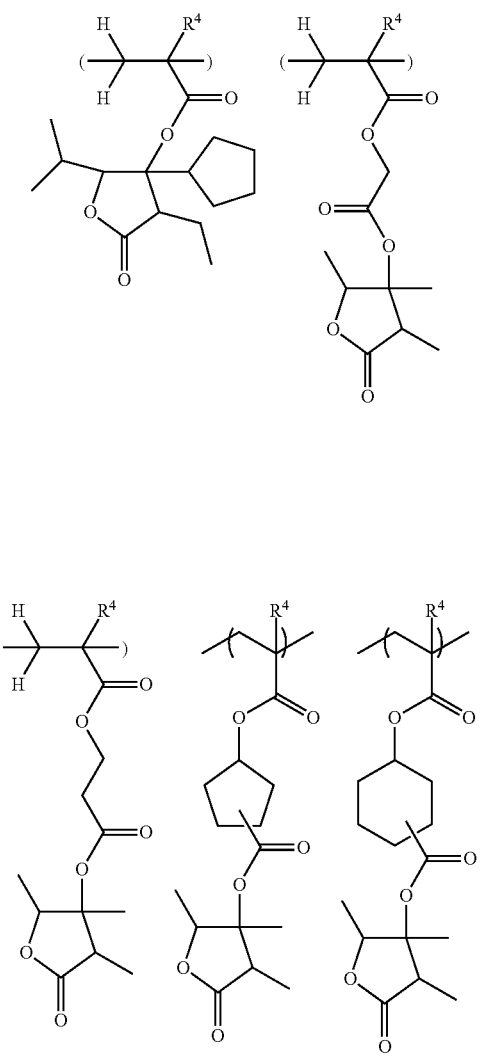
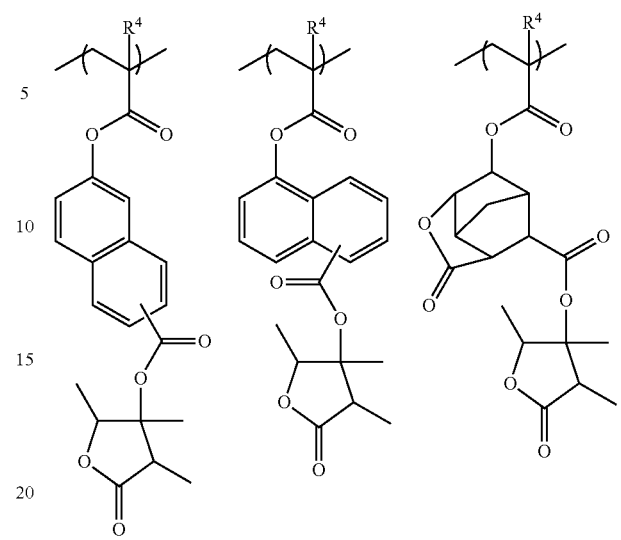
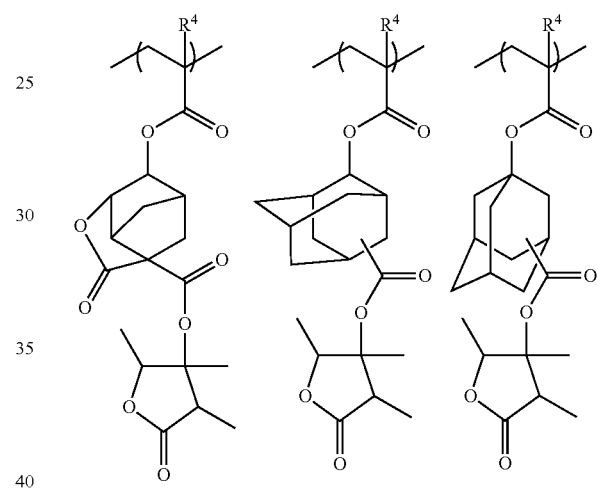
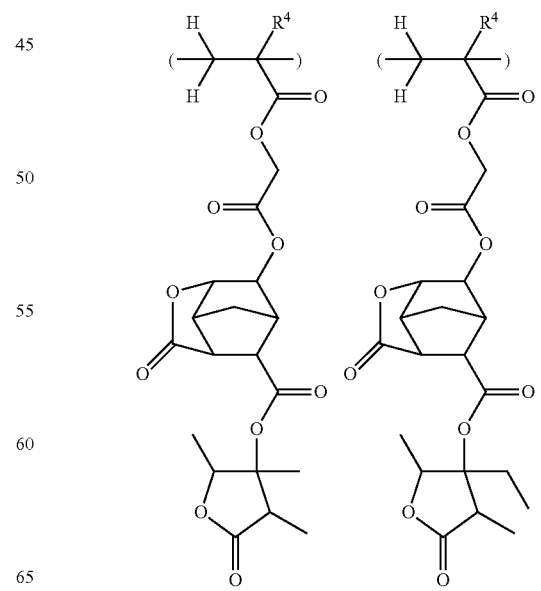

-continued

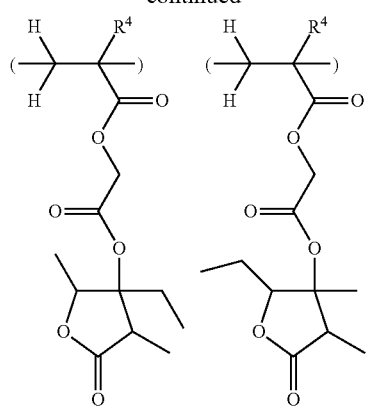

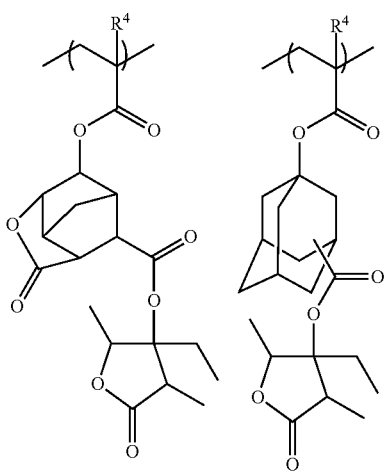

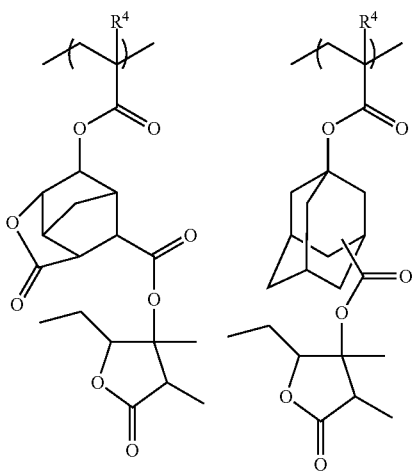

-continued

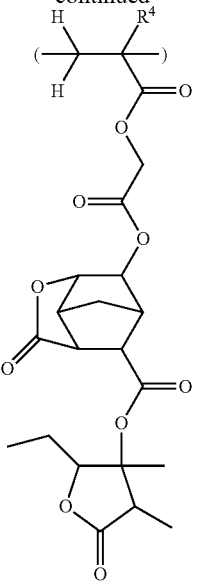

Herein $R^4$ is as defined above.

Of the recurring units having formulae (1) and (1a), the following units are most preferred.

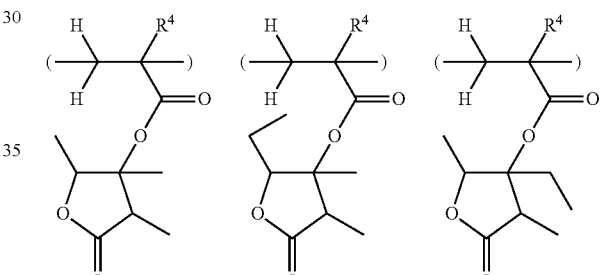

Herein $R^4$ is as defined above.

The recurring units having formula (1) may be obtained by dissolving a monomer having the general formula (5) and optionally another monomer having a polymerizable double bond in an organic solvent, adding a radical polymerization initiator thereto, and effecting heat polymerization.

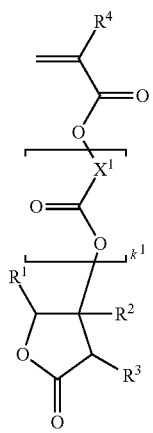

(5)

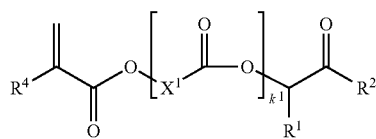

(7)

Herein $R^1$ to $R^4$, $X^1$, and $k^1$ are as defined above. $X^c$ is hydrogen or halogen. $R^a$ is a straight or branched $C_1$-$C_{10}$ monovalent hydrocarbon group.

A second exemplary synthesis method involves the steps of reacting a compound having the above formula (6) with a base or a metal selected from Group 1A, 2A and 2B metals to form a metal enolate reagent, reacting the metal enolate reagent with an acyloxyketone compound having the above formula (7), isolating the resulting intermediate having the general formula (8), and lactonizing the intermediate.

Herein $R^1$, $R^2$ and $R^3$ are each independently methyl, ethyl or a straight, branched or cyclic $C_3$-$C_{10}$ alkyl group, $R^4$ is hydrogen or methyl, $X^1$ is a $C_1$-$C_{10}$ alkylene group which may have an ether, ester, hydroxyl radical or lactone ring, or $C_6$-$C_{10}$ arylene group, and $k^1$ is 0 or 1.

The monomer having formula (5) may be prepared, for example, by the following methods although the synthesis method is not limited thereto.

A first exemplary synthesis method involves the steps of reacting a compound having the general formula (6) with a base or a metal selected from Group 1A, 2A and 2B metals to form a metal enolate reagent, and reacting the metal enolate reagent with an acyloxyketone compound having the general formula (7).

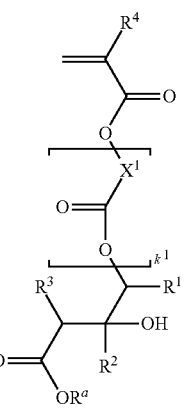

(8)

Herein $R^1$ to $R^4$, $X^1$, $k^1$, and $R^a$ are as defined above.

More particularly, the monomer having formula (5) may be prepared according to the reaction scheme shown below.

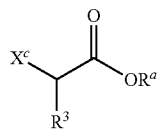

(6)

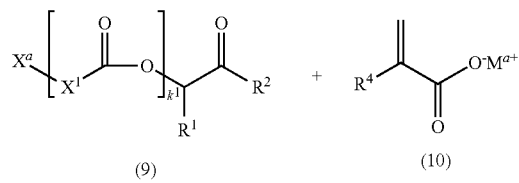

(9)  (10)

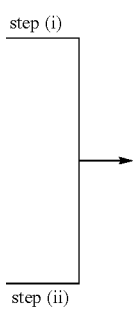

step (i)

step (ii)

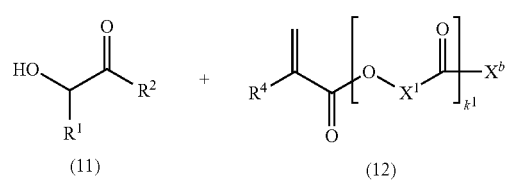

(11)  (12)

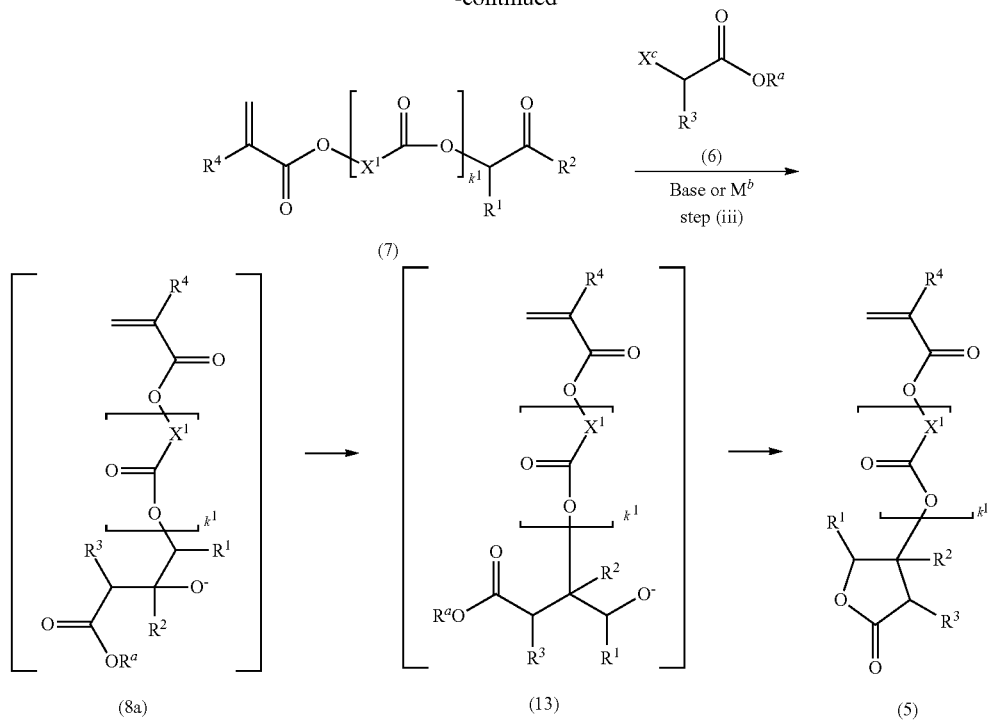

Herein $R^1$ to $R^4$, $X^1$, $X^c$, $k^1$, and $R^a$ are as defined above. $X^a$ is halogen. $X^b$ is halogen, hydroxyl or —$OR^b$, wherein $R^b$ is methyl, ethyl or a group having the formula (14):

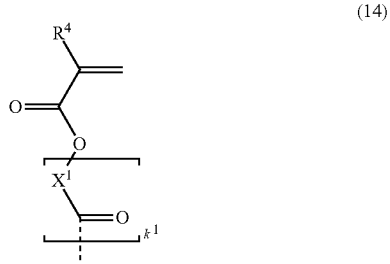

wherein $R^4$, $X^1$ and $k^1$ are as defined above, and the broken line denotes a valence bond. $M^a$ is Li, Na, K, $Mg_{1/2}$, $Ca_{1/2}$ or substituted or unsubstituted ammonium. $M^b$ is a metal selected from Group 1A, 2A and 2B metals.

Below the method for synthesizing the monomer (5) according to the above reaction scheme is described in detail.

Step (i) is a reaction of halo-ketone compound (9) with carboxylic acid salt compound (10) to form cyclization precursor (7). The reaction may readily run by a well-known procedure. The carboxylic acid salt compound (10) may be any of commercially available carboxylic acid salt compounds such as carboxylic acid metal salts. Alternatively, a corresponding carboxylic acid such as methacrylic acid or acrylic acid and a base are added to a reaction system where a carboxylic acid salt compound is formed therefrom. An appropriate amount of carboxylic acid salt compound (10) used is 0.5 to 10 moles, more preferably 1.0 to 3.0 moles per mole of halo-ketone compound (9). If the carboxylic acid salt compound is less than 0.5 mole, a large fraction of the reactant is left unreached, with a substantial drop of yield. More than 10 moles of the carboxylic acid salt compound may be uneconomical because of an increase of material amount and a lowering of pot yield. In the alternative where a carboxylic acid salt compound is formed in situ from a corresponding carboxylic acid and a base, examples of the base used herein include amines such as ammonia, triethylamine, pyridine, lutidine, collidine, and N,N-dimethylaniline; hydroxides such as sodium hydroxide, potassium hydroxide, and tetramethylammonium hydroxide; carbonates such as potassium carbonate and sodium hydrogencarbonate; metals such as sodium; metal hydrides such as sodium hydride; metal alkoxides such as sodium methoxide and potassium tert-butoxide; organometallic compounds such as butyl lithium and ethylmagnesium bromide; and metal amides such as lithium diisopropylamide, which may be used alone or in admixture. An appropriate amount of the base used is 0.2 to 10 moles, more preferably 0.5 to 2.0 moles per mole of the corresponding carboxylic acid. If the base is less than 0.2 mole, a large fraction of the carboxylic acid may become waste, which is uneconomical. More than 10 moles of the base may promote side reactions, with a substantial drop of yield.

A solvent may be used for the reaction of step (i). Suitable solvents include hydrocarbons such as toluene, xylene, hexane and heptane; chlorinated solvents such as methylene chloride, chloroform, and dichloroethane; ethers such as diethyl ether, tetrahydrofuran and dibutyl ether; ketones such as acetone and 2-butanone; esters such as ethyl acetate and butyl acetate; nitriles such as acetonitrile; alcohols such as methanol and ethanol; aprotic polar solvents such as N,N-dimethylformamide, N,N-dimethylacetamide and dimethyl sulfoxide; and water, which may be used alone or in admixture. To the reaction system, a phase transfer catalyst such as tetrabutylammonium hydrogensulfate may be added. An appropriate amount of the phase transfer catalyst added is 0.0001 to 1.0 mole, more preferably 0.001 to 0.5 mole per mole of halo-ketone compound (9). Less than 0.0001 mole of the phase transfer catalyst may fail to exert catalytic effect whereas more than 1.0 mole may be uneconomical because of the increased catalyst cost.

The esterification reaction may be carried out preferably at a temperature in the range from −70° C. to approximately the boiling point of a particular solvent used. While an appropriate reaction temperature may be selected in accordance with other reaction conditions, a temperature in the range from 0° C. to approximately the boiling point of a particular solvent used is especially preferred. Since substantial side reactions may occur at elevated temperatures, it is crucial in achieving high yields to carry out the reaction at a temperature as low as possible within the range where reaction proceeds at a practically acceptable rate. It is desired for higher yields that the reaction time be determined by monitoring the progress of reaction by thin-layer chromatography (TLC) or gas chromatography (GC). The reaction time is usually about 30 minutes to about 40 hours. The precursor (7) may be recovered from the reaction mixture by ordinary aqueous work-up. If necessary, it can be purified by any standard technique such as distillation, recrystallization or chromatography.

Another route, step (ii) is a reaction of alcohol compound (11) with esterifying agent (12) to form cyclization precursor (7). The reaction may readily run by a well-known procedure. The preferred esterifying agent (12) is an acid chloride of formula (12) wherein $X^b$ is chlorine, or a carboxylic anhydride of formula (12) wherein $X^b$ is $-OR^b$, and $R^b$ is a group having formula (14):

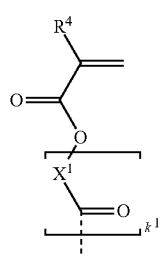

(14)

wherein $R^4$, $X^1$, and $k^1$ are as defined above. When an acid chloride such as methacrylic acid chloride or methacryloyloxyacetic acid chloride is used as esterifying agent (12), the reaction may foe conducted in a solventless system or in a solvent (e.g., methylene chloride, acetonitrile, toluene or hexane) by adding alcohol compound (11), acid chloride, and a base (e.g., triethylamine, pyridine or 4-dimethylaminopyridine) in sequence or at the same time, and optional cooling or heating. An appropriate amount of the acid chloride used is 0.5 to 10 moles, more preferably 1.0 to 3.0 moles per mole of alcohol compound (11). An amount of the base used is preferably at least 0.5 moles per mole of alcohol compound (11) so that the base may also serve as solvent, and more preferably 1.0 to 5.0 moles per mole of alcohol compound (11). When a carboxylic anhydride such as methacrylic anhydride or methacryloyloxyacetic anhydride is used as esterifying agent (12), the reaction may be conducted by heating alcohol compound (11) and carboxylic anhydride in a solvent (e.g., toluene or hexane) in the presence of an acid catalyst and optionally removing water resulting from reaction out of the system. An appropriate amount of the carboxylic anhydride used is 1 to 5 moles per mole of alcohol compound (11). Examples of the acid catalyst used herein include mineral acids such as hydrochloric acid, sulfuric acid, nitric acid and perchloric acid and organic acids such as methanesulfonic acid, trifluoromethanesulfonic acid, p-toluenesulfonic acid and benzenesulfonic acid.

An appropriate amount of esterifying agent (12) used is 1 to 10 moles, more preferably 1 to 5 moles per mole of alcohol compound (11). Less than 1 mole of esterifying agent (12) is short for the progress of reaction so that a large fraction of alcohol compound (11) may be left unreacted, with a substantial drop of yield. More than 10 moles of the esterifying agent (12) may be uneconomical because of an increase of material amount and a lowering of pot yield.

The esterification reaction may be carried out preferably at a temperature in the range from −70° C. to approximately the boiling point of a particular solvent used. While an appropriate reaction temperature may be selected in accordance with other reaction conditions, a temperature in the range from 0° C. to approximately the boiling point of a particular solvent used is especially preferred. Since substantial side reactions may occur at elevated temperatures, it is crucial in achieving high yields to carry out the reaction at a temperature as low as possible within the range where reaction proceeds at a practically acceptable rate. It is desired for higher yields that the reaction time be determined by monitoring the progress of reaction by thin-layer chromatography (TLC) or gas chromatography (GC). The reaction time is usually about 30 minutes to about 40 hours. The precursor (7) may be recovered from the reaction mixture by ordinary aqueous work-up. If necessary, it can be purified by any standard technique such as distillation, recrystallization or chromatography.

Step (iii) is to obtain monomer (5) in one-pot through reaction of a corresponding ester of formula (6) wherein $X^c$ is hydrogen or halo-ester of formula (6) wherein $X^c$ is halogen with a base or metal to form a metal enolate reagent, effecting nucleophilic addition reaction of the enolate to the ketone site of acyloxy-ketone compound (7), forming intermediate (8a) and then intermediate (13).

Examples of the base used herein include, but are not limited to, metal amides such as sodium amide, potassium amide, lithium diisopropylamide, potassium diisopropylamide, lithium dicyclohexylamide, potassium dicyclohexylamide, lithium 2,2,6,6-tetramethylpiperidine, lithium, bistrimethylsilylamide, sodium bistrimethylsilylamide, potassium bistrimethylsilylamide, lithium isopropylcyclohexylamide, magnesium diisopropylamide bromide; alkoxides such as sodium methoxide, sodium ethoxide, lithium methoxide, lithium ethoxide, lithium tert-butoxide, and potassium tert-butoxide; inorganic hydroxides such as sodium hydroxide, lithium hydroxide, potassium hydroxide, barium hydroxide, and tetra-n-butylammonium hydroxide; inorganic carbonates such as sodium carbonate, sodium hydrogencarbonate, lithium carbonate, and potassium carbonate; metal hydrides such as boran, alkylboran, sodium hydride, lithium hydride, potassium hydride, and calcium hydride; alkyl metal compounds such as trityl lithium, trityl sodium, trityl potassium, methyl lithium, phenyl lithium, sec-butyl lithium, tert-butyl lithium, and ethylmagnesium bromide. The metal used herein is selected from Group 1A, 2A and 2B metals such as lithium, sodium, potassium, magnesium and zinc. It is noted that reaction using halo-ester and zinc is known as Reformatsky reaction. Among others, Reformatsky reaction is preferred because of possible preparation and handling of metal enolate reagent under mild temperature conditions and a high selectivity of reaction at the ketone site of acyloxy-ketone (7).

The Reformatsky reaction may be conducted by a well-known procedure. Since the previous preparation of Reformatsky reagent may invite a drop of yield and by-product formation, a procedure of simultaneously adding dropwise halo-ester compound (6) and cyclization precursor or ketone (7) to a suspension of metallic sine is preferred. It is believed that if Reformatsky reagent has been pre-formed, the Reformatsky reagent is consumed by reaction with the reactant, halo-ester compound (6), resulting in a drop of yield. An appropriate amount of cyclization precursor (7) used is 0.5 to 10 moles, more preferably 0.8 to 3.0 moles per mole of the reactant, halo-ester compound (6). If precursor (7) is less than 0.5 mole, a large fraction of the reactant may be left unreached, with a substantial drop of yield. More than 10 moles of precursor (7) may be uneconomical because of an increase of material amount and a lowering of pot yield. Likewise, in the embodiment wherein ester (6) wherein $X^c$ is hydrogen is reacted with a base to form a metal enolate reagent, which is subjected to reaction with precursor (7), an appropriate amount of cyclization precursor (7) used is 0.5 to 10 moles, more preferably 0.8 to 3.0 moles per mole of the reactant, ester (6). An appropriate amount of the base or metal used is 0.8 to 5 moles, more preferably 0.8 to 2.0 moles per mole of ester (6). If the base or metal is less than 0.8 mole, a large fraction of the reactant is left unreached, with a substantial drop of yield. More than 5 moles of the base or metal may be uneconomical because of an increase of material amount and a lowering of pot yield. The reaction may be conducted in a solvent. Suitable solvents include hydrocarbons such as benzene, toluene, xylene, hexane, and heptane; chlorinated solvents such as methylene chloride, chloroform, and dichloroethane; ethers such as diethyl ether, tetrahydrofuran, and dibutyl ether; nitriies such as acetonitrile; alcohols such as methanol and ethanol; aprotic polar solvents such as N,N-dimethylformamide, N,N-dimethylacetamide and dimethyl sulfoxide; and water, which may be used alone or in admixture. Particularly in the case of Reformatsky reaction, the preferred procedure is by dissolving zinc in a solvent and admitting halo-ester (6) to the solution, the solvent being selected from ethers such as ethyl ether, tetrahydrofuran and dibutyl ether and hydrocarbons such as benzene, toluene, xylene, hexane and heptane.

For the above reaction, an appropriate reaction temperature may be selected in accordance with other reaction conditions. A temperature in the range of 30 to 80° C. is preferred because full reaction may not take place at lower temperature whereas side reactions may become noticeable at higher temperature. The reaction time is determined as appropriate for yield improvement by monitoring the reaction process by thin-layer chromatography (TLC) or gas chromatography (GC). The reaction time is usually about 30 minutes to about 2 hours because long-term aging allows for anionic polymerization to invite a drop of monomer yield. In step (iii), basically, a series of reactions run from addition intermediate (8a) such that intermediate (13) forms via rearrangement of ester site, and lactonization ensues to form the desired monomer (5). Monomer (5) may be recovered from the reaction mixture by ordinary aqueous work-up. If necessary, the monomer may be purified by standard techniques like distillation, recrystallization and chromatography.

When a bulky ester such as tert-butyl ester is used as ester (6), the reaction of step (iii) may terminate at the stage of intermediate (8a). This is undesirable for the one-pot synthesis of monomer (5) because a drop of yield, difficulty of purification and other problems arise. In this case, the problems may be overcome by isolating hydroxy-ester (8) and subjecting it to acid treatment. For example, monomer (5) is obtained from cyclization precursor (8) according to the following reaction scheme.

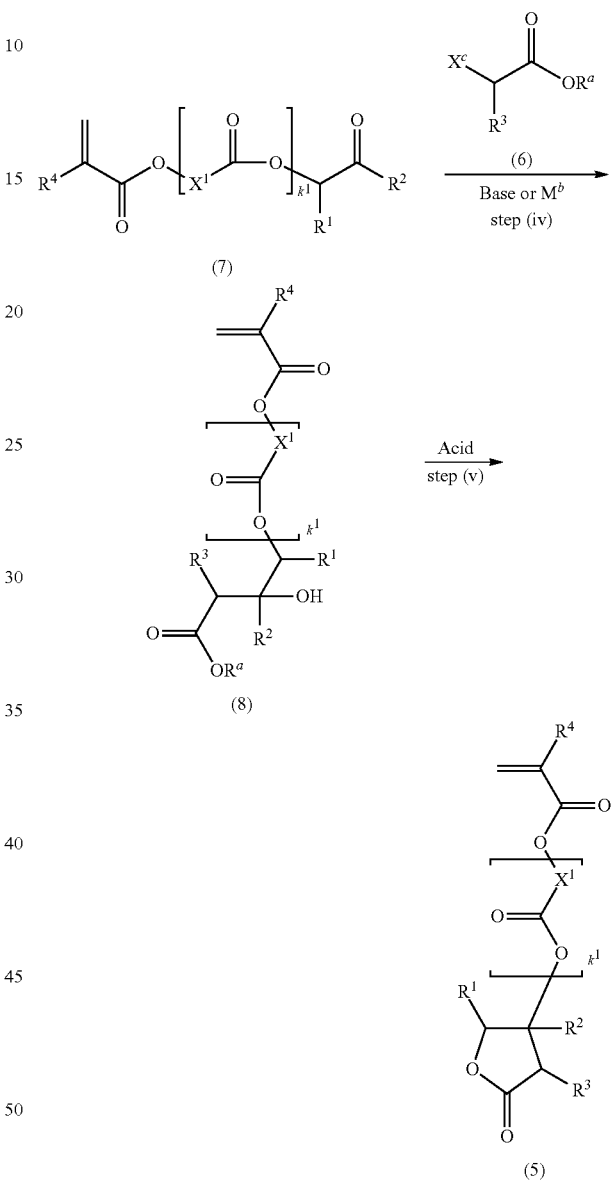

Herein $R^1$ to $R^4$, $X^1$, $X^c$, $k^1$, $R^a$, and $M^b$ are as defined above.

Like step (iii), step (iv) is addition reaction of acyloxy-ketone compound (7) and ester compound (6) with the aid of a base or metal. Preferably Reformatsky reaction is utilized. Reaction may be carried oat under the same conditions as in step (iii). Once the reaction terminates at the stage of intermediate (8a), hydroxy-ester compound (8) may be isolated from the reaction mixture by ordinary aqueous work-up. If necessary, the compound may be purified by standard techniques like distillation, recrystallization and chromatography.

Step (v) is acid treatment of hydroxy-ester compound (8) into the desired monomer (5). Step (v) is carried out by diluting hydroxy-ester compound (8) with a solvent, adding an acid, heating and stirring the mixture for reaction. Suitable solvents include hydrocarbons such as toluene, xylene, hexane and heptane; chlorinated solvents such as methylene chloride, chloroform, and dichloroethane; ethers such as diethyl ether, tetrahydrofuran and dibutyl ether; ketones such as acetone and 2-butanone; esters such as ethyl acetate and butyl acetate; nitrides such as acetonitrile; alcohols such as methanol and ethanol; aprotic polar solvents such as N,N-dimethylfomamide, N,N-dimethylacetamide and dimethyl sulfoxide; and water, which may be used alone or in admixture. Notably, the reaction may also be conducted in a solventless system.

Suitable acids include mineral acids such as hydrochloric acid, sulfuric acid, nitric acid and perchloric acid, organic acids such as methanesulfonic acid, trifluoromethanesulfonic acid, p-toluenesulfonic acid, and benzenesulfonic acid, and Lewis acids such as boron trifluoride, trimethylsilyl triflate, aluminum chloride, magnesium chloride, iron chloride, zinc chloride, and titanium chloride. An appropriate amount of the acid used is 0.001 to 5 moles, more preferably 0.01 to 0.5 mole per mole of the reactant, hydroxy-ester compound (8). Less than 0.001 mole of the acid may invite an economic disadvantage because of a slow reaction rate and longer reaction time. More than 5 moles may incur side reactions due to strong acidity, with a drop of yield. Also, a base may be added for reducing acidity. Exemplary of the base are amines such as ammonia, triethylamine, pyridine, lutidine, collidine, and N,N-dimethylaniline.

For the acid treatment, an appropriate reaction temperature may be selected in accordance with other reaction conditions. In most cases, a temperature of 40 to 70° C. is preferred because reaction does not take place at lower temperatures. The reaction time is determined as appropriate for yield improvement by monitoring the reaction process by thin-layer chromatography (TLC) or gas chromatography (GC). The reaction time is usually about 2 hours to about 1 day. The reaction may be effected by diluting hydroxy-ester compound (8) with a solvent, adding an acid, heating and stirring the mixture. At the end of reaction, monomer (5) may be recovered from the reaction mixture by ordinary aqueous work-up. If necessary, the monomer may be purified by standard techniques like distillation, recrystallization and chromatography.

Due to inclusion of recurring units of formula (1), the resist composition of the invention is improved in MEF and CDU, especially in roundness and CDU in hole pattern formation, as compared with (meth)acrylic-γ-butyrolactone units and other known (meth)acrylic-γ-butyrolactone units, represented by the following formulae (P1) to (P7), as described in Patent Documents 10, 11, and 12.

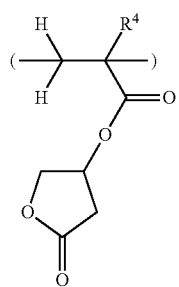
(P1)

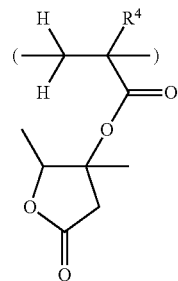
(P2)

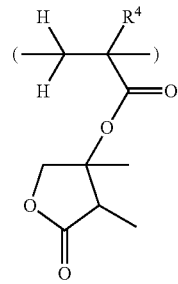
(P3)

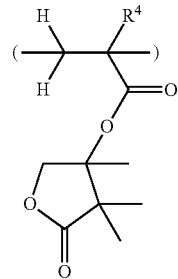
(P4)

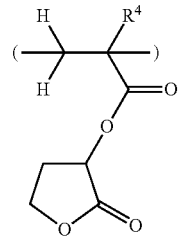
(P5)

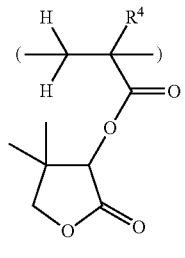
(P6)

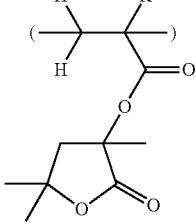
(P7)

The reason why the photoresist composition of the invention has these benefits due to inclusion of recurring units of formula (1) is estimated as follows although the mechanism is not definitely understood.

The recurring unit (1) is a monocyclic lactone having three alkyl groups. Due to the high lipophilicity of pendant alkyl groups, the recurring unit (1) has higher organic solvent solubility than the recurring units of monocyclic lactone represented by formulae (P1), (P2), (P3), (P5), and (P6), shown below.

When the recurring unit of formula (1) is used in negative pattern formation via organic solvent development, the high developer solubility leads to an improvement in dissolution contrast, and hence, improvements in resist performance factors such as MEF and CDU. If a recurring unit of monocyclic lactone having more than three alkyl groups is used in negative pattern formation via organic solvent development, an excessively high developer solubility may cause undesirable phenomena such as film thickness loss and pattern collapse.

Further, it is believed that the recurring unit (1) reacts with a basic compound (commonly used as a sensitivity adjusting agent in resist) as shown by the reaction scheme below. That is, the basic compound induces proton abstraction reaction relative to α-hydrogen (depicted at $H^a$) with high acidity on lactone (1) while the acyl group at β-position becomes a leaving group. In this way, elimination reaction takes place.

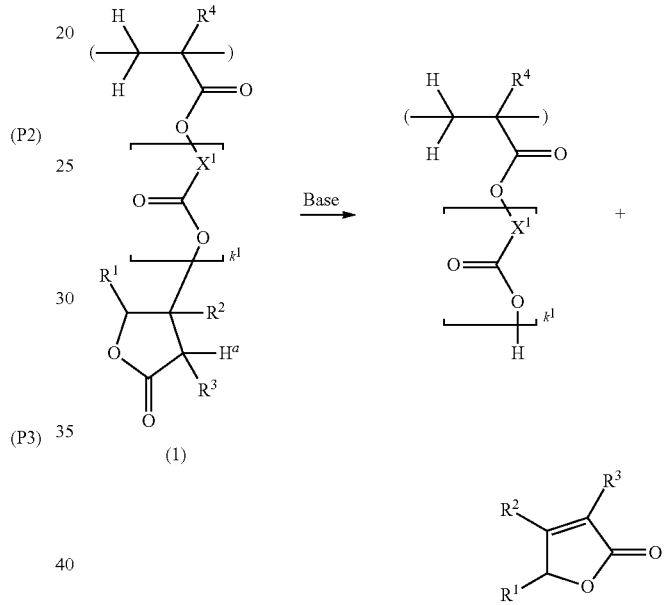

On this reaction, a carboxylic acid unit is created by the recurring unit (1) as well as the recurring unit having an acid, labile group. This results in a change of solubility in developer, leading to an improvement in dissolution contrast. To trigger this reaction, a β-(meth) acrylic-γ-butyrolactone structure having α-hydrogen is essential. Thus the recurring unit (1) of lactone according to the invention has a higher dissolution contrast than the recurring units (not having the relevant, structure) represented by formulae (P4), (P5), (P6), and (P7), shown below.

(P1)
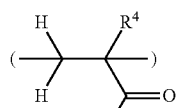

(P2)
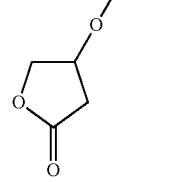

(P3)
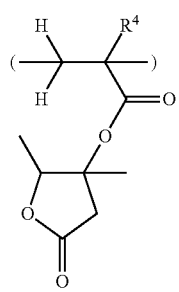

(P5)
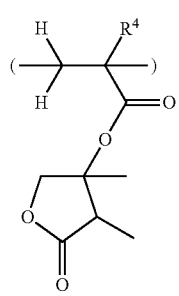

(P6)
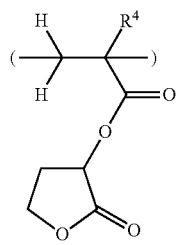

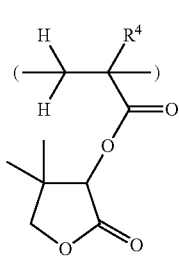

(P4)
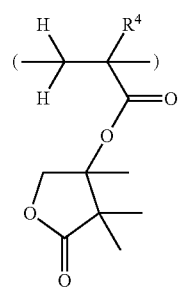

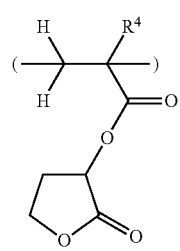

(P5)

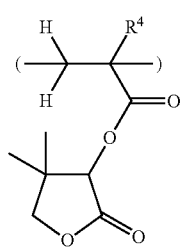

(P6)

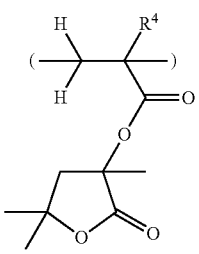

(P7)

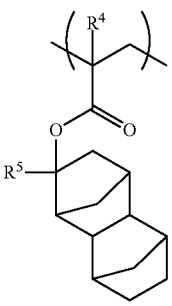

(2A)

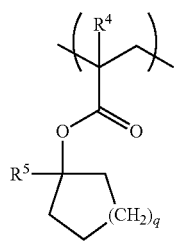

(2B)

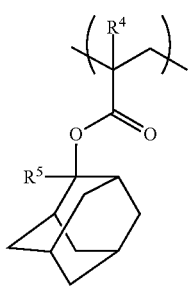

(2C)

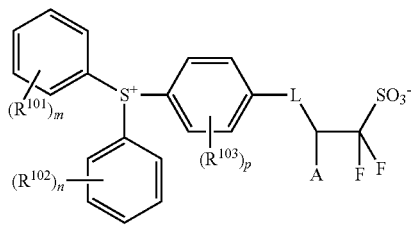

(4)

The above discussion accounts for the reason why the resist composition having recurring units of formula (1) included therein is improved in MEF and CDU, especially in roundness and CDU in hole pattern formation.

Furthermore, when the recurring unit (1) having an appropriately high solvent solubility and a structure capable of polarity conversion via elimination reaction is combined with a recurring unit (2A), (2B) or (2C) having an acid labile group of high elimination ability or a photoacid generator (4) with high acid diffusion control ability, there is obtained a resist composition having a higher dissolution contrast.

In summary, the recurring unit of formula (1) has a high developer solubility without the risks of film thickness loss and pattern collapse, is capable of polarity conversion via base elimination reaction in resist film, and thus displays a high dissolution contrast. As a result, a resist composition comprising a base resin composed of recurring units (1), when used in pattern formation via positive/negative reversal by organic solvent development, is improved in resist performance factors such as MEF and CDU, and especially in roundness and CDU on hole pattern formation.

In this context, the resist composition of the invention is defined as comprising a polymer comprising recurring units (1) and recurring units of at least one type selected from the general formulae (2A), (2B) and (2C); or a polymer comprising recurring units (1) and a photoacid generator having the general formula (4).

Herein $R^4$ is hydrogen or methyl, $R^5$ is methyl, ethyl or a straight or branched $C_3$-$C_6$ hydrocarbon group, q is 1 or 2, A is hydrogen or trifluoromethyl, $R^{101}$, $R^{102}$ and $R^{103}$ are each independently hydrogen or a straight, branched or cyclic $C_1$-$C_{20}$ monovalent hydrocarbon group which may be substituted with or separated by a heteroatom, m and n each are an integer of 0 to 5, p is an integer of 0 to 4, and L is a single bond, oxygen atom or a straight, branched or cyclic $C_1$-$C_{20}$ divalent hydrocarbon group which may be substituted with or separated by a heteroatom.

Below, the components of the resist composition are described. First reference is made to the polymer serving as base resin in the resist composition.

For the polymer used in the resist composition, the incorporation of recurring units having formula (2A) into the polymer comprising recurring units having formula (1) is effective for achieving a sufficient dissolution contrast. Examples of the recurring unit having formula (2A) are shown below, but not limited thereto.

-continued
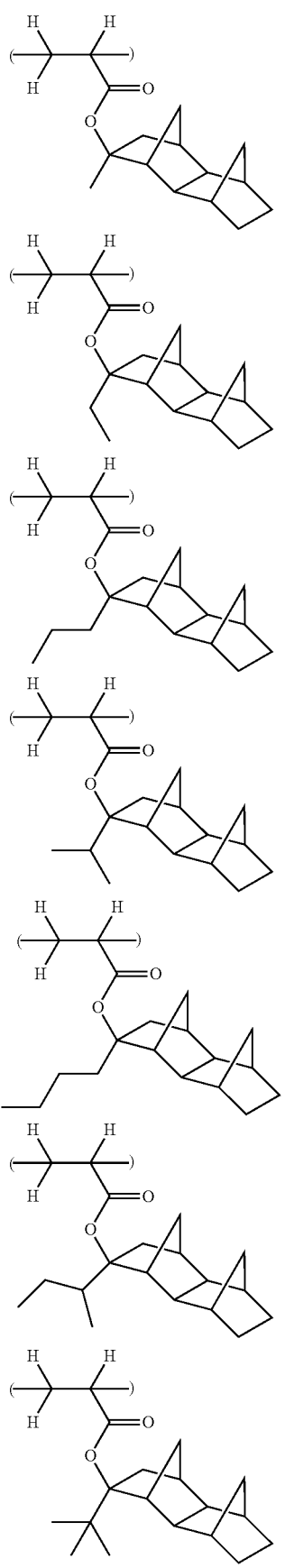
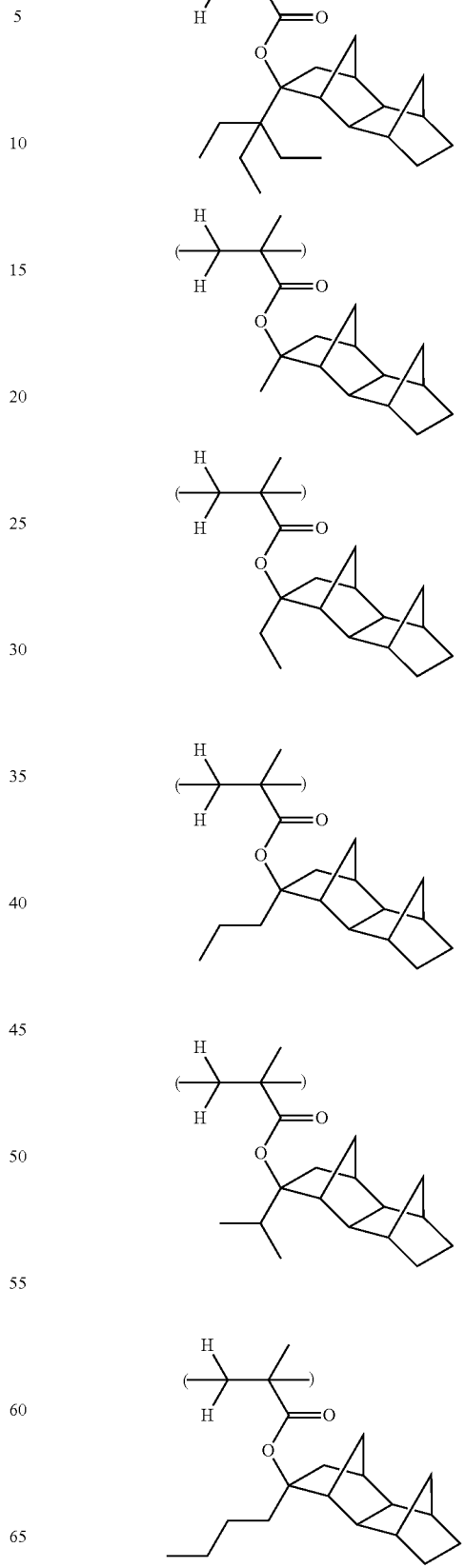

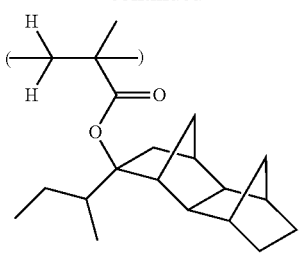
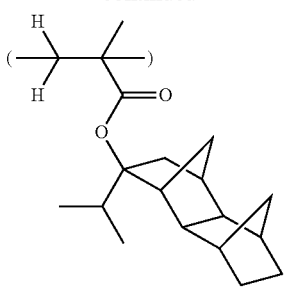
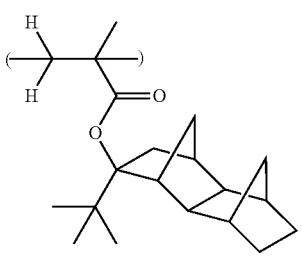
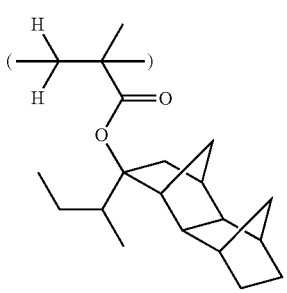
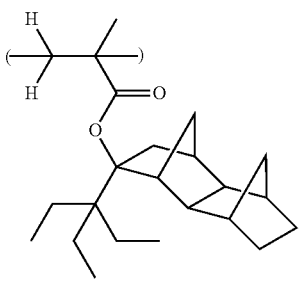
The incorporation of recurring units having formula (2B) into the polymer comprising recurring units having formula (1) is effective for improving resolution. Examples of the recurring unit having formula (2B) are shown below, but not limited thereto.
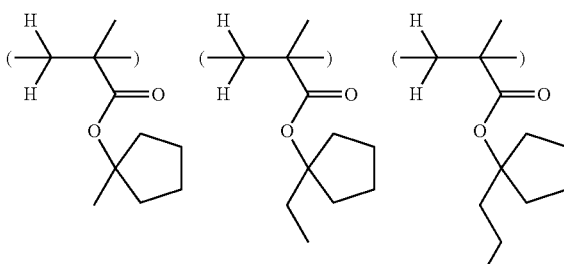
Of the recurring units having formula (2A), those recurring units shown below are especially preferred.
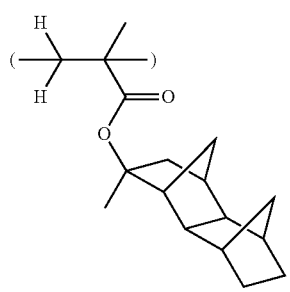
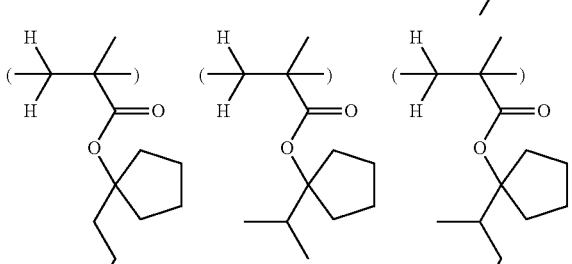
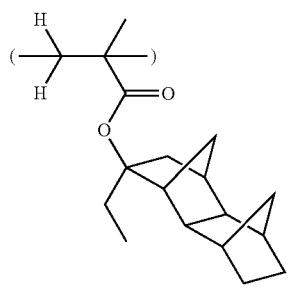
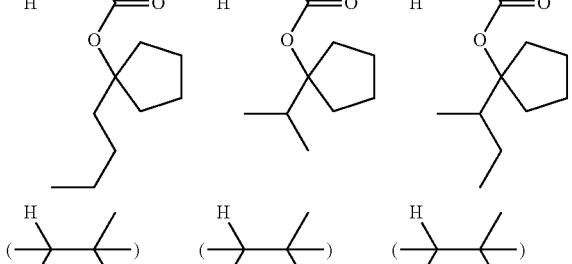

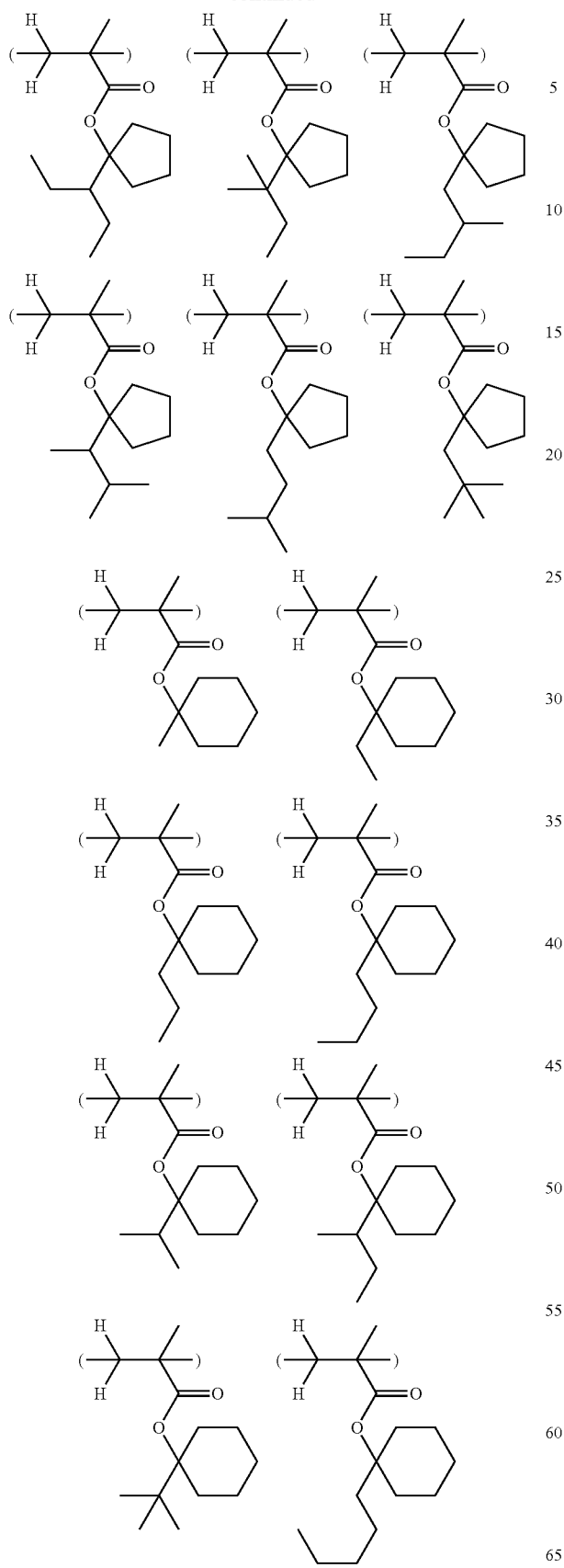
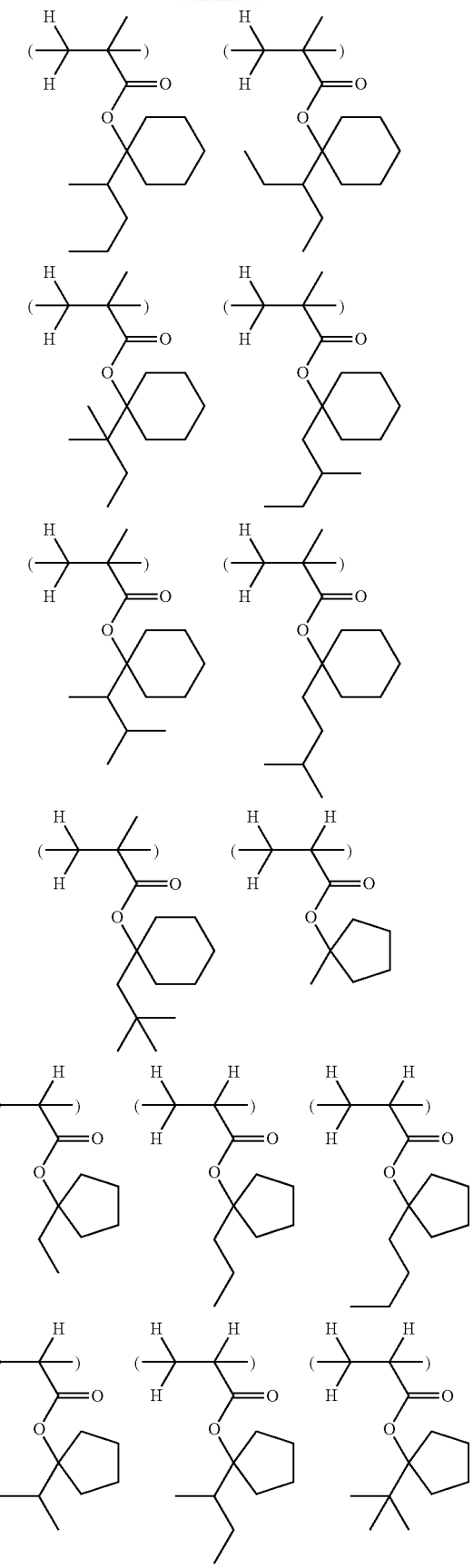

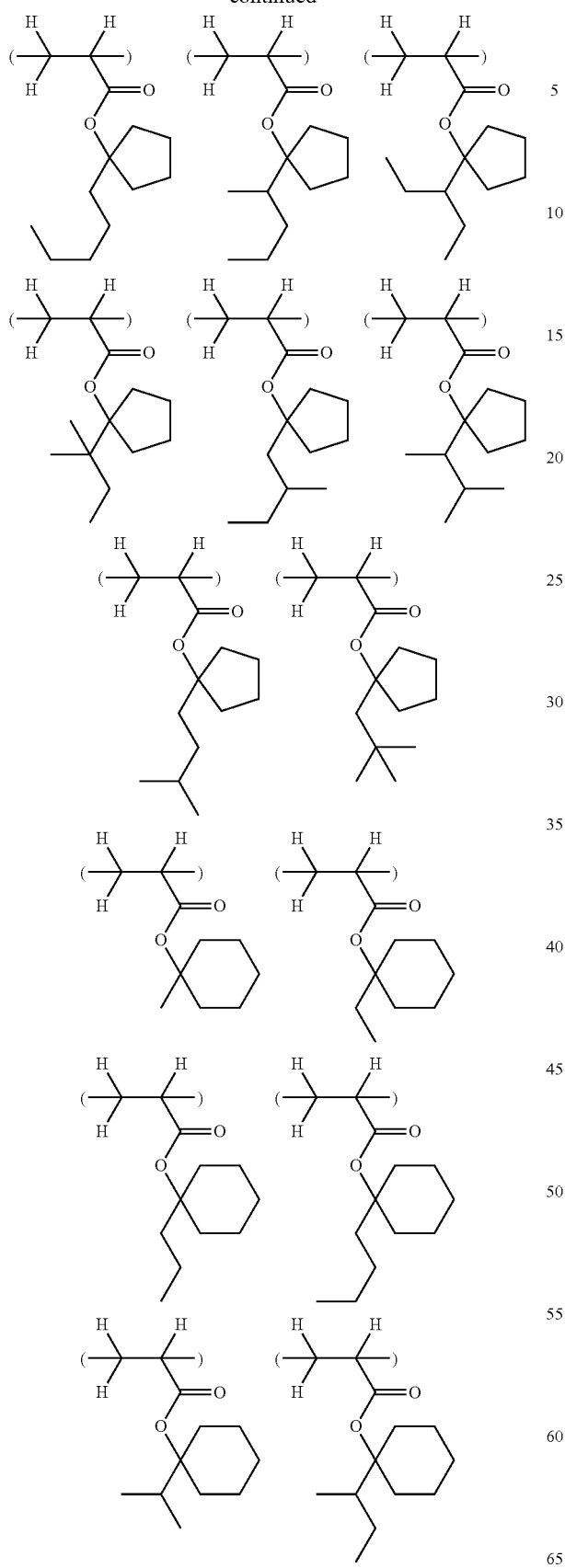
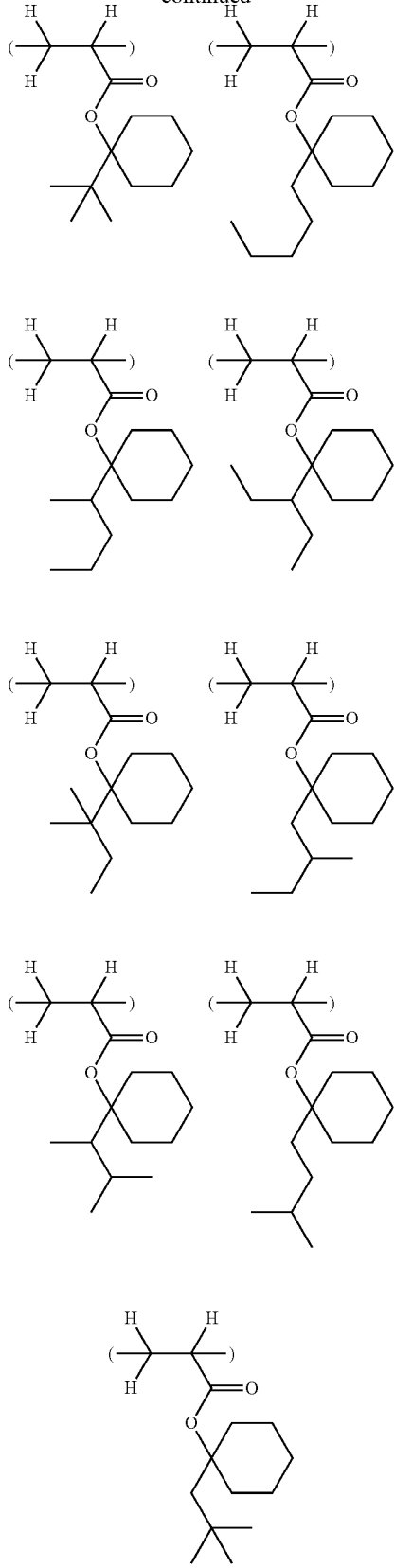
Of the recurring units having formula (2B), those recurring units shown below are especially preferred.

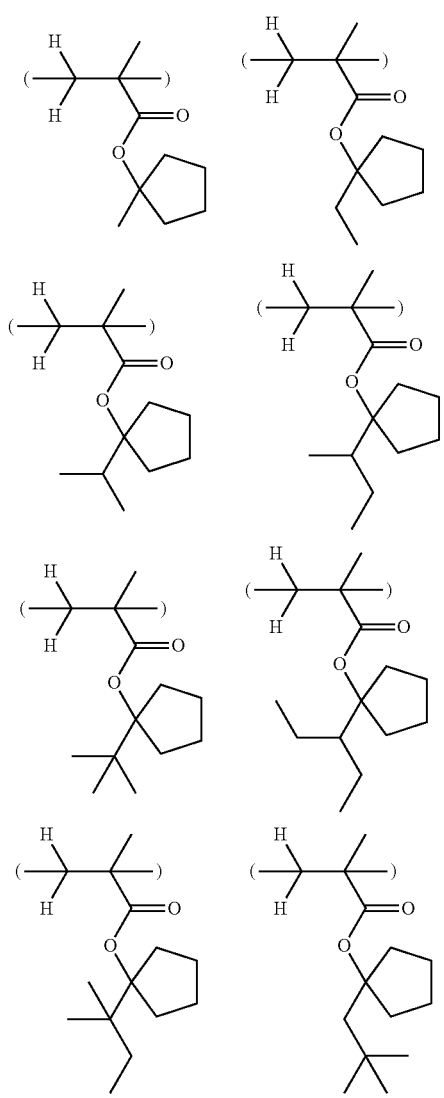
The incorporation of recurring units having formula (2C) into the polymer comprising recurring units having formula (1) is effective for improving resolution and etch resistance. Examples of the recurring unit having formula (2C) are shown below, but not limited thereto.
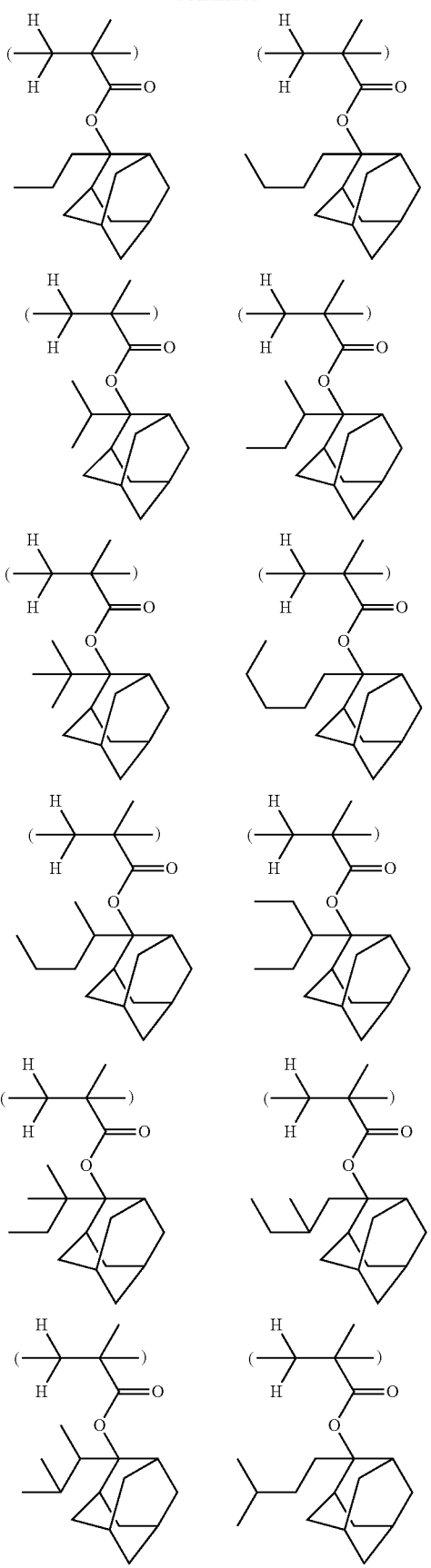

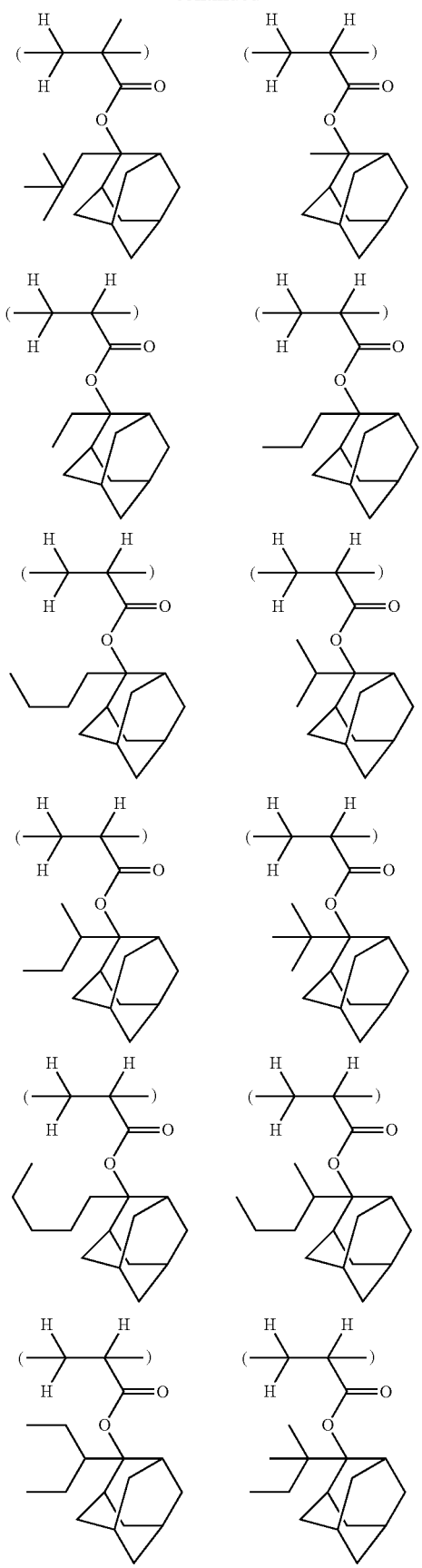

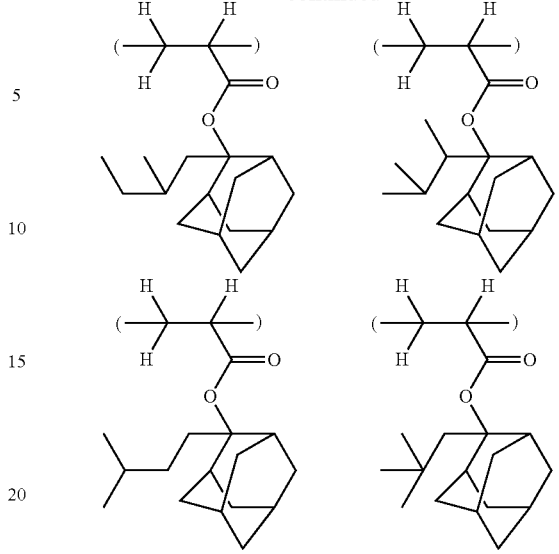

Of the recurring units having formula (2C), those recurring units shown below are especially preferred.

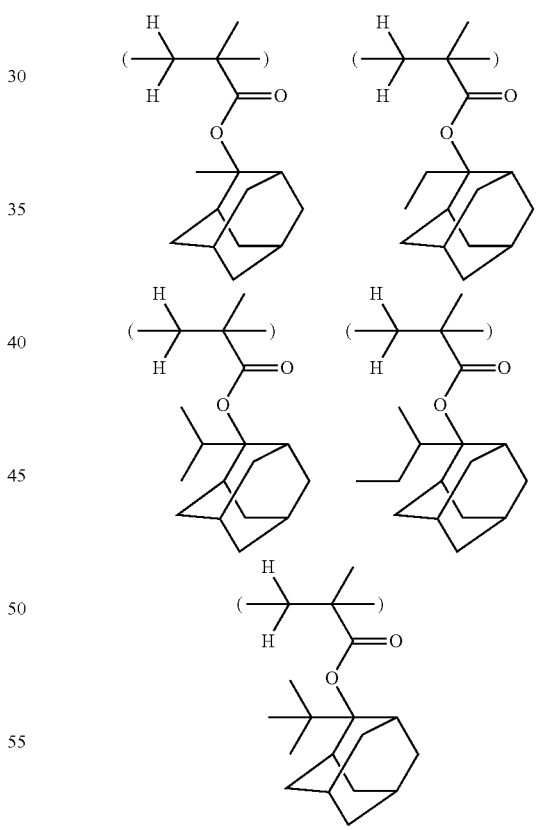

The polymer or resin component (A) in the resist composition may further comprise recurring units other than the recurring units of formula (1) and the recurring units of formulae (2A), (2B) and (2C). Such additional recurring units are, for example, recurring units containing a tertiary alkyl group, acetal structure, hydroxyadamantyl group, lactone ring, lactam ring, sultone ring, carboxyl group, fluoroalkyl group, oxetane ring, and oxirane ring.

Examples of the recurring unit containing a tertiary alkyl group, which may be included in resin component (A), are given below, but not limited thereto.
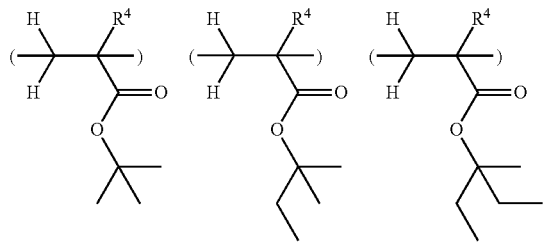
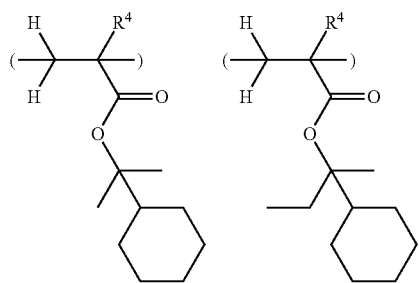
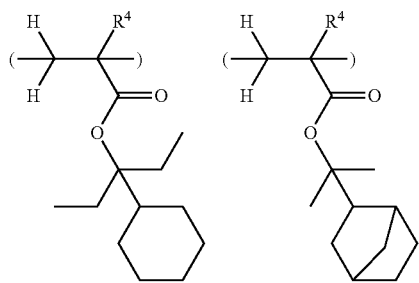
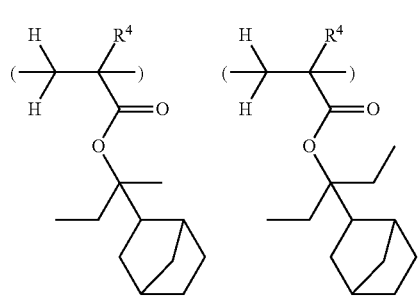
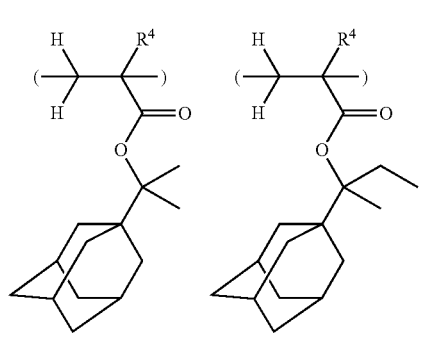
-continued
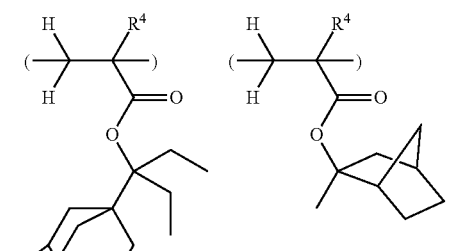
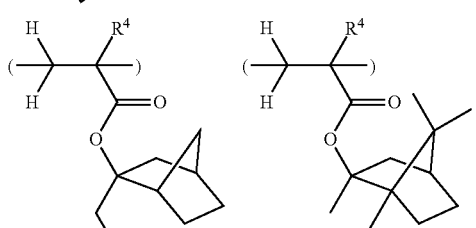
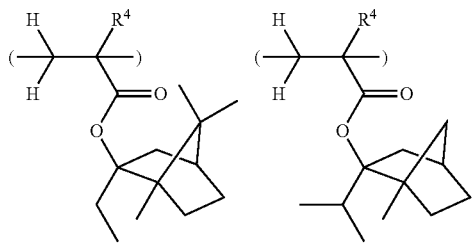
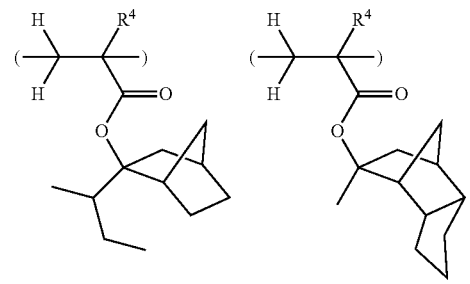
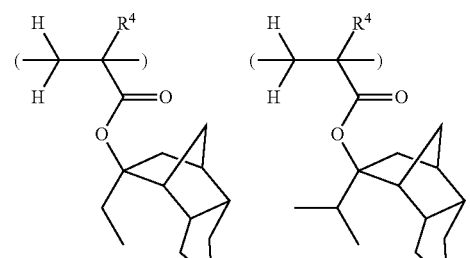
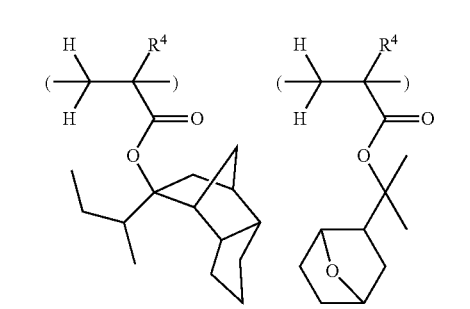

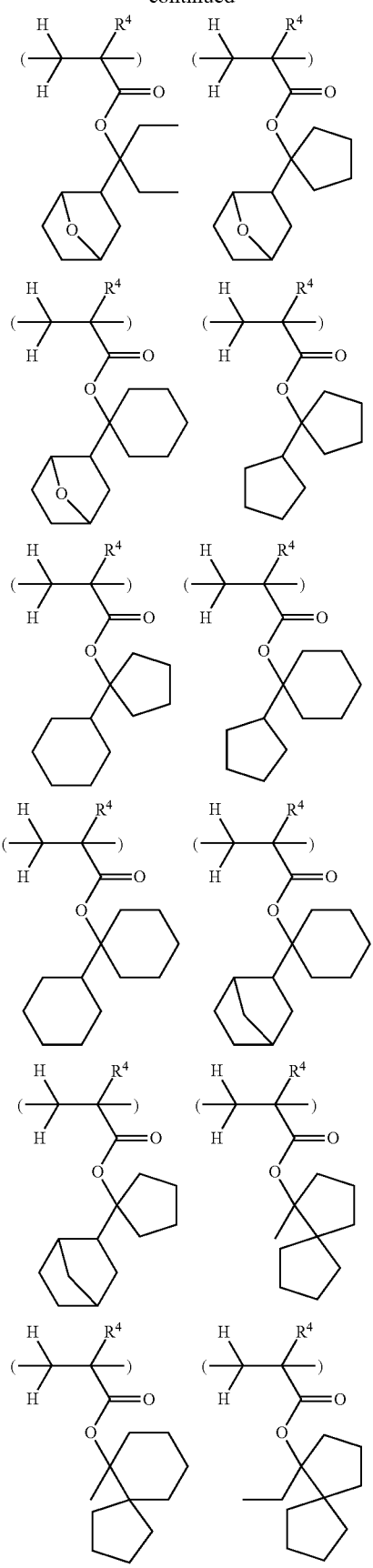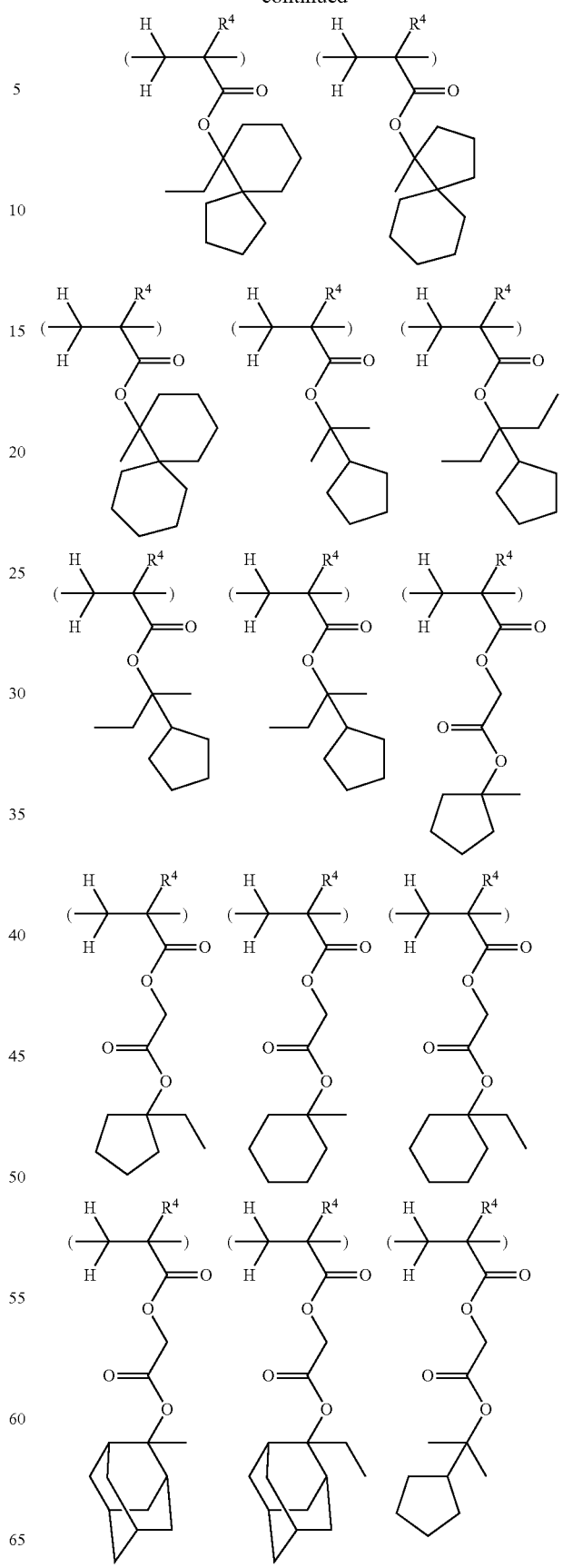

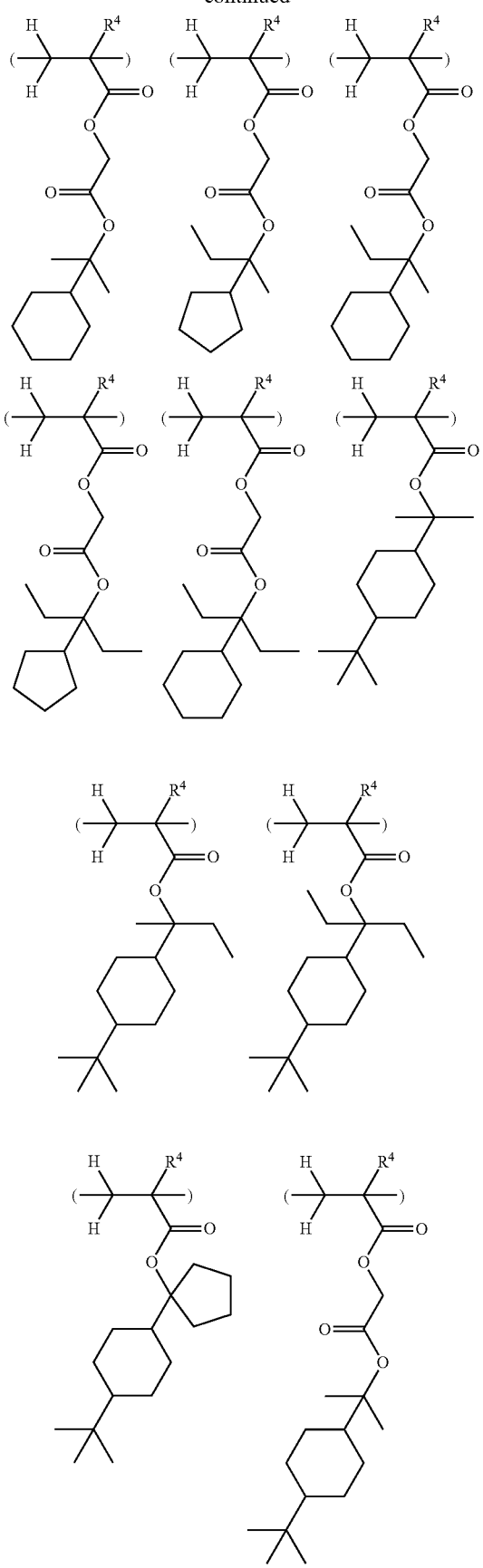
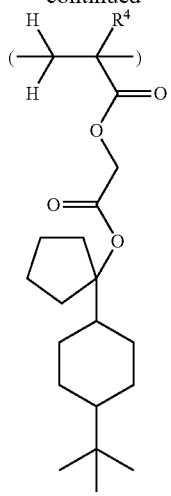
Herein R⁴ is as defined above.
Examples of the recurring unit containing acetal, which may be included in resin component (A), are given below, but not limited thereto.

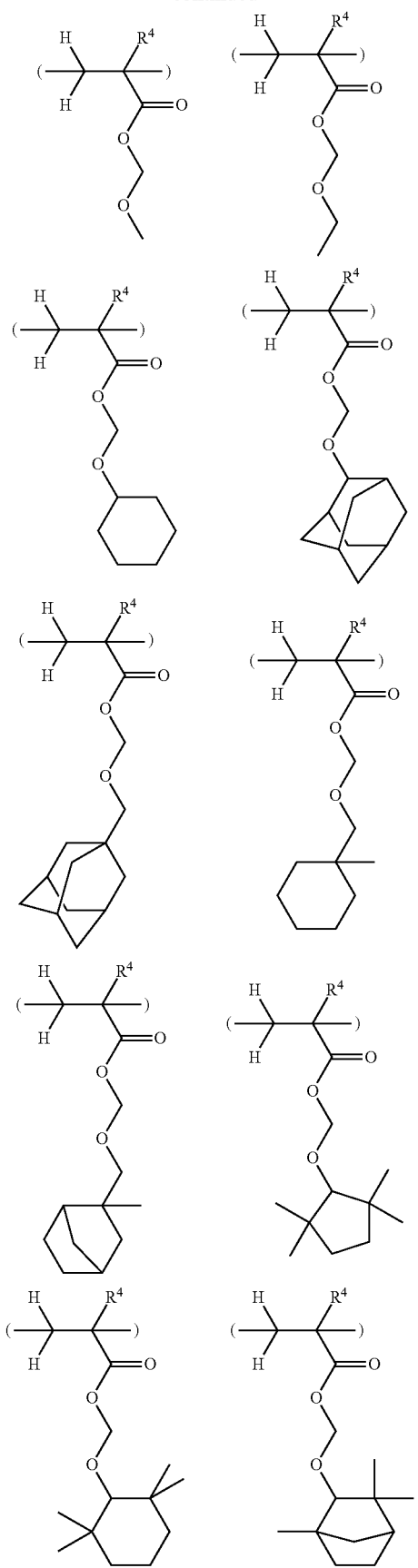
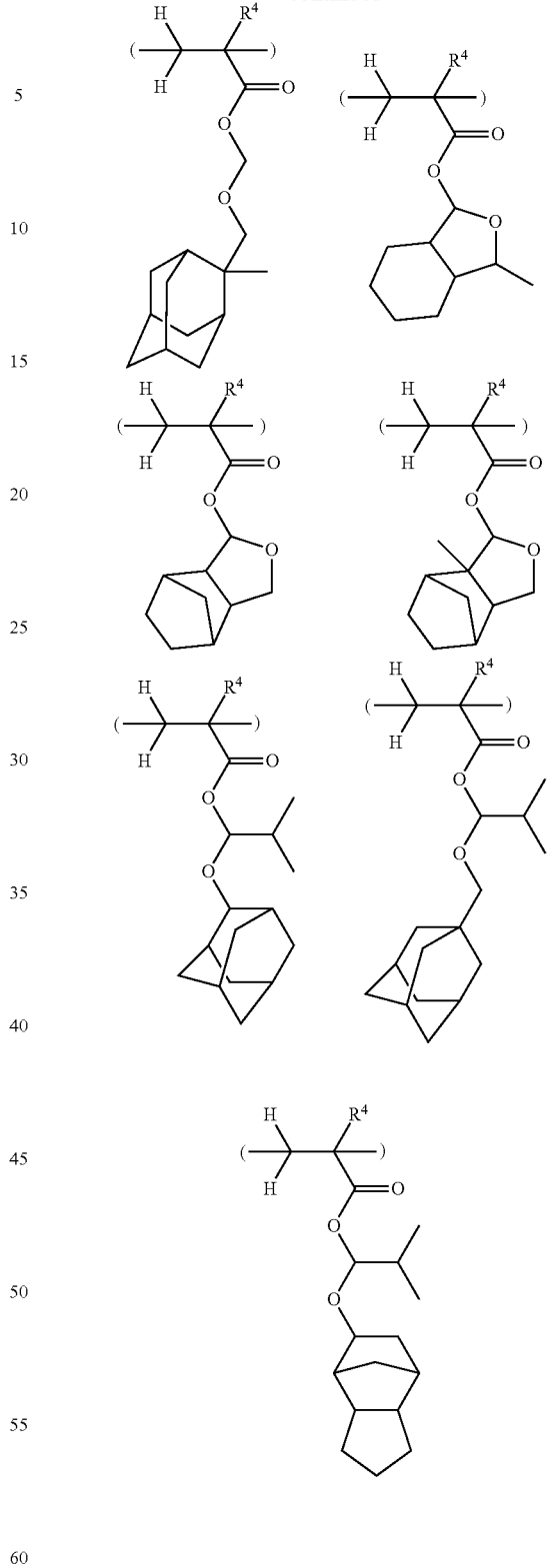
Herein R⁴ is as defined above.
Examples of the recurring unit containing a hydroxyadamantyl group, which may be included in resin component (A), are given below, but not limited thereto.

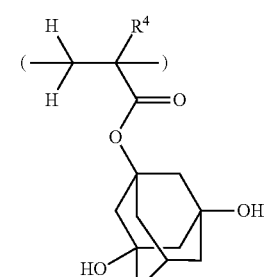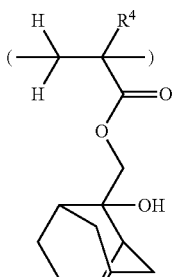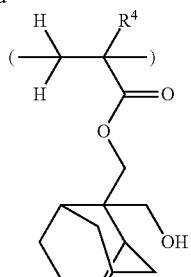
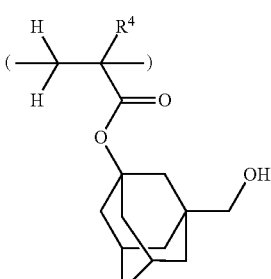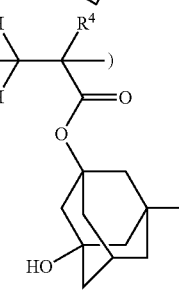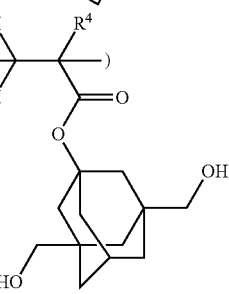
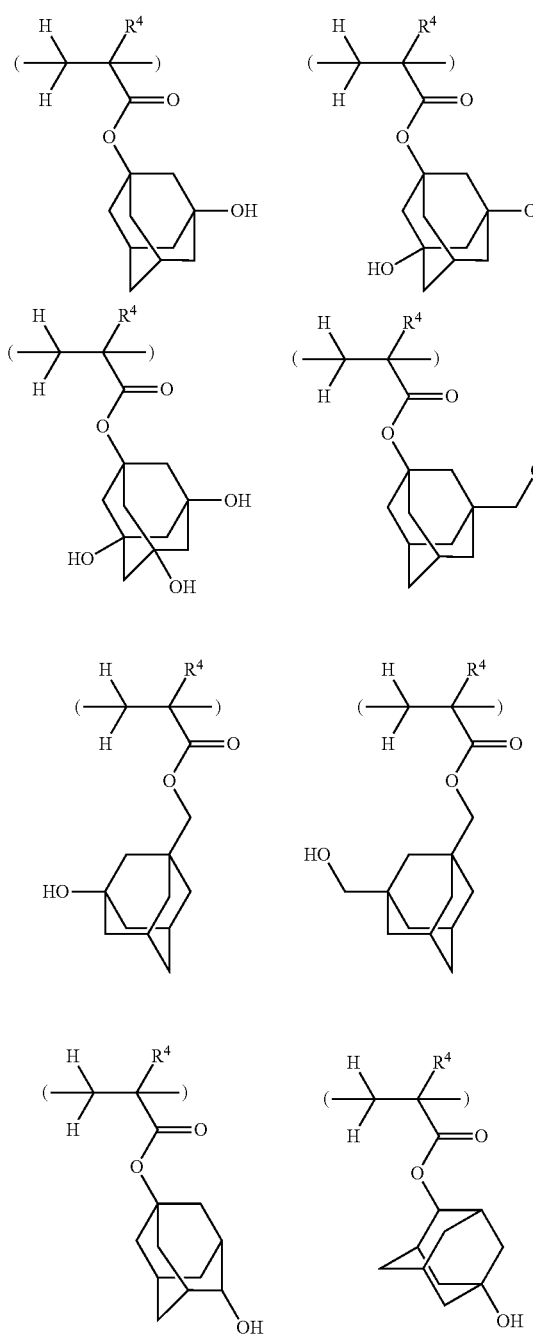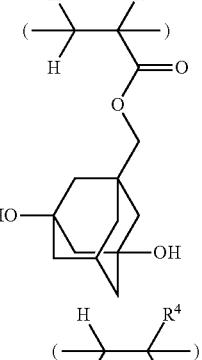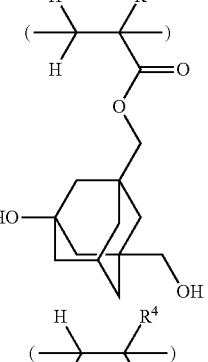
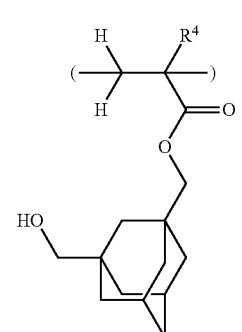
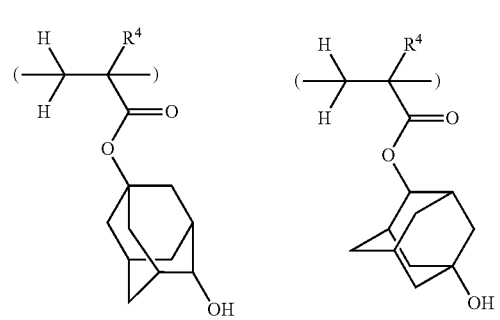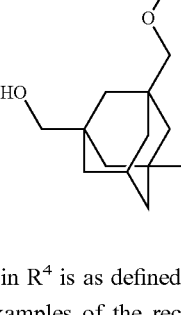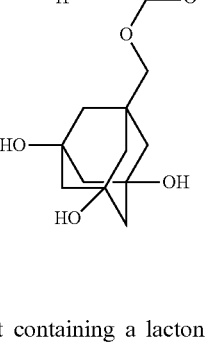
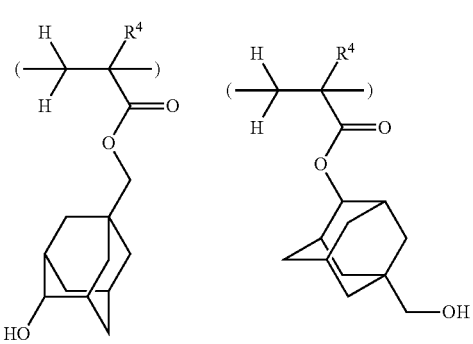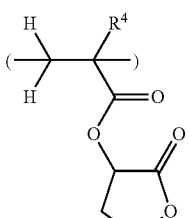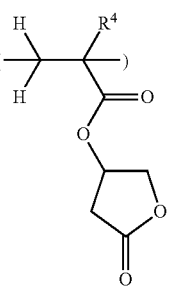
Herein R⁴ is as defined above.
Examples of the recurring unit containing a lactone or sultone skeleton, which may be included in resin component (A), are given below, but not limited thereto.

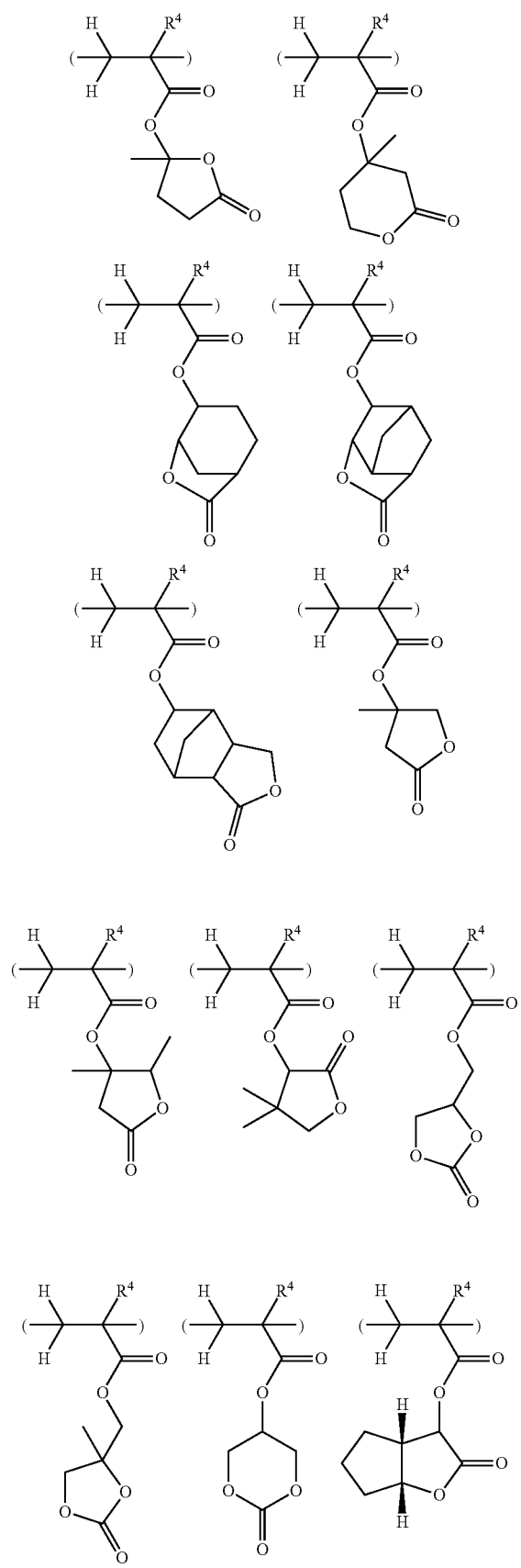
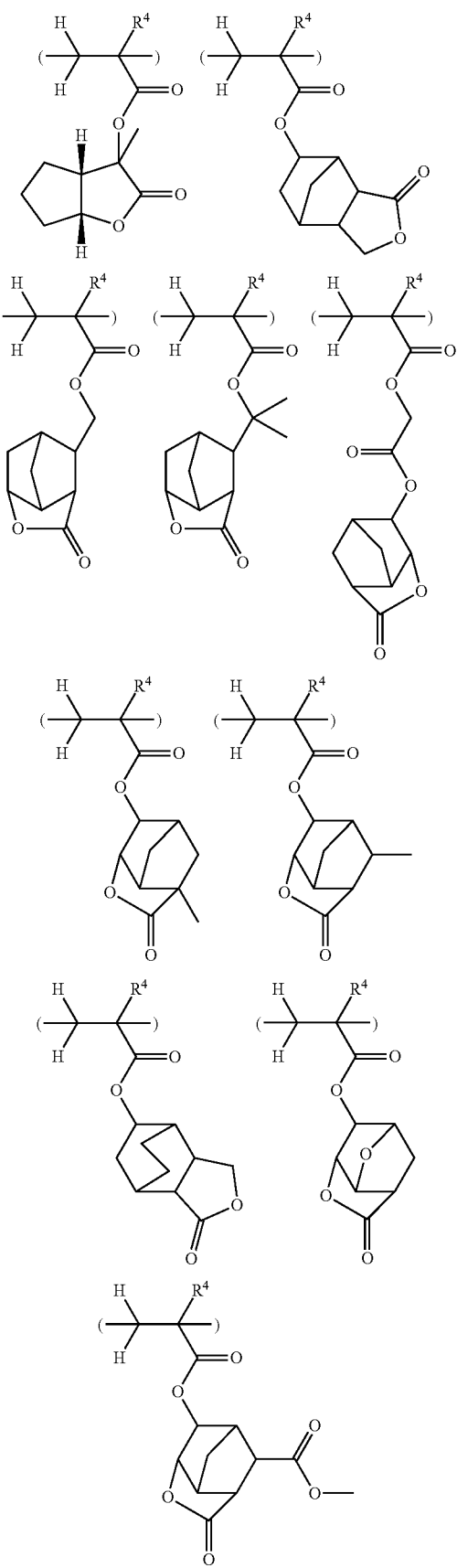

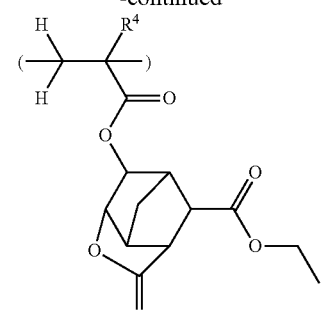
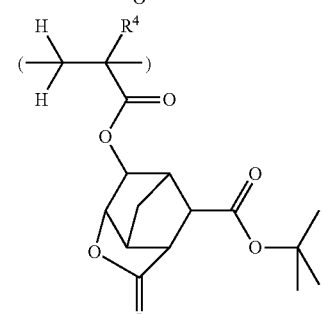
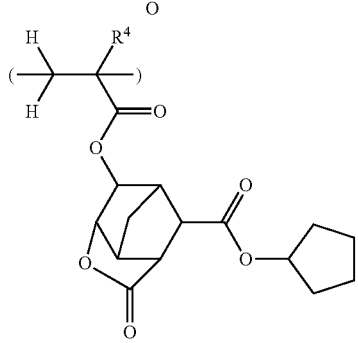
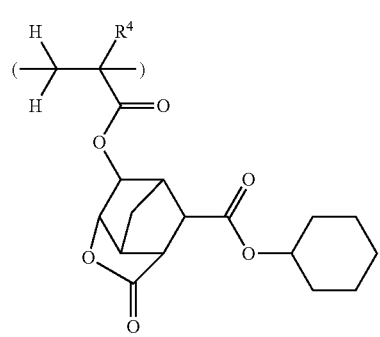
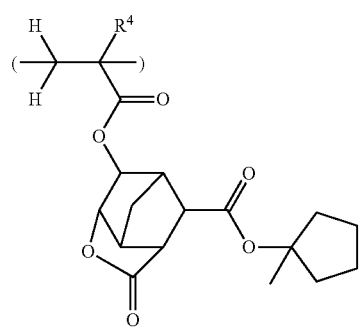
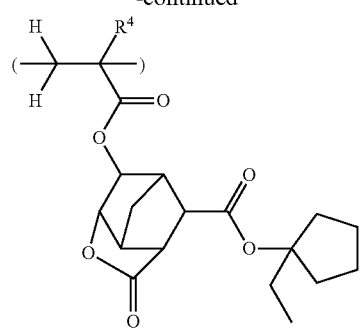
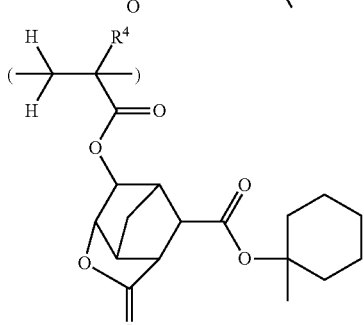
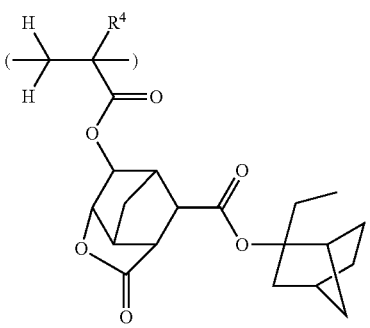
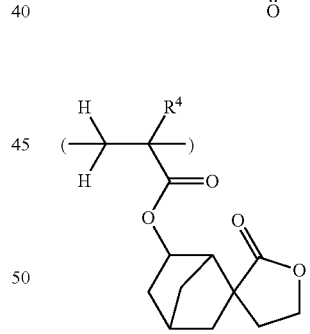
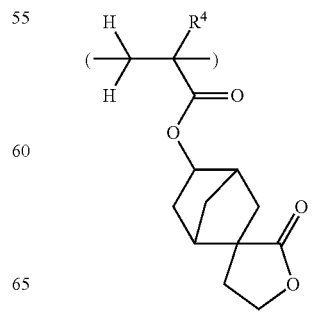
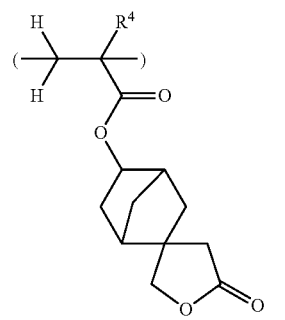

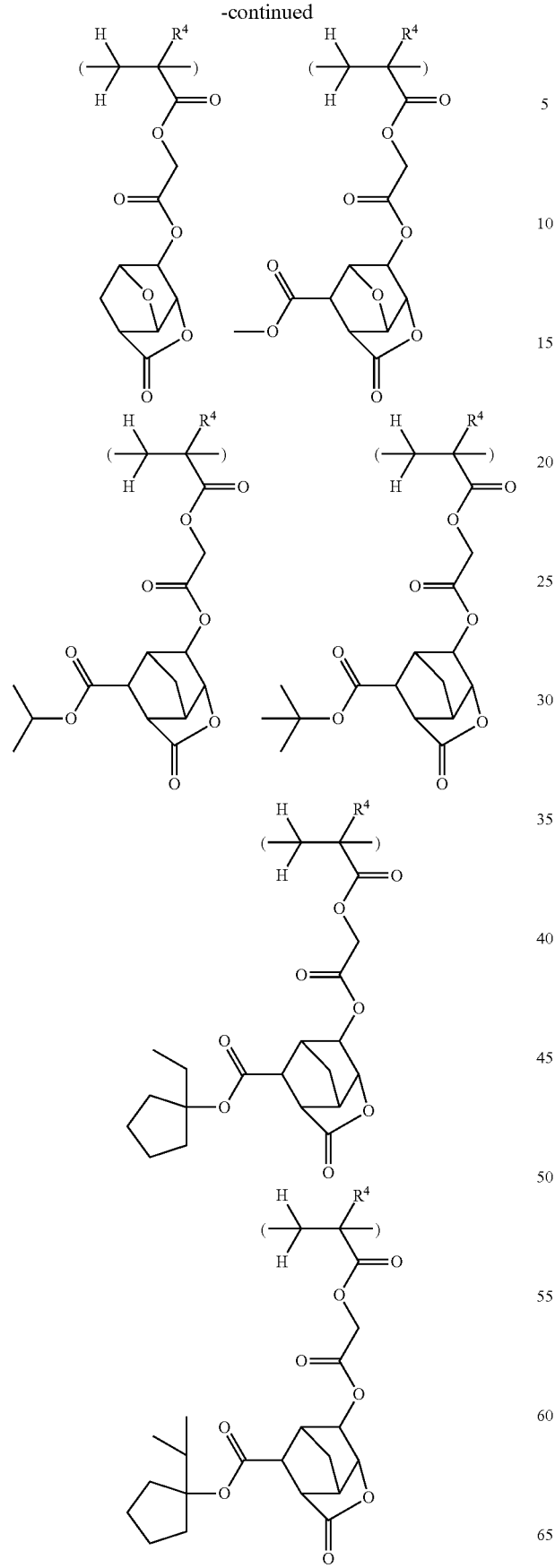
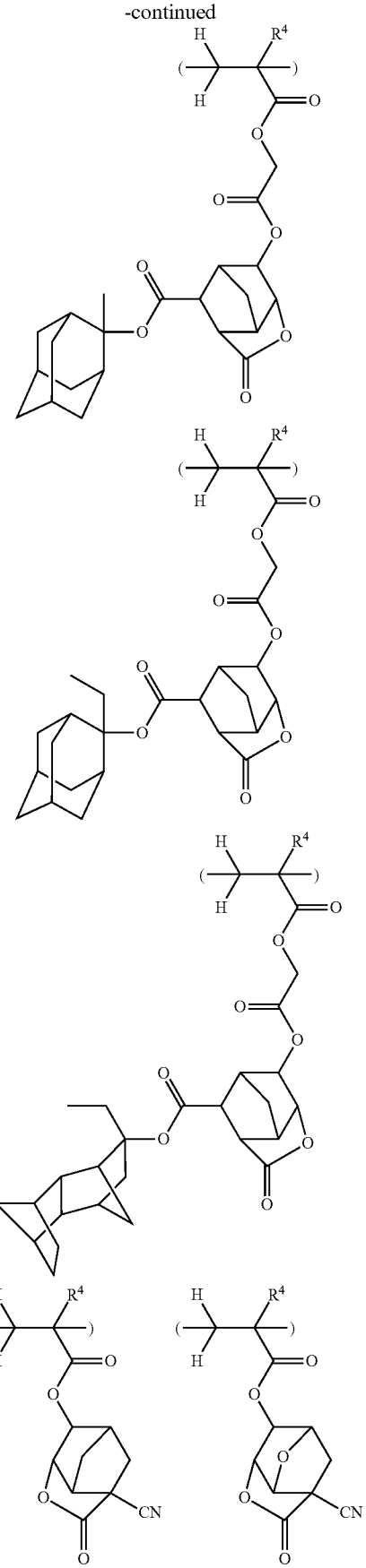

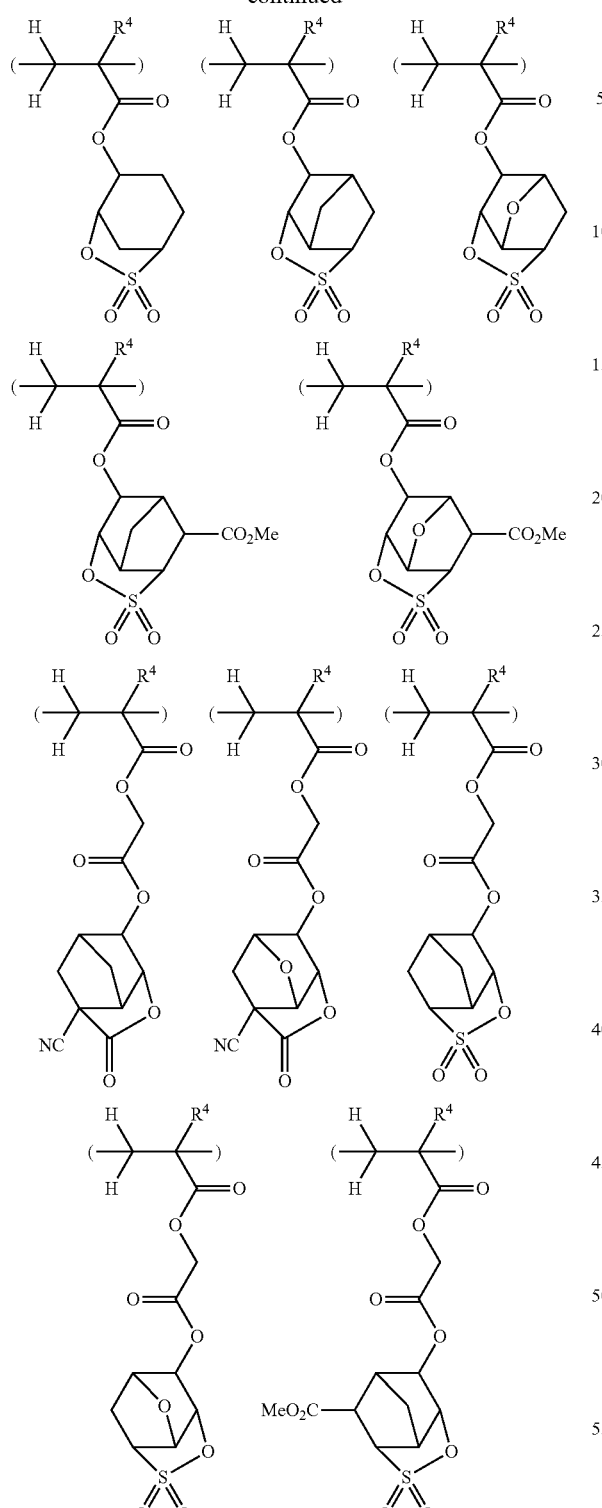
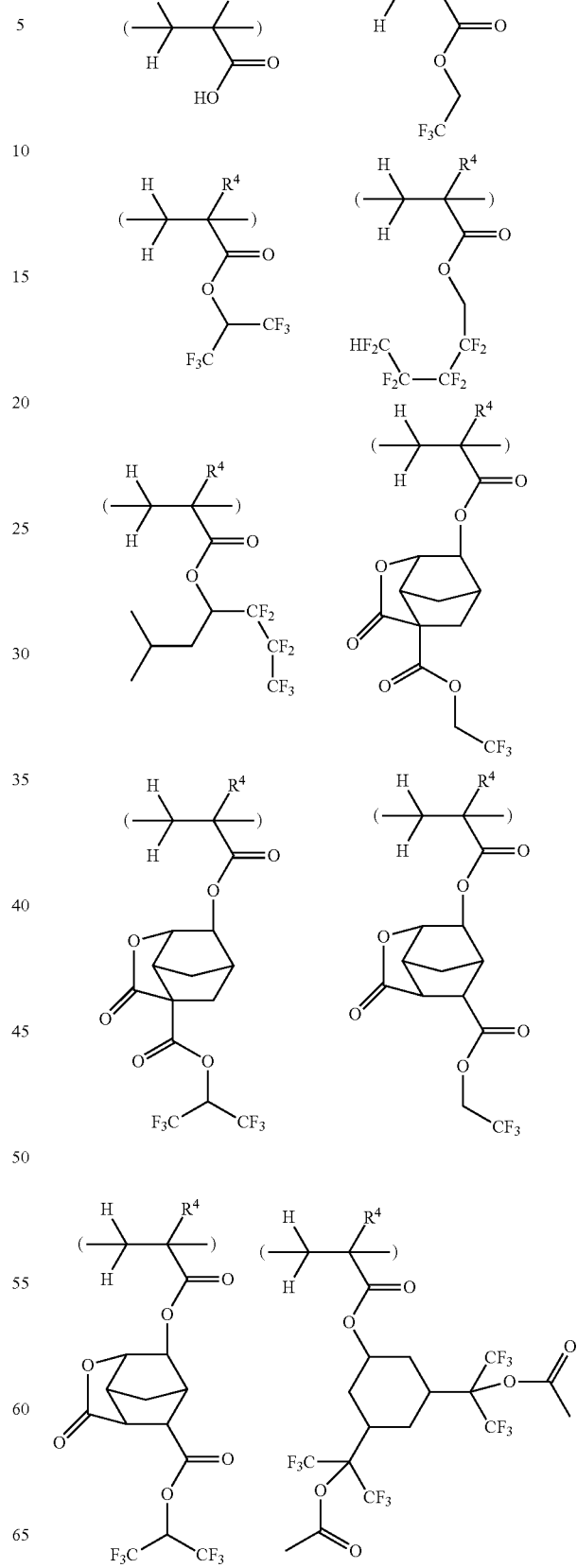
Herein R⁴ is as defined above.
Examples of the recurring unit containing a carboxyl or fluoroalkyl group, which may be included in resin component (A), are given below, but not limited thereto.

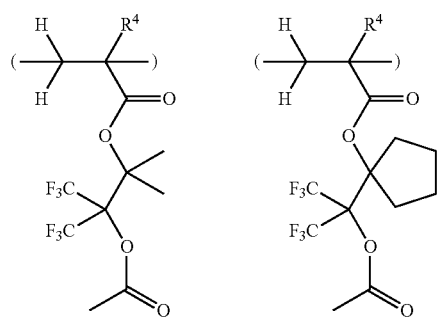
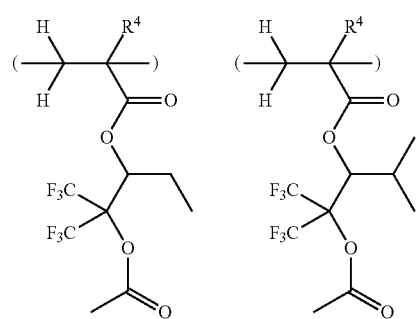
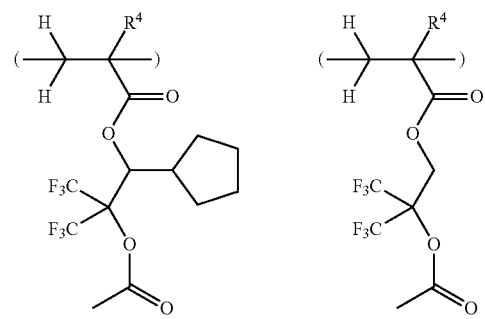
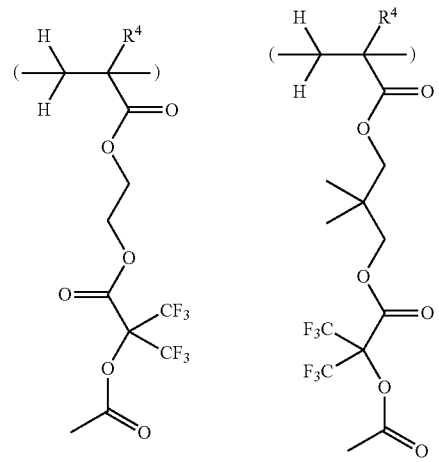
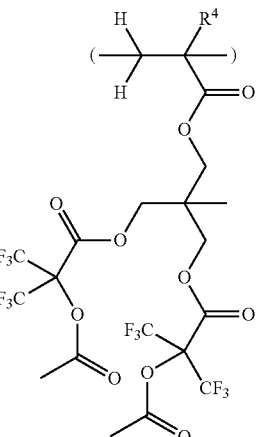
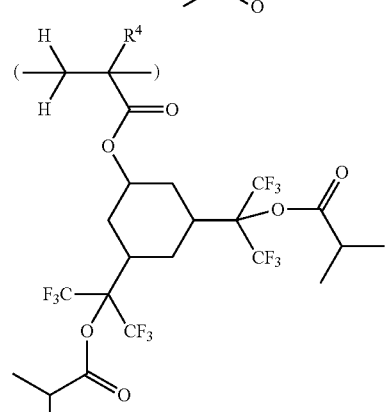
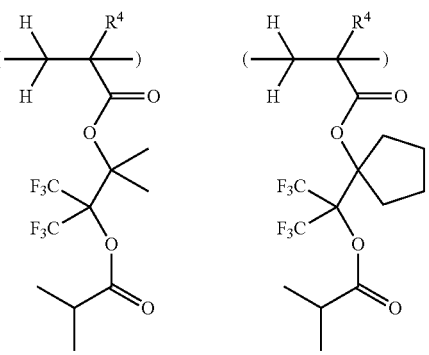
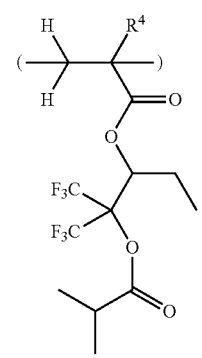
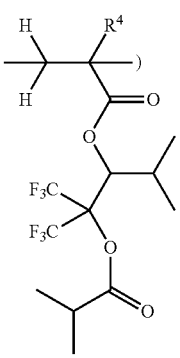

-continued

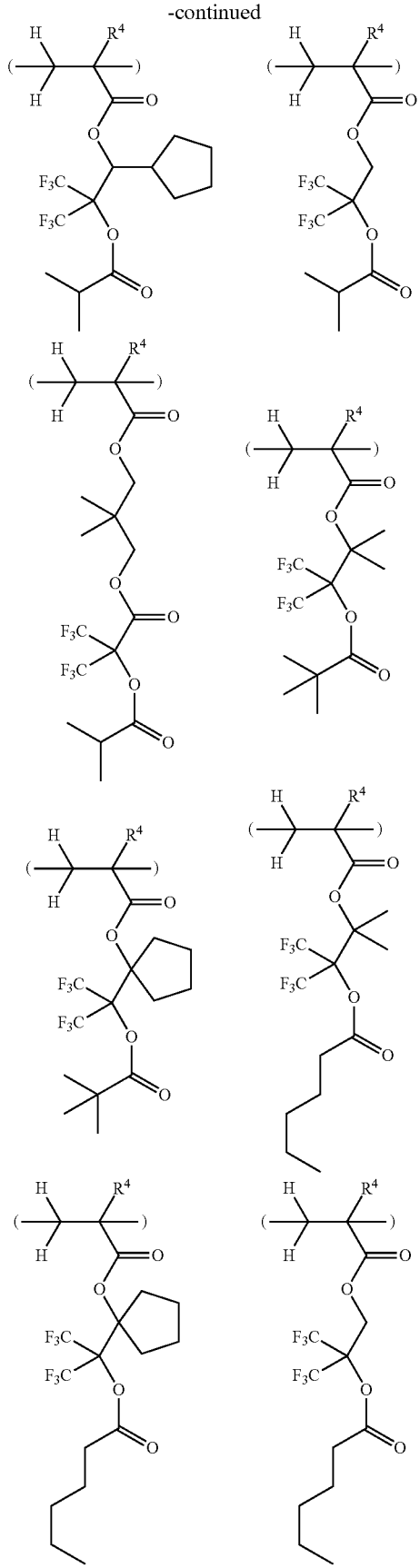

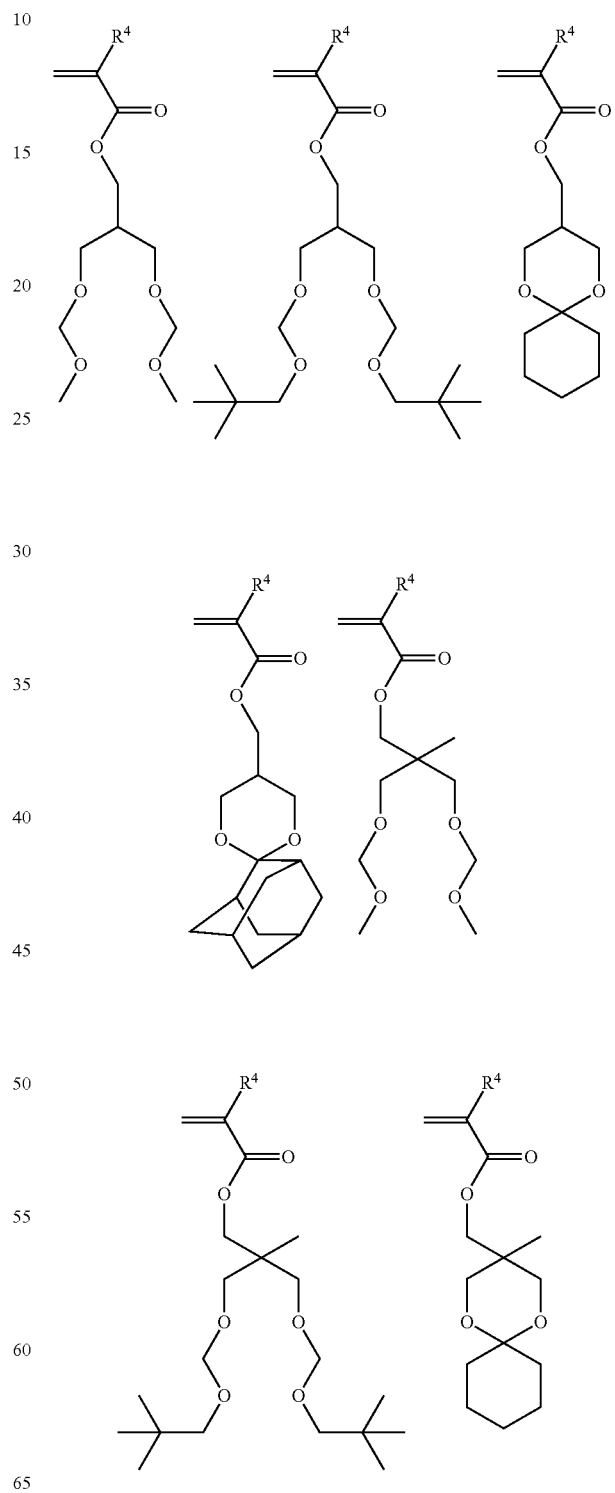

Suitable recurring units containing an acetal structure, which may be included in resin component (A), include recurring units serving as an acid labile protective group for (meth)acrylic acid, and recurring units which are decomposed under the action of acid to generate a hydroxyl group for thereby changing solubility in various solvents. Examples are given below, but not limited thereto.

Herein $R^4$ is as defined above.

-continued
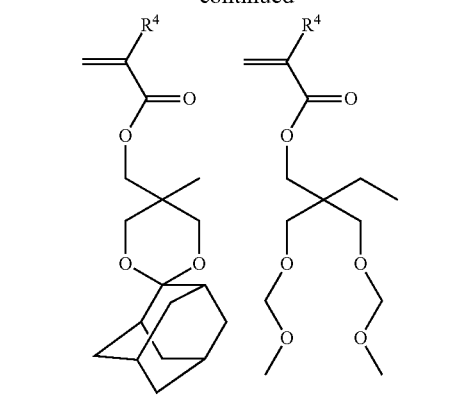
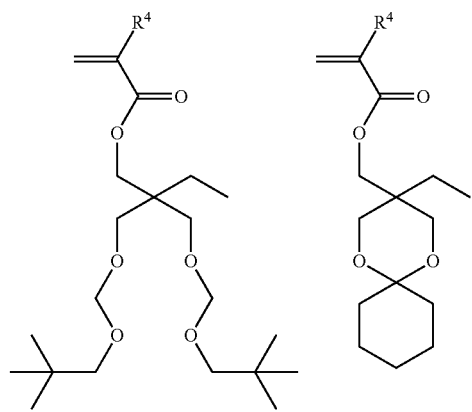
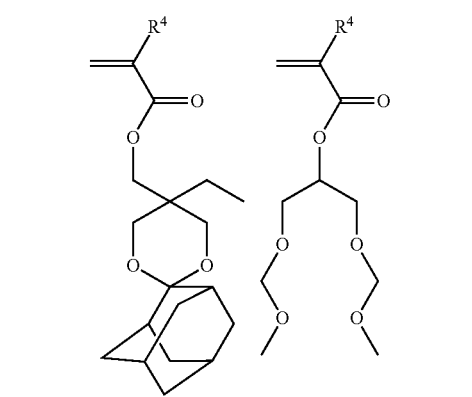
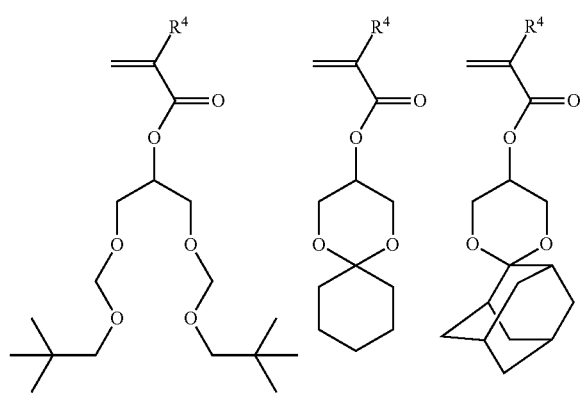
-continued
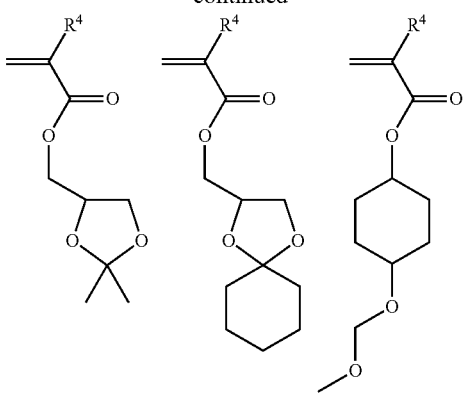
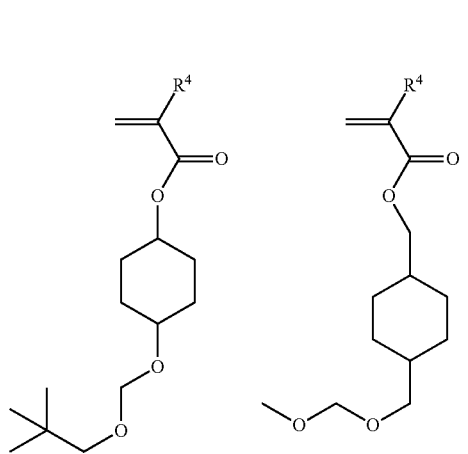
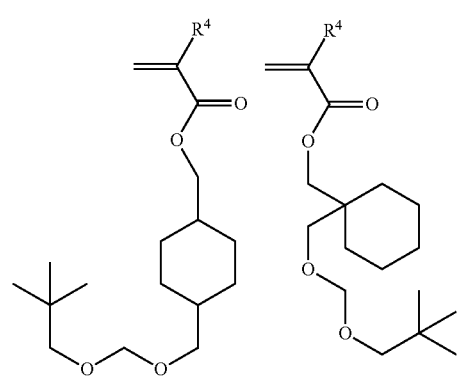
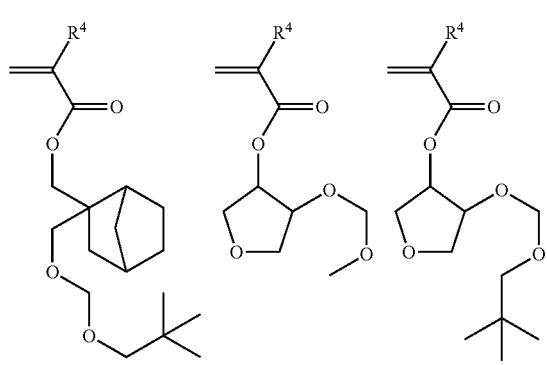

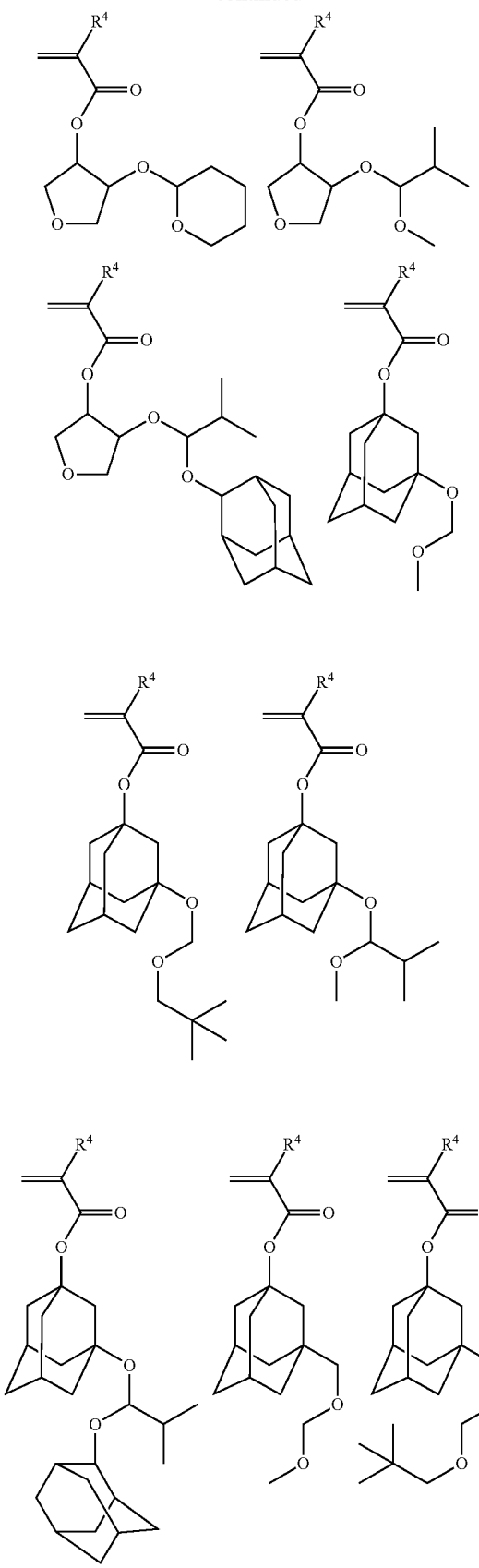
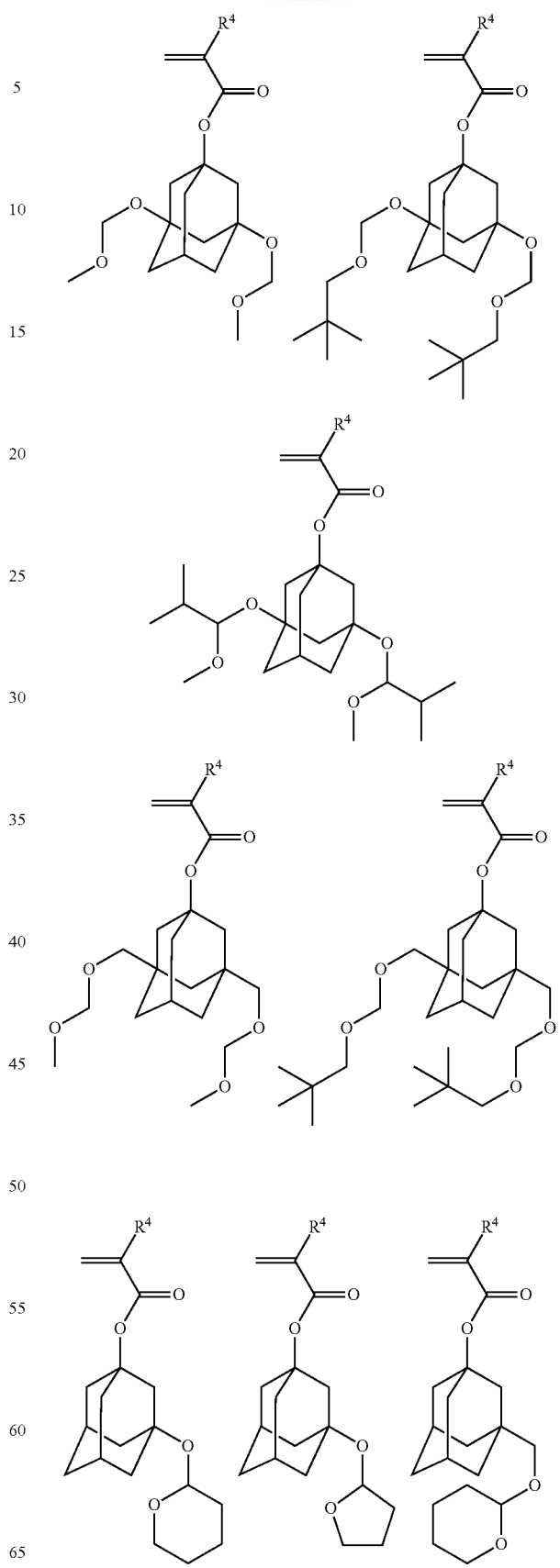

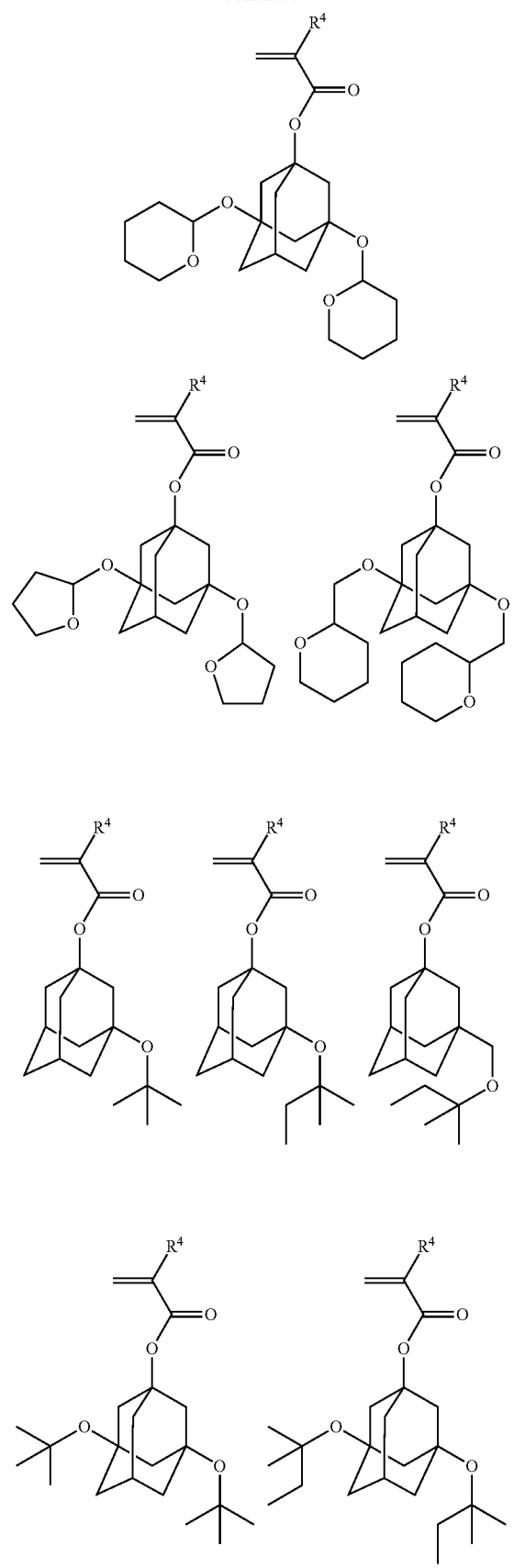
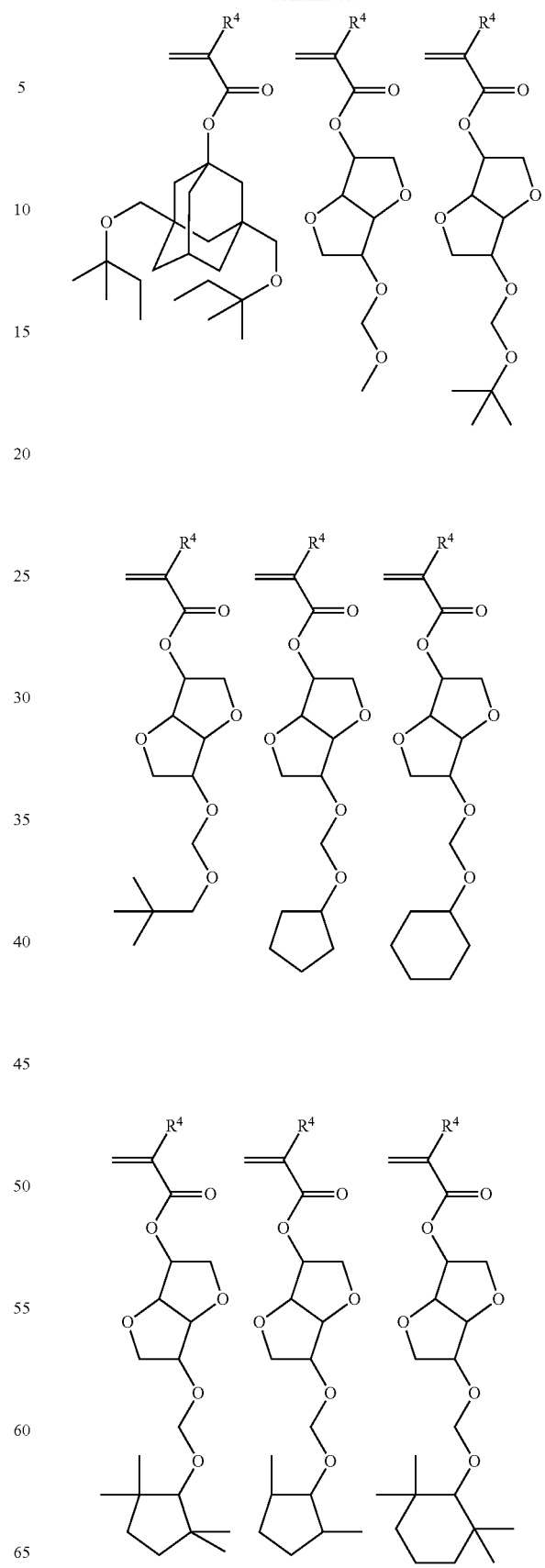

71
-continued
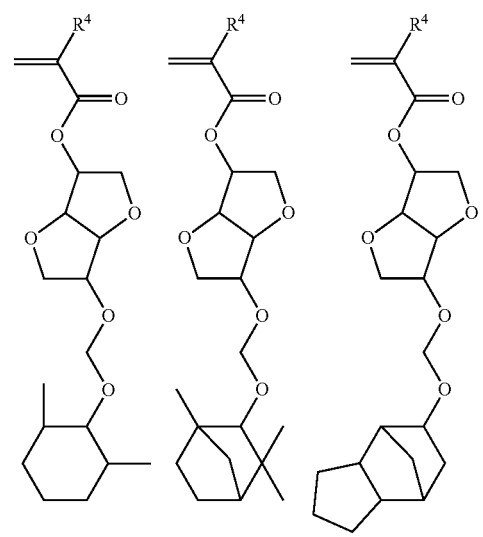
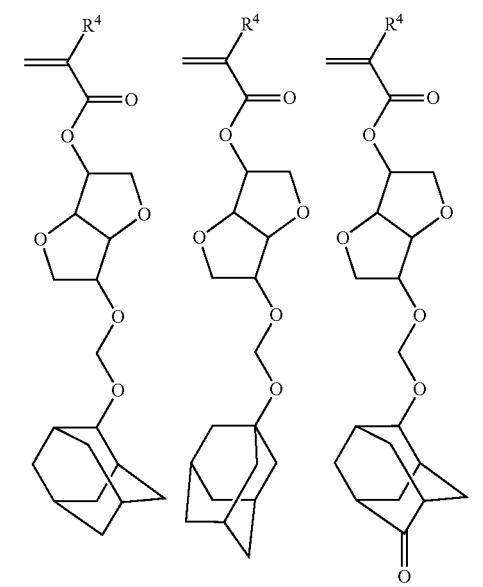
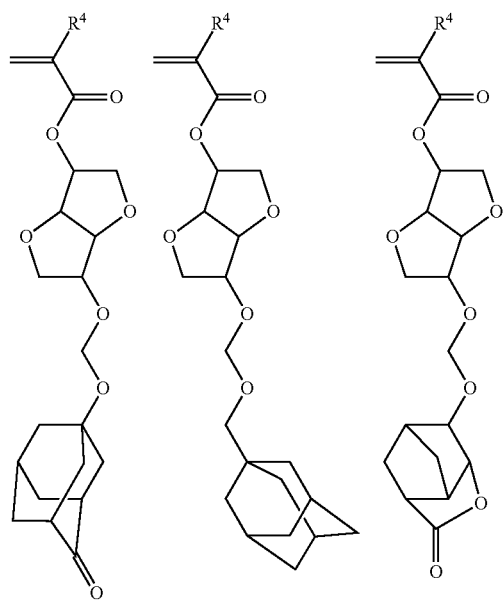
72
-continued
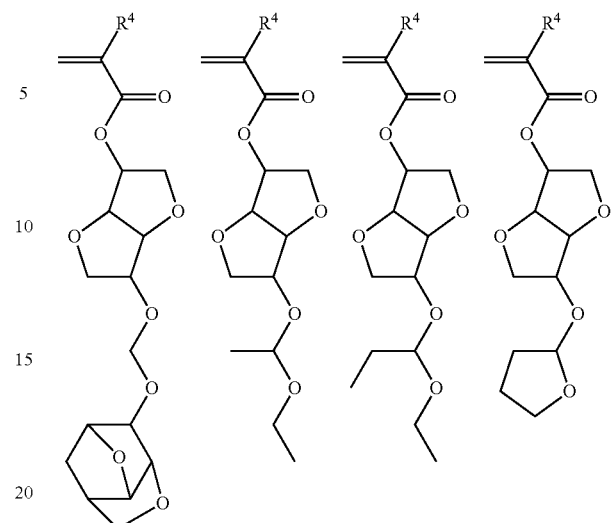
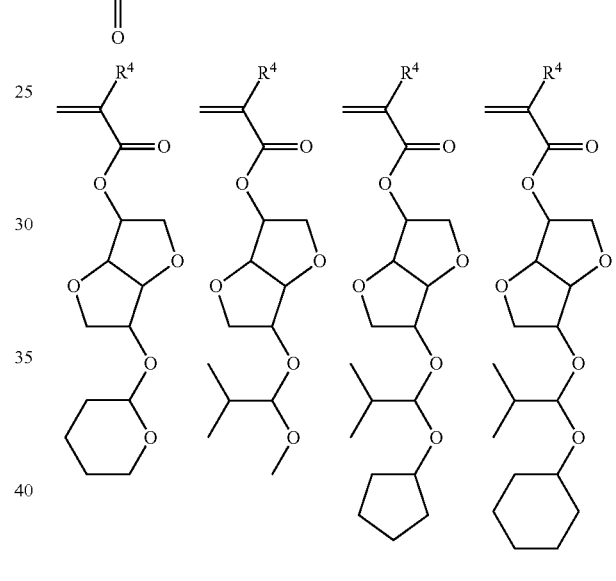
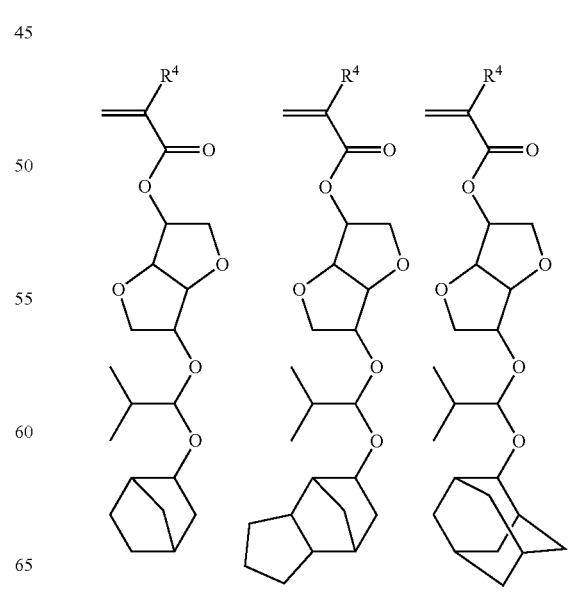

73
-continued
74
-continued
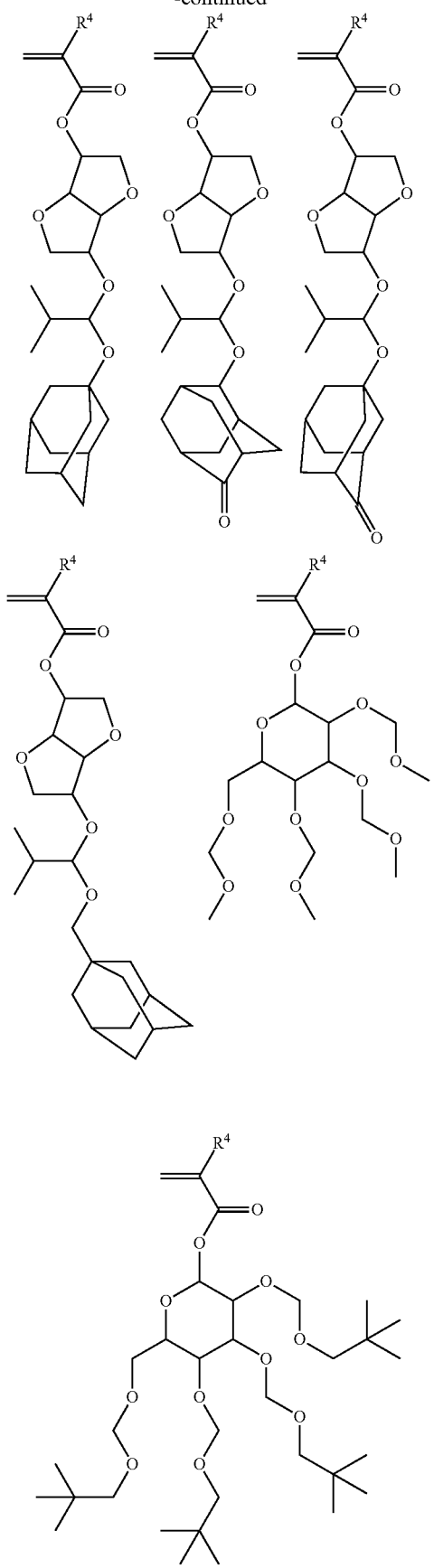
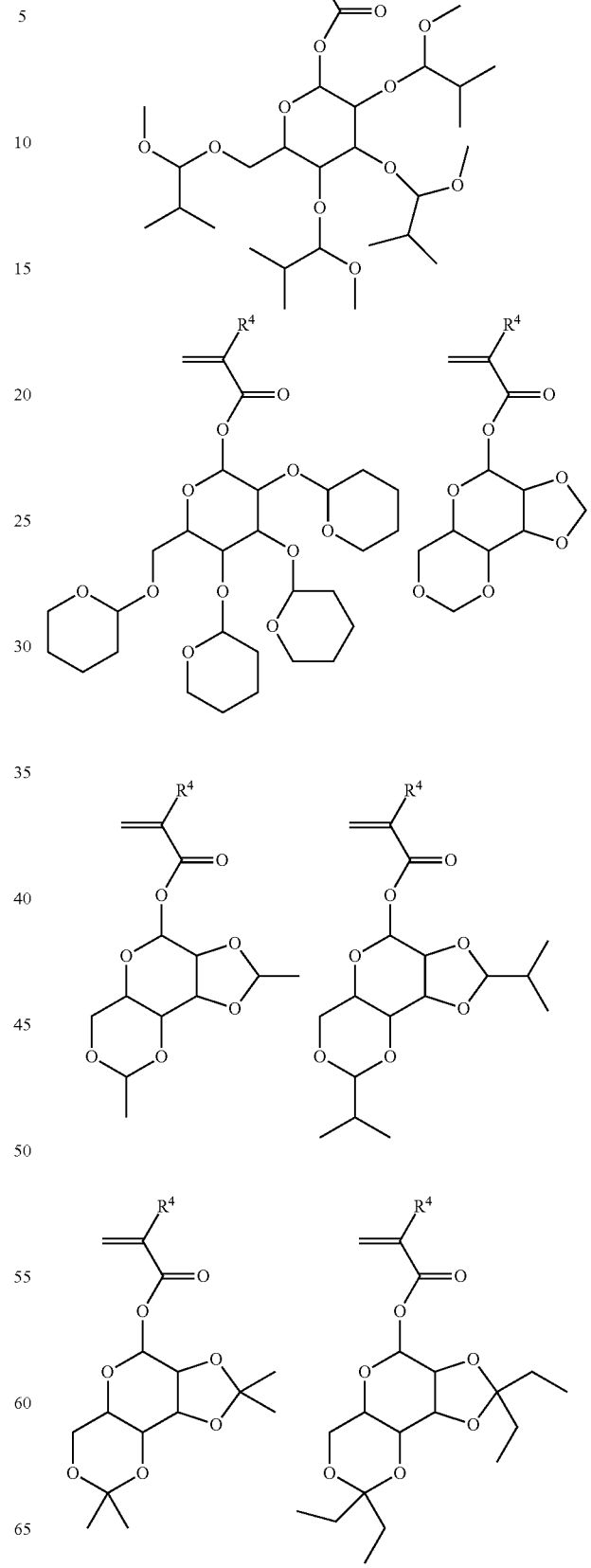

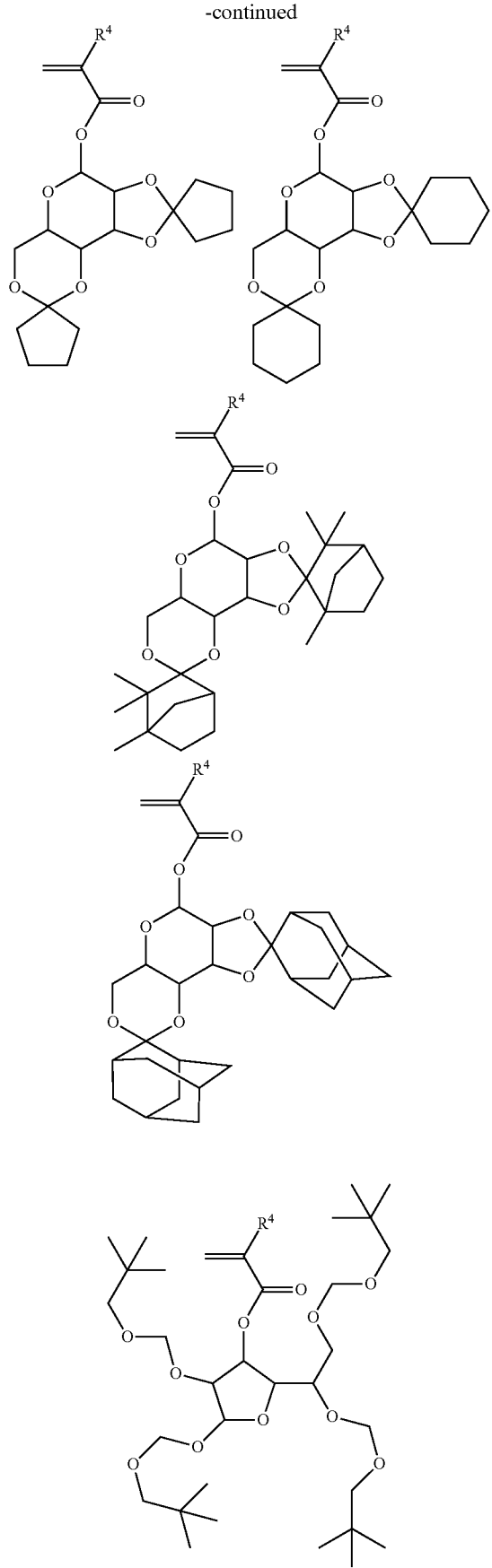

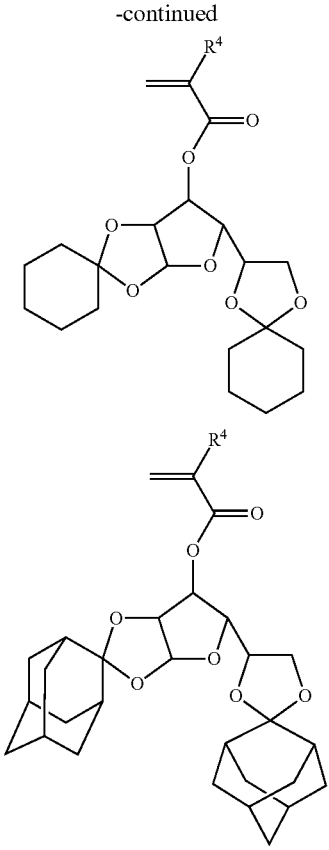

Herein R⁴ is as defined above.

Examples of the recurring unit containing an oxetane or oxirane ring, which may be included in resin component (A), are given below, but not limited thereto. Copolymerization of oxetane or oxirane ring-containing units ensures that the resist film, is crosslinked in the exposed region. The exposed region film is thus improved in retention and etches resistance.

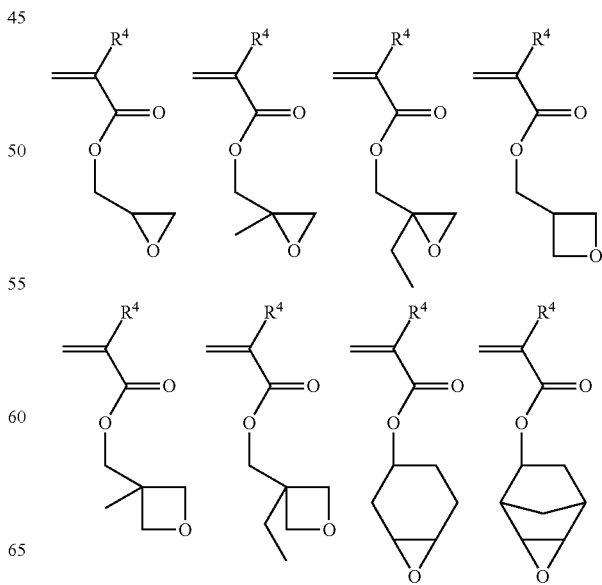

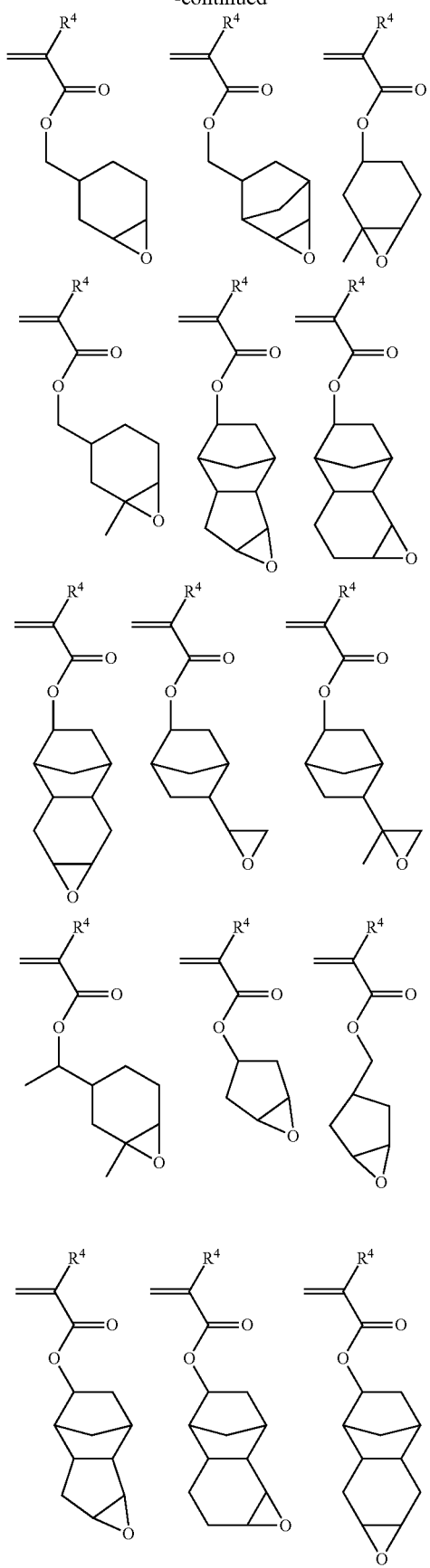
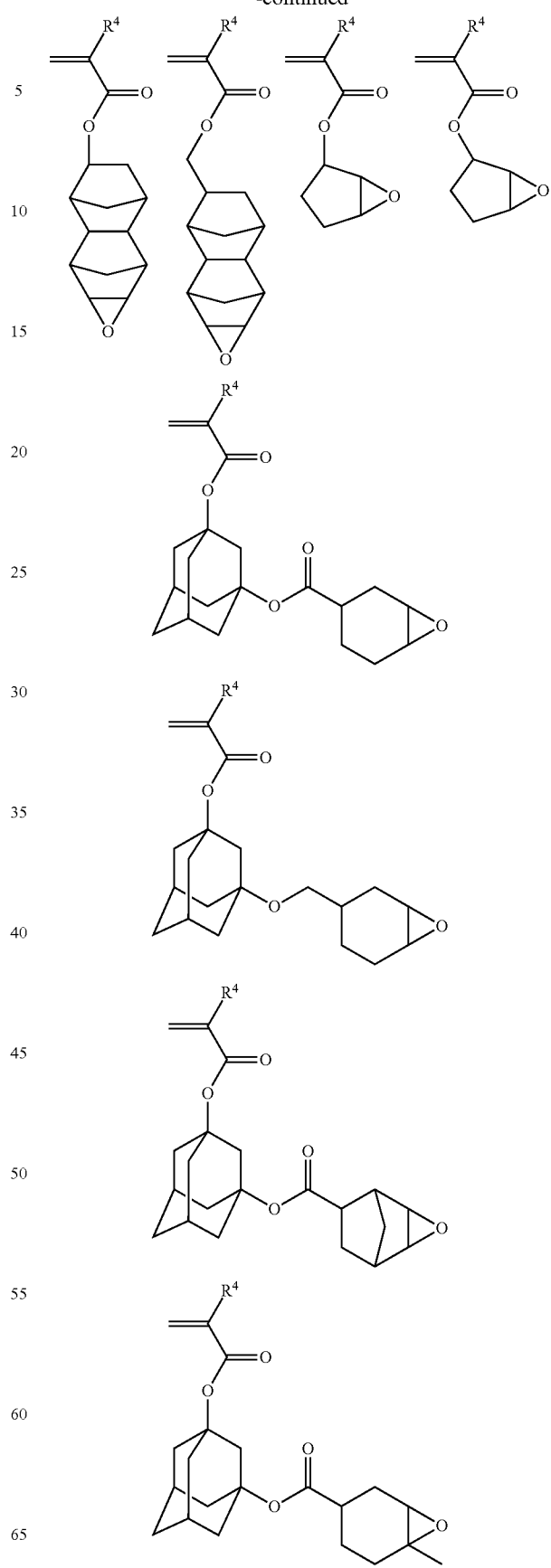

-continued
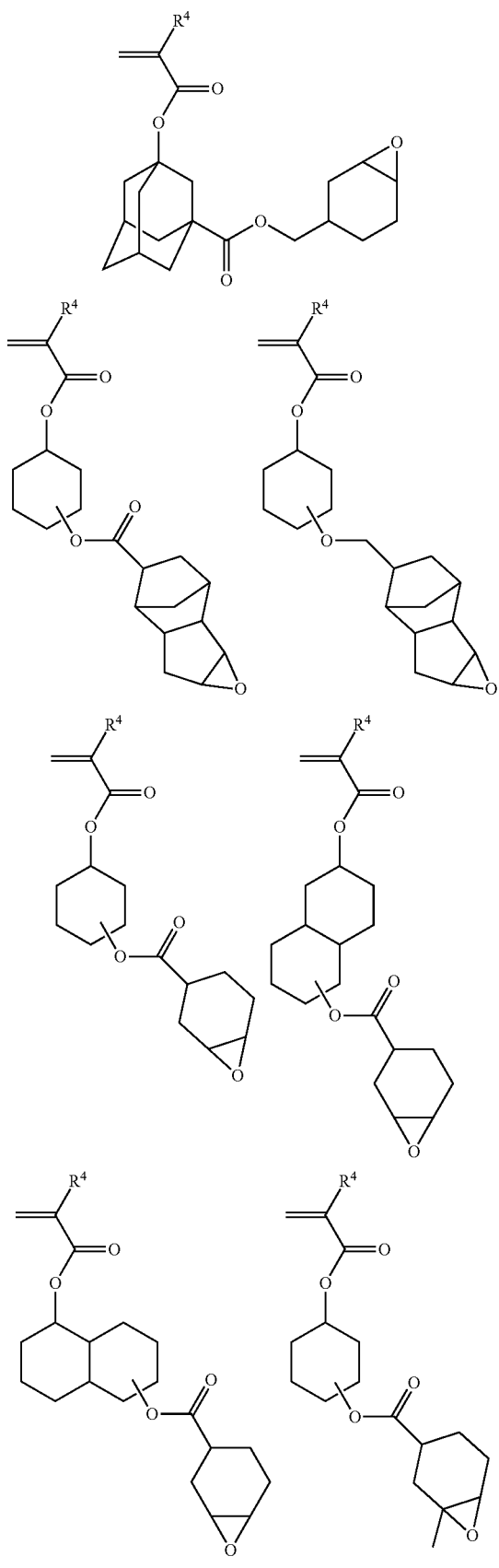
-continued
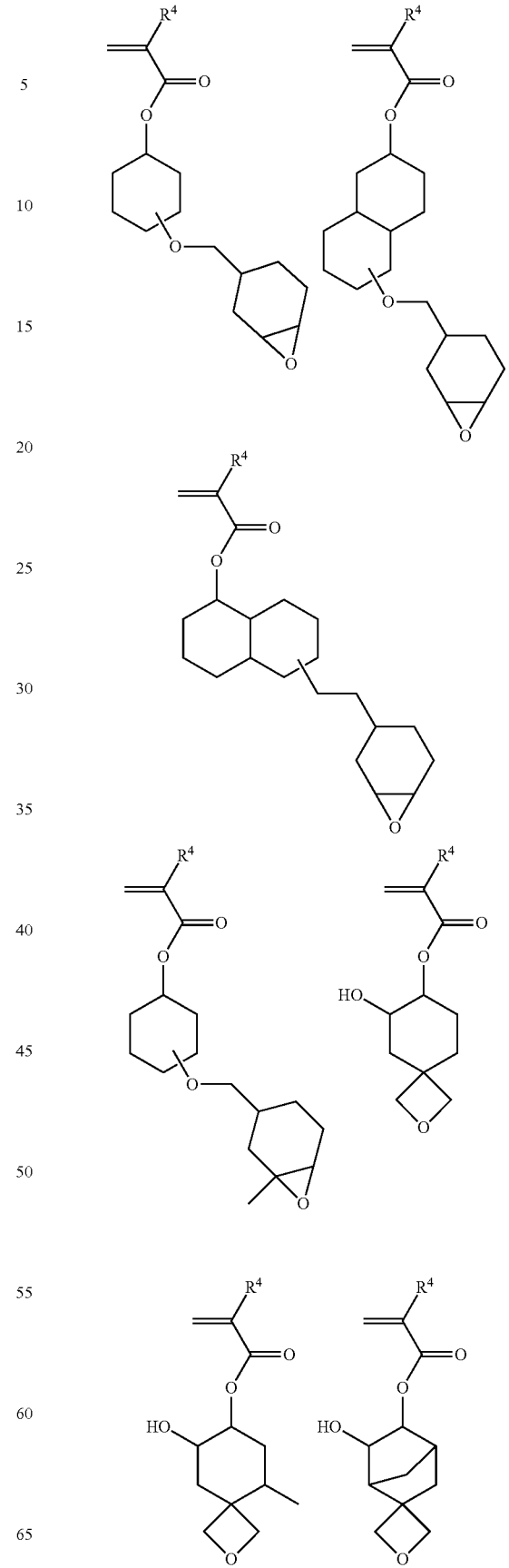

-continued

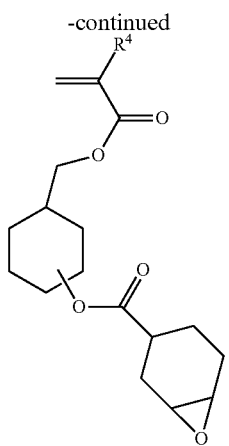

wherein R⁴ is as defined above.

In addition to the recurring units having formula (1) and the recurring units having formulae (2A), (2B) and (2C), the resin component (A) in the resist composition may have further copolymerized therein any of recurring units (f1) to (f3) of sulfonium salt, represented by the general formula (F).

(F)

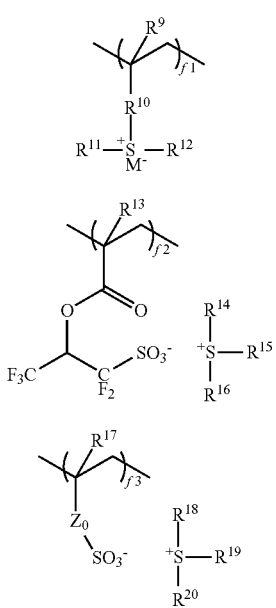

(f1)

(f2)

(f3)

Herein $R^9$, $R^{13}$, and $R^{17}$ each are hydrogen or methyl. $R^{10}$ is a single bond, phenylene, —O—$R^{21}$—, or —C(=O)—Y—$R^{21}$—, wherein Y is oxygen or NH, and $R^{21}$ is a straight, branched or cyclic $C_1$-$C_6$ alkylene group, alkenylene or phenylene group, which may contain a carbonyl (—CO—), ester (—COO—), ether (—O—) or hydroxyl radical. $R^{11}$, $R^{12}$, $R^{14}$, $R^{15}$, $R^{16}$, $R^{18}$, $R^{19}$, and $R^{20}$ are each independently a straight, branched or cyclic $C_1$-$C_{12}$ alkyl group which may contain a carbonyl, ester or ether radical, or a $C_6$-$C_{12}$ aryl or $C_7$-$C_{20}$ aralkyl group. $Z_0$ is a single bond, methylene, ethylene, phenylene, fluorophenylene, —O—$R^{22}$—, or —C(=O)—$Z_1$—$R^{22}$—, wherein $Z_1$ is oxygen or NH, and $R^{22}$ is a straight, branched or cyclic $C_1$-$C_6$ alkylene group, alkenylene or phenylene group, which may contain a carbonyl, ester, ether or hydroxyl radical. M⁻ is a non-nucleophilic counter ion.

Examples of the non-nucleophilic counter ion represented by M⁻ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide, and bis(perfluorobutylsulfonyl)imide; and methidates such as tris(trifluoromethylsulfonyl)methide and tris (perfluoroethylsulfonyl)methide.

In addition to the foregoing units, the polymer or resin component (A) in the resist composition may further comprise recurring units derived from other monomers having a carbon-carbon double bond, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[4.4.0.1²,⁵.1⁷,¹⁰]dodecene derivatives, unsaturated acid anhydrides such as itaconic anhydride, and other monomers. Examples of the other monomers are shown below, but not limited thereto.

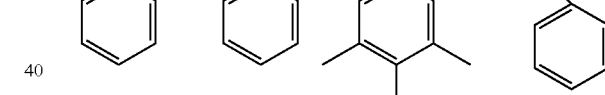

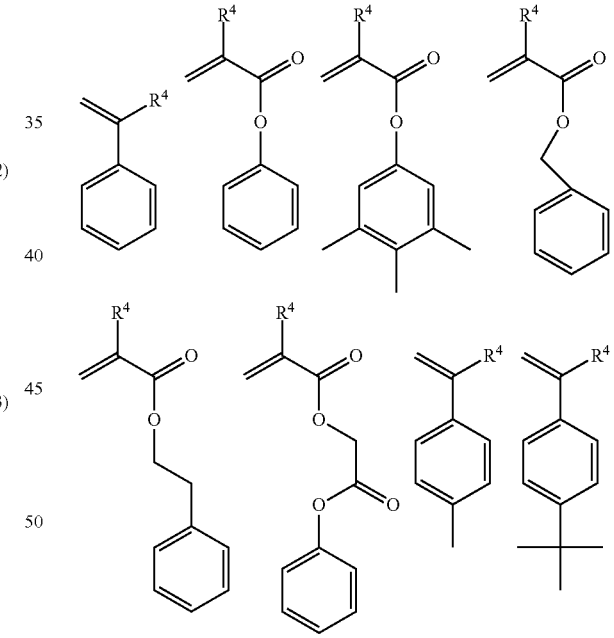

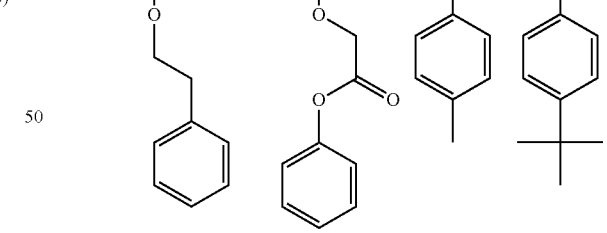

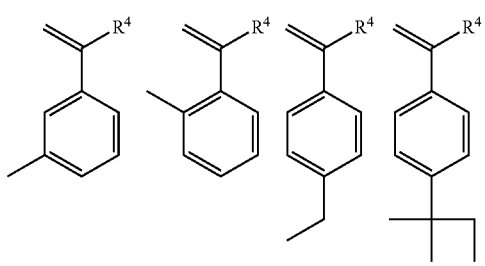

-continued
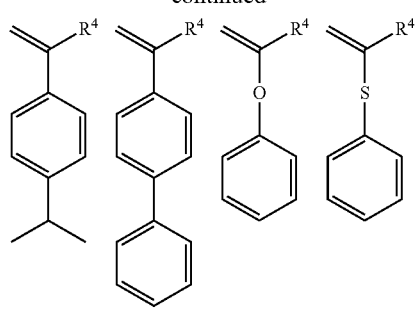
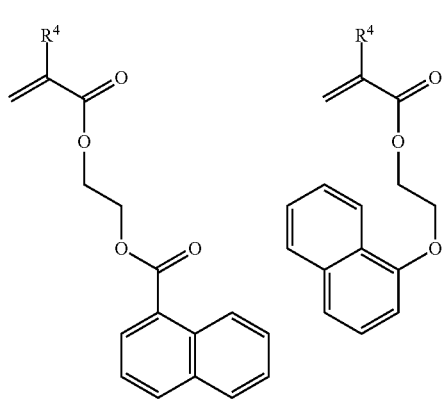
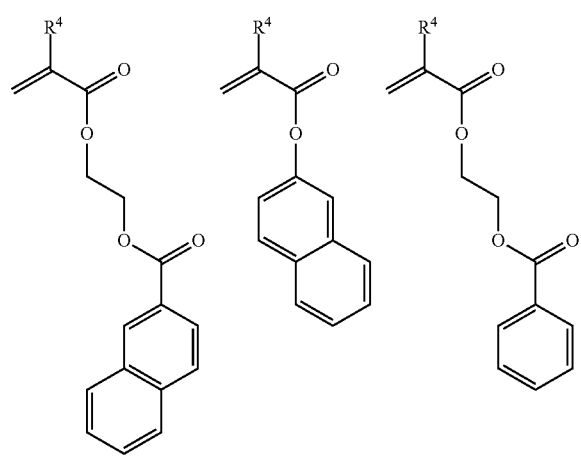
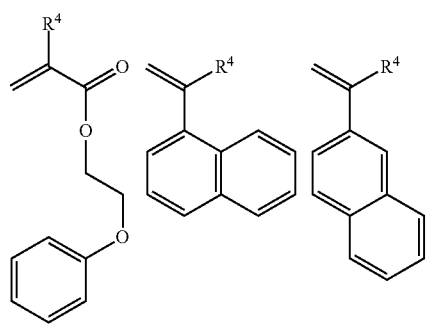
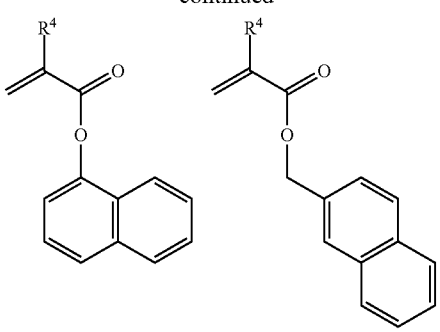
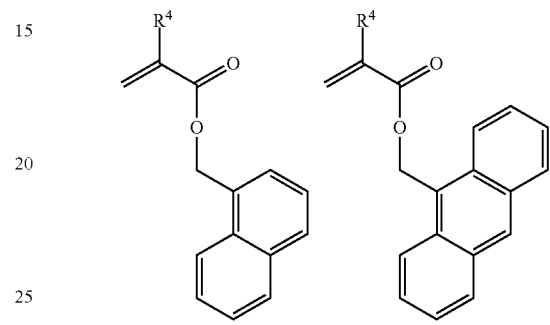
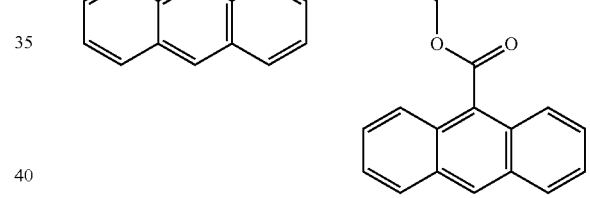
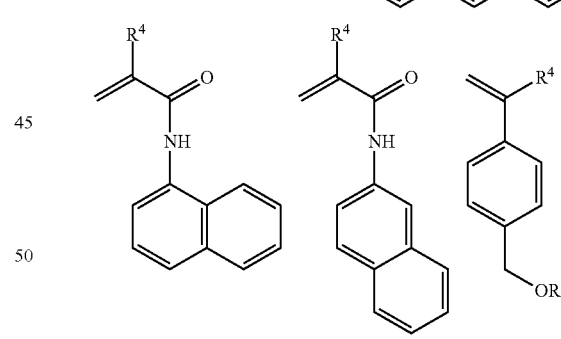
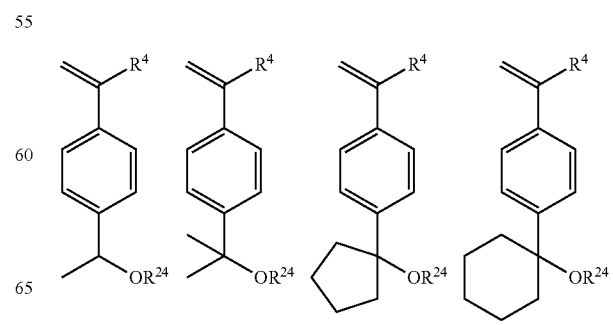

-continued

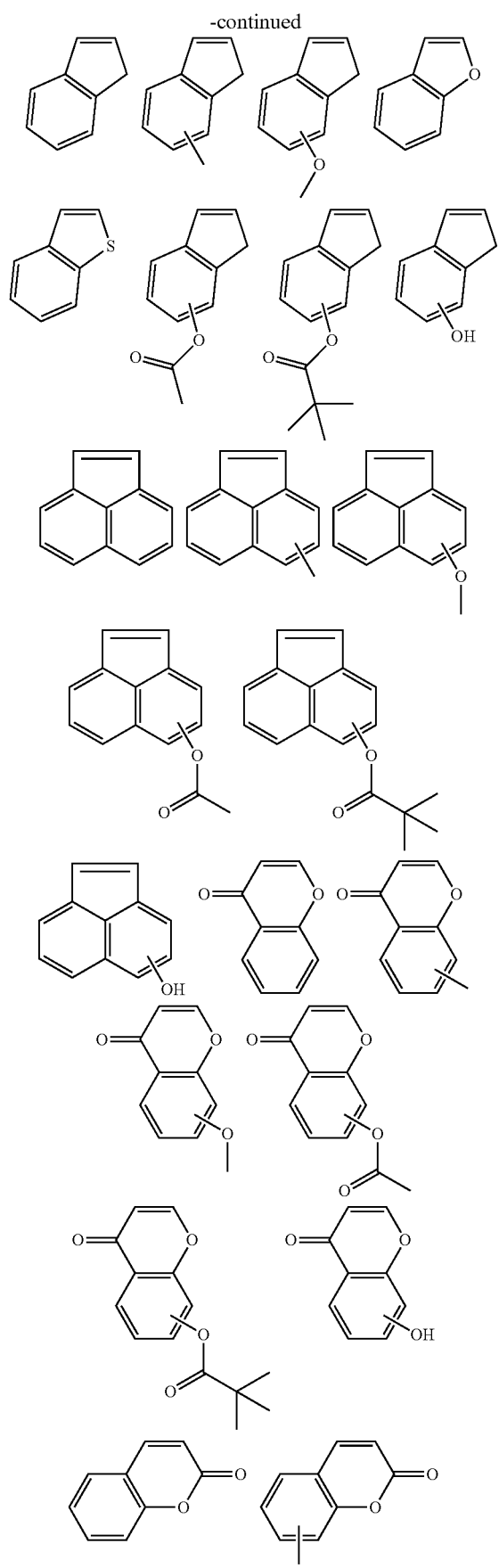

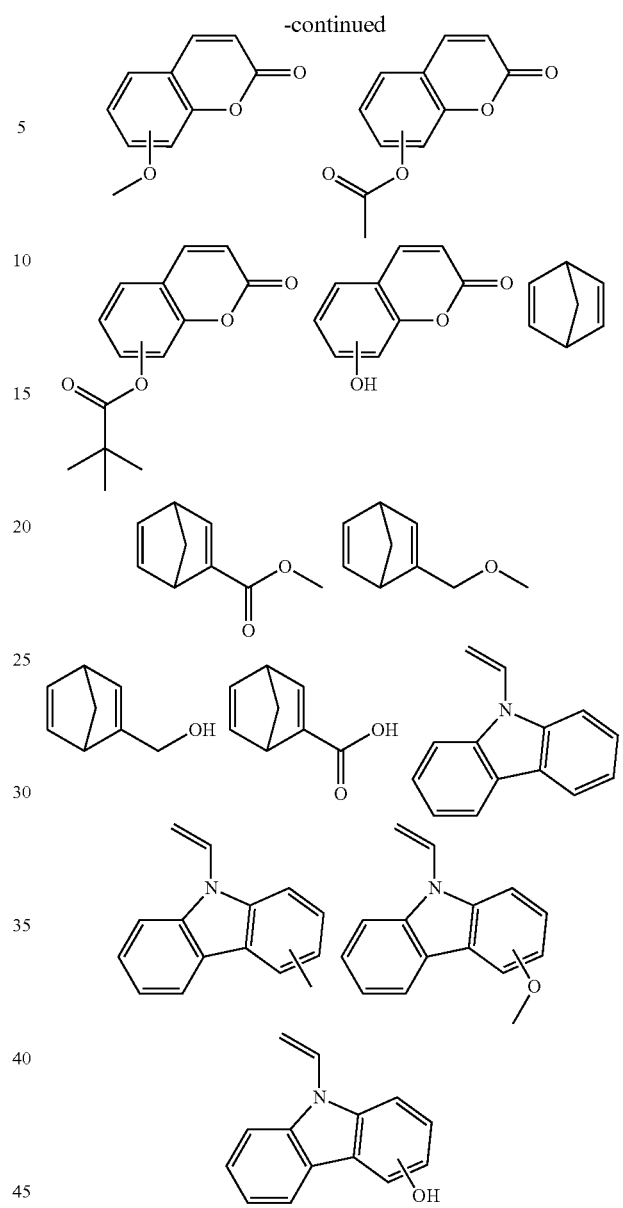

Herein $R^4$ is as defined above, and $R^{24}$ is $C_1$-$C_{10}$ alkyl.

In the (co)polymer, the recurring unit (a) having formula (1), the recurring unit (b) having formula (2A), (2B) and/or (2C), the recurring unit (c) having a tertiary alkyl, acetal, hydroxyadamantyl, lactone, lactam, sultone, carboxyl, fluoroalkyl, oxetane ring, or oxirane ring, the recurring unit (d) having formula (F), and other recurring unit (e) are typically present in molar fractions: $0<a\leq1.0$, $0\leq b<1.0$, $0\leq c<1.0$, $0\leq d\leq0.3$, and $0\leq e\leq0.8$;

preferably $0.05\leq a\leq0.7$, $0.05\leq b\leq0.7$, $0.05\leq c\leq0.9$, $0\leq d\leq0.2$, and $0\leq e\leq0.7$; and more preferably $0.1\leq a\leq0.5$, $0.1\leq b\leq0.6$, $0.1\leq c\leq0.8$, $0\leq d\leq0.1$, and $0\leq e\leq0.5$; provided that $a+b+c+d+e=1$.

The polymer should preferably have a weight average molecular weight (Mw) in the range of 1,000 to 500,000, and more preferably 3,000 to 15,000, as measured by GPC versus polystyrene standards using tetrahydrofuran solvent. With too low a Mw, a loss of film thickness may occur during organic solvent development. A polymer with too high a Mw may lose solubility in organic solvent and have a likelihood of footing after pattern formation.

If a multi-component polymer has a wide molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.6, in order to provide a resist composition suitable for micropatterning to a small feature size.

The polymer may be synthesized by any desired method, for example, by dissolving unsaturated bond-containing monomers corresponding to the recurring unit having formula (1), the recurring unit having formula (2A), (2B) and/or (2C), and optionally other recurring units in an organic solvent, adding a radical initiator thereto, and effecting heat polymerization. Examples of the organic solvent which can be used for polymerization include toluene, benzene, tetrahydrofuran, diethyl ether, dioxane, cyclohexane, cyclopentane, methyl ethyl ketone, and γ-butyrolactone. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 100° C. for polymerization to take place. The reaction time is 2 to 100 hours, preferably 5 to 20 hours. The acid labile group that has been incorporated in the monomer may be kept as such, or the acid labile group may be protected or partially protected after polymerization.

It is acceptable to use a blend of two or more inventive polymers which differ in compositional ratio, molecular weight or disparsity as well as a blend of an inventive polymer and another polymer free of recurring units having formula (1).

In a further embodiment, the inventive polymer may be blended with any of (meth)acrylate polymers, polynorbornene, cycloolefin-maleic anhydride copolymers, and ring-opening metathesis polymerization (ROMP) polymers of conventional type wherein the exposed region is dissolved on alkaline development; or any of (meth)acrylate polymers, polynorbornene, and cycloolefin-maleic anhydride copolymers having a hydroxyl group substituted with an acid labile group, wherein the exposed region is not dissolved on alkaline development, but a negative tone pattern is formed by organic solvent development.

Next, the photoacid generator as component (B) in the resist composition is described.

When the resist composition comprising the PAG (B) having formula (4) is used to form a negative tone pattern, especially hole pattern, via exposure and organic solvent development, the resulting pattern is improved in roundness and CDU. A high dissolution contrast is achievable by combining the polymer of formula (1) with the PAG of formula (4) featuring highly controlled acid diffusion. Better results are obtained on use of the PAG of formula (4) wherein A is trifluoromethyl.

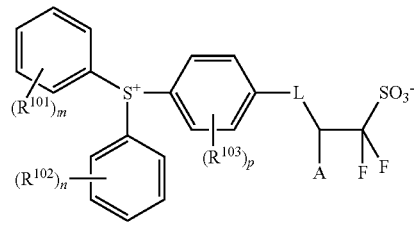

(4)

Herein A is hydrogen or trifluoromethyl, $R^{101}$, $R^{102}$ and $R^{103}$ are each independently hydrogen or a $C_1$-$C_{20}$ monovalent hydrocarbon group, typically straight, branched or cyclic alkyl, which may be separated by a heteroatom such as oxygen or substituted with a heteroatom such as fluorine, m and n each are an integer of 0 to 5, p is an integer of 0 to 4, and L is a single bond, oxygen atom or a $C_1$-$C_{20}$ divalent hydrocarbon group, typically straight, branched or cyclic alkylene or arylene, which may be substituted with or separated by a heteroatom.

As the PAG of formula (4), suitable structures are shown below, but not limited thereto.

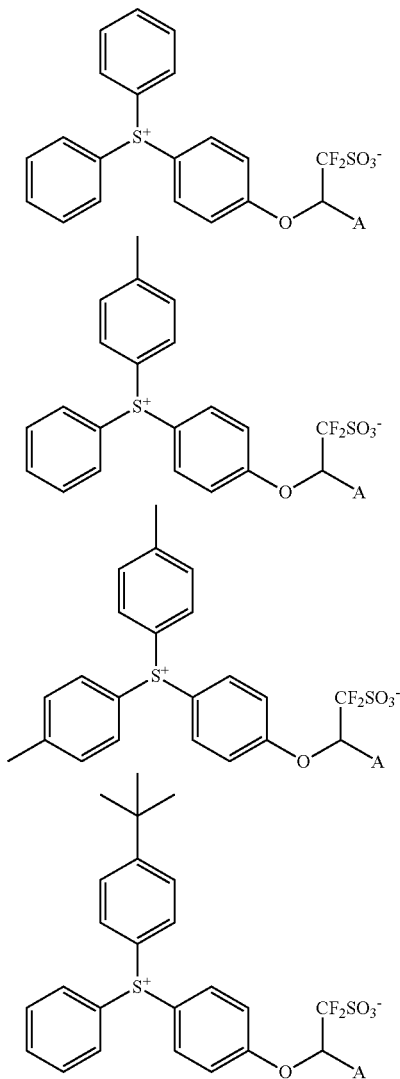

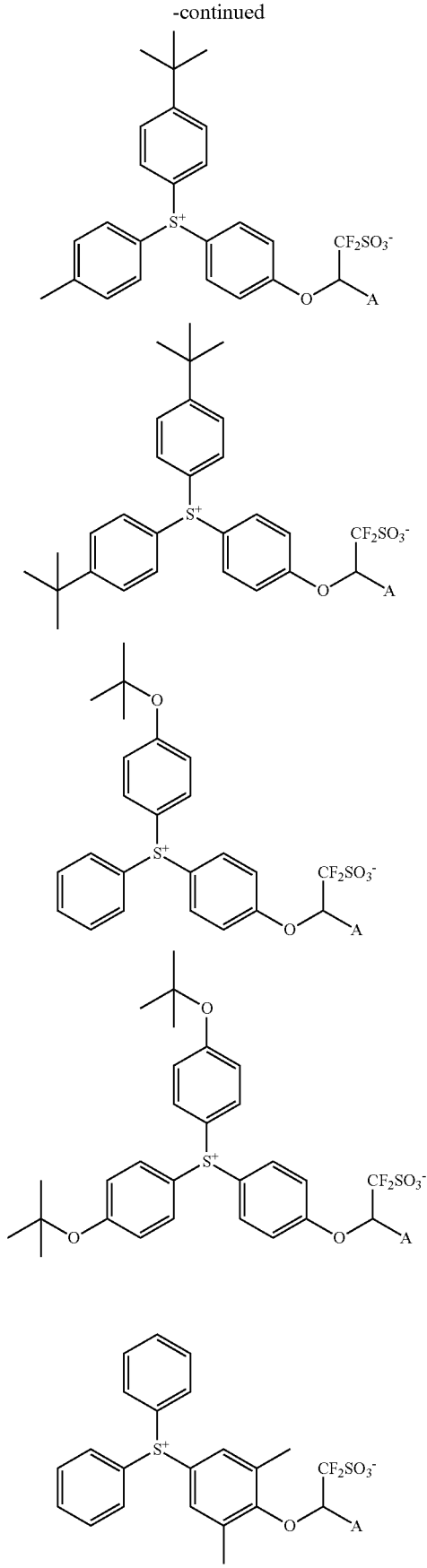
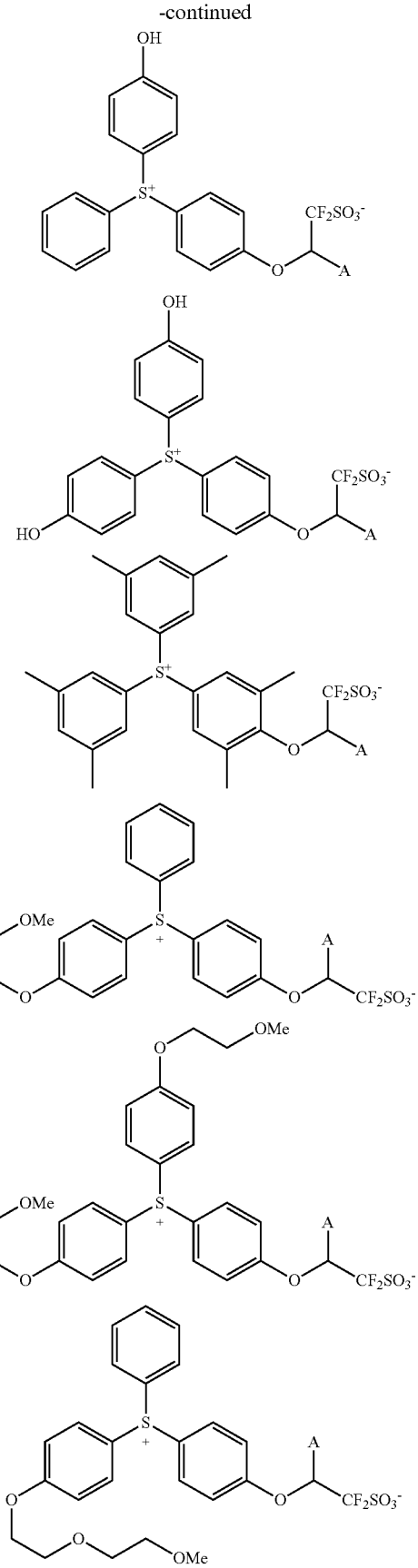

-continued
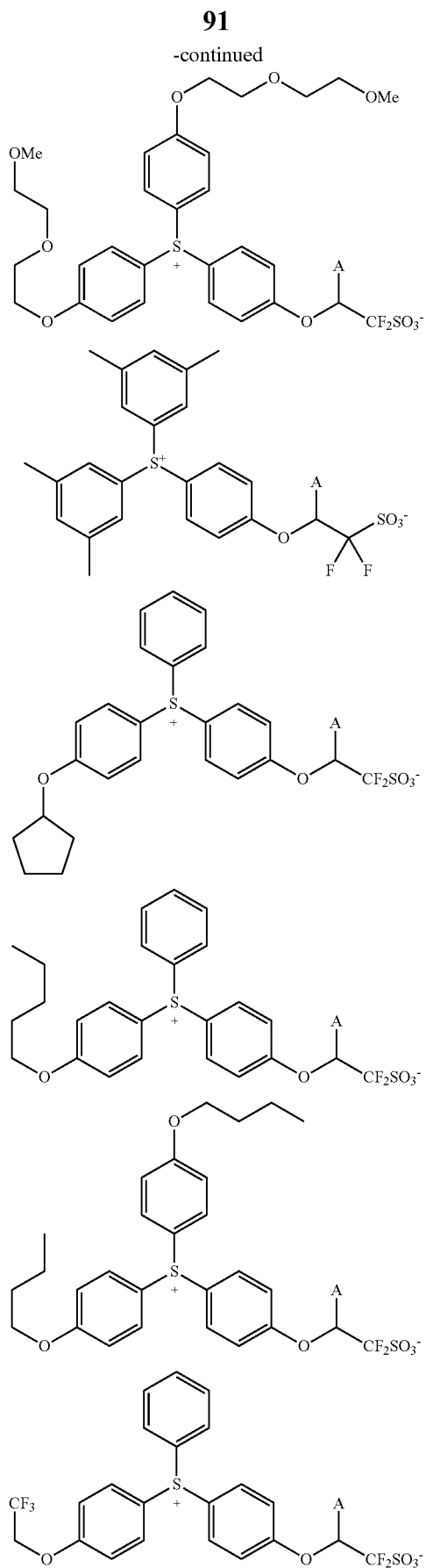
-continued
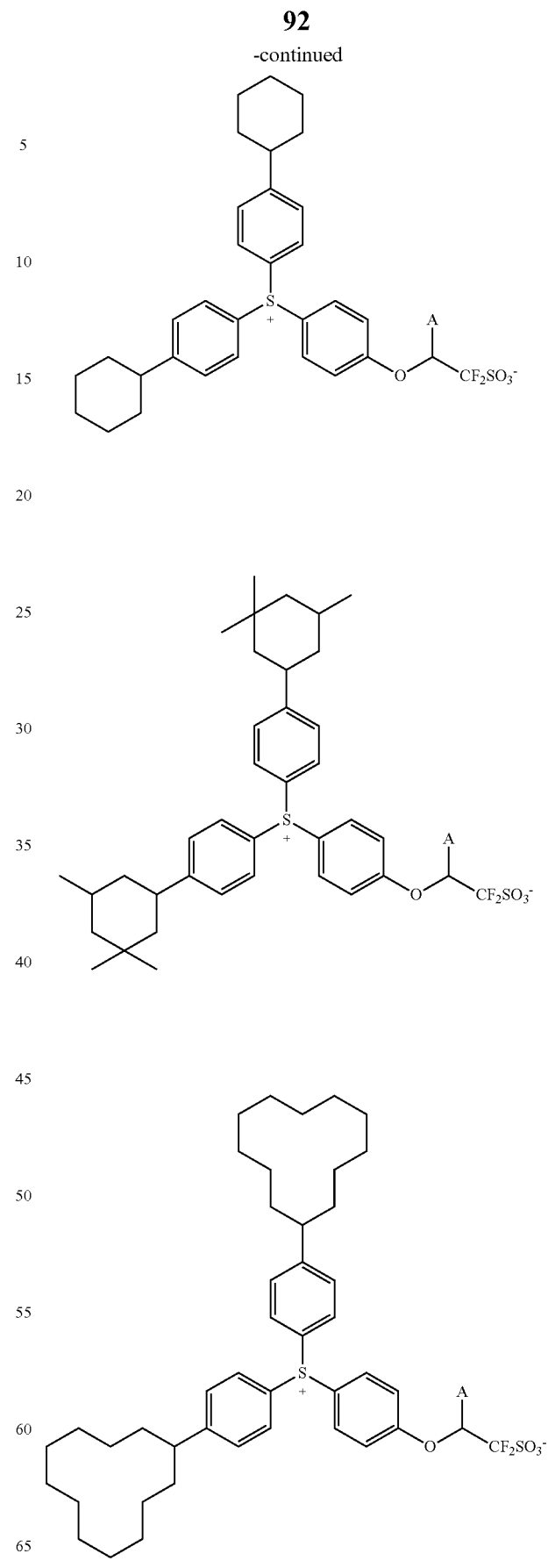

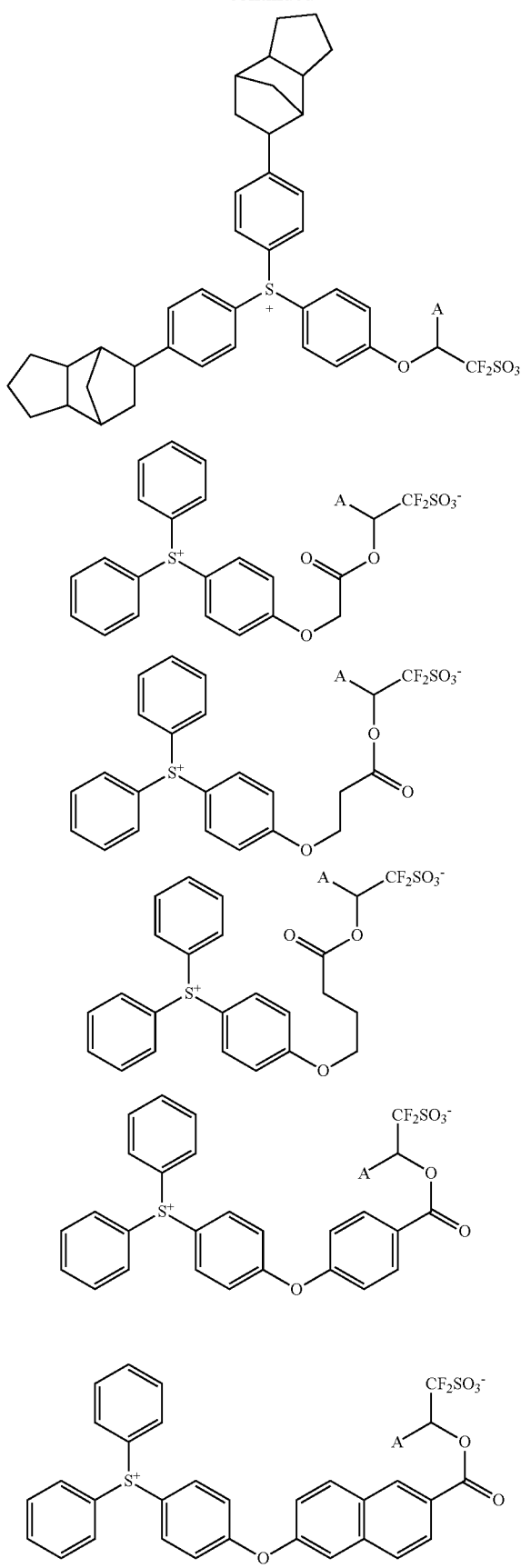

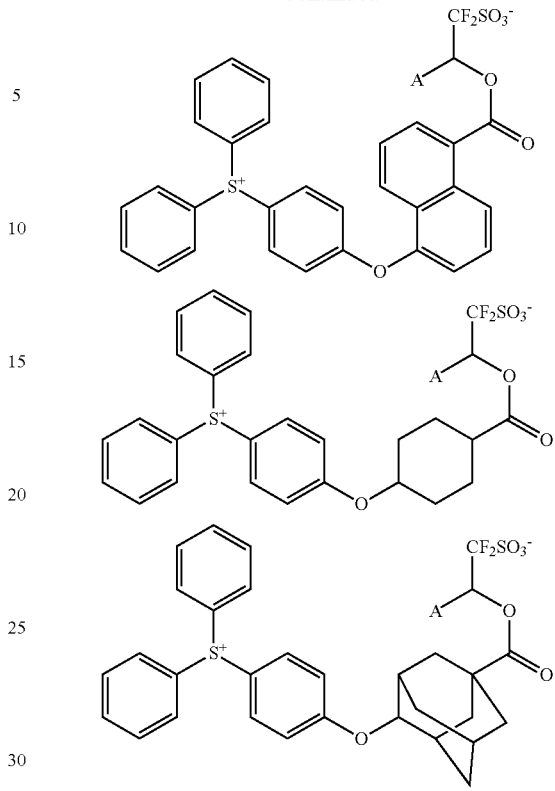

Herein A is hydrogen or trifluoromethyl.

Preferably the PAG of formula (4) is used in an amount of 0 to 30 parts, more preferably 0 to 20 parts, and even more preferably 0 to 15 parts by weight per 100 parts by weight of the polymer or base resin. Excess amounts of the PAG may give rise to problems including degraded resolution and foreign particles left after development and resist film stripping.

If desired, the resist composition may contain an acid generator other than the PAG of formula (4). The other acid generator may be any compound capable of generating an acid upon exposure to high-energy radiation or any of well-known PAGs commonly used in prior art resist compositions, especially chemically amplified resist compositions. The preferred PAGs include the sulfonium salts and PAGs described in JP-A 2009-269953 and the PAGs described in JP 3995575. Any sulfonium salt, iodonium salt, sulfonyldiazomethane, N-sulfonyloxyimide, and oxime-O-sulfonate acid generators may be used. These compounds may be used alone or in admixture. Examples of the acid generated by the acid generator include sulfonic acids, imidic acids and methide acids. Of these, sulfonic acids which are fluorinated at α-position are most commonly used. Fluorination at α-position is not essential when the acid labile group used is an acetal group susceptible to deprotection. Where the base polymer having recurring units (f1), (f2) or (f3) of acid generator copolymerized therein is used, the acid generator of addition type is not essential.

The resist composition may comprise an acid generator having the general formula (Z1) or (Z2). Of the acid generators having formula (Z1), an acid generator having the general formula (Z3) is preferred.

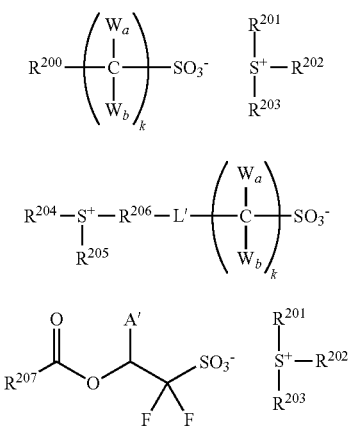

Herein $R^{200}$ is hydrogen, fluorine, or a straight, branched or cyclic $C_1$-$C_{35}$ monovalent hydrocarbon group which may contain a heteroatom. $W_a$ and $W_b$ are each independently hydrogen, fluorine, or trifluoromethyl, k is an integer of 1 to 4. $R^{201}$, $R^{202}$, and $R^{203}$ are each independently a substituted or unsubstituted, straight or branched alkyl, alkenyl or oxoalkyl group of 1 to 10 carbon atoms, or a substituted or unsubstituted aryl, aralkyl or aryloxoalkyl group of 6 to 18 carbon atoms, or any two or more of $R^{201}$, $R^{202}$, and $R^{203}$ may bond together to form a ring with the sulfur atom. $R^{204}$ and $R^{205}$ are each independently a straight, branched or cyclic $C_1$-$C_{20}$ monovalent hydrocarbon group which may be substituted with or separated by a heteroatom. $R^{206}$ is a straight, branched or cyclic $C_1$-$C_{20}$ divalent hydrocarbon group which may be substituted with or separated by a heteroatom. $R^{207}$ is a straight, branched or cyclic $C_1$-$C_{35}$ monovalent hydrocarbon group which may contain a heteroatom. Any two or more of $R^{204}$, $R^{205}$, and $R^{206}$ may bond together to form a ring with the sulfur atom. L' is a single bond or a straight, branched or cyclic $C_1$-$C_{20}$ divalent hydrocarbon group which may be substituted with or separated by a heteroatom. A' is hydrogen or trifluoromethyl.

Illustrative, non-limiting examples of the other acid generator which can be blended herein are shown below.

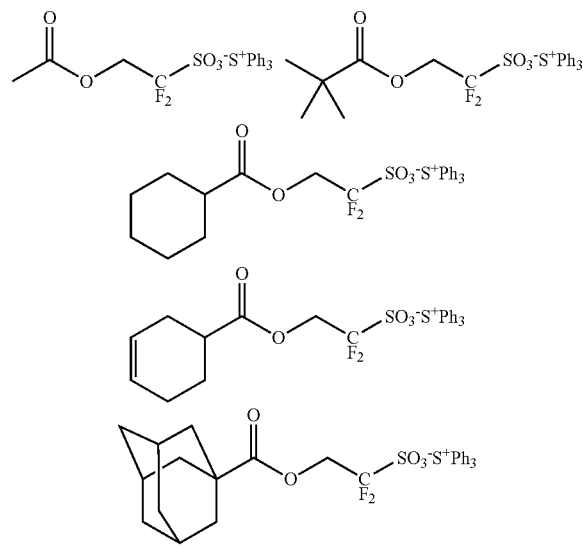

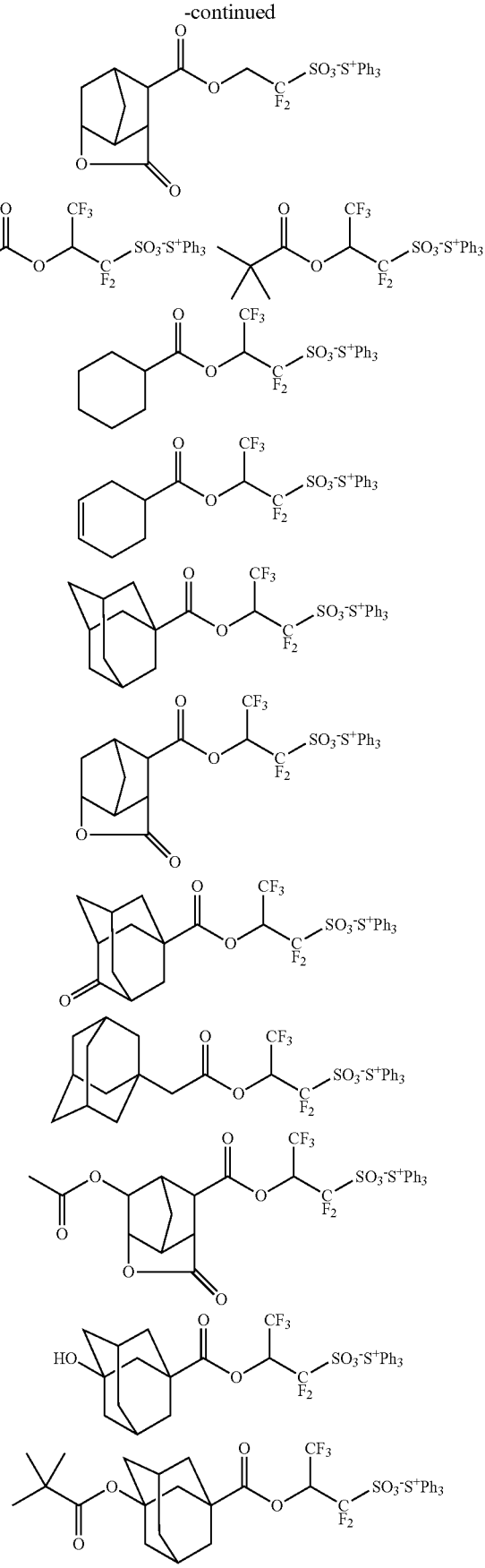

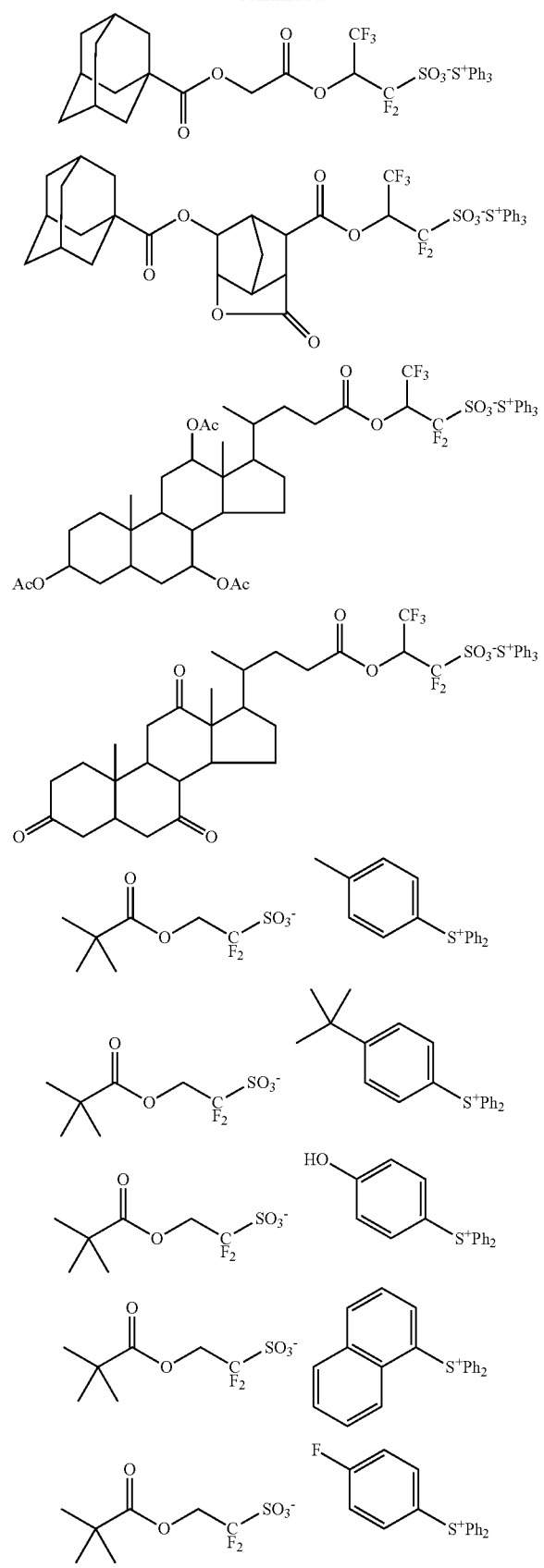
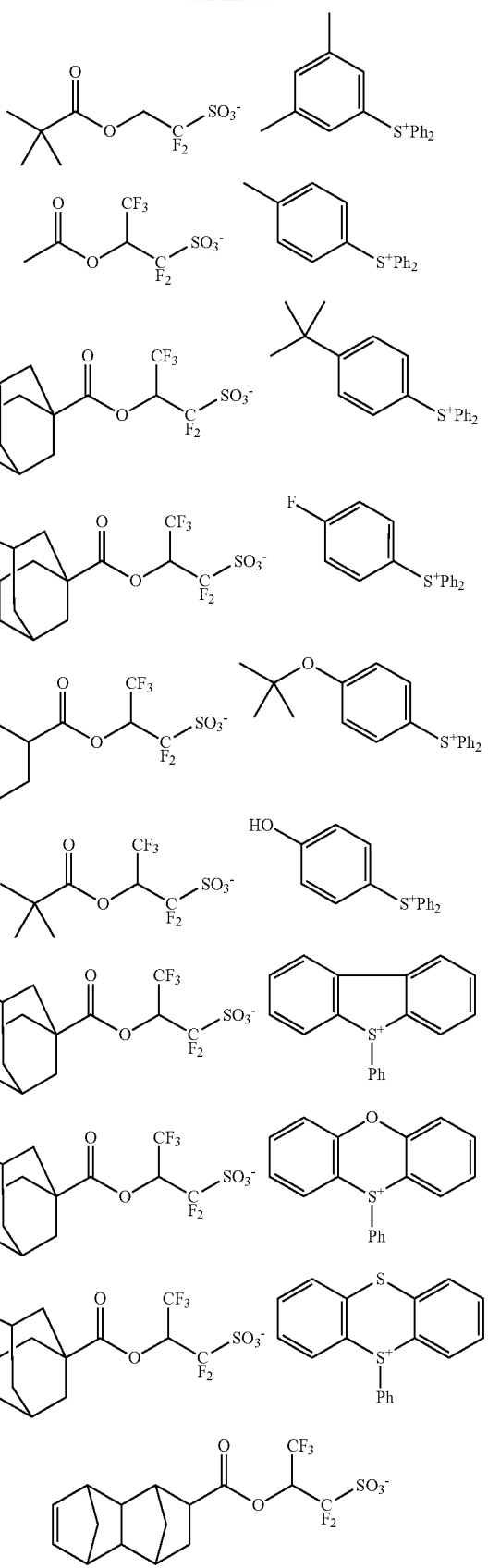

-continued
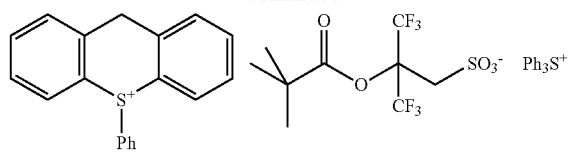
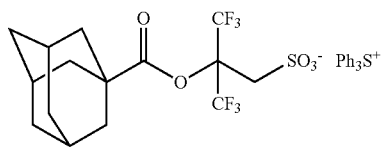
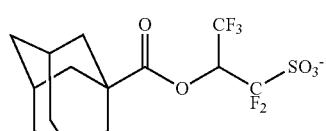
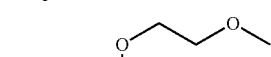
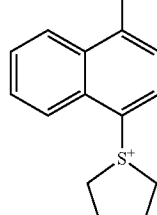
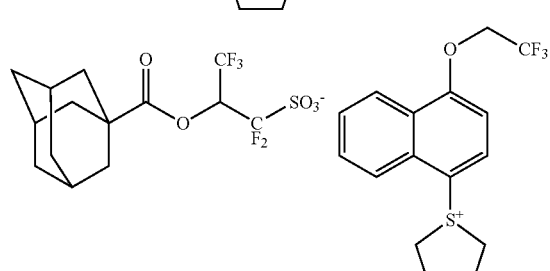
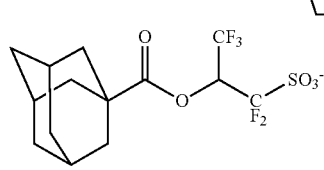
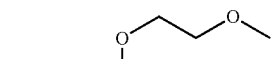
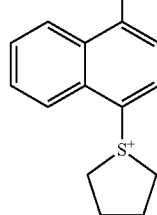
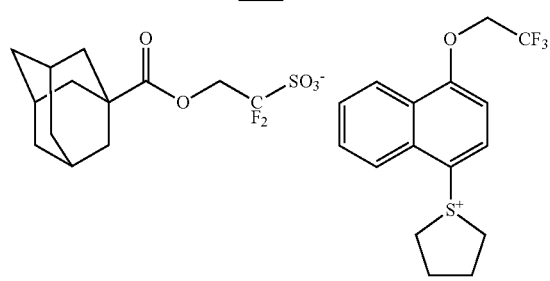
-continued
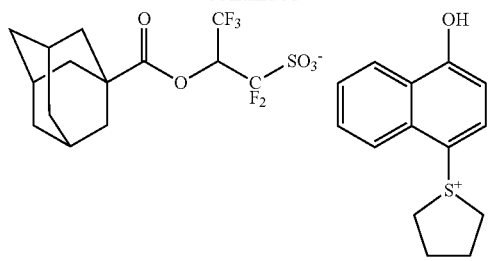
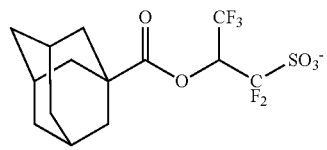
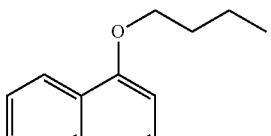
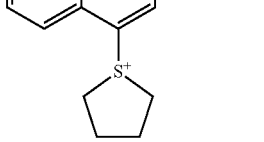
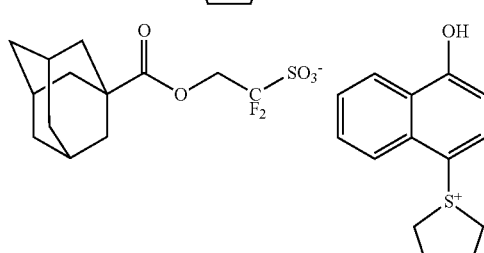
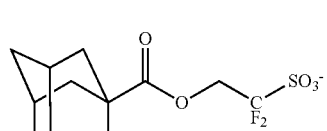
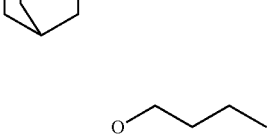
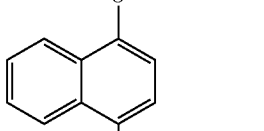
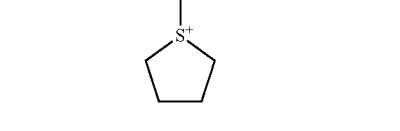
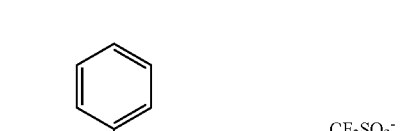
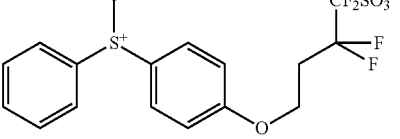

-continued

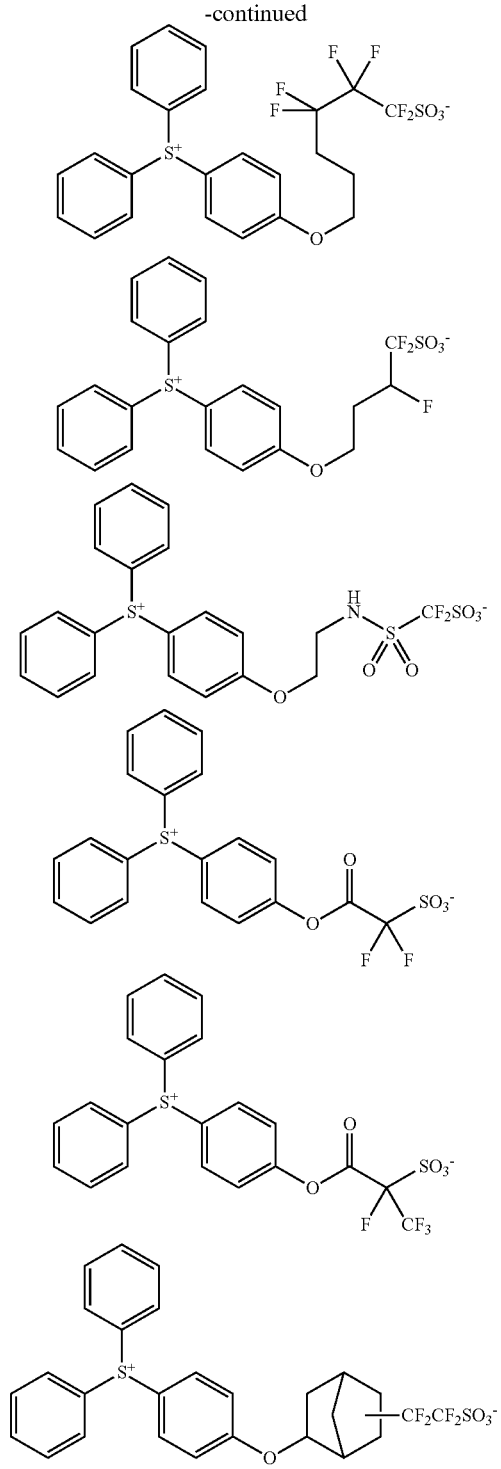

The other acid generator may be used in an amount of 0 to 30 parts, more preferably 0 to 20 parts by weight per 100 parts by weight of the base resin.

In addition to the inventive polymer, the resist composition may farther comprise at least one component selected from among a basic compound, organic solvent, dissolution regulator, surfactant, and acetylene alcohol.

The basic compound is preferably a compound capable of holding down the diffusion rate of acid when the acid generated by the acid generator diffuses in the resist film.

The inclusion of the basic compound holds down the diffusion rate of acid in the resist film, which leads to many advantages including improved resolution, minimized sensitivity change following exposure, reduced substrate poisoning and environment dependency, and improved exposure latitude and pattern profile.

Examples of the basic compound used herein include primary, secondary, and tertiary amine compounds as described in JP-A 2008-111103, paragraphs [0146] to [0164] (U.S. Pat. No. 7,537,880), specifically amine compounds having a hydroxyl, ether, ester, lactone, cyano or sulfonic ester group, and compounds having a carbamate group as described in JP 3790649. The basic compound may be used in an amount of 0 to 100 parts, more preferably 0.001 to 50 parts by weight per 100 parts by weight of the base resin.

Onium salts such as sulfonium salts, Iodonium salts and ammonium salts of sulfonic acids which are not fluorinated at α-position as described in US 2008153030 (JP-A 2008-158339) and similar onium salts of carboxylic acids as described in JP-A 2013-037092 may be used as the quencher. Where an α-position non-fluorinated sulfonic acid salt or carboxylic acid salt and an α-position fluorinated sulfonic acid, imide acid, and methide acid generated by a PAG are co-present, salt exchange occurs to generate an α-position non-fluorinated sulfonic acid or carboxylic acid. Since this α-position non-fluorinated sulfonic acid or carboxylic acid has an insufficient acid strength to induce deprotection reaction to the resist resin, the relevant sulfonium salt, iodonium salt or ammonium salt functions as a quencher. In particular, since sulfonium salts and iodonium salts of an α-position non-fluorinated sulfonic acid and a carboxylic acid are photo-decomposable, those portions receiving a high light intensity are reduced in quenching capability and increased in the concentration of an α-position fluorinated sulfonic acid, imide acid, or methide acid. This enables to form a pattern having an improved contrast in exposed area, further improved focus margin or DOF and satisfactory dimensional control.

In case the acid labile group is an acetal group which is very sensitive to acid, the acid for eliminating the protective group need not necessarily be an α-fluorinated sulfonic acid, imide acid or methide acid. Sometimes, deprotection reaction may take place even with α-position non-fluorinated sulfonic acid. In this case, since an onium salt of sulfonic acid cannot be used as the quencher, an onium salt of carboxylic acid is preferably used alone as the quencher.

Preferred as the α-position non-fluorinated sulfonic acid salt or carboxylic acid salt are sulfonium salts of sulfonic acid or carboxylic acid having the general formula (Z4) or (Z5).

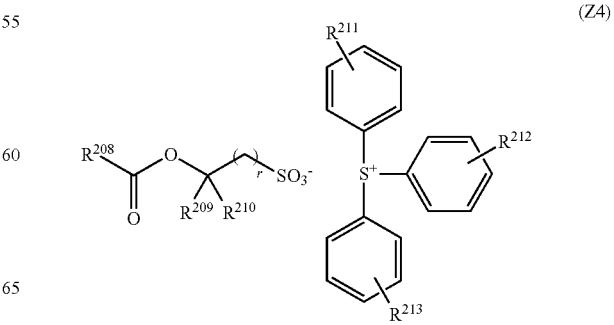

(Z4)

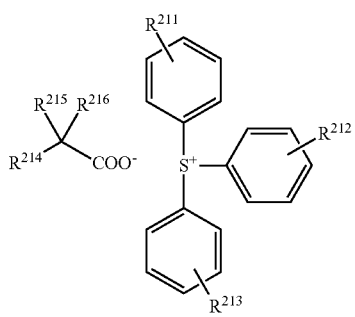

(Z5)

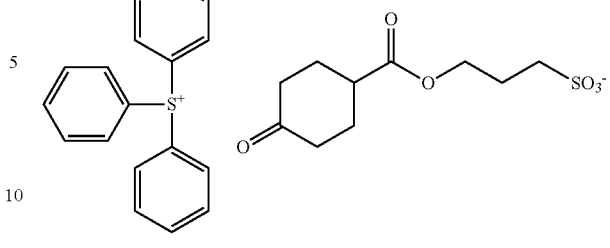

Herein $R^{209}$, $R^{210}$, $R^{215}$, and $R^{216}$ each are hydrogen or trifluoromethyl. $R^{208}$ is a straight, branched or cyclic $C_1$-$C_{35}$ monovalent hydrocarbon group which may contain an oxygen atom, r is an integer of 1 to 3. $R^{214}$ is hydrogen, hydroxyl, a straight, branched or cyclic $C_1$-$C_{35}$ monovalent hydrocarbon group which may contain an oxygen atom, or a substituted or unsubstituted $C_6$-$C_{30}$ aryl group. $R^{211}$, $R^{212}$, and $R^{213}$ are each independently a substituted or unsubstituted, straight or branched alkyl, alkenyl or oxoalkyl group of 1 to 10 carbon atoms, or a substituted or unsubstituted aryl, aralkyl or aryloxoalkyl group of 6 to 18 carbon atoms, or any two or more of $R^{211}$, $R^{212}$, and $R^{213}$ may bond together to form a ring with the sulfur atom.

Examples of the α-position non-fluorinated sulfonic acid salt and carboxylic acid salt are shown below, but not limited thereto.

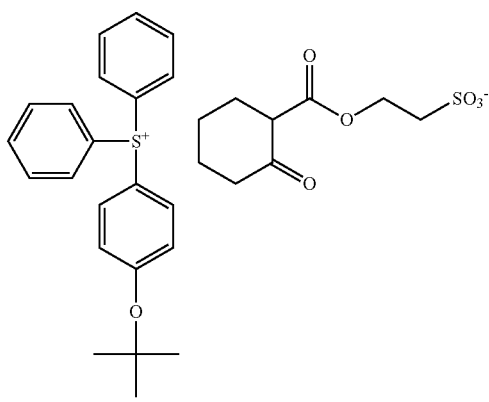

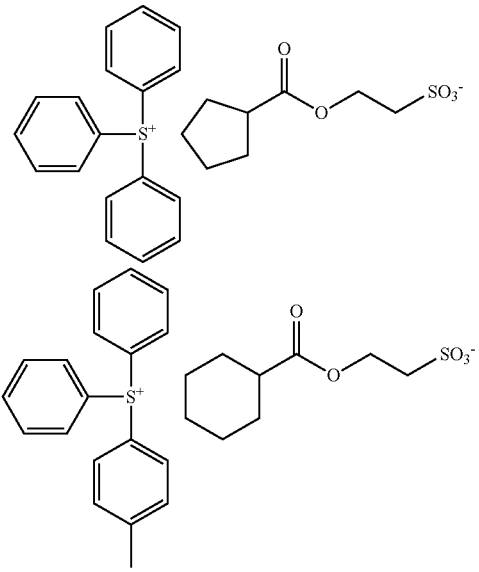

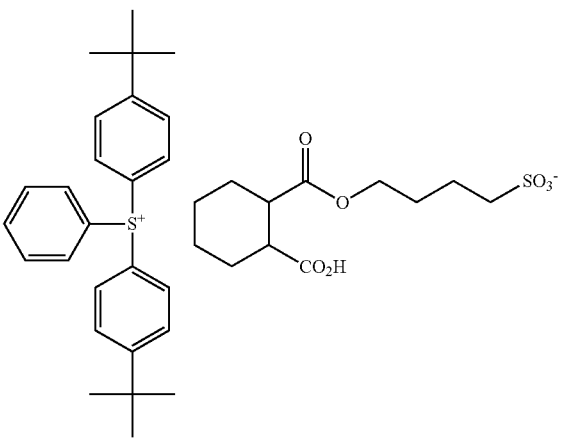

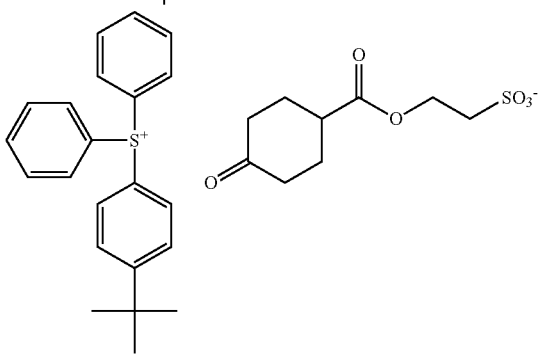

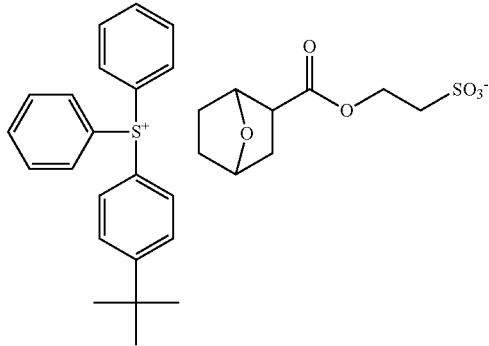

105
-continued
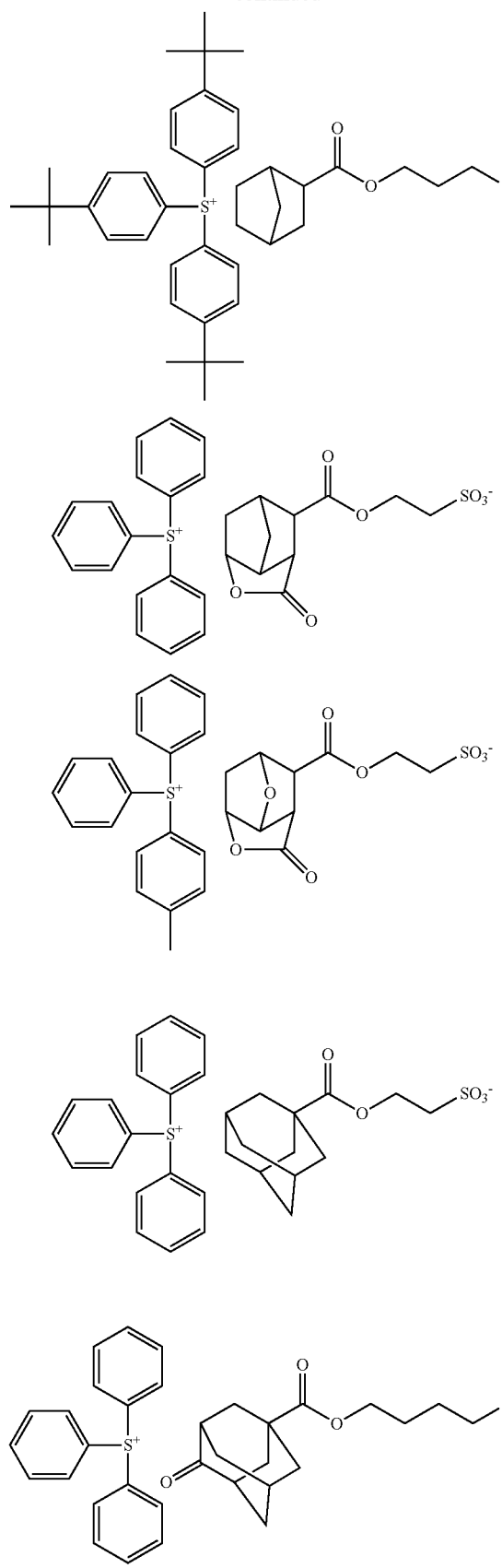
106
-continued
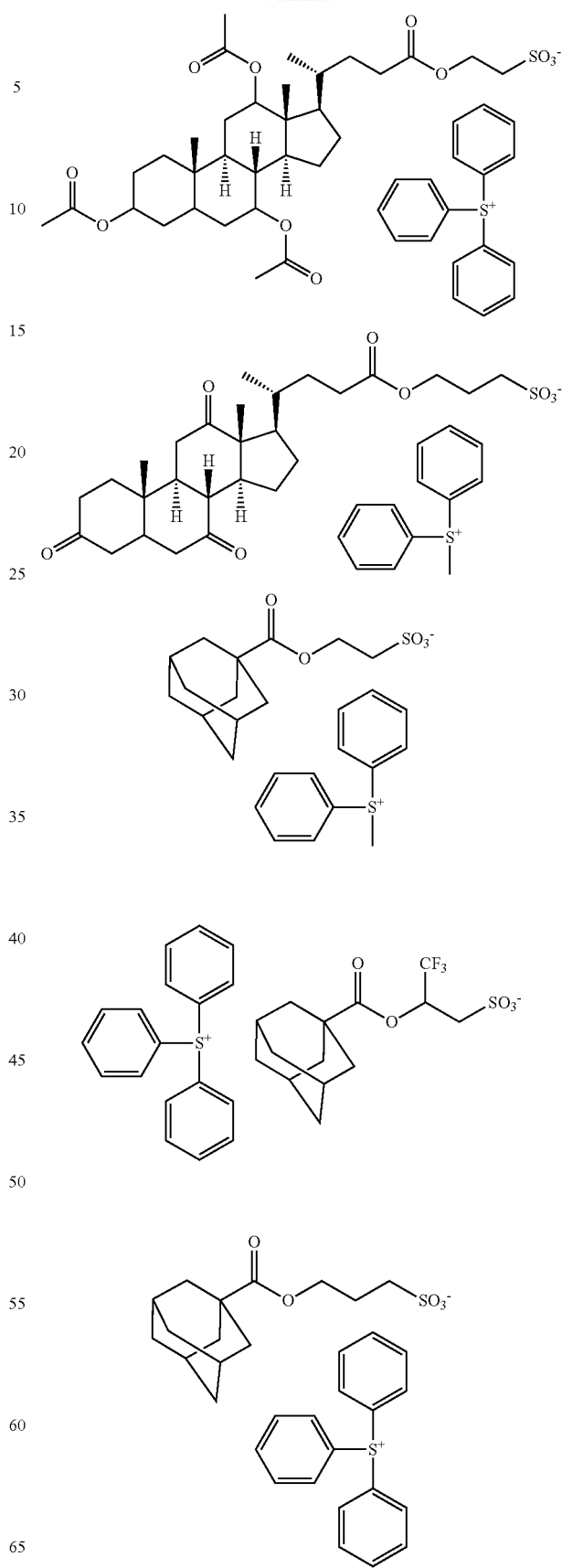

-continued
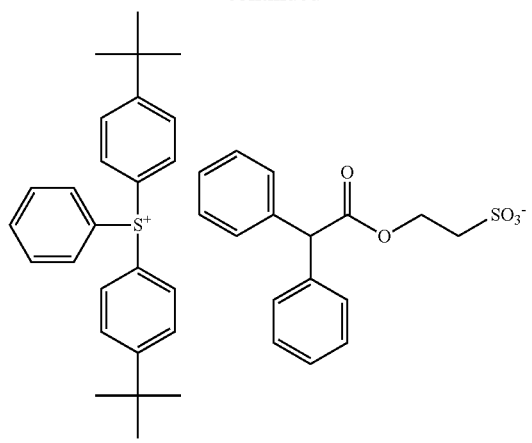
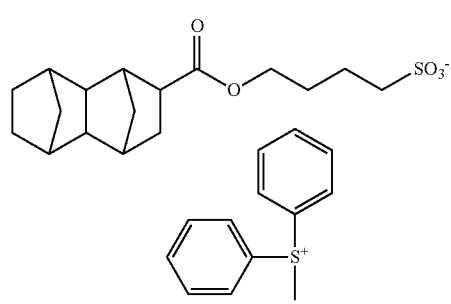
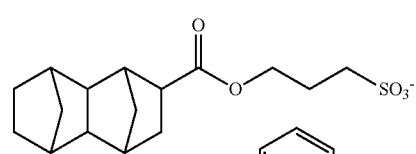
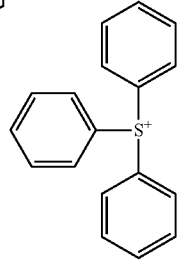
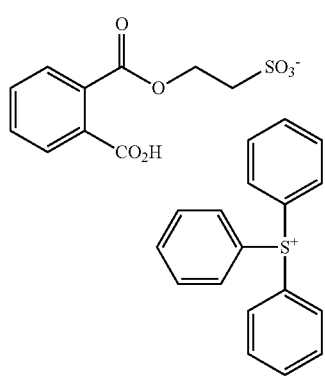
-continued
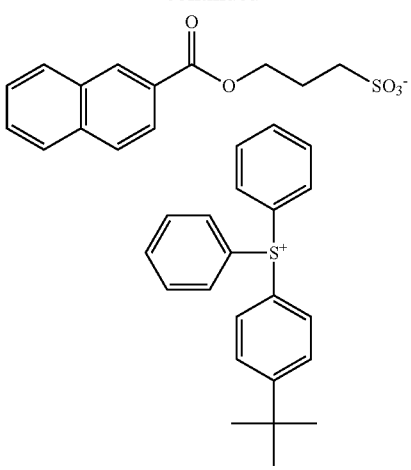
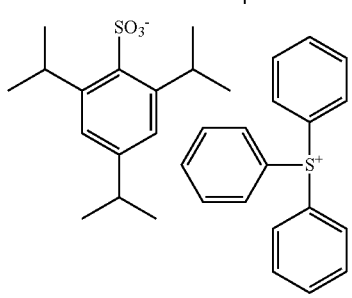
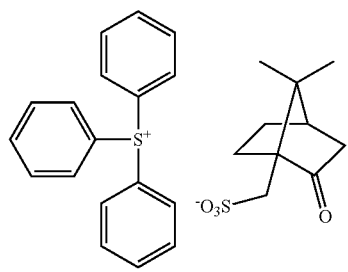
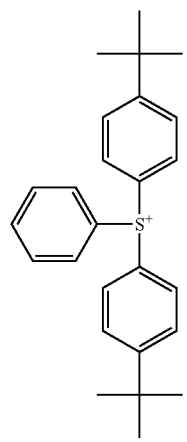
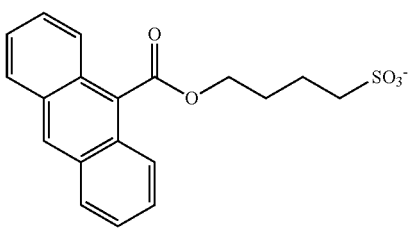

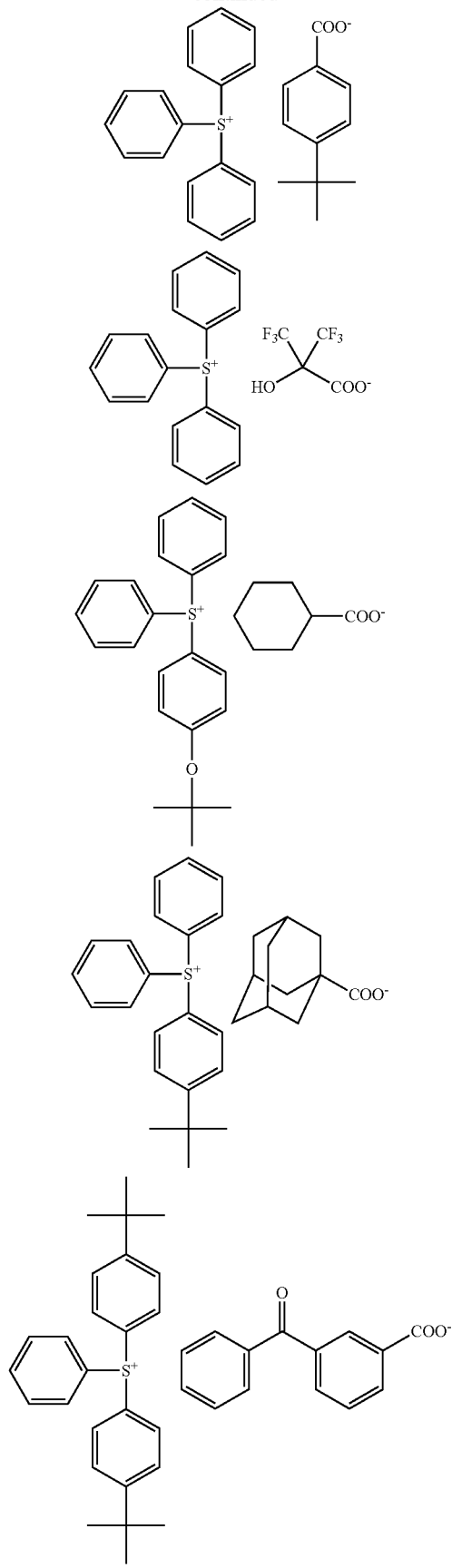
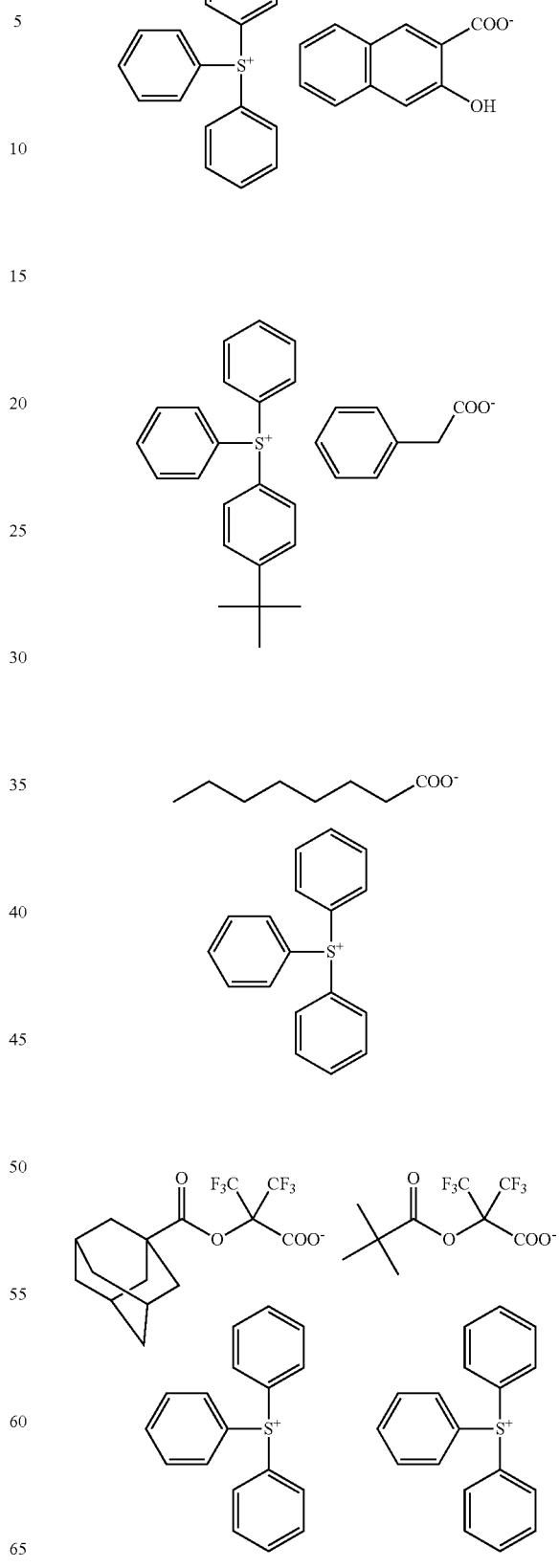

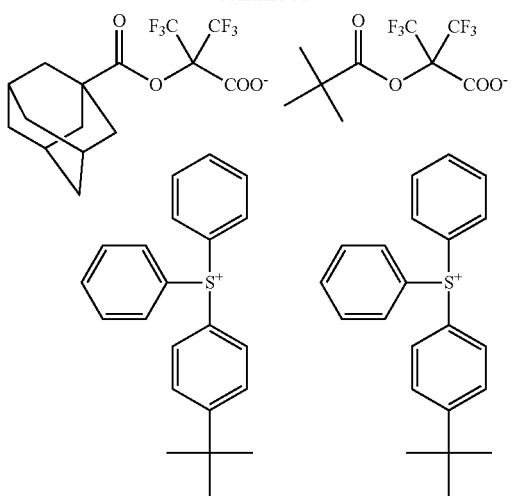
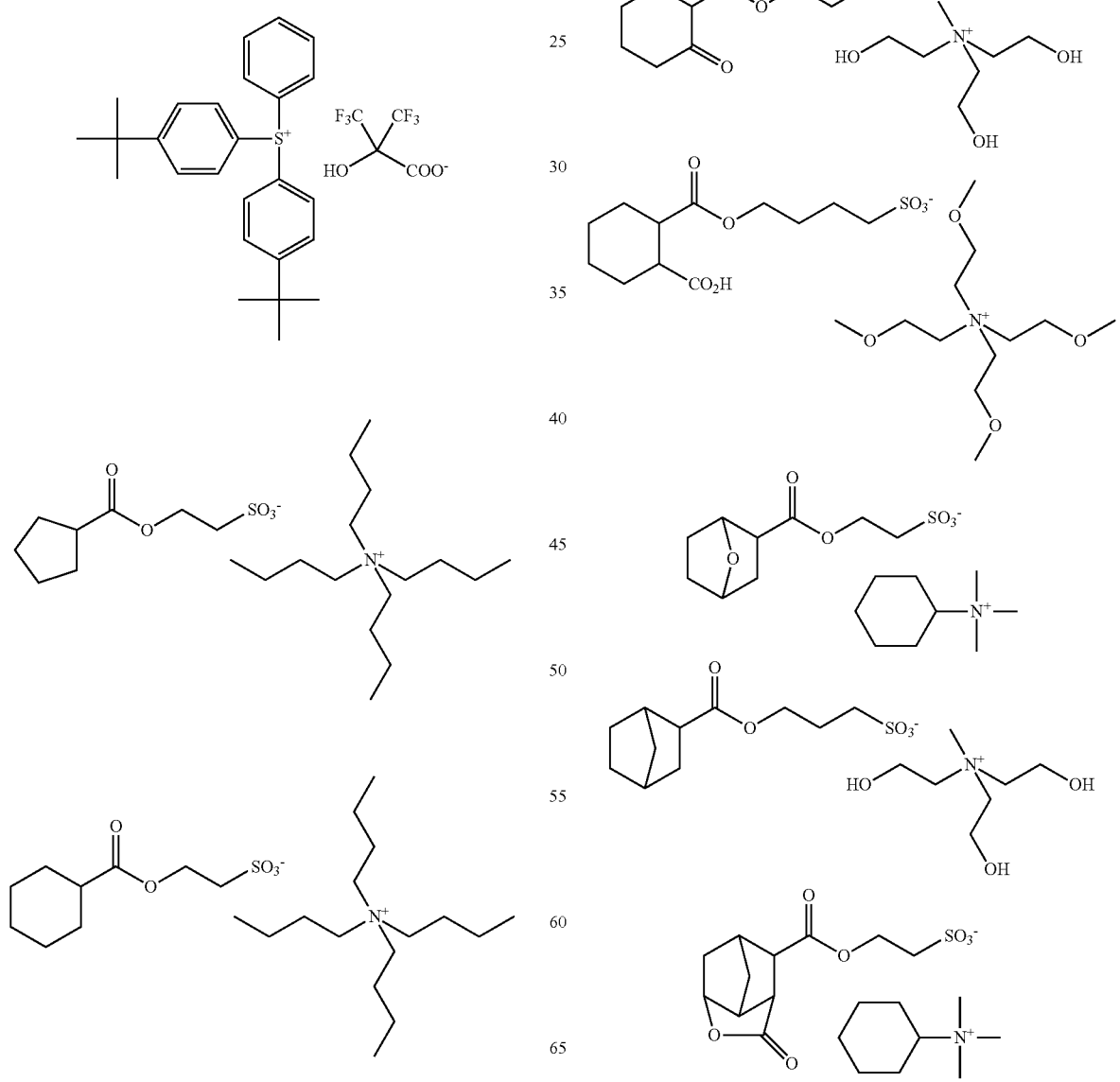

113
-continued
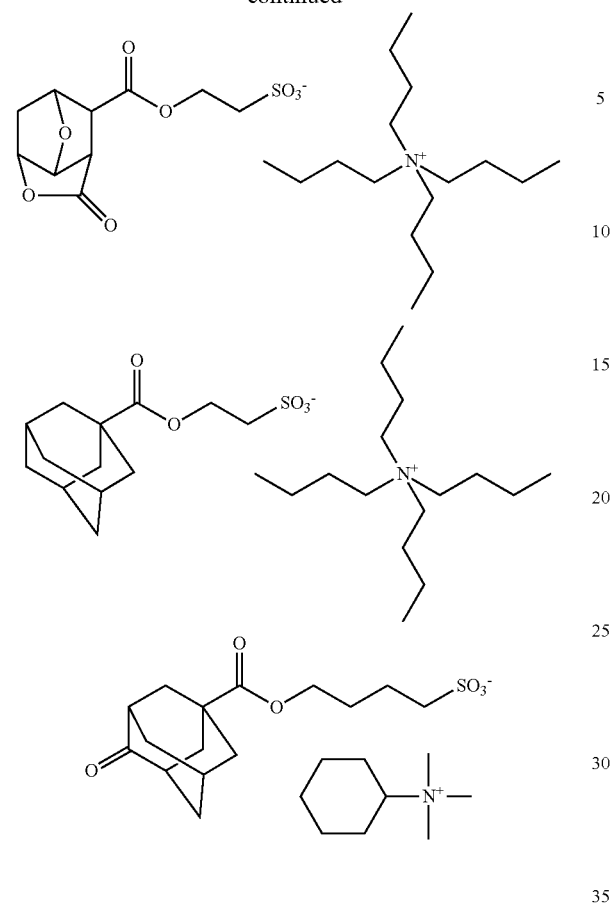
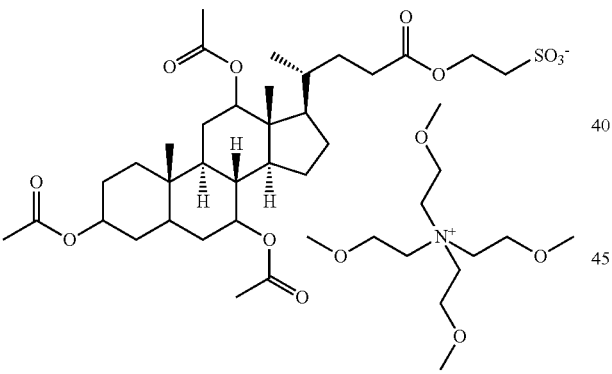
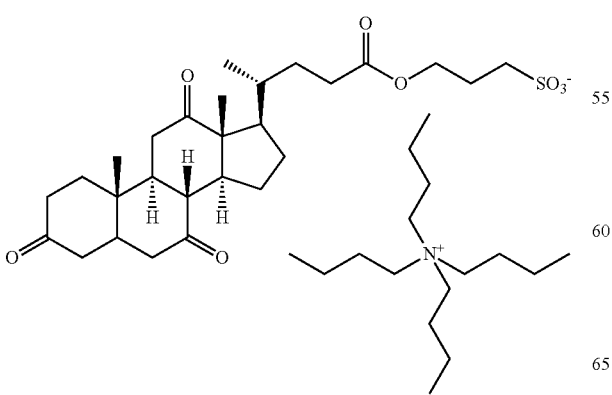
114
-continued
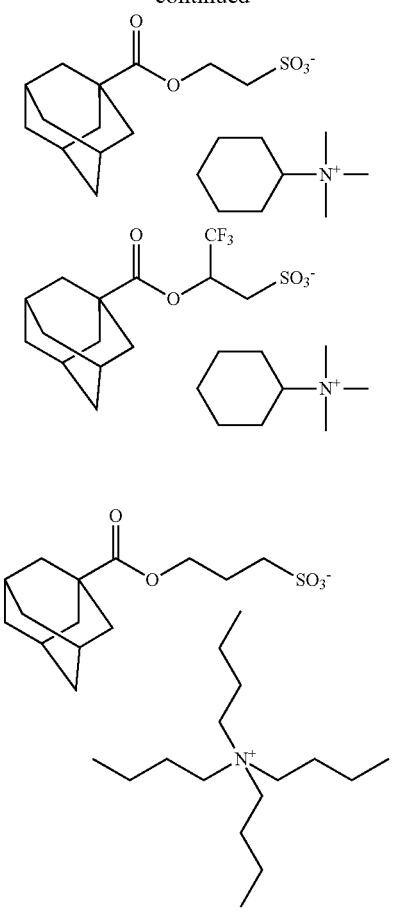
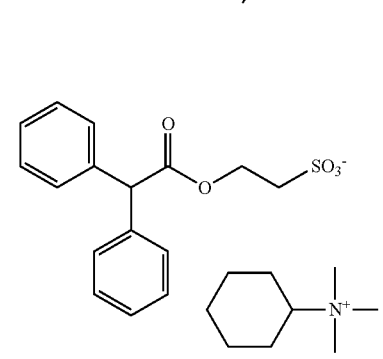
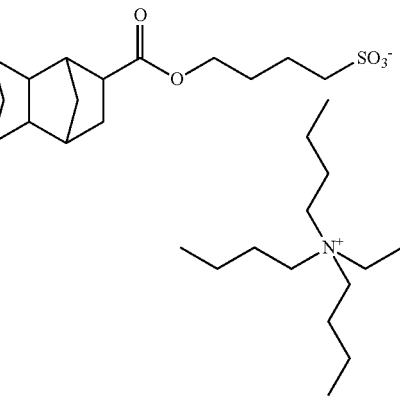

115
-continued
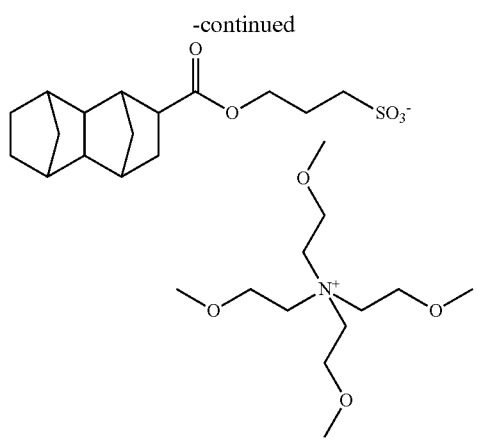
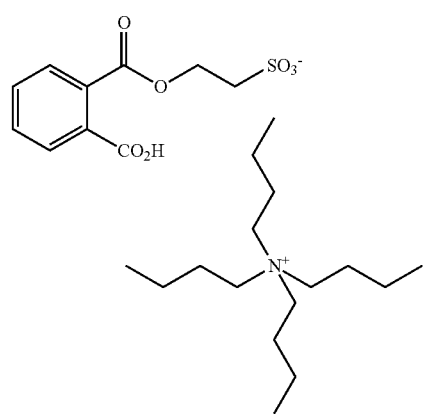
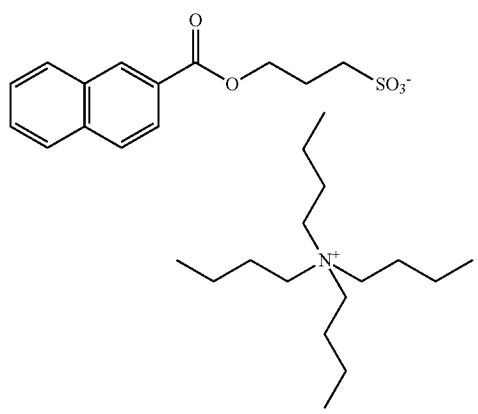
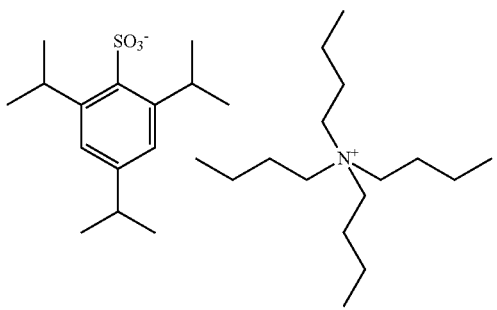
116
-continued
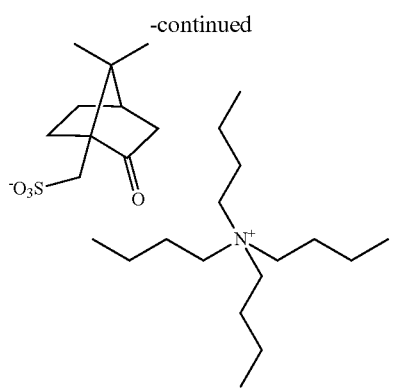
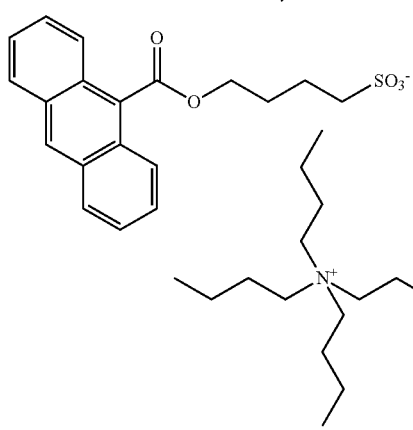
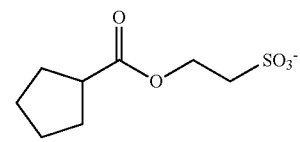
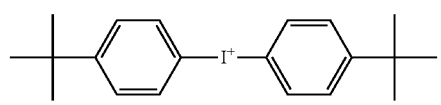
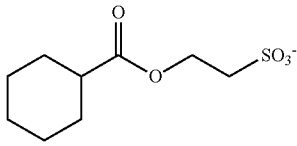
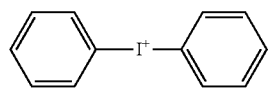
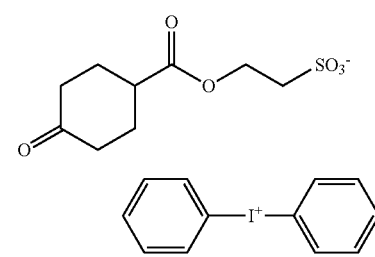

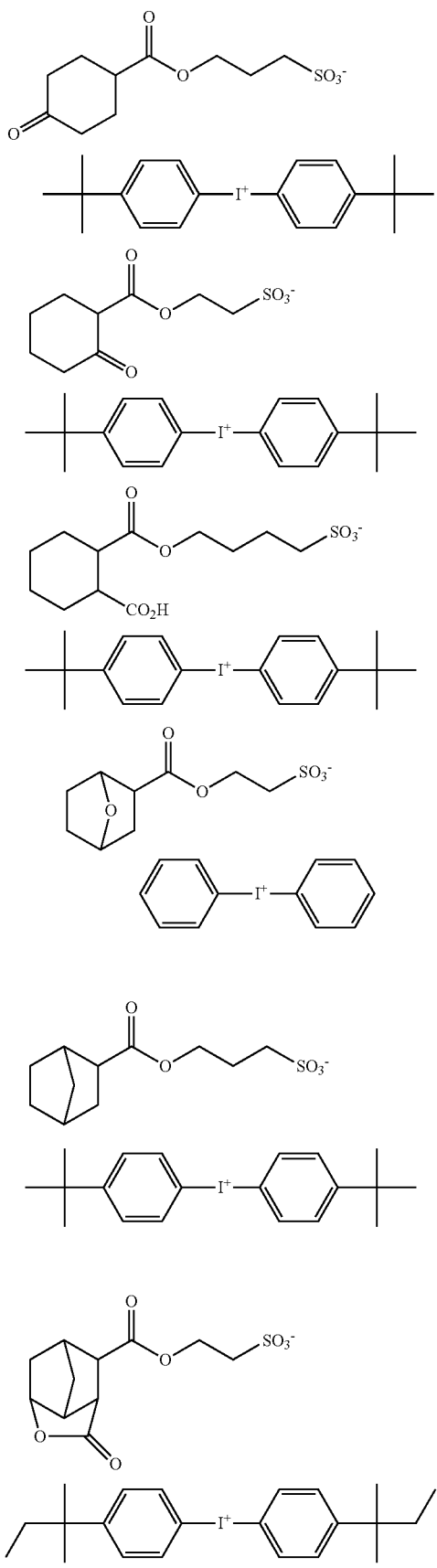
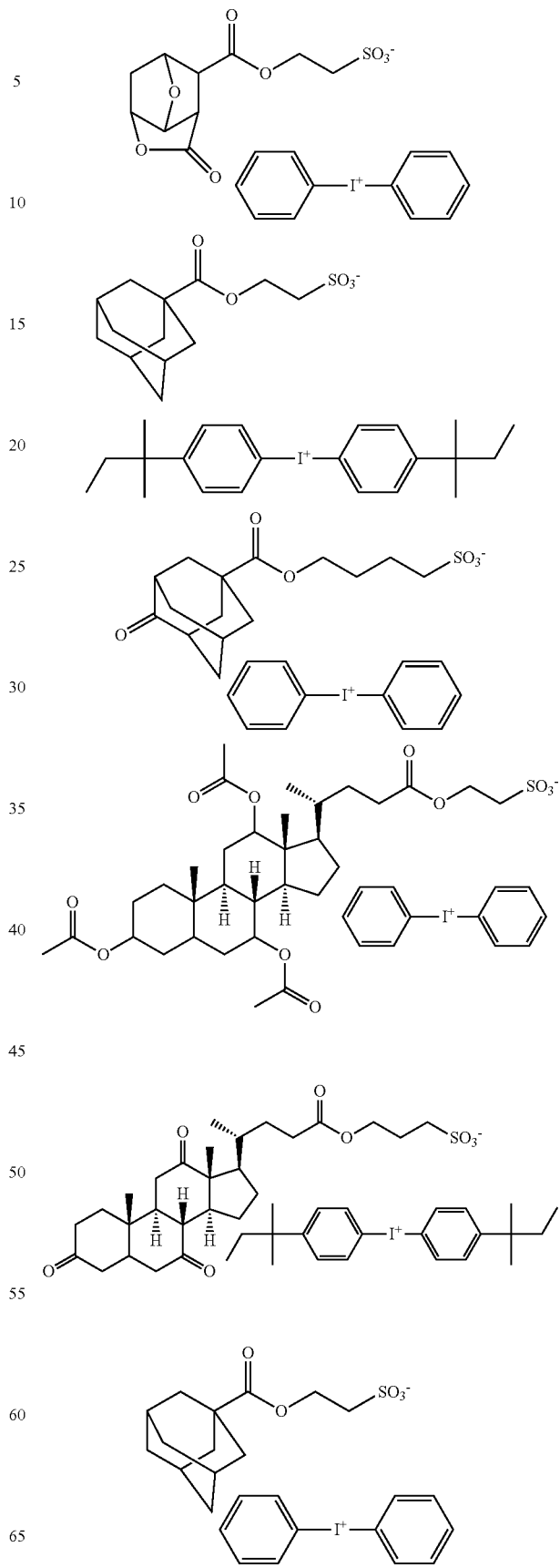

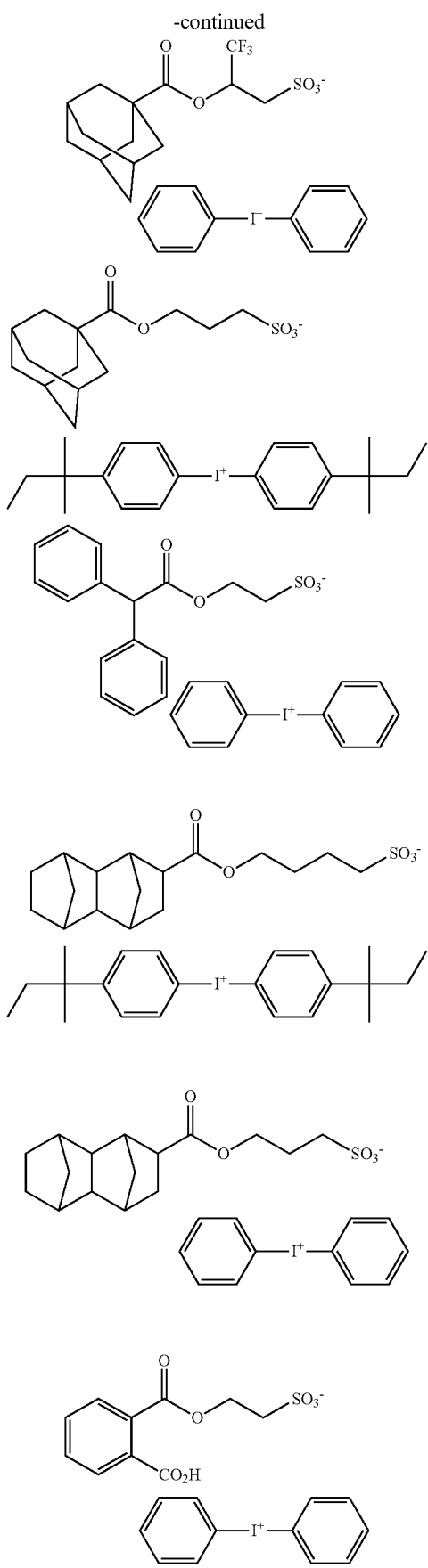
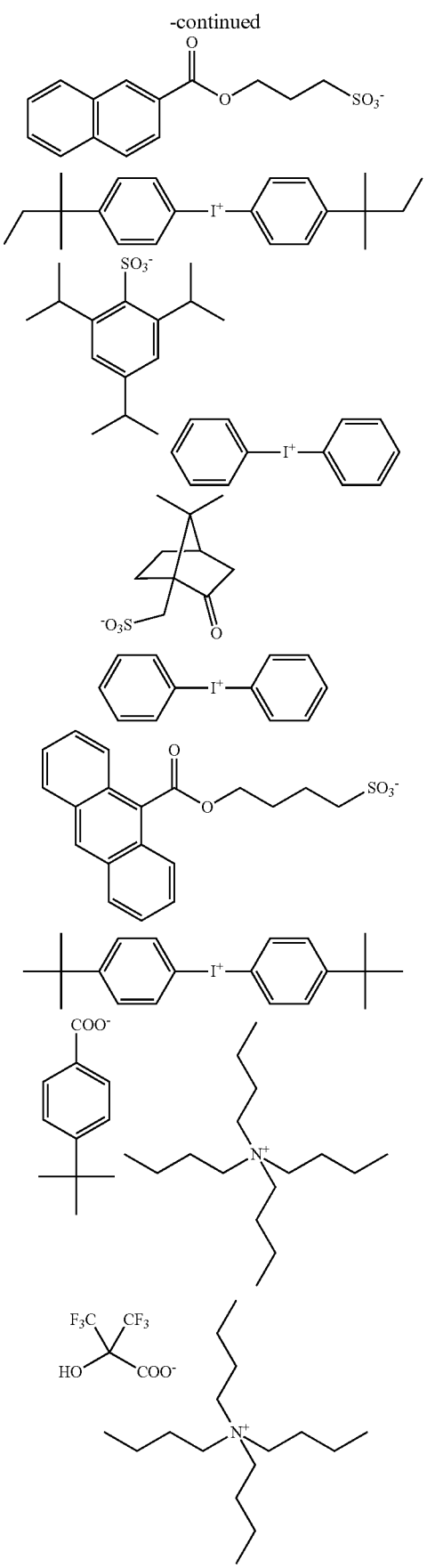

121
-continued
122
-continued
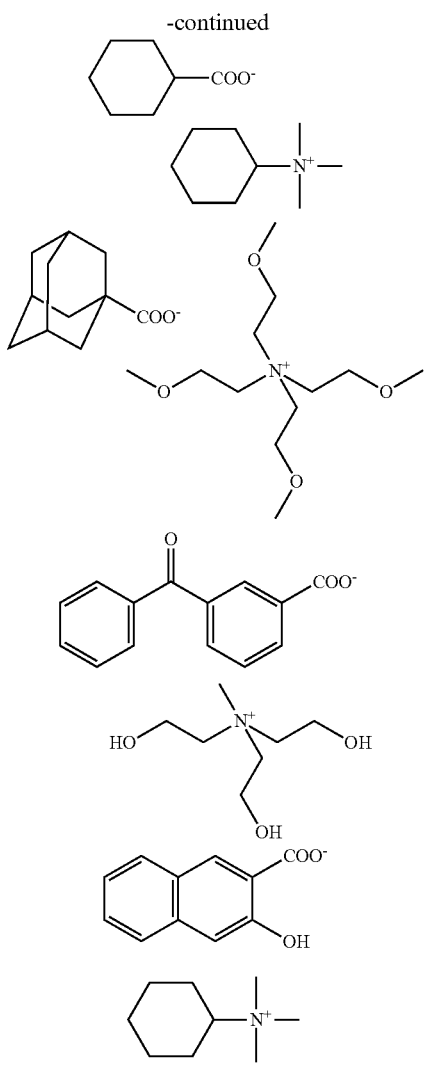
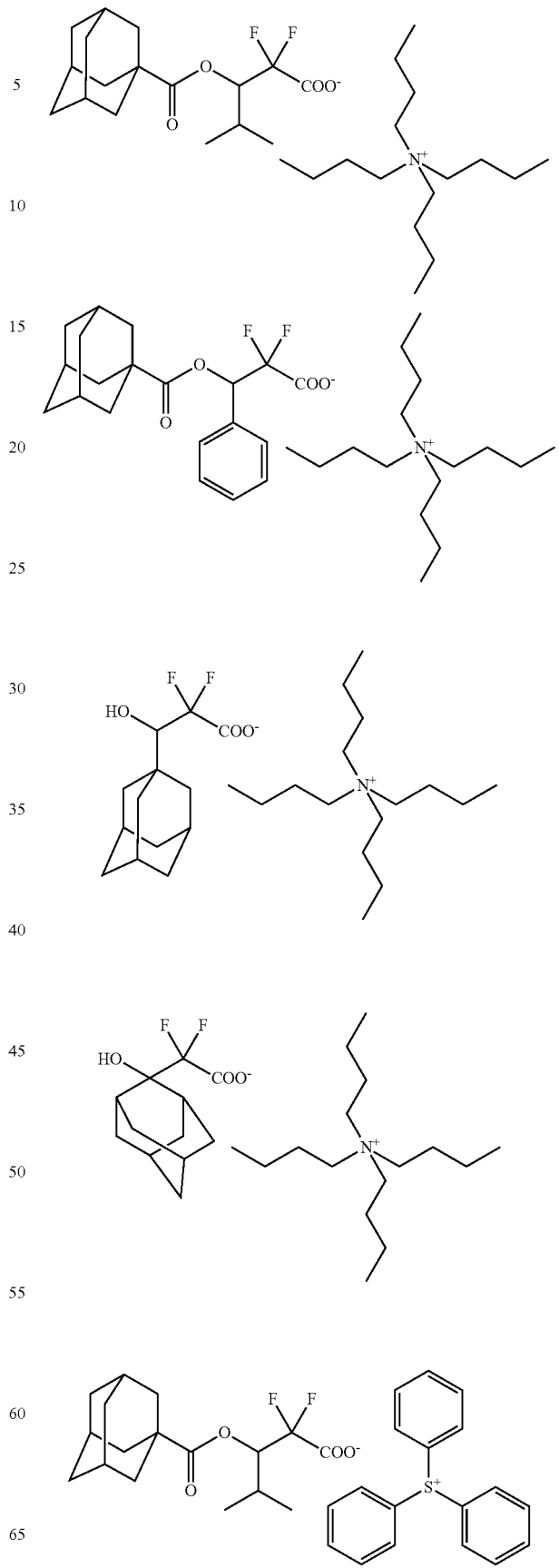

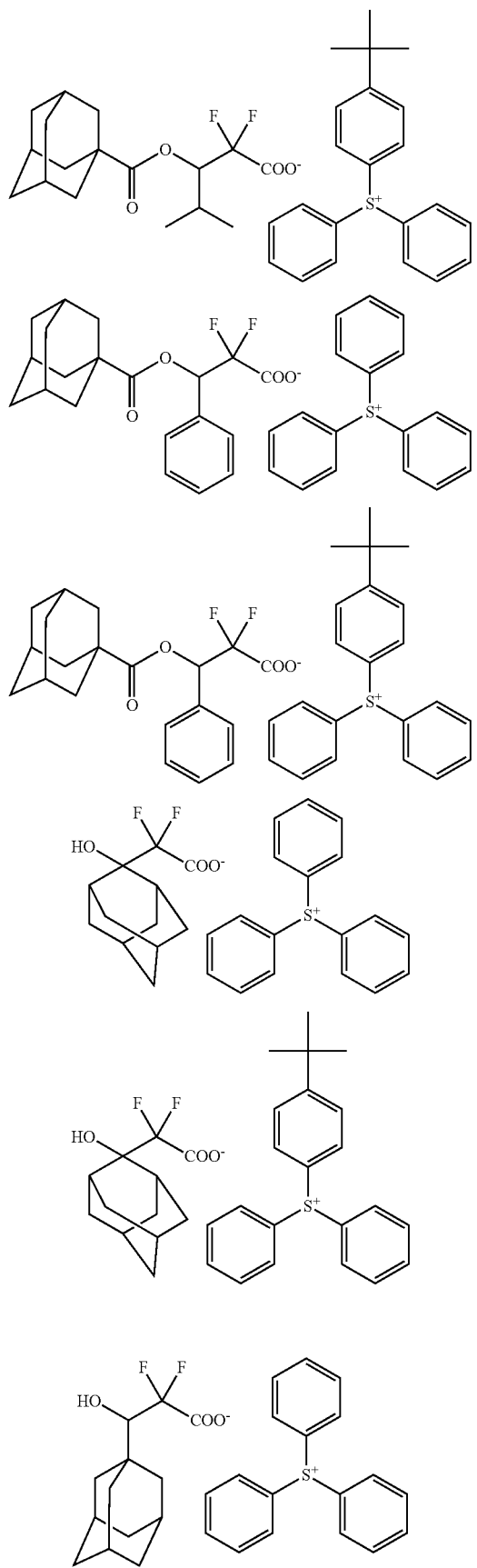
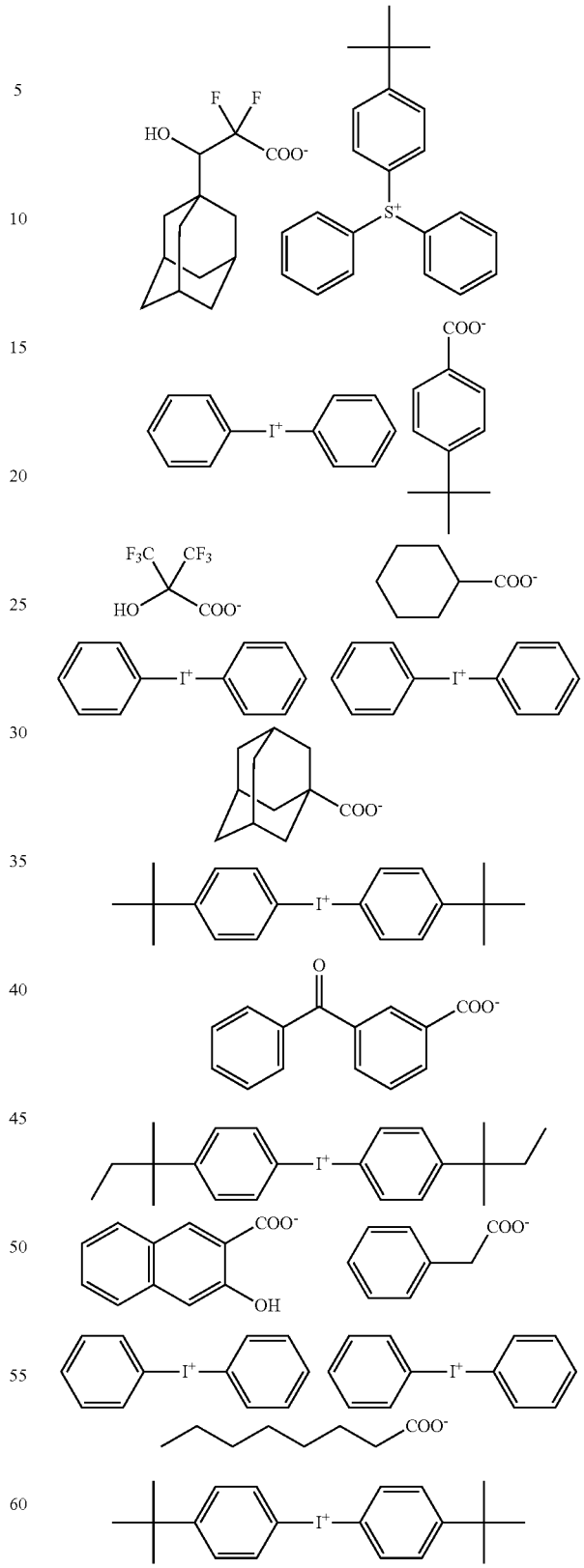
The basic compound may be used in an amount of 0 to 30 parts, more preferably 0 to 20 parts by weight per 100 parts by weight of the base resin.

Suitable organic solvents include those described in JP-A 2008-111103, paragraphs [0144] to [0145], for example, ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture. Where an acid labile group of acetal form is used, a high-boiling alcohol solvent such as diethylene glycol, propylene glycol, glycerol, 1,4-butanediol or 1,3-butanediol may be added for accelerating deprotection reaction of acetal.

An appropriate amount of the organic solvent used is 50 to 10,000 parts, preferably 100 to 8,000 parts by weight per 100 parts by weight of the bass resin.

Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Amounts of the surfactant, dissolution regulator, and acetylene alcohol may be determined as appropriate for a particular purpose.

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590, JP-A 2008-111103, JP-A 2008-122932, and JP-A 2012-128067.

The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, any hole pattern opening failure after development, and bridging of a line-and-space pattern. An appropriate amount of the water repellency improver is 0.1 to 20 parts, preferably 0.5 to 10 parts by weight per 100 parts by weight of the base resin.

Process

When the resist composition of the invention is used to form a variety of integrated circuits, any well-known lithography processes are applicable. The pattern forming process involves the steps of coating the resist composition onto a substrate, prebaking the coating to form a resist film, exposing the resist film to high-energy radiation, baking (PEB), and developing the exposed film in an organic solvent-based developer to form a negative tone pattern (e.g., hole or trench pattern) wherein the unexposed region of resist film is dissolved away and the exposed region of resist film is left. If necessary, any additional steps may be added.

Figure 1B:
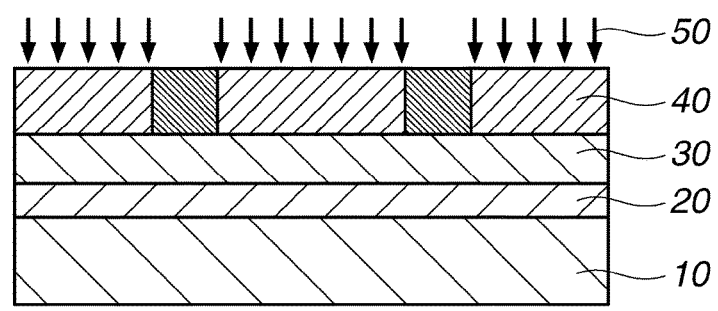
FIG. 1(B) shows the resist film being exposed.
Figure 1C:
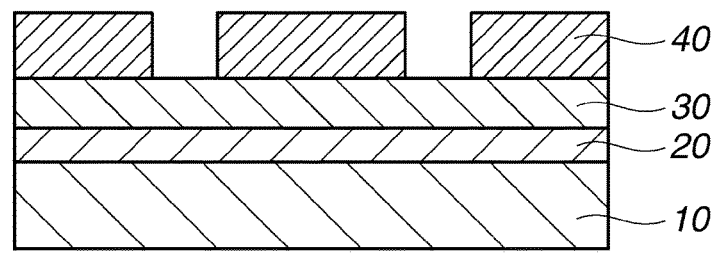
FIG. 1(C) shows the resist film being developed in an organic solvent.

The process of forming a pattern according to the invention is illustrated in FIG. 1. First, the positive resist composition is coated on a substrate to form a resist film thereon. Specifically, a resist film 40 of a resist composition is formed on a processable substrate 20 disposed on a substrate 10 directly or via an intermediate intervening layer 30 as shown in FIG. 1(A). The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Next comes exposure depicted at 50 in FIG. 1 (B). For the exposure, preference is given to high-energy radiation having a wavelength of 140 to 250 nm, EUV having a wavelength of 13.5 nm, EB, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water or liquid introduced between the resist film and the projection lens. Since this allows lenses to be designed to a NA of 1.0 or higher, formation of finer feature size patterns is possible. The immersion lithography is important, for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2propanol residues which is insoluble in water, but soluble in an alkaline developer liquid, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units derived from a monomer having a 1,1,1,3,3,3-hexafluoro-2-propanol residue dissolves in organic solvent developers. In particular, protective film-forming materials having 1,1,1,3,3,3-hexafluoro-2-propanol residues as described in JP-A 2007-025634, 2008-003569, 2008-81716, and 2008-111089 readily dissolve in organic solvent developers.

In the protective film-forming composition, an amine compound or amine salt or a polymer having copolymerized therein recurring units containing an amine group or amine salt may be used. This component is effective for controlling diffusion of the acid generated in the exposed region of the photoresist film to the unexposed region for thereby preventing any hole opening failure. Useful protective film materials having an amine compound added thereto are described in JP-A 2008-003569, and useful protective film materials having an amino group or amine salt copolymerized are described in JP-A 2007-316448. The amine compound or amine salt may be selected from the compounds enumerated as the basic compound to be added to the resist composition. An appropriate amount of the amine compound or amine salt added is 0.01 to 10 parts, preferably 0.02 to 8 parts by weight per 100 parts by weight of the base resin.

After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film. If the acid evaporating from the exposed region during PEB deposits on the unexposed region to deprotect the protective group on the surface of the unexposed region, there is a possibility that the surface edges of holes or lines of a hole or line-and-space pattern after development are bridged. Particularly in the case of negative development, regions surrounding the holes receive light so that acid is generated therein. There is a possibility that the holes are not opened if the acid outside the holes evaporates and deposits inside the holes during PEB. Provision of a protective film is effective for preventing evaporation of acid and for avoiding any hole opening failure. A protective film having an amine compound or amine salt added thereto is more effective for preventing acid evaporation. On the other hand, a protective film to which an acid compound such as a carboxyl or sulfo group is added or which is based on a polymer having copolymerized therein monomeric units containing a carboxyl or sulfo group is undesirable because of a potential hole opening failure.

A further embodiment of the invention is a process for forming a pattern by applying a resist composition comprising a polymer comprising recurring units having formula (1), an acid generator, and an organic solvent (with the proviso that the polymer further comprises acid labile group-containing recurring units of formula (2A), (2B) or (2C) in addition to recurring units of formula (1) or the composition further comprises a PAG of formula (4)) onto a substrate, baking the composition to form a resist film, forming a protective film on the resist film, exposing the resist film to high-energy radiation to define exposed and unexposed regions, baking, and applying an organic solvent developer to the coated substrate to form a negative pattern wherein the unexposed region of resist film and the protective film are dissolved and the exposed region of resist film is not dissolved. The protective film is preferably formed from a composition comprising a polymer bearing a 1,1,1,3,3,3-hexafluoro-2-propanol residue and an amino group or amine salt-containing compound, or a composition comprising a polymer bearing a 1,1,1,3,3,3-hexafluoro-2-propanol residue and having amino group or amine salt-containing recurring units copolymerized, the composition further comprising an alcohol solvent of at least 4 carbon atoms, an ether solvent of 8 to 12 carbon atoms, or a mixture thereof.

With respect to the recurring units having a 1,1,1,3,3,3-hexafluoro-2-propanol residue, those monomers having a —C(CF$_3$)(OH) group, i.e., a carbon atom having CF$_3$ and OH radicals bonded thereto are preferred. Suitable monomers are shown below, though not limited thereto.

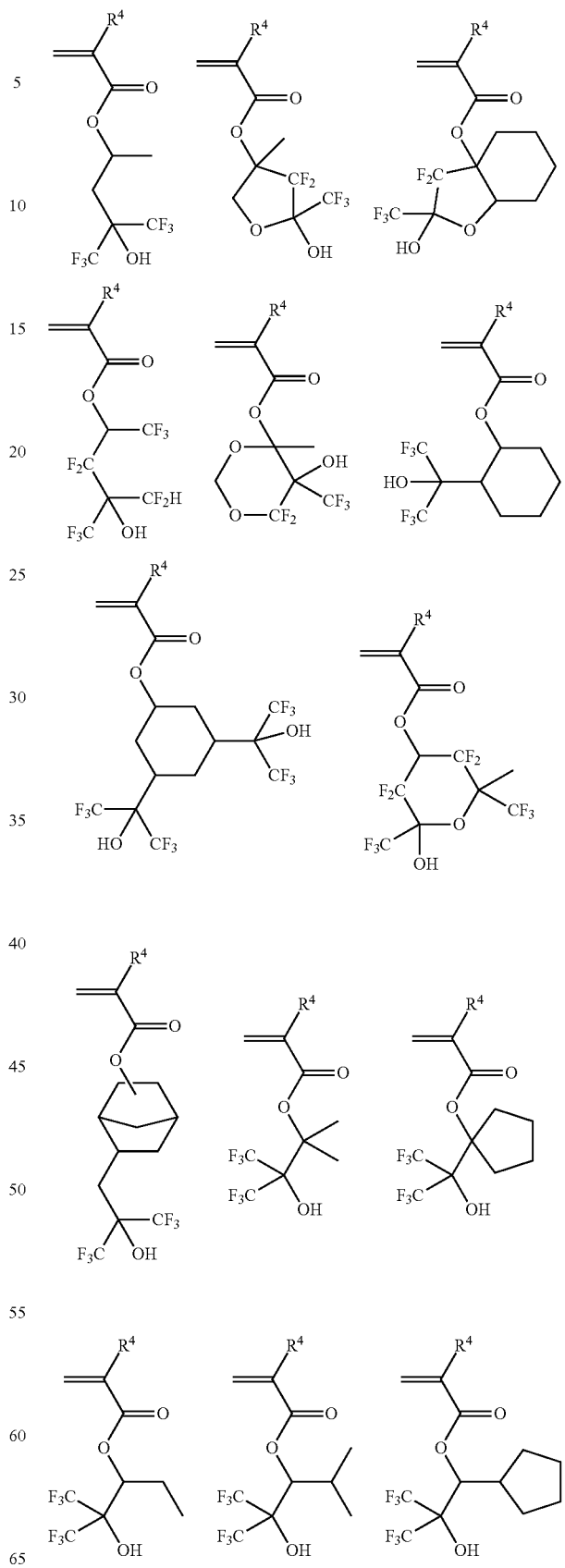

-continued

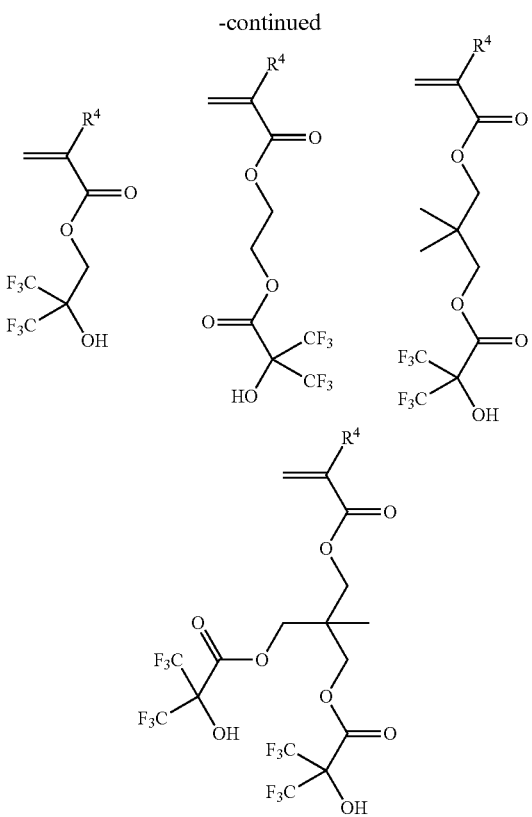

Herein R⁴ is as defined above.

The amino group-containing compound may be selected from the exemplary amine compounds (to be added to photoresist compositions) described in JP-A 2008-111103, paragraphs [0146] to [0164]. As the amine salt-containing compound, salts of the foregoing amine compounds with carboxylic acid or sulfonic acid may be used.

Suitable alcohols of at least 4 carbon atoms include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Suitable ether solvents of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether.

Exposure is preferably performed in an exposure dose of about 1 to 200 mJ/cm², more preferably about 10 to 100 mJ/cm². This is followed by baking (PEB) on a hot plate at 60 to 150° C. for 1 to 5 minutes, preferably at 80 to 120° C. for 1 to 3 minutes.

Thereafter the exposed resist film is developed in a developer consisting of an organic solvent for 0.1 to 3 minutes, preferably 0.5 to 2 minutes by any conventional techniques such as dip, puddle and spray techniques. In this way, the unexposed region of resist film was dissolved away, leaving a negative resist pattern 40 on the substrate 10 as shown in FIG. 1 (C). The developer used herein is preferably selected from among ketones such as 2-octanone, 2-nonanone, 2-heptanone, 3-heptanone, 4-heptanone, 2-hexanone, 3-hexanone, diisobutyl ketone, methylcyclohexanone, acetophenone, and methylacetophenone, and esters such as propyl, acetate, butyl, acetate, isobutyl acetate, amyl acetate, isoamyl acetate, butenyl acetate, propyl formats, butyl, formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof. A surfactant may be added to the developer while it may be selected from the same surfactants listed for the resist composition.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, ondecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and oyolooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. Suitable aromatic solvents include toluene, xylene, ethylbenzene, isopropylbenzene, tert-butylbenzene, and mesitylene. The solvents may be used alone or in admixture.

While rinsing is effective for mitigating collapse and defect formation in the resist pattern, rinsing is not essential. If the rinsing step is omitted, the amount of solvent used in the process may be reduced.

A hole pattern after reversal may foe shrunk by the RELACS® process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is at a temperature of 70 to 180° C., preferably 80 to 170° C., for a time of 10 to 300 seconds. The extra shrink agent is stripped and the hole pattern is shrunk.

Where a hole pattern is formed by negative tone development, exposure by doable dipole illuminations of X- and Y-direction line patterns provides the highest contrast light. The contrast may be further increased by combining dipole illumination with s-polarized illumination.

When a halftone phase shift mask bearing a lattice-like shifter pattern is used, a pattern of holes may be formed at the intersections between gratings of the lattice-like shifter pattern after development, as described in JP-A 2011-170316, paragraph [0097] (US 20110177462). The preferred halftone phase shift mask bearing a lattice-like shifter pattern has a transmittance of 3 to 15%. More preferably, the phase shift mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed. Also preferably, the phase shift mask used is a please shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

Exposure by double dipole illuminations of X- and Y-direction lines combined with polarized illumination presents a method of forming light of the highest contrast. This method, however, has the drawback that the throughput is substantially reduced by double exposures and mask exchange therebetween. To continuously carry out two exposures while exchanging a mask, the exposure tool must be equipped with two mask stages although the existing exposure tool includes a single mask stage. Higher throughputs may be obtained by carrying out exposure of X direction lines continuously on 25 wafers in a front-opening unified pod (FOUP), exchanging the mask, and carrying out exposure continuously on the same 25 wafers, rather than exchanging a mask on every exposure of a single wafer. However, a problem arises that as the time duration until the first one of 25 wafers is exposed in the second exposure is prolonged, the environment affects the resist such that the resist after development may change its size and shape. To block the environmental impact on wafers in standby until the second exposure, it is effective that the resist film is overlaid with a protective film.

To proceed with a single mask, it is proposed in Proc. SPIE Vol. 5377, p255 (2004) to carry out two exposures by dipole illuminations in X and Y directions using a mask bearing a lattice-like pattern. When this method is compared with the above method using two masks, the optical contrast is somewhat reduced, but the throughput is improved by the use of a single mask. The method involves forming X-direction lines in a first photoresist film by X-direction dipole illumination using a mask bearing a lattice-like pattern, insolubilizing the X-direction lines by light irradiation, coating a second photoresist film thereon, and forming Y-direction lines by Y-direction dipole illumination, thereby forming holes at the interstices between X- and Y-direction lines. Although only a single mask is needed, this method includes additional steps of insolubilizing the first photoresist pattern between the two exposures, and coating and developing the second photoresist film. Then the wafer must be removed from the exposure stage between the two exposures, giving rise to the problem of an increased alignment error. To minimize the alignment error between two exposures, two exposures must be continuously carried out without removing the wafer from the exposure stage. The addition of s-polarized illumination to dipole illumination provides a further improved contrast and is thus preferably employed. After two exposures for forming X- and Y-direction lines using a lattice-like mask are performed in an overlapping manner, negative tone development is performed whereupon a hole pattern is formed.

When it is desired to form a hole pattern via a single exposure using a lattice-like mask, a quadrupole illumination or cross-polo illumination is used. The contrast may be improved by combining it with X-Y polarized illumination or azimuthally polarized illumination of circular polarization.

In the hole pattern forming process using the resist composition of the invention, when two exposures are involved, these exposures are carried out by changing the illumination and mask for the second exposure from those for the first exposure, whereby a fine size pattern can be formed at the highest contrast and to dimensional uniformity. The masks used in the first and second exposures bear first and second patterns of intersecting lines whereby a pattern of holes at intersections of lines is formed in the resist film after development. The first and second lines are preferably at right angles although an angle of intersection other than 90° may be employed. The first and second lines may have the same or different size and/or pitch. If a single mask bearing first lines in one area and second lines in a different area is used, it is possible to perform first and second exposures continuously. In this case, however, the maximum area available for exposure is one half. Notably, the continuous exposures lead to a minimized alignment error. Of course, the single exposure provides a smaller alignment error than the two continuous exposures.

When two exposures are performed using a single mask without reducing the exposure area, the mask pattern may be a lattice-like pattern, a dot pattern, or a combination of a dot pattern and a lattice-like pattern. The use of a lattice-like pattern contributes to the most improved light contrast, but has the drawback of a reduced resist sensitivity due to a lowering of light intensity. On the other hand, the use of a dot pattern suffers a lowering of light contrast, but provides the merit of an improved resist sensitivity.

Where holes are arrayed in horizontal and vertical directions, the above-described illumination and mask pattern are used. Where holes are arrayed at a different angle, for example, at an angle of 45°, a mask of a 45° arrayed pattern is combined with dipole illumination or cross-pole illumination.

Where two exposures are performed, a first exposure by a combination of dipole illumination with polarized illumination for enhancing the contrast of X-direction lines is followed by a second exposure by a combination of dipole illumination with polarized illumination for enhancing the contrast of Y-direction lines. Two continuous exposures with the X- and Y-direction contrasts emphasized through a single mask can be performed on a currently commercially available scanner.

The method of combining X and Y polarized illuminations with cross-pole illumination using a mask bearing a lattice-like pattern can form a hole pattern through a single exposure, despite a slight lowering of light contrast as compared with two exposures of dipole illumination. The method is estimated to attain a substantial improvement in throughput and avoids the problem of misalignment between two exposures. Using such a mask and illumination, a hole pattern of the order of 40 nm can be formed at a practically acceptable cost.

On use of a mask bearing a lattice-like pattern, light is fully shielded at intersections between gratings. A fine hole pattern may be formed by performing exposure through a mask bearing such a pattern and organic solvent development entailing positive/negative reversal.

On use of a mask bearing a dot pattern, although the contrast of an optical image is low as compared with the lattice-like pattern mask, the formation of a hole pattern is possible owing to the presence of black or light shielded spots.

It is difficult to form a fine hole pattern that holes are randomly arrayed at varying pitch and position. The super-resolution technology using off-axis illumination (such as dipole or cross-pole illumination) in combination with a phase shift mask and polarization is successful in improving the contrast of dense (or grouped) patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a photoresist composition, specifically dissolution contrast and acid diffusion, the proximity bias of a mask varies with the type of photoresist composition. For a particular type of photoresist composition, a mask having a different proximity bias must be used. This adds to the burden of mask manufacturing. Then the pack and unpack (PAU) method is proposed in Proc. SPIE Vol. 5753, p 171 (2005), which involves strong super-resolution illumination of a first positive resist to resolve a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

To form a random pitch hole pattern by organic solvent development entailing positive/negative reversal, a mask is used in which a lattice-like pattern is arrayed over the entire surface and the width of gratings is thickened only where holes are to be formed as described in JP-A 2011-170316, paragraph [0102].

Also useful is a mask in which a lattice-like pattern is arrayed over the entire surface and thick dots are disposed only where holes are to be formed.

On use of a mask bearing no lattice-like pattern arrayed, holes are difficult to form, or even if holes are formed, a variation of mask size is largely reflected by a variation of hole size because the optical image has a low contrast.

EXAMPLE

Examples of the invention are given below by way of illustration and not by way of limitation. All parts (pbw) and % are by weight unless otherwise stated. For all polymers, Mw and Mn are determined by GPC versus polystyrene standards using tetrahydrofuran solvent.

Synthesis Example 1

Synthesis of Monomer

A monomer from which inventive recurring units were derived was synthesized according to the following formulation. A typical synthesis example is shown below.

Synthesis Example 1-1

Synthesis of Monomer 1 via Route 1

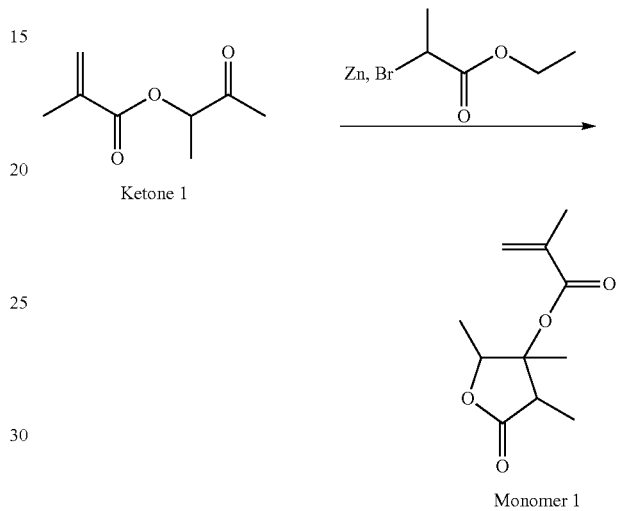

In a nitrogen atmosphere, 33.9 g of zinc powder was dissolved in 250 ml of THF. Then 2.3 g of 1,2-dibromoethane and 0.9 g of trimethylsilyl chloride were added to the solution, which was heated and stirred for activating zinc. To the activated zinc-THF solution, a mixture of 82.0 g of Ketone 1, 98.5 g of ethyl 2-bromopropionate, and 150 ml of THF was added dropwise at 55° C., followed by heating and stirring at 55° C. for 1.5 hours. Under ice cooling, 227 g of 10% aqueous hydrochloric acid was added. This was followed by standard aqueous workup and solvent distillation. The product was purified by silica gel column chromatography, obtaining 53.1 g of Monomer 1 (yield 48%, isomer ratio 57:32:11:0).

IR (D-ATR): ν=2985, 2944, 1782, 1717, 1637, 1455, 1386, 1328, 1302, 1208, 1167, 1135, 1096, 1072, 1052, 1012, 944, 888, 814, 663 cm$^{-1}$ $^1$H-HMR (600 MHz in DMSO-d$_6$, only major isomer): δ=1.13 (3H, d), 1.30 (3H, d), 1.57 (3H, s), 1.83 (1H, m), 3.09 (1H, q), 4.96 (1H, q), 5.68 (1H, m), 5.95 (1H, m) ppm Synthesis Example 1-2

Synthesis of Monomer 1 via Route 2

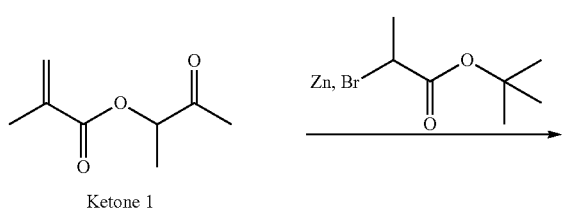

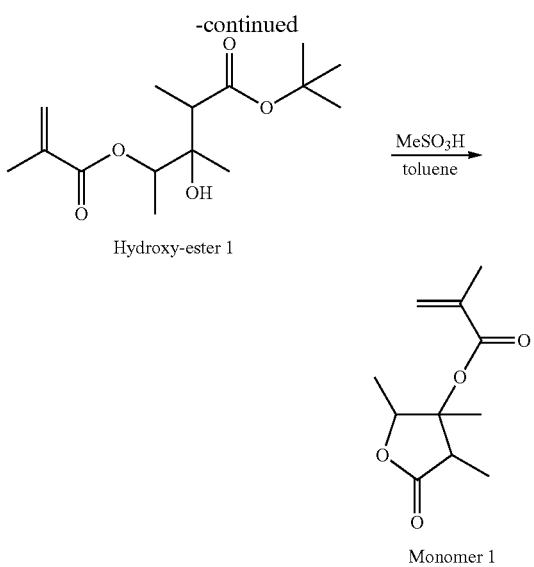

Synthesis Example 1-2-1

Synthesis of Hydroxy-ester 1

First, 16.4 g of 1,2-dibromoethane was added to a suspension of 250.6 g of zinc in 2,900 ml of THF, which was stirred for 1 hour under reflux conditions. The suspension was cooled to an internal temperature of 40° C., after which 7.6 g of chlorotrimethylsilane was added thereto and stirred for 10 minutes. To the suspension, a mixture of 653 g of Ketone 1, 728.5 g of tert-butyl 2-bromopropionate, 16.4 g of 1,2-dibromoethane, and 750 ml of THF was added dropwise at an internal temperature of 30° C. While the suspension was suitably cooled, dropwise addition was completed at a temperature below 40° C. At the end of addition, the suspension was stirred at an internal temperature of 35° C. for 1 hour and cooled. With the temperature kept below 20° C., 1,050 g of 20% hydrochloric acid was added dropwise to the reaction solution to quench the reaction. Stirring was continued at room temperature for some time until zinc was dissolved. The solution was extracted with 2,000 ml of toluene, followed by standard aqueous workup and solvent distillation. The product was purified by distillation, obtaining 716.3 g of Hydroxy-ester 1 (yield 69%, isomer ratio 40:39:18:3).

boiling point: 30° C./10 Pa $^1$H-NMR (600 MHz in DMSO-$d_6$, only major isomer): δ=1.05 (3H, d), 1.09 (3H, s), 1.17 (3H, d), 1.33 (9H, s), 1.87 (3H, s), 2.46 (1H, q), 4.56 (1H, s), 4.87 (1H, m) 5.61 (1H, s), 6.08 (1H, s) ppm Synthesis Example 1-2-2

Synthesis of Monomer 1

At room temperature, 80 g of methanesulfonic acid was added dropwise to a mixture of 800 g of Hydroxy-ester 1 and 800 g of toluene, which was heated and stirred at an internal temperature of 50° C. for 12 hours. After the completion of reaction was confirmed, the reaction solution was cooled, to which 880 g of 10% sodium hydrogencarbonate aqueous solution was added dropwise to quench the reaction. This was followed by standard aqueous workup and solvent distillation. The product was purified by distillation, obtaining 466.8 g of Monomer 1 (yield 77%, isomer ratio 40:28:18:14). The major isomer was the same as in Synthesis Example 1-1.

boiling point: 73° C./5 Pa

Synthesis Example 2

Synthesis of Polymers

A series of polymers for use in resist compositions were synthesized by dissolving selected monomers in propylene glycol monomethyl ether acetate (PGMEA), copolymerization reaction, crystallizing from methanol, repeatedly washing with methanol, isolation and drying. The composition of a polymer was analyzed by $^1$H-HMR spectroscopy, and the Mw and Mw/Mn determined by GPC. The polymers are designated Polymers 1 to 14 and Comparative Polymers 1 to 7.

Polymer 1

Mw=9,600

Mw/Mn=1.58

(a=0.40, b=0.30, c=0.20, d=0.10)

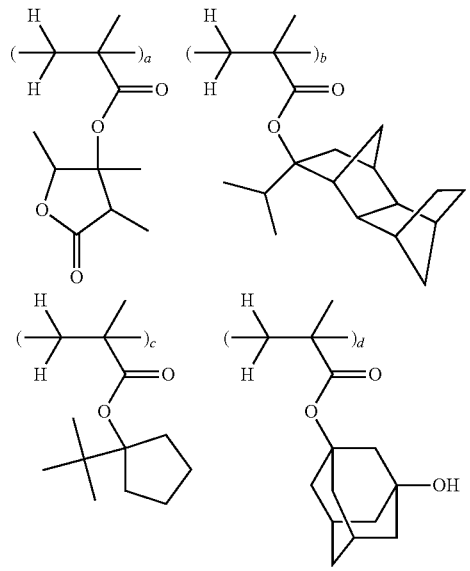

Polymer 2

Mw=10,100

Mw/Mn=1.60

(a=0.50, b=0.40, c=0.10)

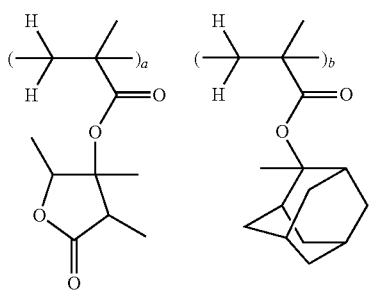

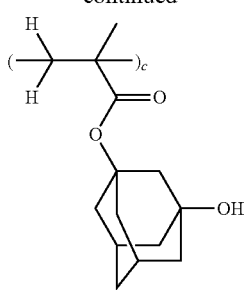
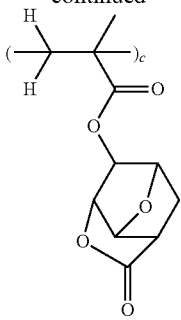
Polymer 3
Mw=8,900
Mw/Mn=1.55
(a=0.35, b=0.25, c=0.25, d=0.15)
Polymer 5
Mw=9,300
Mw/Mn=1.55
(a=0.30, b=0.40, c=0.10, d=0.20)
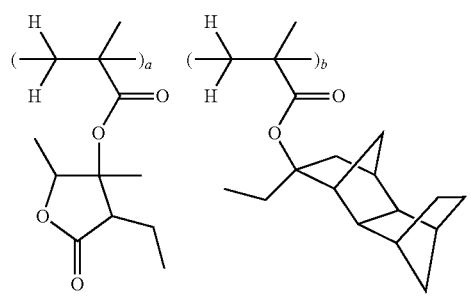
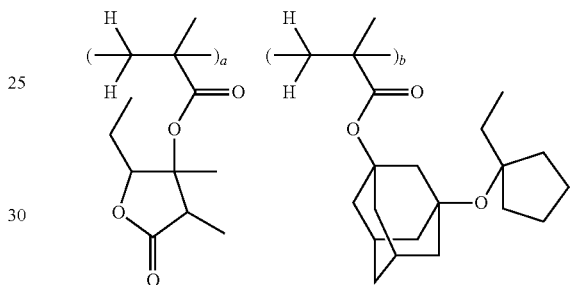
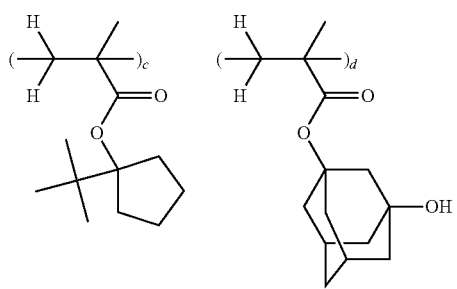
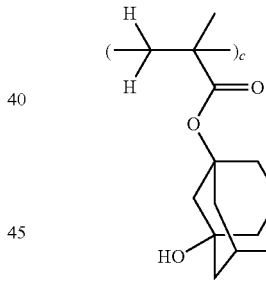
Polymer 4
Mw=9,900
Mw/Mn=1.62
(a=0.25, b=0.55, c=0.20)
Polymer 6
Mw=9,400
Mw/Mn=1.57
(a=0.35, b=0.30, c=0.20, d=0.15)
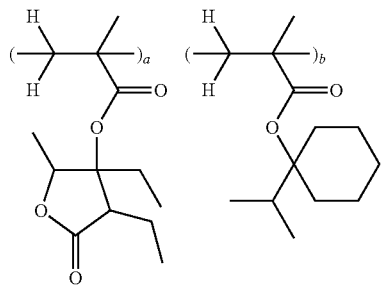
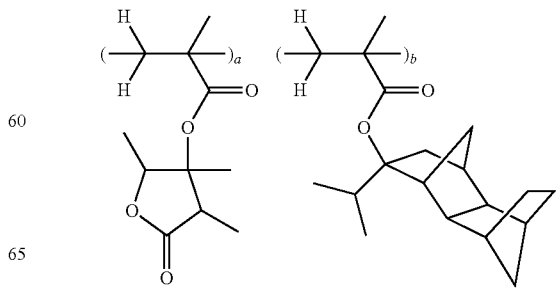

-continued
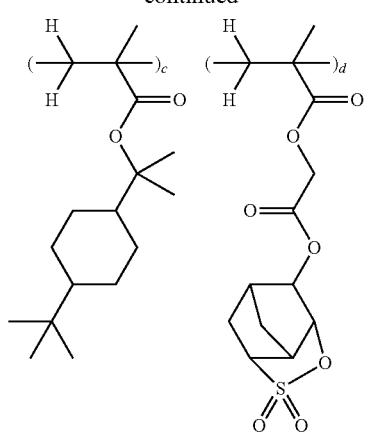
Polymer 7
Mw=9,100
Mw/Mn=1.67
(a≤0.35, b=0.35, c=0.15, d=0.15)
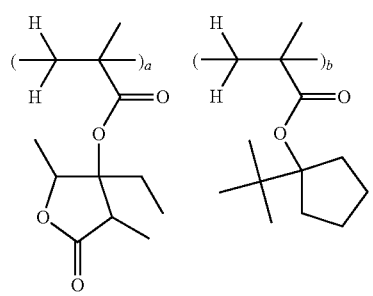
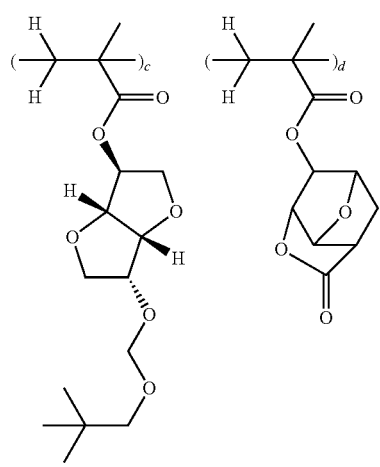
Polymer 8
Mw=7,900
Mw/Mn=1.68
(a=0.35, b=0.50, c=0.10, d=0.05)
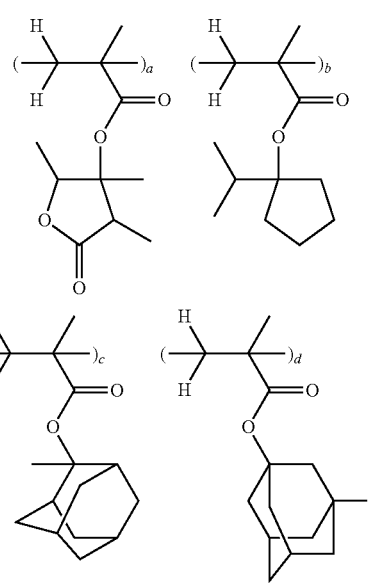
Polymer 9
Mw=8,500
Mw/Mn=1.63
(a=0.25, b=0.45, c=0.20, d=0.05, e=0.05)
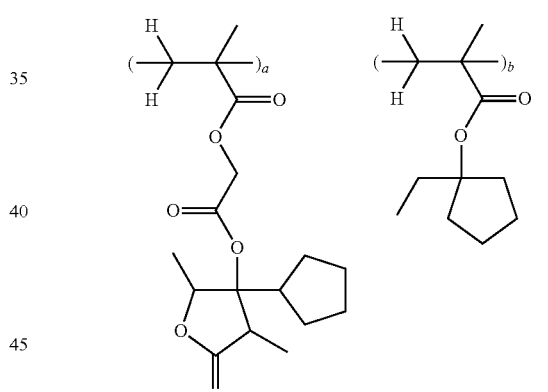
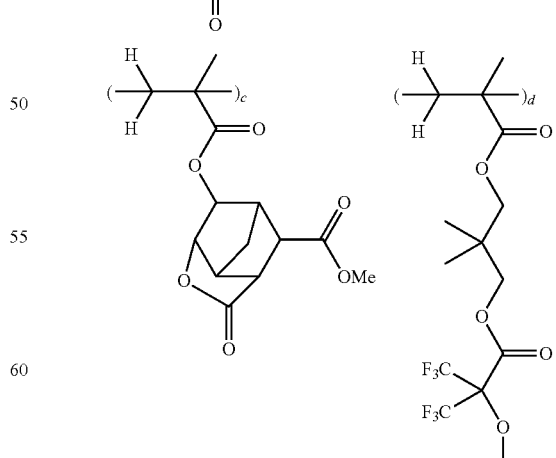

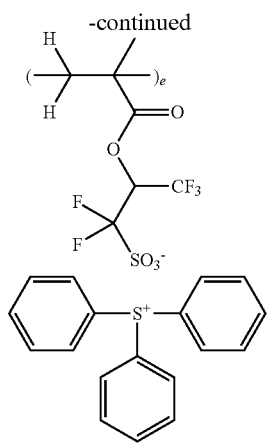
Polymer 10
 Mw=8,800
 Mw/Mn=1.54
 (a=0.25, b=0.35, c=0.10, d=0.20, e=0.10)
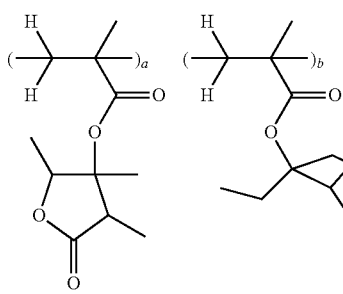
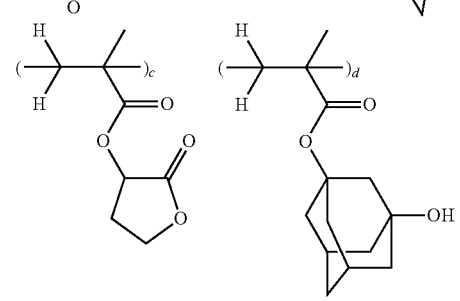
Polymer 12
 Mw=9,300
 Mw/Mn=1.64
 (a=0.30, b=0.40, c=0.20, d=0.10)
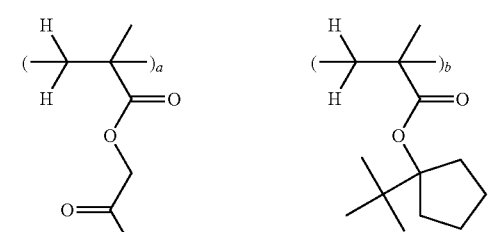
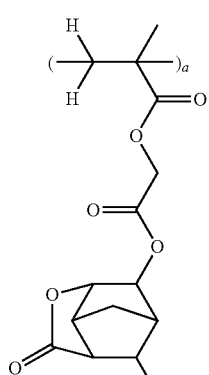
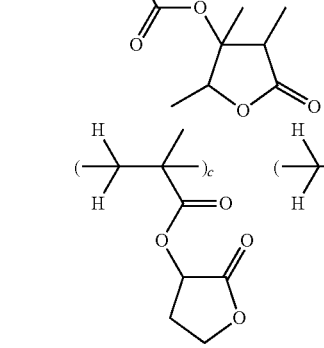
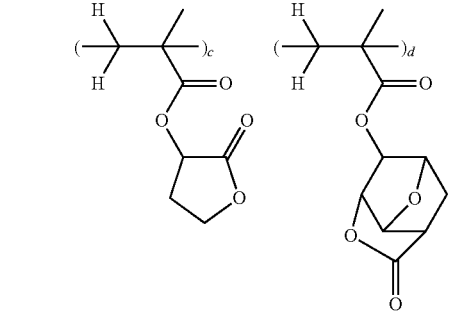
Polymer 11
 Mw=8,800
 Mw/Mn=1.61
 (a=0.35, b=0.35, c=0.20, d=0.10)
Polymer 13
 Mw=8,800
 Mw/Mn=1.57
 (a=0.25, b=0.30, c=0.15, d=0.20, e=0.10)

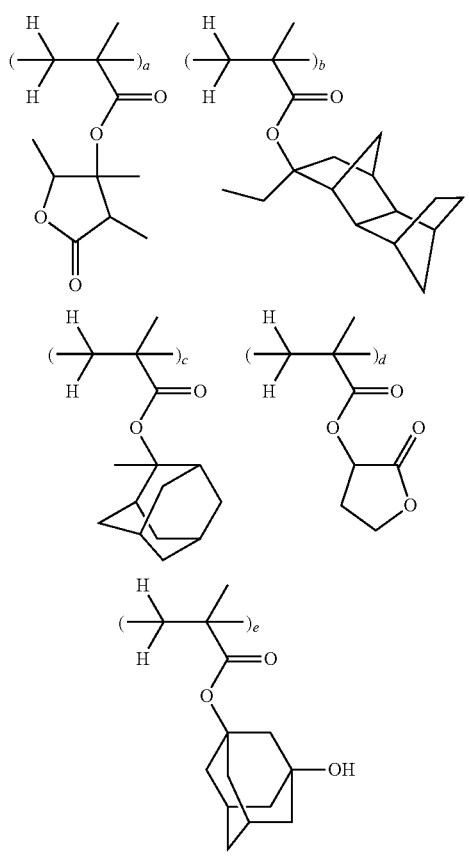
Polymer 14
 Mw=9,500
 Mw/Mn=1.64
 (a=0.25, b=0.20, c=0.25, d=0.20, e=0.10)
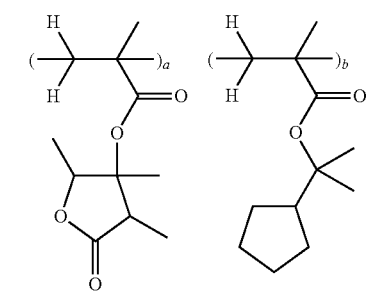
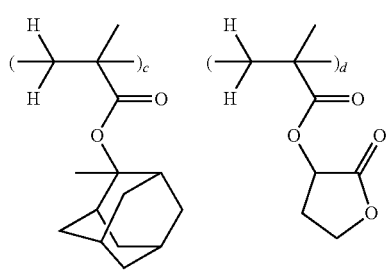
-continued
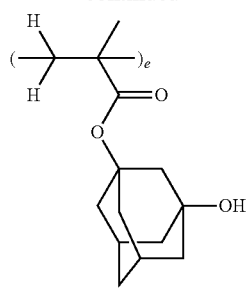
Comparative Polymer 1
 Mw=8,600
 Mw/Mn=1.53
 (a=0.35, b=0.35, c=0.20, d=0.10)
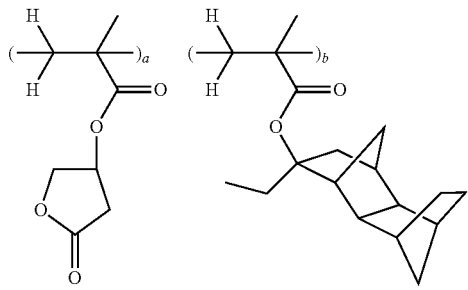
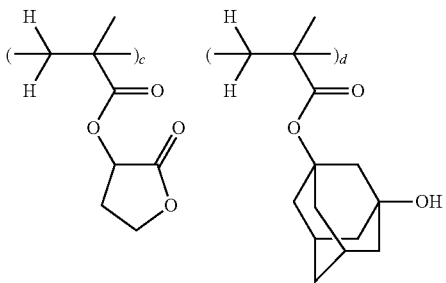
Comparative Polymer 2
 Mw=8,400
 Mw/Mn=1.60
 (a=0.35, b=0.35, c=0.20, d=0.10)
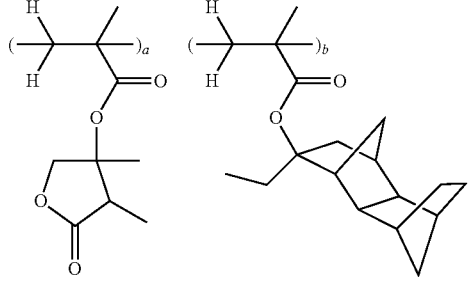

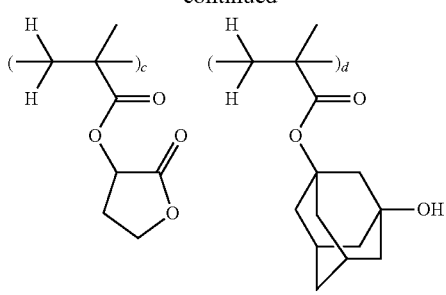
Comparative Polymer 3
Mw=8,800
Mw/Mn=1.66
(a=0.35, b=0.35, c=0.20, d=0.10)
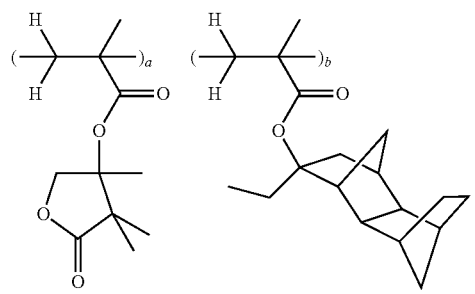
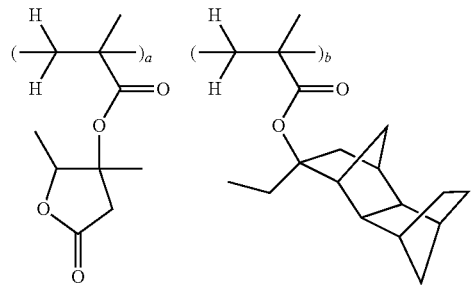
Comparative Polymer 4
Mw=8,600
Mw/Mn=1.59
(a=0.35, b=0.35, c=0.20, d=0.10)
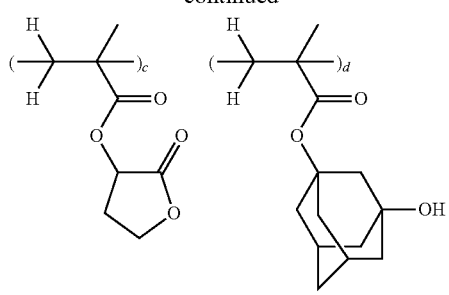
Comparative Polymer 5
Mw=8,300
Mw/Mn=1.53
(a=0.55, b=0.35, c=0.10)
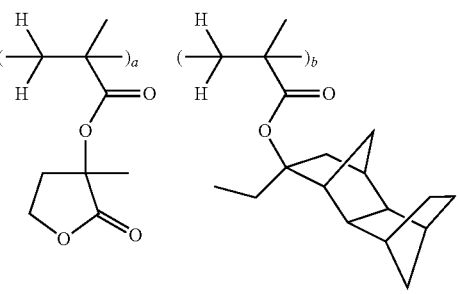
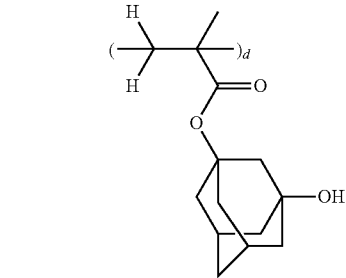
Comparative Polymer 6
Mw=8,900
Mw/Mn=1.61
(a=0.35, b=0.35, c=0.20, d=0.10)
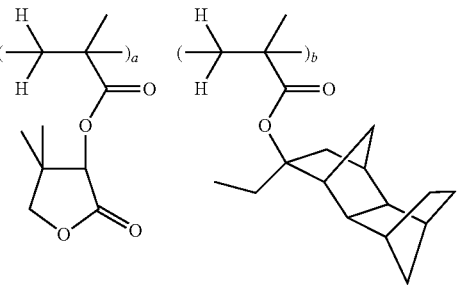

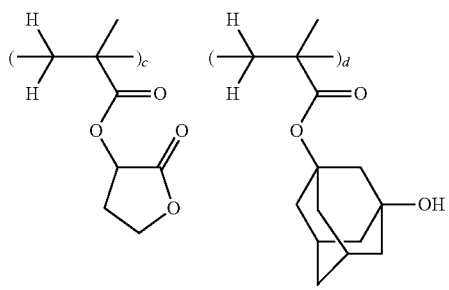

Comparative Polymer 7
  Mw=8,300
  Mw/Mn=1.59
  (a=0.35, b=0.35, c=0.20, d=0.10)

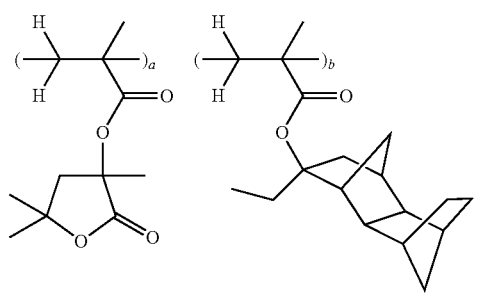

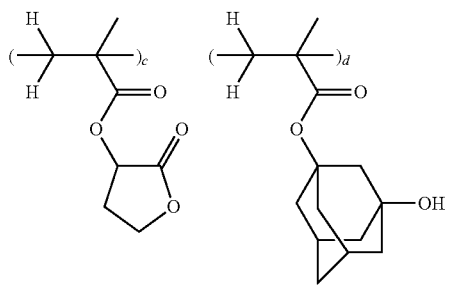

Photoacid generator: PAG-1 to 5 shown below

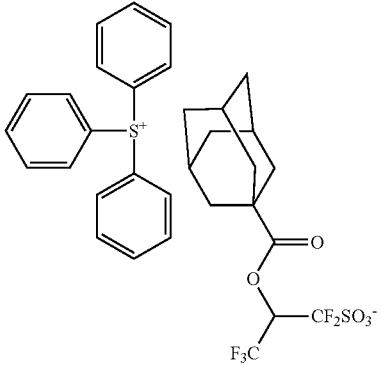

PAG-1

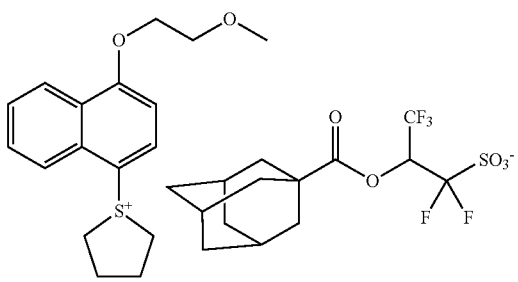

PAG-2

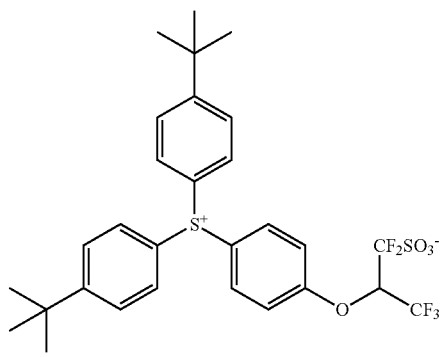

PAG-3

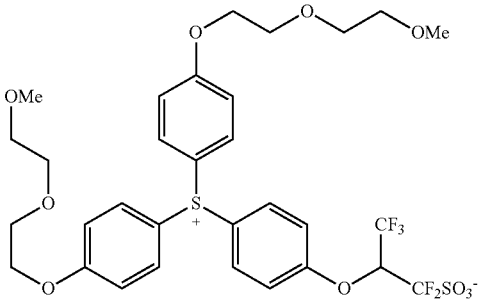

PAG-4

Examples 1-1 to 1-17 and Comparative Examples 1-1 to 1-9

Preparation of Resist Composition

Resist compositions R-1 to B-26 in solution form were prepared by dissolving a polymer (Polymers 1 to 14 or Comparative Polymers 1 to 7) as base resin, photoacid generator, water-repellent polymer, and quencher in a solvent in accordance with the formulation of Tables 1 and 2 and filtering through a Teflon® filter with a pore size of 0.2 μm. The photoacid generator (PAG-1 to 5), water-repellent polymer (SF-1, 2), quencher (Q-1 to 5), and solvent used herein are identified below.

PAG-5
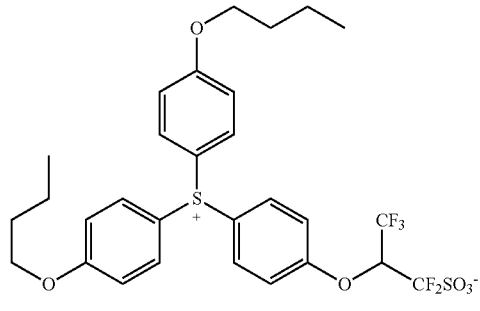
Water-repellent polymer: SF-1 and 2 shown below
SF-1
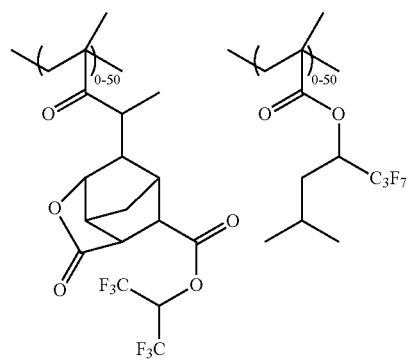
Mw = 7,500
Mw/Mn = 1.52
SF-2
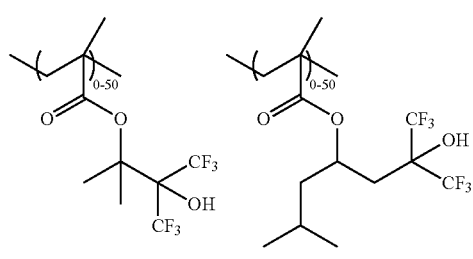
Mw = 8,800
Mw/Mn = 1.87
Quencher: Q-1 to 5 shown below
Q-1
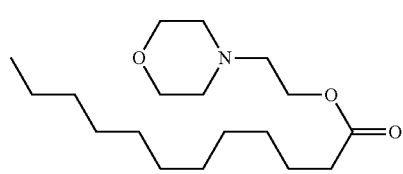
Q-2
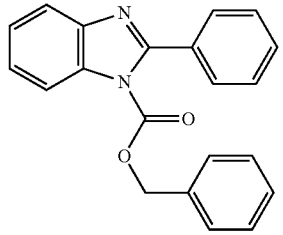
Q-3
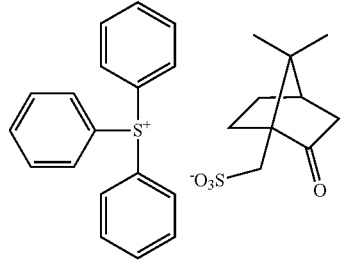
Q-4
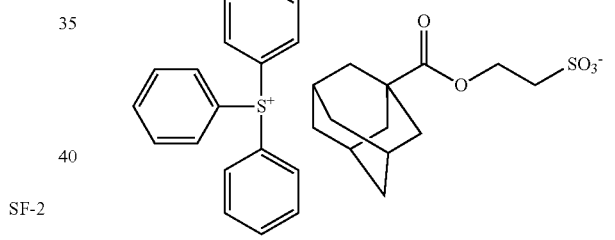
Q-5
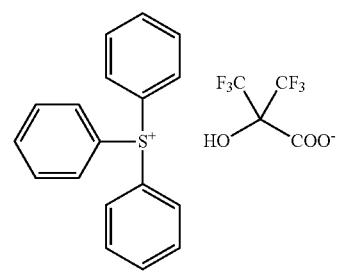
Organic solvent:
    PGMEA (propylene glycol monomethyl ether acetate)
    GBL (γ-butyrolactone)
    PGME (propylene glycol monomethyl ether)

TABLE 1

|  |  | Resist | Resin (pbw) | PAG (pbw) | Quencher (pbw) | Water-repellent polymer (pbw) | Solvent (pbw) |
|---|---|---|---|---|---|---|---|
| Example | 1-1 | R-1 | Polymer 1 (100) | PAG-1 (8.0) | Q-4 (1.5) | SF-1 (6.0) | PGMEA (2,000) GBL (500) |
|  | 1-2 | R-2 | Polymer 2 (100) | PAG-3 (8.0) | Q-5 (1.5) | SF-1 (6.0) | PGMEA (2,000) GBL (500) |
|  | 1-3 | R-3 | Polymer 3 (100) | PAG-4 (8.0) | Q-5 (1.5) | SF-2 (6.0) | PGMEA (2,000) GBL (500) |
|  | 1-4 | R-4 | Polymer 4 (100) | PAG-5 (8.0) | Q-3 (1.5) | SF-2 (6.0) | PGMEA (2,000) GBL (500) |
|  | 1-5 | R-5 | Polymer 5 (100) | PAG-4 (8.0) | Q-5 (1.5) | SF-1 (6.0) | PGMEA (2,000) GBL (500) |
|  | 1-6 | R-6 | Polymer 6 (100) | PAG-3 (8.0) | Q-5 (1.5) | SF-1 (6.0) | PGMEA (2,000) GBL (500) |
|  | 1-7 | R-7 | Polymer 7 (100) | PAG-2 (10.0) | Q-3 (1.5) | SF-1 (6.0) | PGMEA (2,000) GBL (500) |
|  | 1-8 | R-8 | Polymer 8 (100) | PAG-2 (10.0) | Q-1 (1.0) Q-4 (1.0) | SF-1 (6.0) | PGMEA (2,000) GBL (500) |
|  | 1-9 | R-9 | Polymer 9 (100) | — | Q-2 (1.5) | — | PGMEA (500) GBL (1,450) PGME (50) |
|  | 1-10 | R-10 | Polymer 10 (100) | PAG-3 (8.0) | Q-5 (1.5) | SF-2 (6.0) | PGMEA (2,000) GBL (500) |
|  | 1-11 | R-11 | Polymer 11 (100) | PAG-5 (8.0) | Q-5 (1.5) | SF-1 (6.0) | PGMEA (2,000) GBL (500) |
|  | 1-12 | R-12 | Polymer 12 (100) | PAG-3 (8.0) | Q-4 (1.5) | SF-1 (6.0) | PGMEA (2,000) GBL (500) |
|  | 1-13 | R-13 | Polymer 13 (100) | PAG-3 (8.0) | Q-5 (1.5) | SF-2 (6.0) | PGMEA (2,000) GBL (500) |
|  | 1-14 | R-14 | Polymer 1 (100) | PAG-4 (8.0) | Q-4 (1.5) | SF-1 (6.0) | PGMEA (2,000) GBL (500) |
|  | 1-15 | R-15 | Polymer 7 (100) | PAG-5 (8.0) | Q-3 (1.5) | SF-1 (6.0) | PGMEA (2,000) GBL (500) |
|  | 1-16 | R-16 | Polymer 8 (100) | PAG-4 (8.0) | Q-1 (1.0) Q-4 (1.0) | SF-1 (6.0) | PGMEA (2,000) GBL (500) |
|  | 1-17 | R-17 | Polymer 14 (100) | PAG-1 (8.0) | Q-1 (1.5) | SF-1 (6.0) | PGMEA (2,000) GBL (500) |

TABLE 2

|  |  | Resist | Resin (pbw) | PAG (pbw) | Quencher (pbw) | Water-repellent polymer (pbw) | Solvent (pbw) |
|---|---|---|---|---|---|---|---|
| Comparative Example | 1-1 | R-18 | Comparative Polymer 1 (100) | PAG-5 (8.0) | Q-5 (1.5) | SF-1 (6.0) | PGMEA (2,000) GBL (500) |
|  | 1-2 | R-19 | Comparative Polymer 2 (100) | PAG-5 (8.0) | Q-5 (1.5) | SF-1 (6.0) | PGMEA (2,000) GBL (500) |
|  | 1-3 | R-20 | Comparative Polymer 3 (100) | PAG-5 (8.0) | Q-5 (1.5) | SF-1 (6.0) | PGMEA (2,000) GBL (500) |
|  | 1-4 | R-21 | Comparative Polymer 4 (100) | PAG-5 (10.0) | Q-5 (1.0) | SF-1 (6.0) | PGMEA (2,000) GBL (500) |
|  | 1-5 | R-22 | Comparative Polymer 5 (100) | PAG-5 (8.0) | Q-5 (1.5) | SF-1 (6.0) | PGMEA (2,000) GBL (500) |
|  | 1-6 | R-23 | Comparative Polymer 6 (100) | PAG-5 (8.0) | Q-5 (1.5) | SF-1 (6.0) | PGMEA (2,000) GBL (500) |
|  | 1-7 | R-24 | Comparative Polymer 7 (100) | PAG-5 (8.0) | Q-5 (1.5) | SF-1 (6.0) | PGMEA (2,000) GBL (500) |

TABLE 2-continued

| | Resist | Resin (pbw) | PAG (pbw) | Quencher (pbw) | Water-repellent polymer (pbw) | Solvent (pbw) |
|---|---|---|---|---|---|---|
| 1-8 | R-25 | Polymer 5 (100) | PAG-1 (8.0) | Q-5 (1.5) | SF-1 (6.0) | PGMEA (2,000) GBL (500) |
| 1-9 | R-26 | Polymer 5 (100) | PAG-2 (10.0) | Q-5 (1.5) | SF-1 (6.0) | PGMEA (2,000) GBL (500) |

Examples 2-1 to 2-17 and Comparative Examples 2-1 to 2-9

ArF Lithography Patterning Test: Evaluation of Hole Pattern

On a silicon wafer, a spin-on carbon film ODL-50 (Shin-Etsu Chemical Co., Ltd.) having a carbon content of 100% was deposited to a thickness of 200 nm and a silicon-containing spin-on hard mask SHB-A940 having a silicon content of 43 wt % was deposited thereon to a thickness of 35 nm. On this substrate for trilayer process, the resist composition (R-1 to R-17) or comparative resist composition (R-18 to R-26) shown in Tables 1 and 2 was spin coated, then baked on a hot plate at 100° C. for 60 seconds to form a resist film of 90 nm thick. Using an ArF excimer laser immersion lithography scanner NSR-610C (Nikon Corp., NA 1.30, σ 0.9/0.72, crosspole opening 35 degrees, azimuthally polarized illumination), exposure was performed through a mask while the exposure dose was varied. The mask bore a hole pattern having a hole size of 55 nm and a pitch of 100 nm (after reduction projection). After the exposure, the wafer was baked (PEB) at the temperature shown in Tables 3 and 4 for 60 seconds and developed. Specifically, the developer shown in Tables 3 and 4 was injected from a development nozzle while the wafer was spun at 30 rpm for 3 seconds, which was followed by stationary puddle development for 27 seconds. The wafer was rinsed with 4-methyl-2-pentanol, spin dried, and baked at 100° C. for 20 seconds to evaporate off the rinse liquid. There was obtained a hole pattern having a hole diameter of 50 nm.

Hole Size Variation (Unit: nm)

The hole pattern was observed under TDSEM (CG-4000 by Hitachi High-Technologies Ltd.). The diameter of 125 holes was measured, from which a 3-fold value (3σ) of standard variation (σ) was computed and reported as hole size variation. A smaller value of 3σ indicates a pattern having a multiplicity of holes with a less size variation.

Roundness (Unit: nm)

Also under SEM observation, the distance from the center to the periphery of 25 holes was measured in 24 directions, from which a 3-fold value (3σ) of standard deviation (σ) was determined and reported as roundness. A smaller value of 3σ indicates a pattern having a multiplicity of holes with higher roundness.

Mask Error Factor (MEF)

At the exposure dose corresponding to a hole pattern with diameter 50 nm, a hole pattern having a pitch of 100 nm was printed through a mask pattern providing a hole pattern size of 53 nm, 54 nm, 56 nm, or 57 nm (after reduction projection). The hole pattern was observed under TDSEM CG-4000 and the diameter of holes was measured. A straight line was drawn by plotting the hole pattern size (nm) after reduction projection on the abscissa and the diameter of holes in the resist film via each mask pattern on the ordinate, before the slope of the straight line was determined and reported as MEF. A value of MEF closer to unity (1) indicates better mask reproduction.

For the resist compositions shown in Table 1, the PEB temperature, developer used and evaluation results are shown in Table 3. For the comparative resist compositions shown in Table 2, the PEB temperature, developer used and evaluation results are shown in Table 4.

TABLE 3

| | | Resist | PEB temp. (° C.) | Developer | Hole size variation (nm) | Roundness (nm) | MEF (nm) |
|---|---|---|---|---|---|---|---|
| Example | 2-1 | R-1 | 90 | n-butyl acetate | 3.7 | 1.9 | 3.6 |
| | 2-2 | R-2 | 115 | n-butyl acetate | 3.6 | 1.7 | 3.1 |
| | 2-3 | R-3 | 95 | n-butyl acetate | 4.0 | 2.0 | 3.2 |
| | 2-4 | R-4 | 90 | n-butyl acetate | 4.1 | 1.9 | 3.4 |
| | 2-5 | R-5 | 110 | 2-heptanone | 3.9 | 2.0 | 3.3 |
| | 2-6 | R-6 | 90 | n-butyl acetate | 3.7 | 1.7 | 3.0 |
| | 2-7 | R-7 | 90 | 2-heptanone | 4.0 | 1.8 | 3.4 |
| | 2-8 | R-8 | 95 | 2-heptanone | 3.9 | 2.0 | 3.3 |
| | 2-9 | R-9 | 105 | n-butyl acetate | 3.7 | 2.0 | 2.9 |
| | 2-10 | R-10 | 100 | n-butyl acetate | 3.6 | 1.6 | 3.0 |
| | 2-11 | R-11 | 95 | n-butyl acetate | 3.4 | 1.7 | 2.9 |
| | 2-12 | R-12 | 95 | n-butyl acetate | 3.7 | 1.9 | 3.1 |
| | 2-13 | R-13 | 100 | n-butyl acetate | 3.3 | 1.6 | 2.8 |
| | 2-14 | R-14 | 90 | n-butyl acetate | 3.5 | 1.7 | 3.2 |
| | 2-15 | R-15 | 90 | 2-heptanone | 3.8 | 1.9 | 3.1 |
| | 2-16 | R-16 | 95 | 2-heptanone | 3.7 | 2.1 | 3.1 |
| | 2-17 | R-17 | 95 | n-butyl acetate | 3.8 | 2.0 | 3.0 |

TABLE 4

| | Resist | PEB temp. (° C.) | Developer | Hole size variation (nm) | Roundness (nm) | MEF (nm) |
|---|---|---|---|---|---|---|
| Comparative Example | 2-1 R-18 | 95 | n-butyl acetate | 4.1 | 2.2 | 3.8 |
| | 2-2 R-19 | 95 | n-butyl acetate | 4.0 | 2.1 | 3.6 |
| | 2-3 R-20 | 95 | n-butyl acetate | 4.2 | 2.0 | 3.7 |
| | 2-4 R-21 | 95 | n-butyl acetate | 4.1 | 2.1 | 3.6 |
| | 2-5 R-22 | 95 | n-butyl acetate | 4.3 | 2.3 | 3.5 |
| | 2-6 R-23 | 95 | n-butyl acetate | 4.3 | 2.1 | 3.4 |
| | 2-7 R-24 | 100 | n-butyl acetate | 4.4 | 2.0 | 3.5 |
| | 2-8 R-25 | 110 | 2-heptanone | 4.1 | 2.1 | 4.2 |
| | 2-9 R-26 | 110 | 2-heptanone | 4.2 | 2.0 | 4.4 |

It is evident from Tables 3 and 4 that the process for forming a negative pattern by coating a resist composition comprising a polymer comprising recurring units of formula (1), an acid generator and an organic solvent (with the proviso that the polymer further comprises acid labile group-containing recurring units of formula (2A), (2B) or (2C) in addition to recurring units of formula (1) or the composition further comprises a PAG of formula (4)) onto a substrate, baking the composition to form a resist film, exposing the resist film to high-energy radiation, PEB, and developing in an organic solvent developer to form a negative tone pattern wherein the unexposed region of resist film is dissolved and the exposed region of resist film is not dissolved, is successful in forming hole patterns having minimized size variation and improved roundness and MEF, as demonstrated by Examples 2-1 to 2-17.

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims.

Japanese Patent Application No. 2014-179953 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising (A) a polymer consisting of recurring units having the general formula (1) and recurring units containing a hydroxyadamantyl group, and optionally recurring units containing a tertiary alkyl group, acetal structure, lactone ring, lactam ring, sultone ring, carboxyl group, oxetane ring, or oxirane ring, and (B) a photoacid generator having the general formula (4):

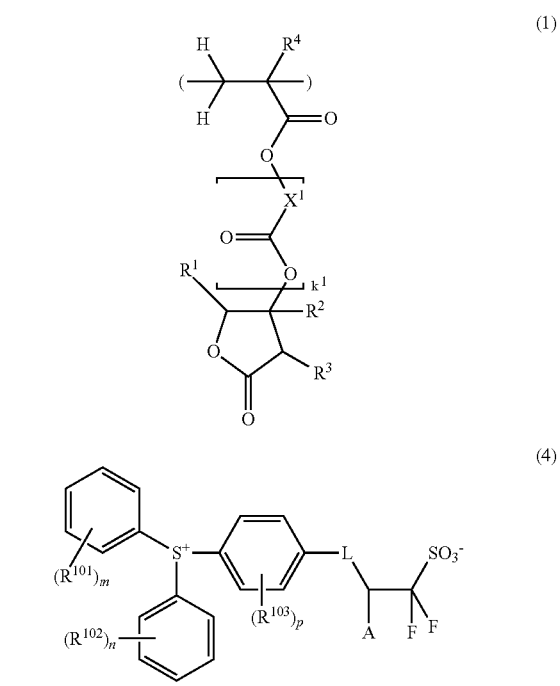

wherein $R^1$, $R^2$ and $R^3$ are each independently methyl, ethyl or a straight, branched or cyclic $C_3$-$C_{10}$ alkyl group, $R^4$ is hydrogen or methyl, $X^1$ is a $C_1$-$C_{10}$ alkylene group which may have an ether, ester, hydroxyl radical or lactone ring, or $C_6$-$C_{10}$ arylene group, $k^1$ is 0 or 1, A is hydrogen or trifluoromethyl, $R^{101}$, $R^{102}$ and $R^{103}$ are each independently hydrogen or a straight, branched or cyclic $C_1$-$C_{20}$ monovalent hydrocarbon group which may be substituted with or separated by a heteroatom, m and n each are an integer of 0 to 5, p is an integer of 0 to 4, and L is a single bond, oxygen atom or a straight, branched or cyclic $C_1$-$C_{20}$ divalent hydrocarbon group which may be substituted with or separated by a heteroatom, wherein the recurring unit containing a tertiary alkyl group is selected from the group consisting of the following formulae:

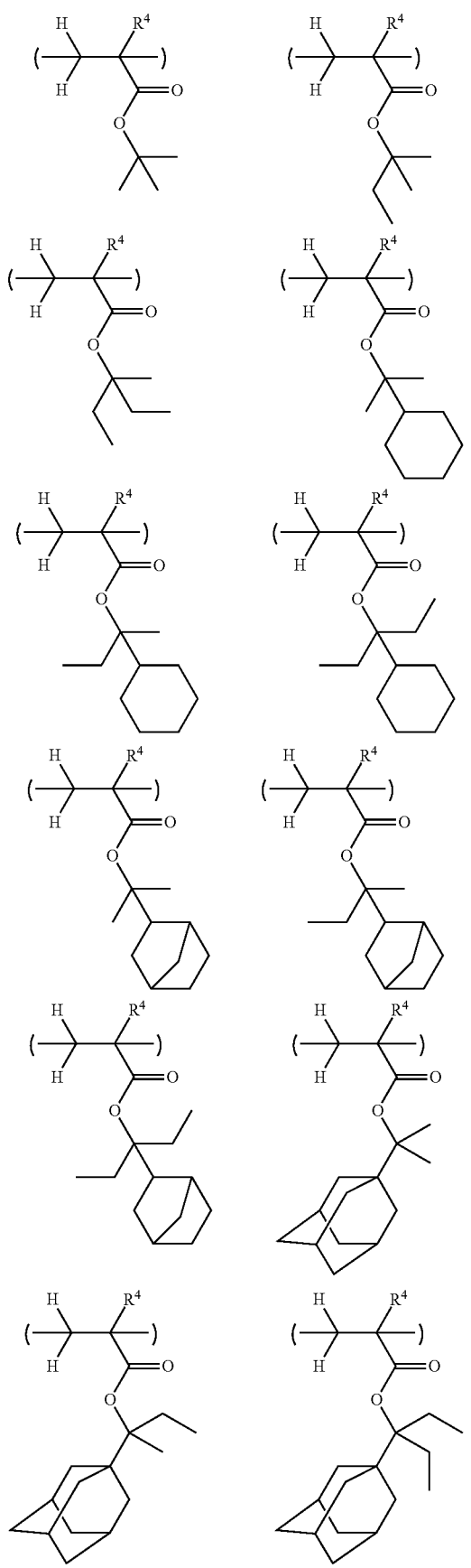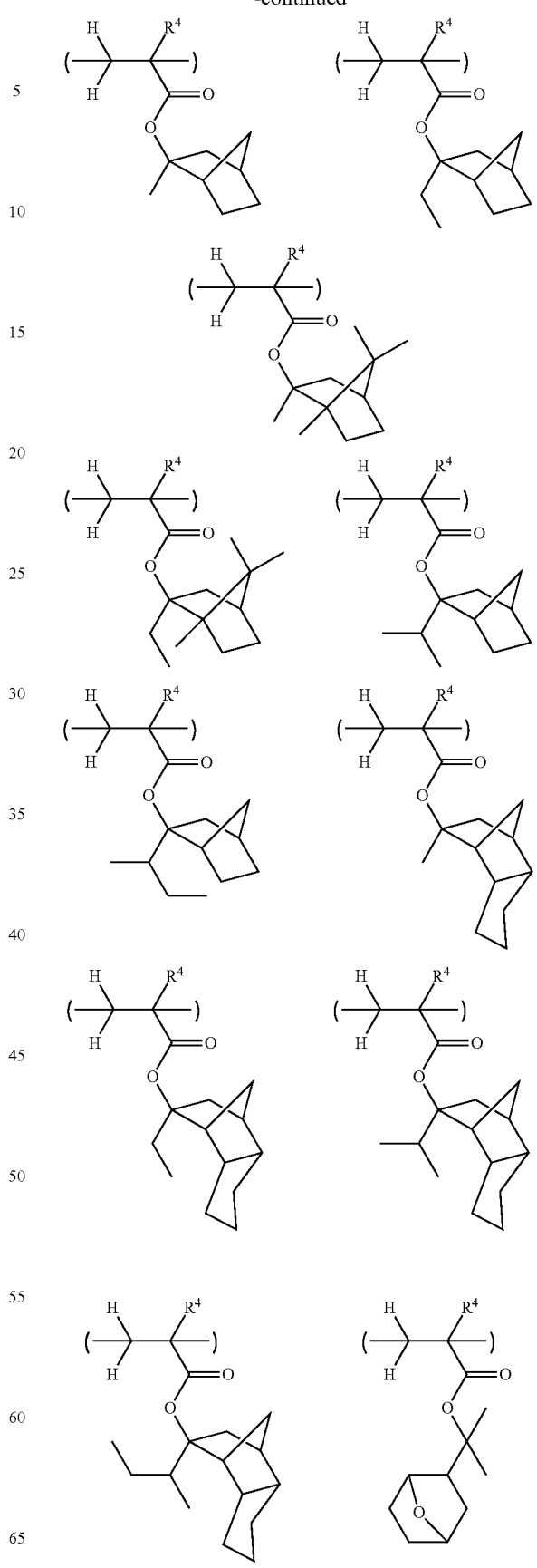

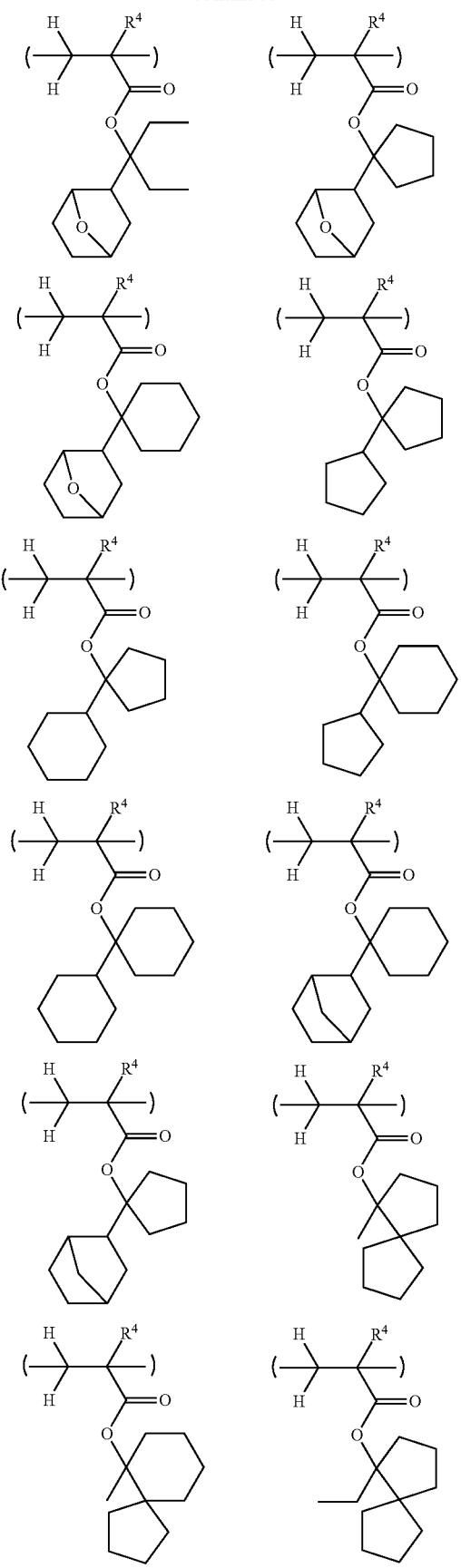
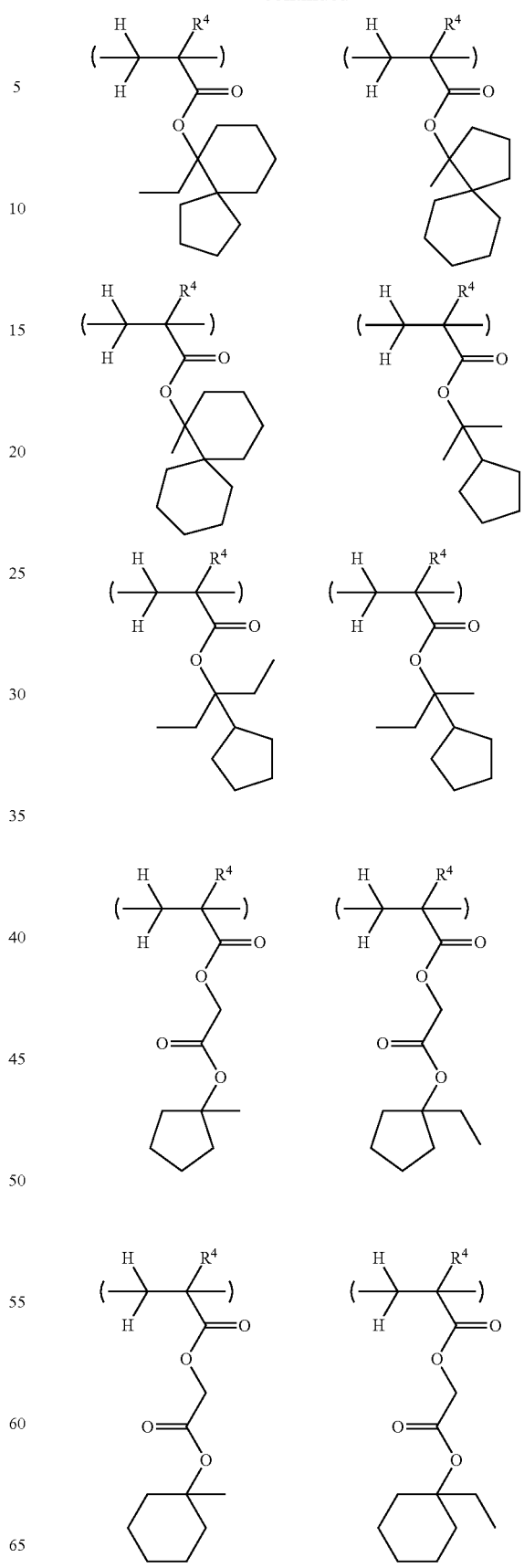

-continued
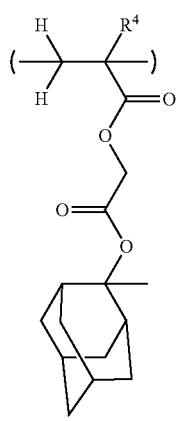 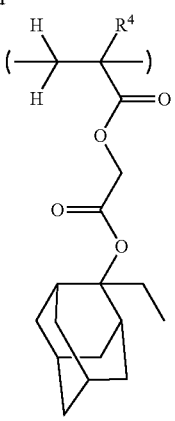
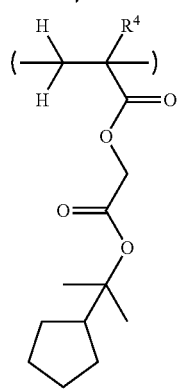 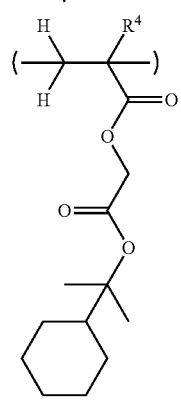
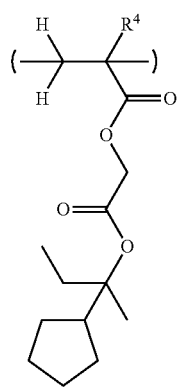 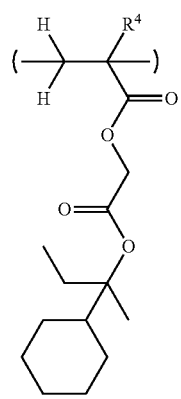
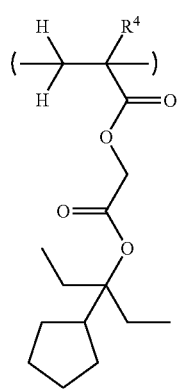 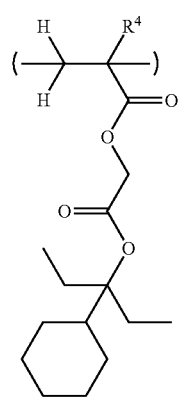
-continued
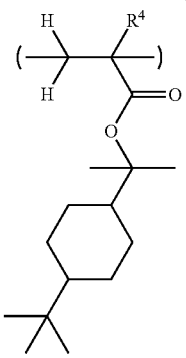 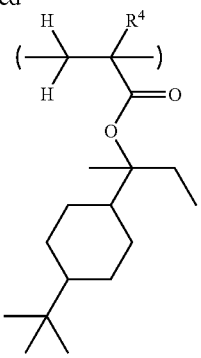
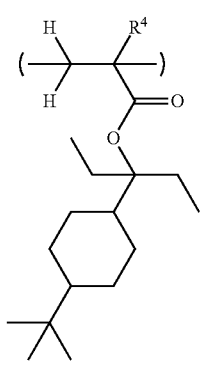 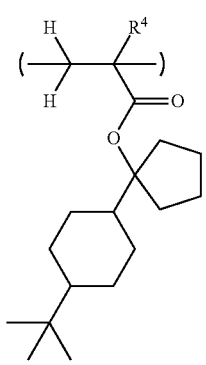
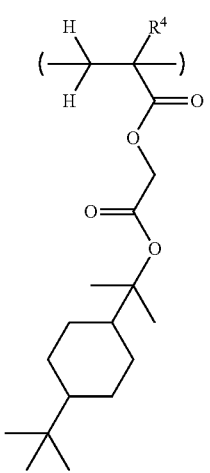 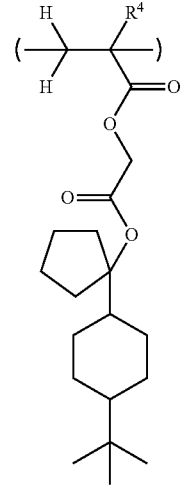
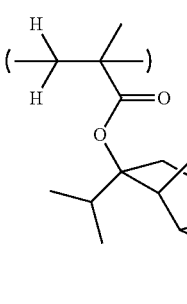

-continued

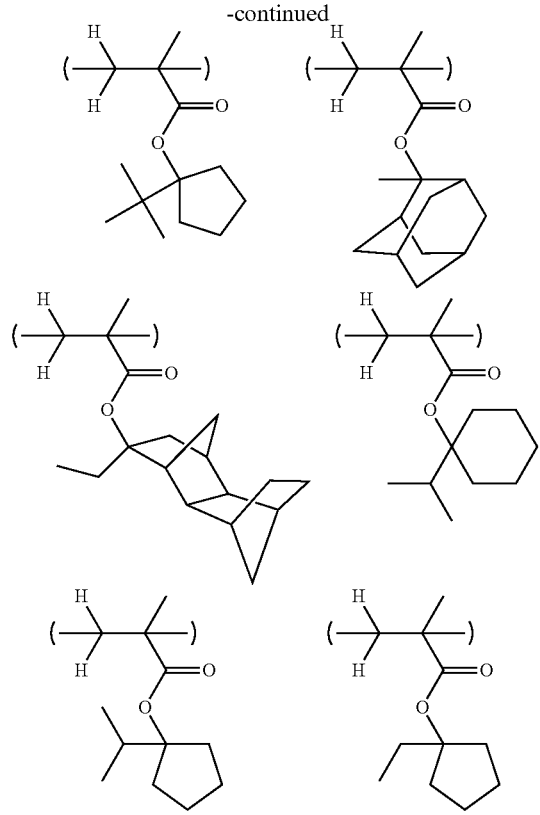

wherein R⁴ is as defined above.

2. The resist composition of claim 1 wherein the recurring unit having formula (1) is selected from the following:

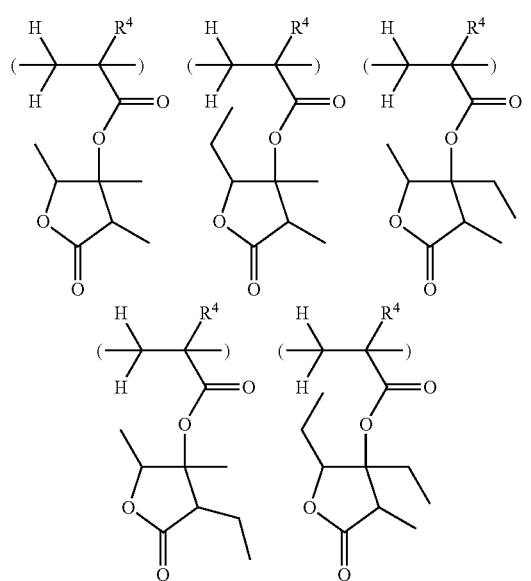

wherein R⁴ is as defined above.

3. The resist composition of claim 1 wherein k¹ is 1.

4. The resist composition of claim 1, wherein the recurring unit containing a tertiary alkyl group is selected from the group consisting of the following formulae:

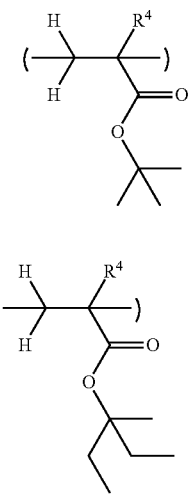
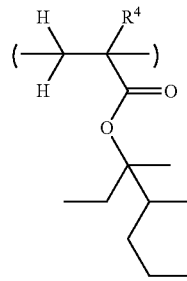
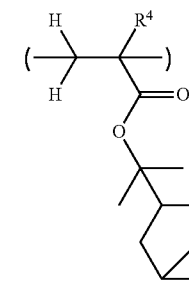
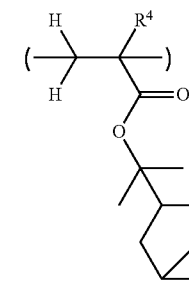
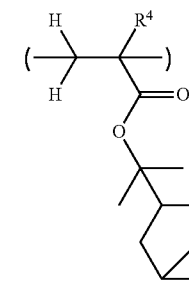
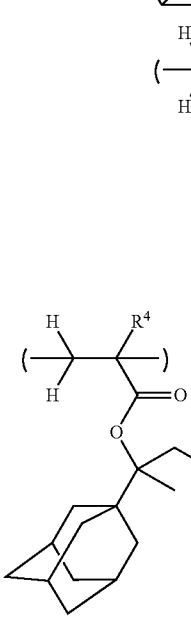

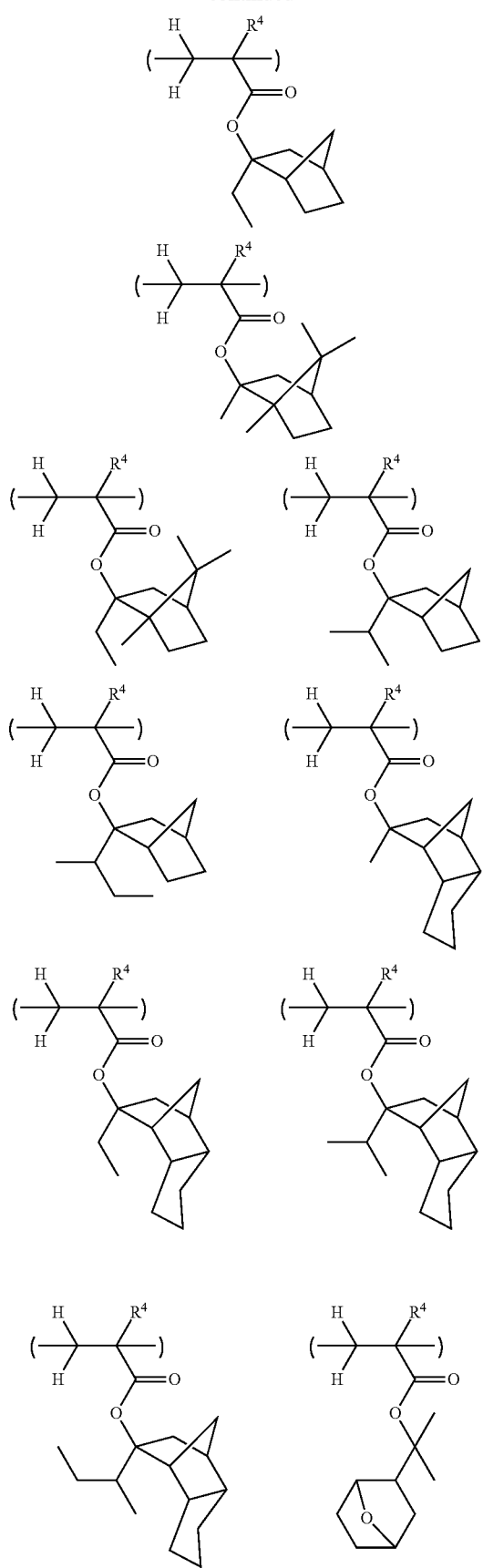
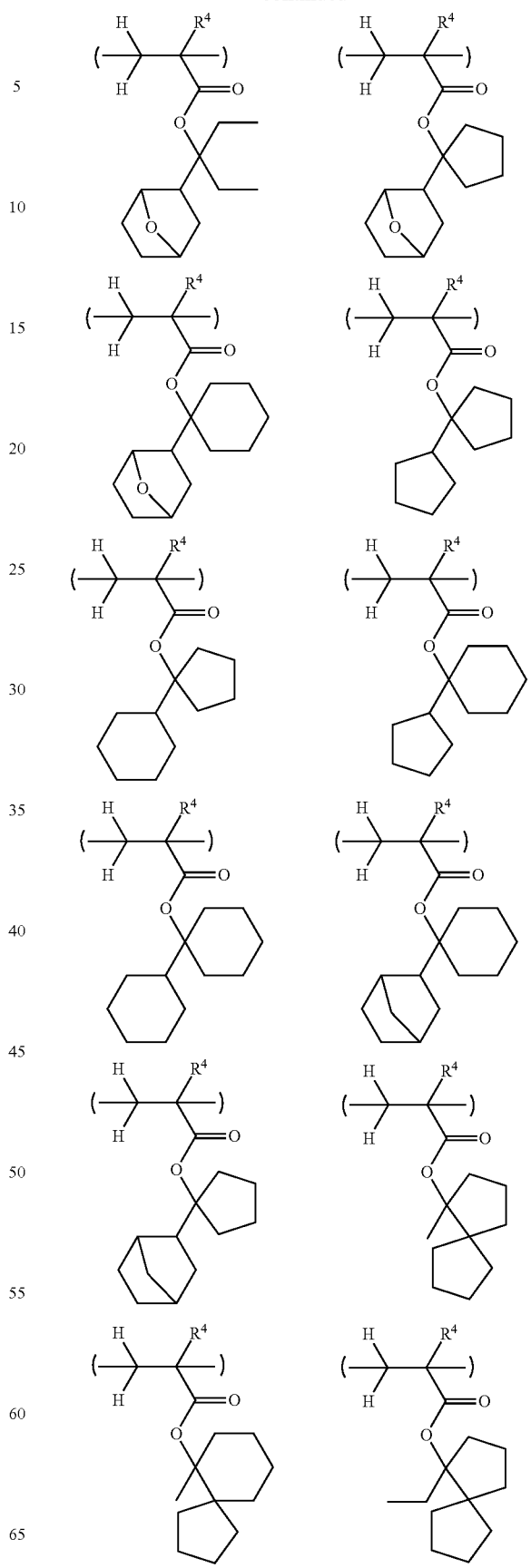

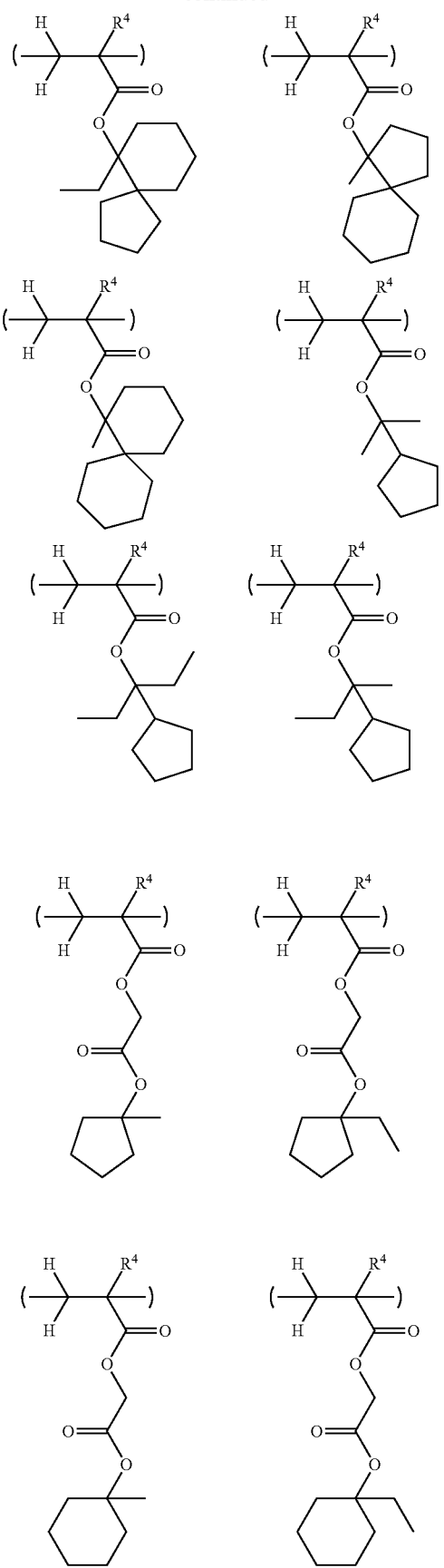
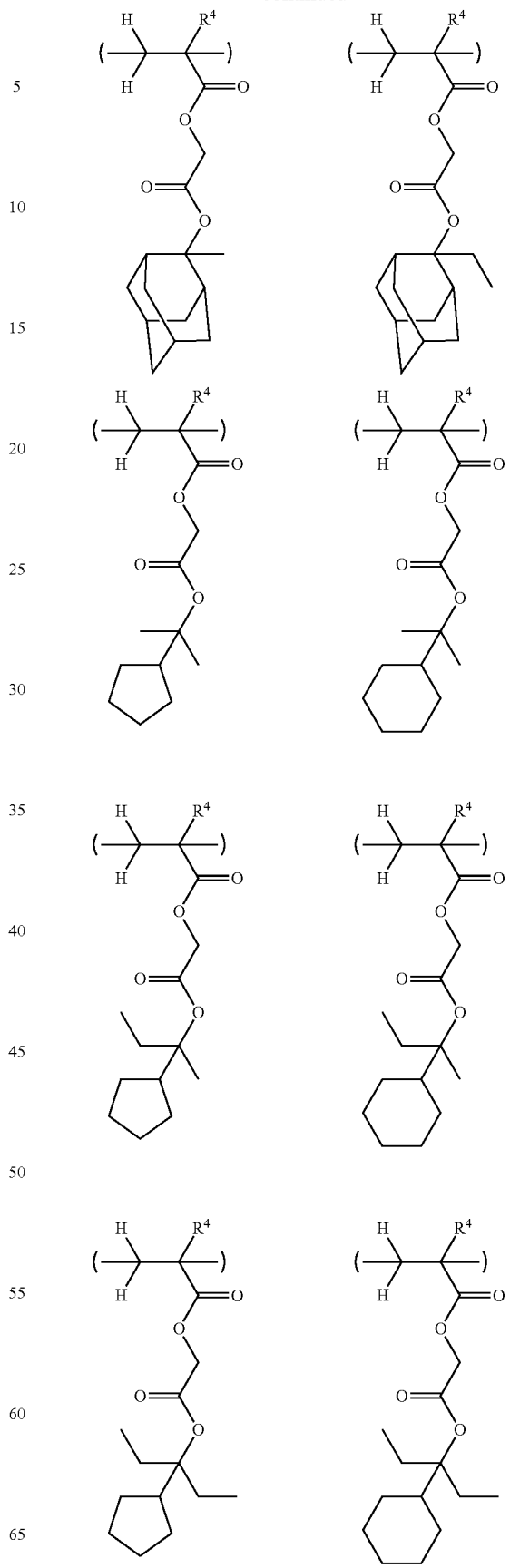

-continued

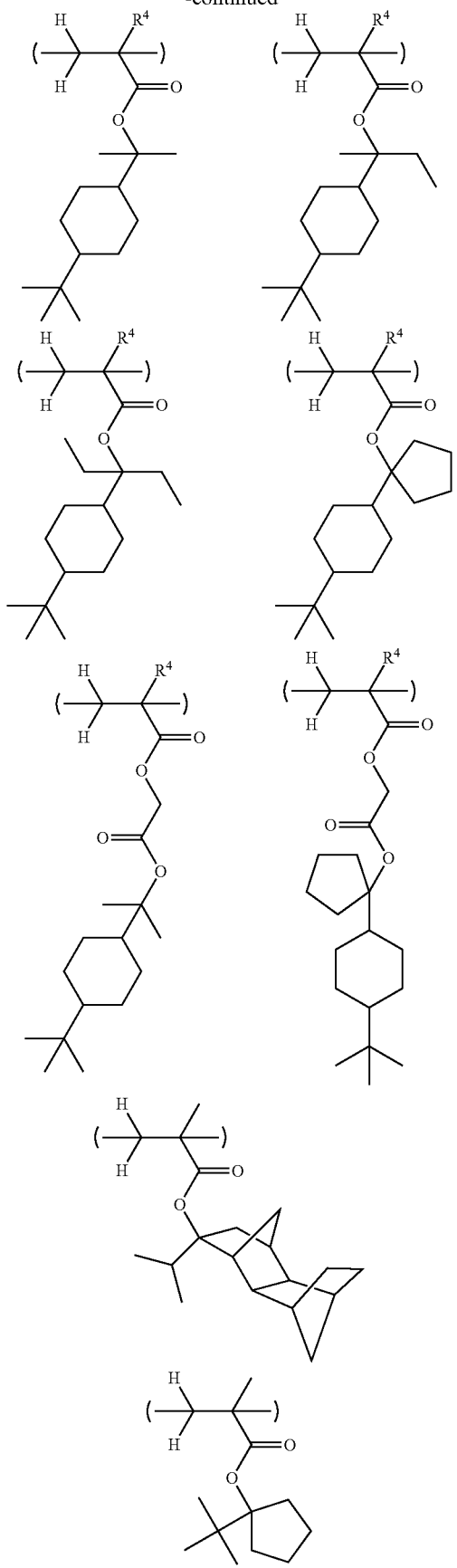

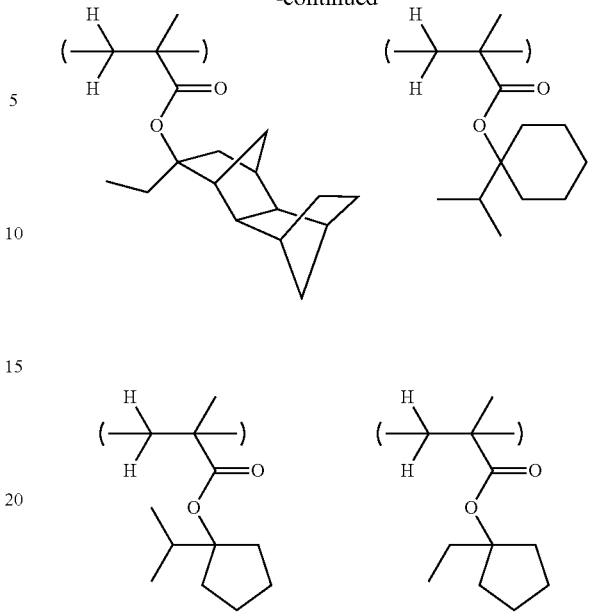

wherein $R^4$ is as defined above.

5. A pattern forming process comprising the steps of coating the resist composition of claim 1 onto a substrate, baking to form a resist film, exposing the resist film to high-energy radiation, baking, and developing the exposed film in an organic solvent-based developer to form a negative pattern wherein the unexposed region of film is dissolved away and the exposed region of film is not dissolved.

6. The process of claim 5 wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

7. The process of claim 5 wherein the step of exposing the resist film to high-energy radiation includes KrF excimer laser lithography of 248 nm wavelength, ArF excimer laser lithography of 193 nm wavelength, EUV lithography of 13.5 nm wavelength or EB lithography.

8. A resist composition comprising (A) a polymer consisting of recurring units having the general formula (1), recurring units of at least one type selected from the general formulae (2A), (2B) and (2C) and recurring units containing a hydroxyadamantyl group, and optionally recurring units containing a tertiary alkyl group, acetal structure, lactone ring, lactam ring, sultone ring, carboxyl group, oxetane ring, or oxirane ring, and (B) a photoacid generator having the general formula (4):

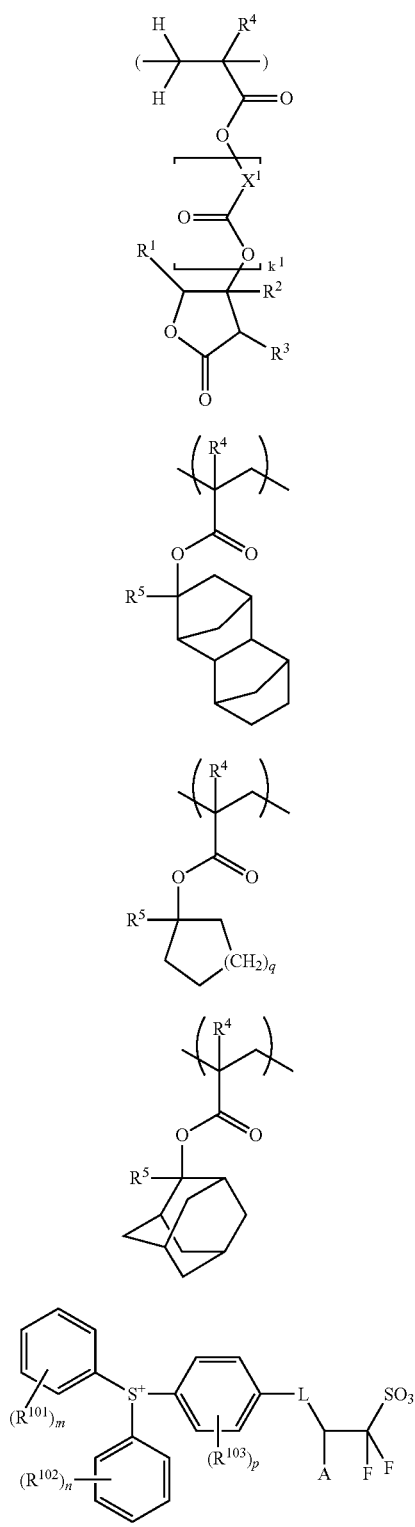

wherein $R^1$, $R^2$ and $R^3$ are each independently methyl, ethyl or a straight, branched or cyclic $C_3$-$C_{10}$ alkyl group, $R^4$ is hydrogen or methyl, $R^5$ is methyl, ethyl or a straight or branched $C_3$-$C_6$ alkyl group, $X^1$ is a $C_1$-$C_{10}$ alkylene group which may have an ether, ester, hydroxyl radical or lactone ring, or $C_6$-$C_{10}$ arylene group, $k^1$ is 0 or 1, q is 1 or 2, A is hydrogen or trifluoromethyl, $R^{101}$, $R^{102}$ and $R^{103}$ are each independently hydrogen or a straight, branched or cyclic $C_1$-$C_{20}$ monovalent hydrocarbon group which may be substituted with or separated by a heteroatom, m and n each are an integer of 0 to 5, p is an integer of 0 to 4, and L is a single bond, oxygen atom or a straight, branched or cyclic $C_1$-$C_{20}$ divalent hydrocarbon group which may be substituted with or separated by a heteroatom, wherein the recurring unit containing a tertiary alkyl group is selected from the group consisting of the following formulae:

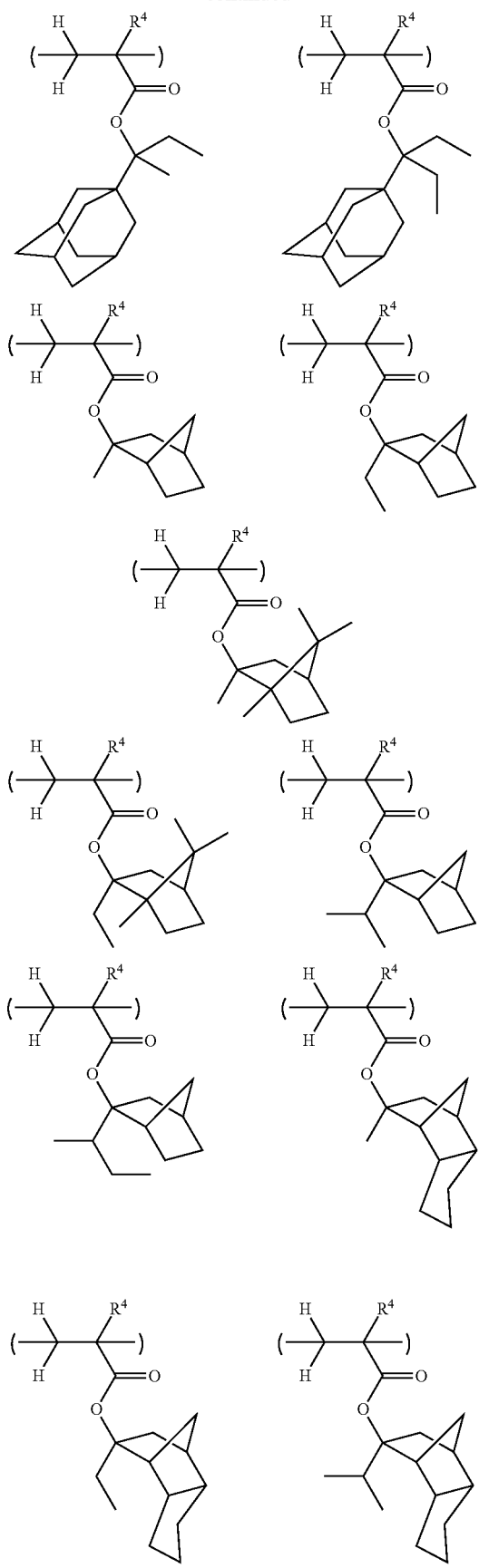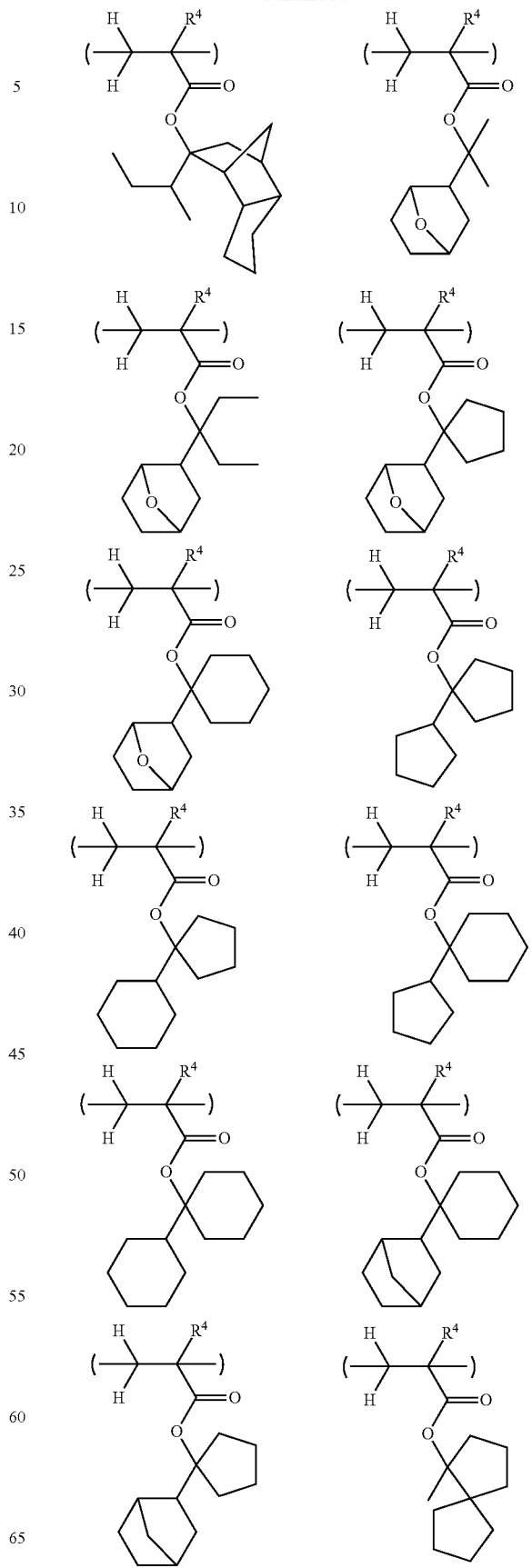

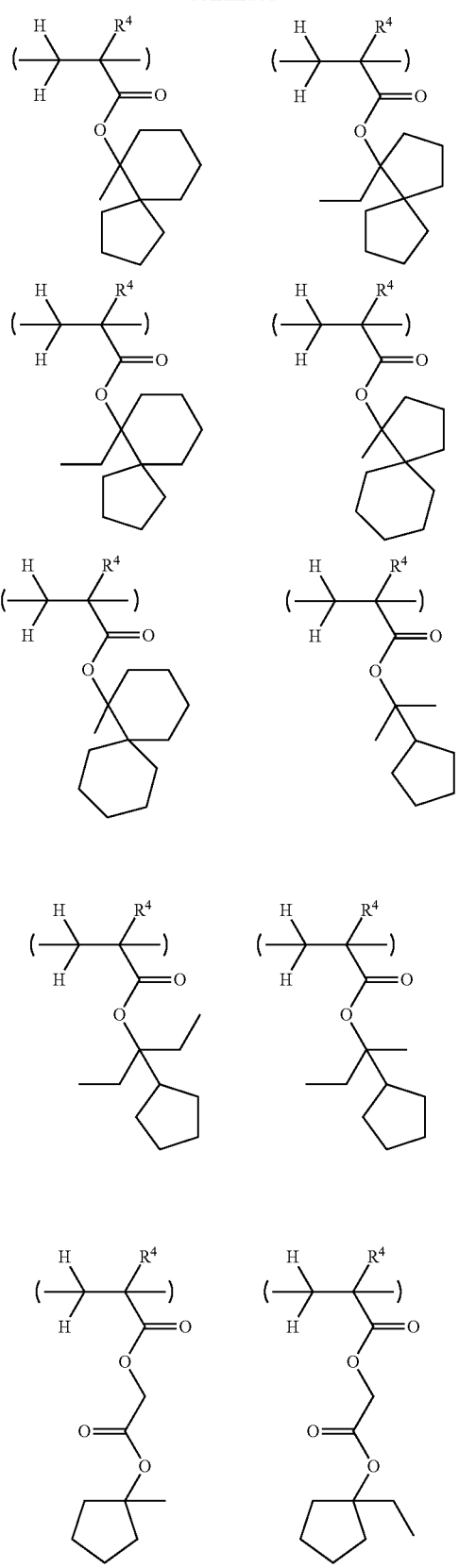
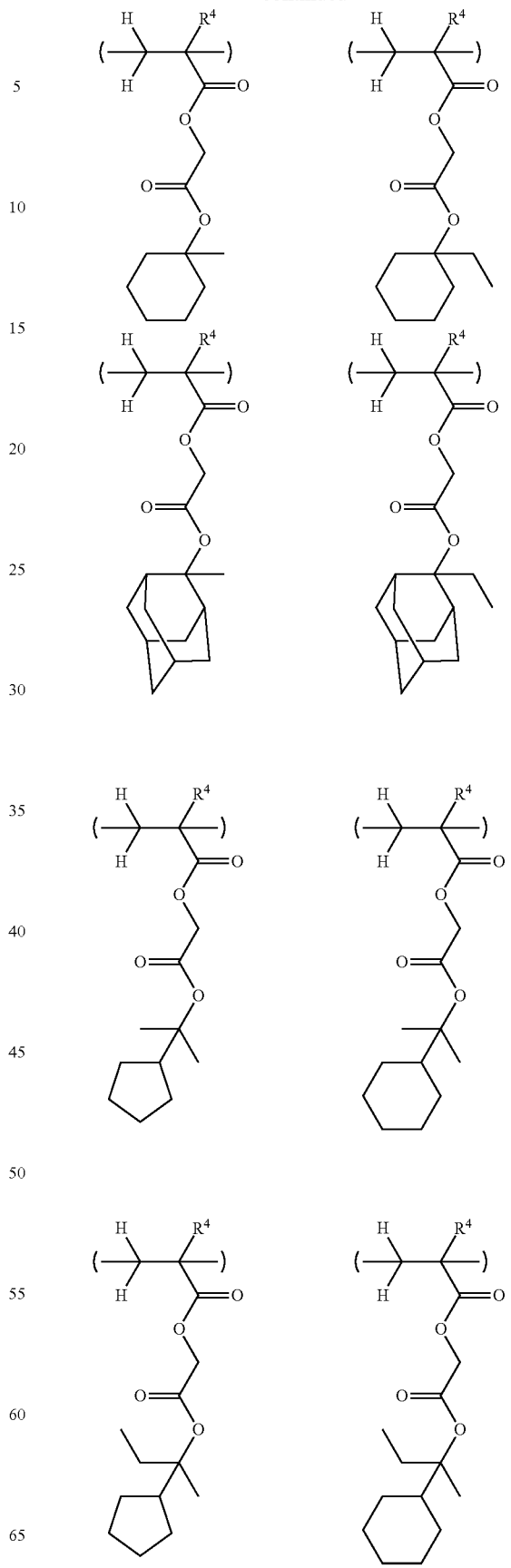

-continued
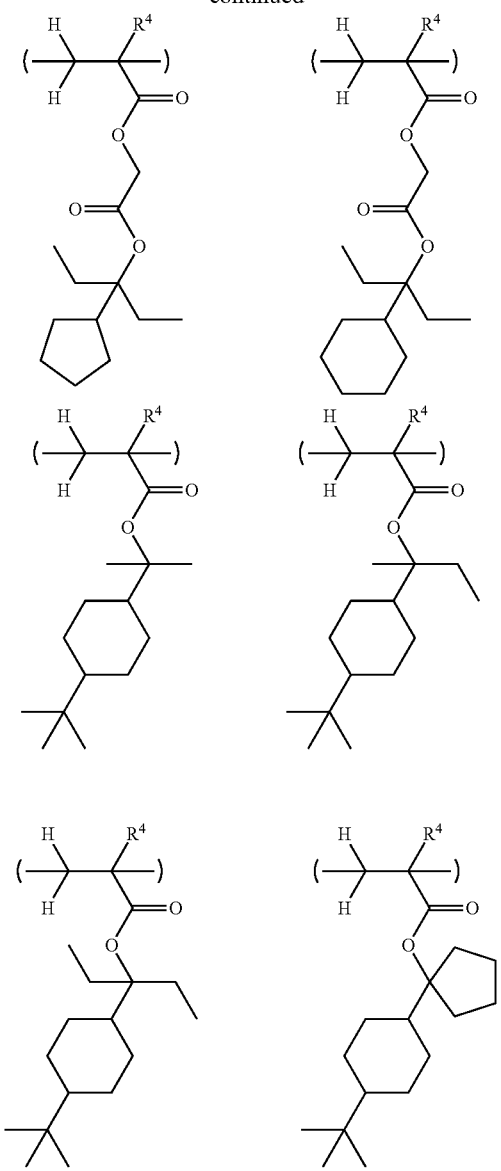
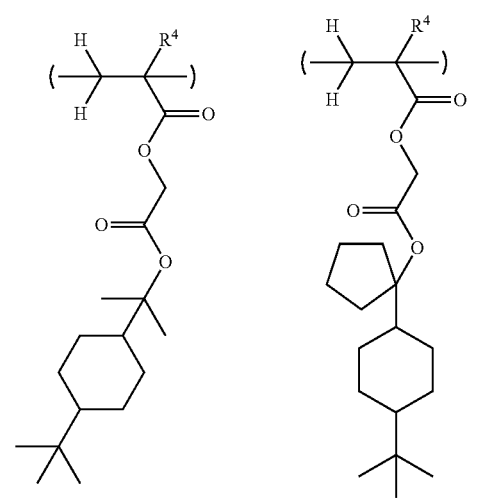
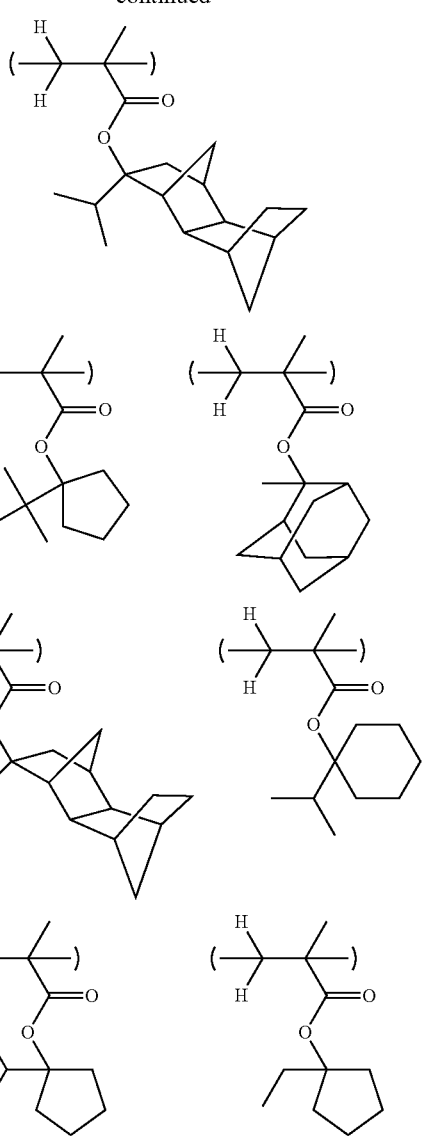
wherein R⁴ is as defined above.
9. The resist composition of claim 8 wherein $k^1$ is 1.
10. The resist composition of claim 8, wherein the recurring unit containing a tertiary alkyl group is selected from the group consisting of the following formulae:
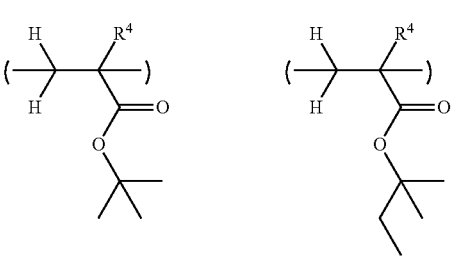

-continued
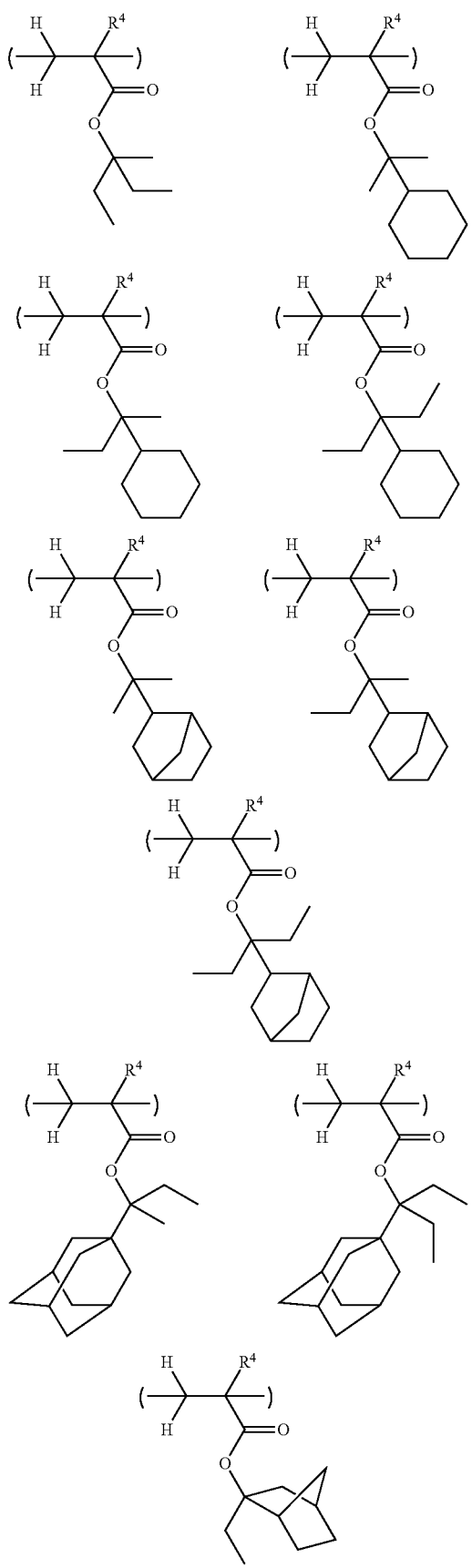
-continued
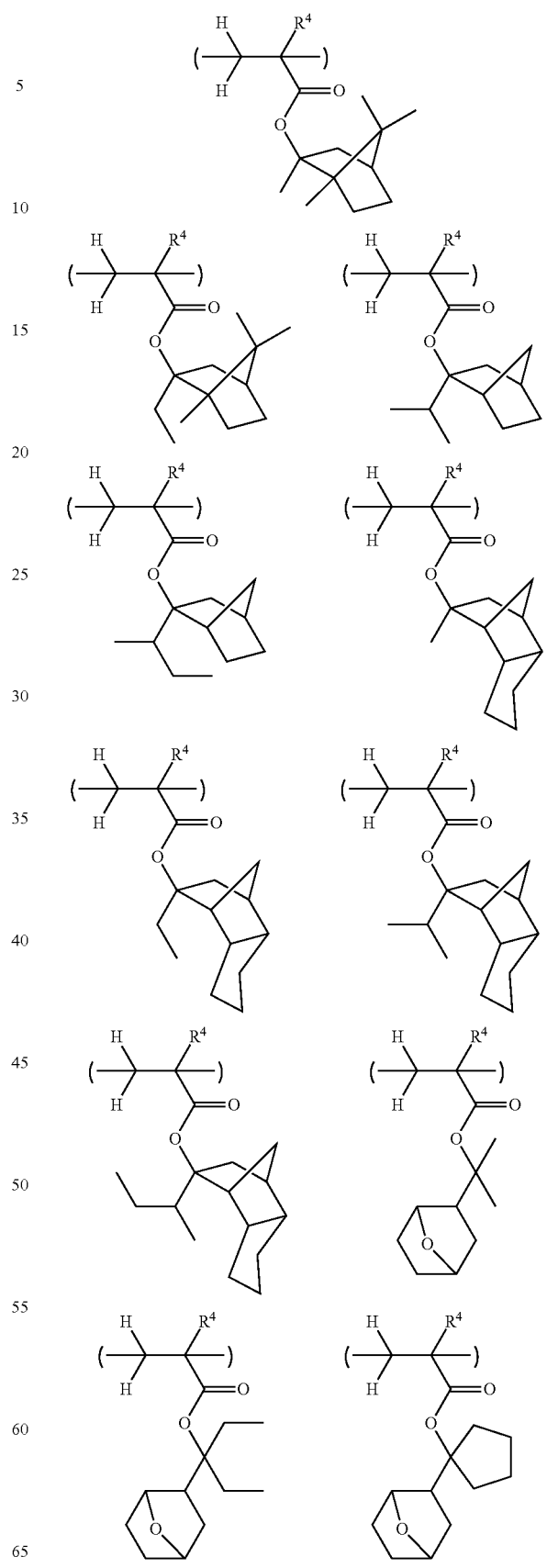

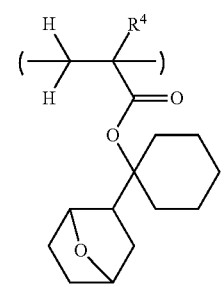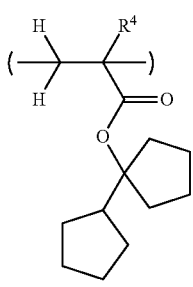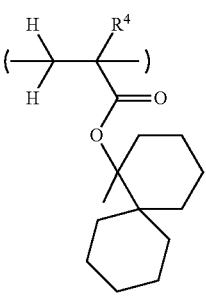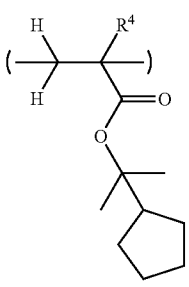
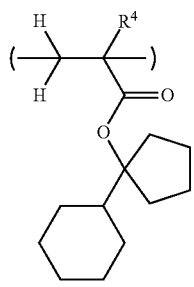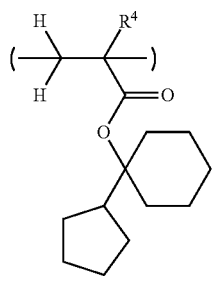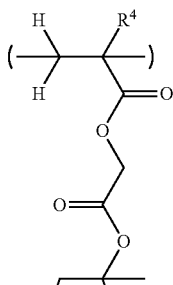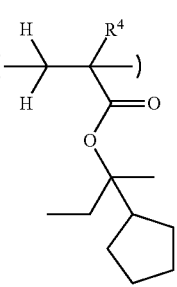
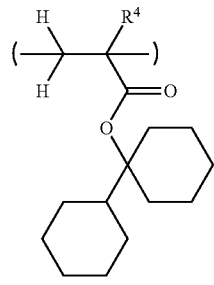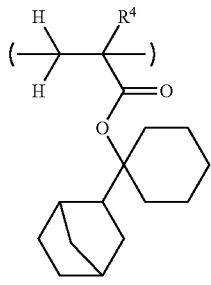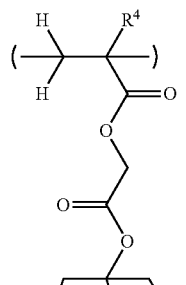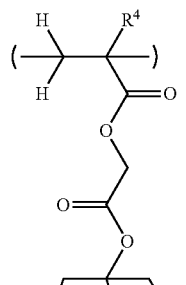
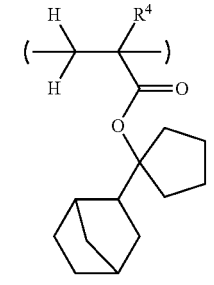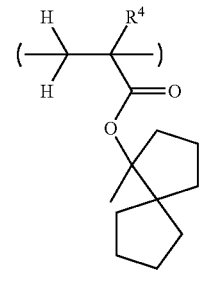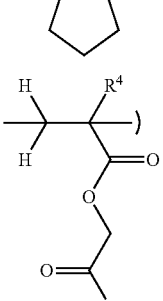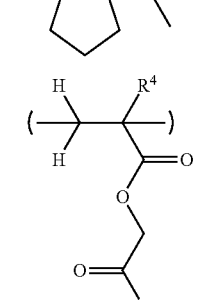
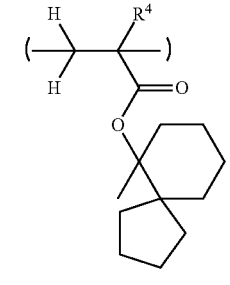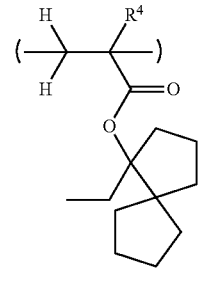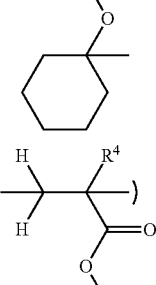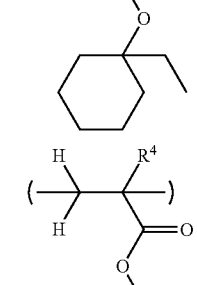
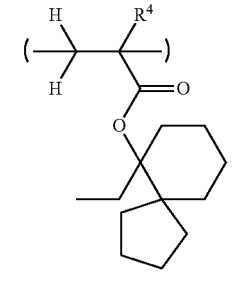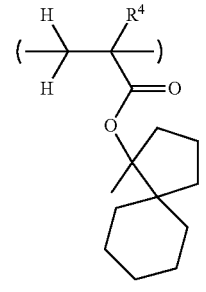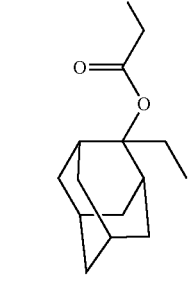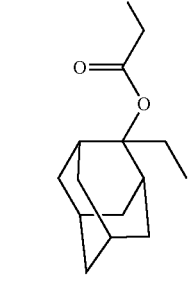

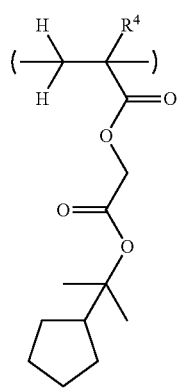 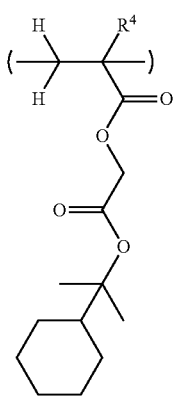 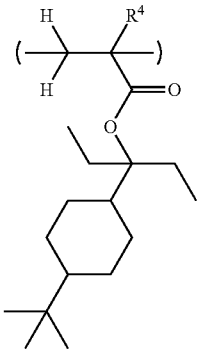 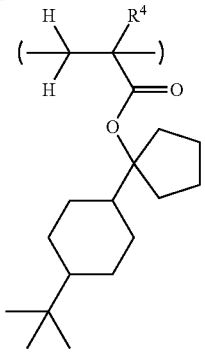
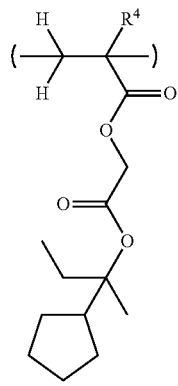 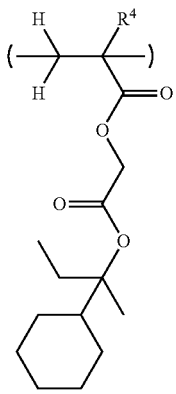 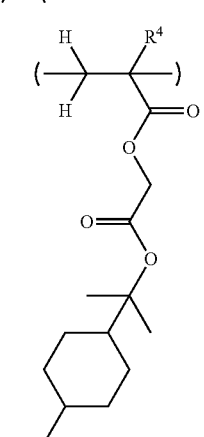 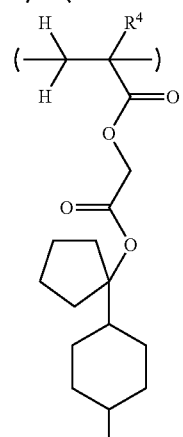
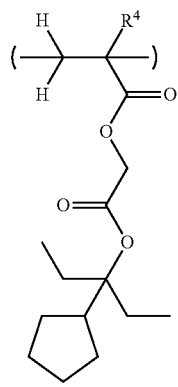 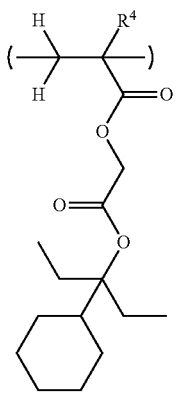 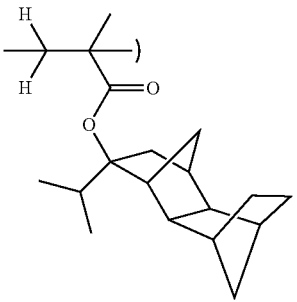
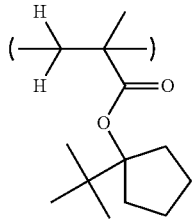
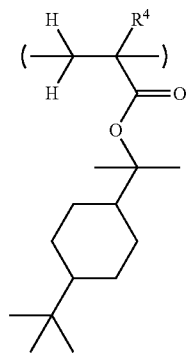 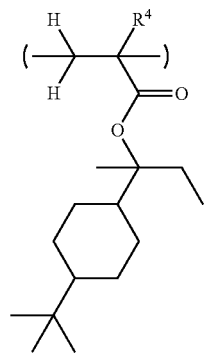 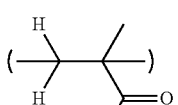 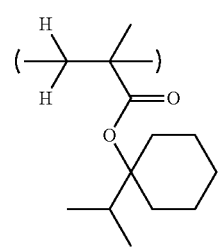

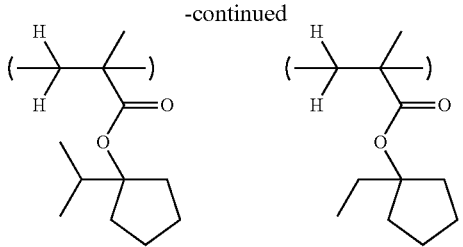

wherein R⁴ is as defined above.

11. A resist composition comprising (A) a polymer consisting of recurring units having the general formula (1), recurring units containing a hydroxyadamantyl group and recurring units of at least one type selected from sulfonium salt units (f1) to (f3) represented by general formula (F), and optionally recurring units containing a tertiary alkyl group, acetal structure, lactone ring, lactam ring, sultone ring, carboxyl group, oxetane ring, or oxirane ring, and (B) a photoacid generator having the general formula (4):

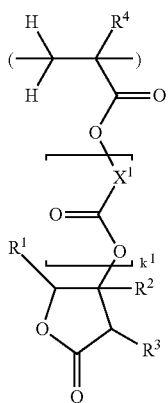

(1)

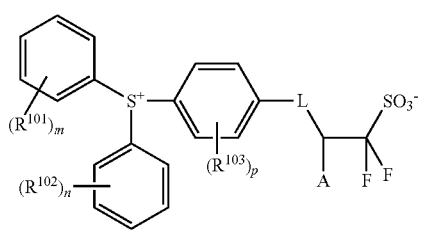

(4)

(F)

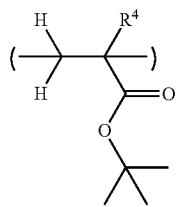

(f1)

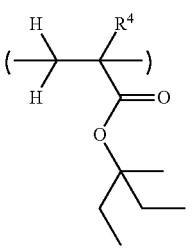

(f2)

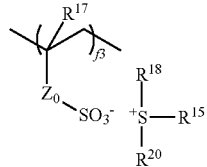

(f3)

wherein $R^1$, $R^2$ and $R^3$ are each independently methyl, ethyl or a straight, branched or cyclic $C_3$-$C_{10}$ alkyl group, $R^4$ is hydrogen or methyl, $X^1$ is a $C_1$-$C_{10}$ alkylene group which may have an ether, ester, hydroxyl radical or lactone ring, or $C_6$-$C_{10}$ arylene group, $k^1$ is 0 or 1, A is hydrogen or trifluoromethyl, $R^{101}$, $R^{102}$ and $R^{103}$ are each independently hydrogen or a straight, branched or cyclic $C_1$-$C_{20}$ monovalent hydrocarbon group which may be substituted with or separated by a heteroatom, m and n each are an integer of 0 to 5, p is an integer of 0 to 4, and L is a single bond, oxygen atom or a straight, branched or cyclic $C_1$-$C_{20}$ divalent hydrocarbon group which may be substituted with or separated by a heteroatom, and wherein $R^9$, $R^{13}$, and $R^{17}$ each are hydrogen or methyl, $R^{10}$ is a single bond, phenylene, —O—$R^{21}$—, or —C(=O)—Y—$R^{21}$—, Y is oxygen or NH, $R^{21}$ is a straight, branched or cyclic $C_1$-$C_6$ alkylene group, alkenylene or phenylene group, which may contain a carbonyl (—CO—), ester (—COO—), ether (—O—) or hydroxyl radical, $R^{11}$, $R^{12}$, $R^{14}$, $R^{15}$, $R^{16}$, $R^{18}$, $R^{19}$, and $R^{20}$ are each independently a straight, branched or cyclic $C_1$-$C_{12}$ alkyl group which may contain a carbonyl, ester or ether radical, or a $C_6$-$C_{12}$ aryl or $C_7$-$C_{20}$ aralkyl group, $Z_0$ is a single bond, methylene, ethylene, phenylene, fluorophenylene, —O—$R^{22}$—, or —C(=O)—$Z_1$—$R^{22}$—, $Z_1$ is oxygen or NH, $R^{22}$ is a straight, branched or cyclic $C_1$-$C_6$ alkylene group, alkenylene or phenylene group, which may contain a carbonyl, ester, ether or hydroxyl radical, and M⁻ is a non-nucleophilic counter ion, wherein the recurring unit containing a tertiary alkyl group is selected from the group consisting of the following formulae:

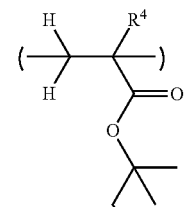

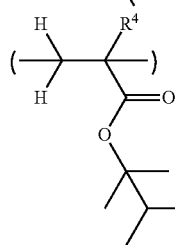

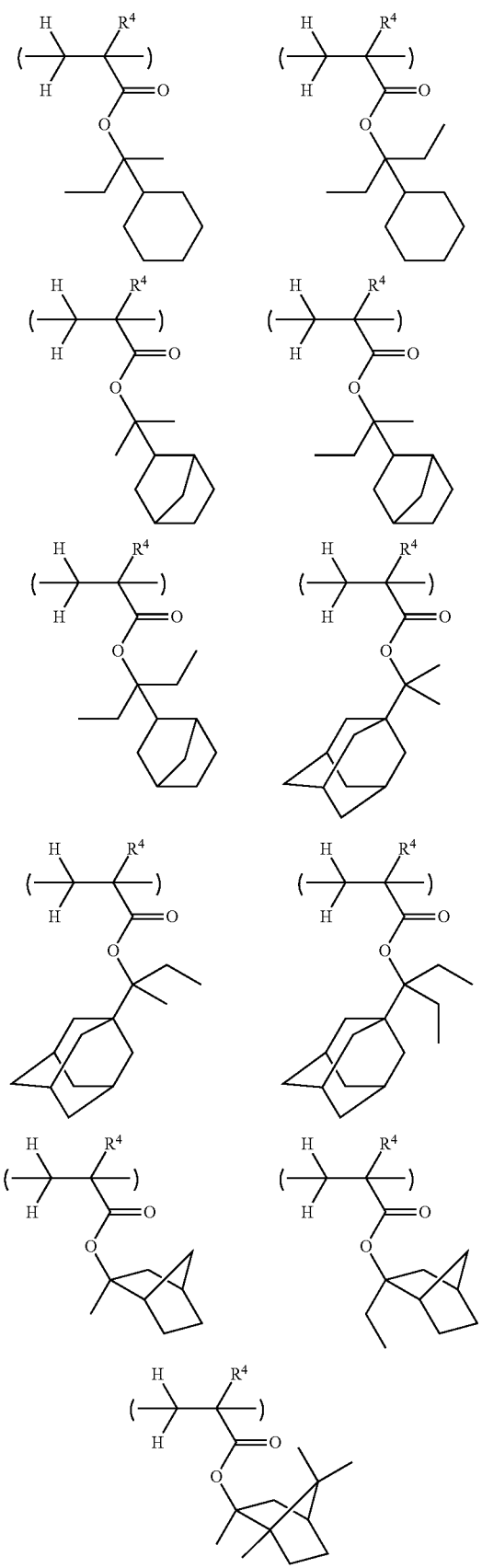
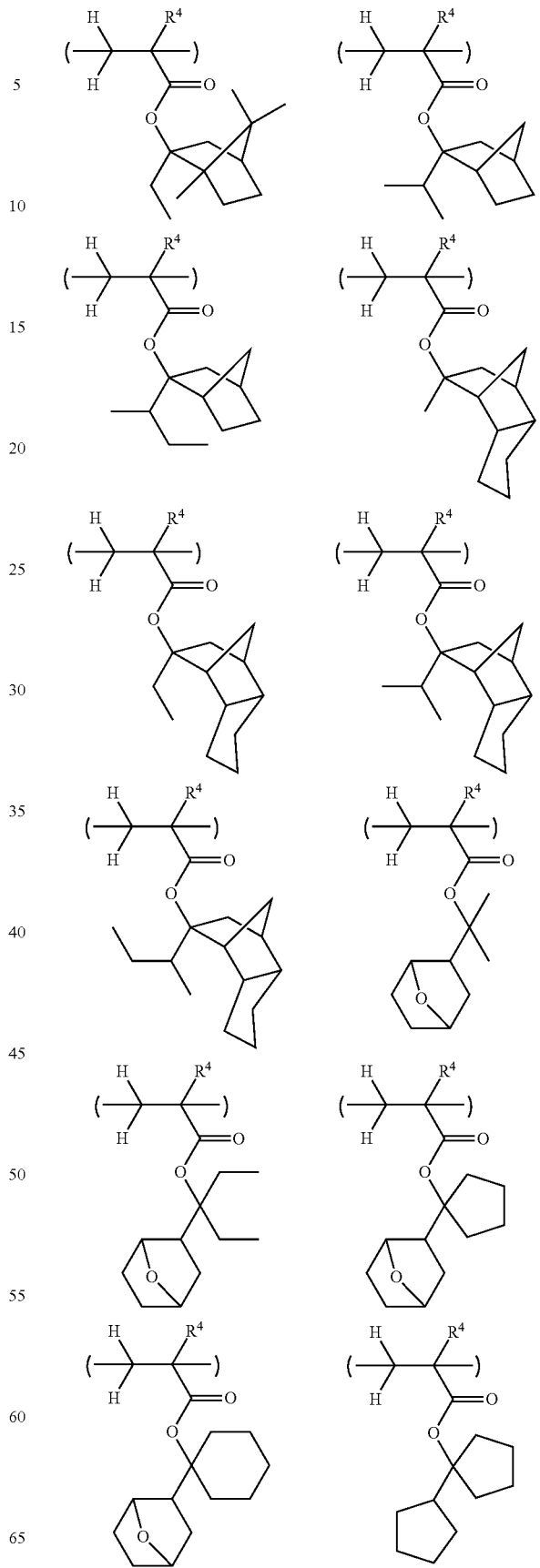

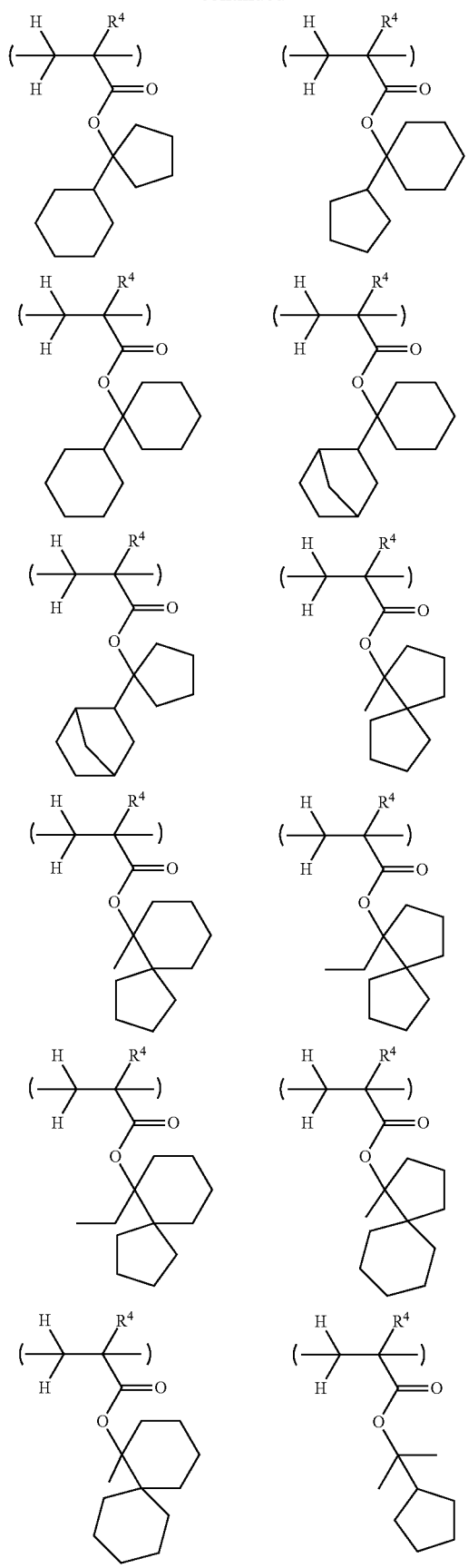
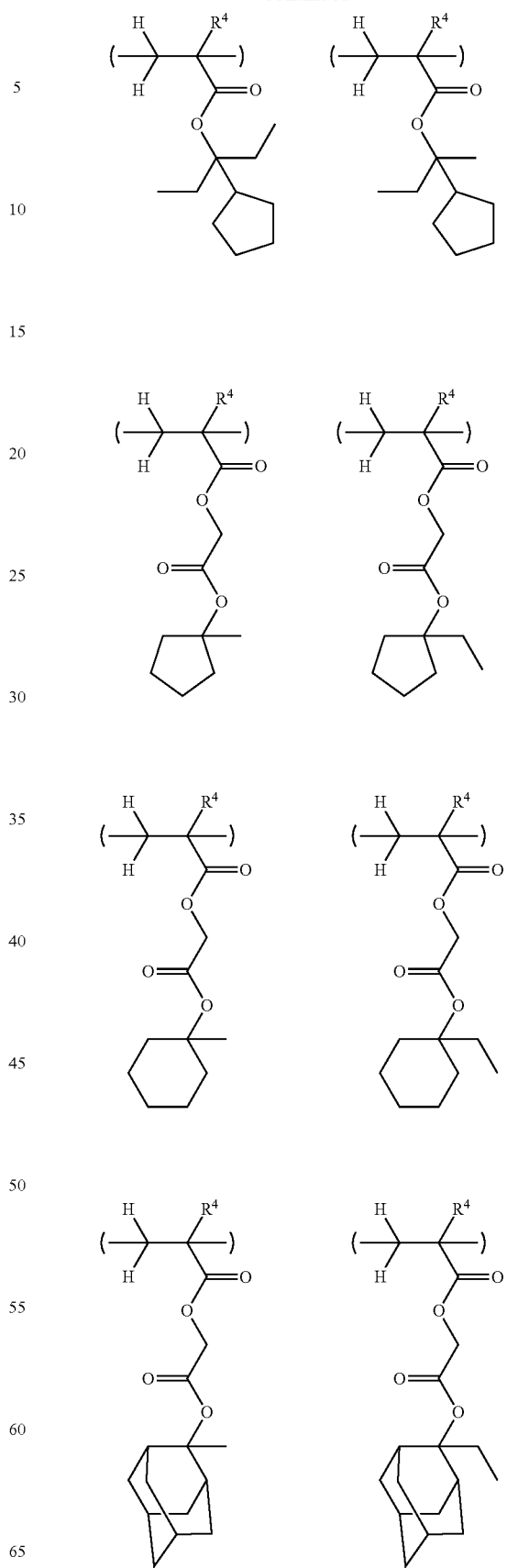

-continued
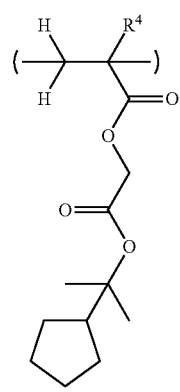 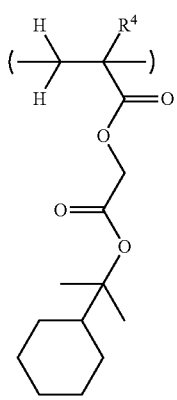
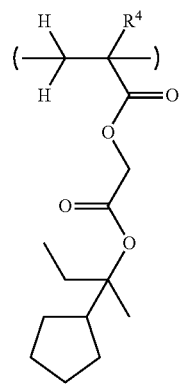 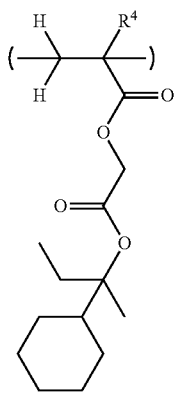
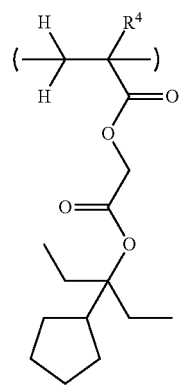 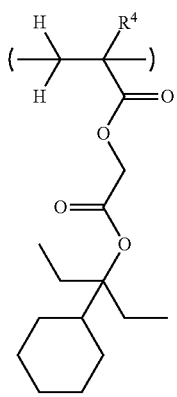
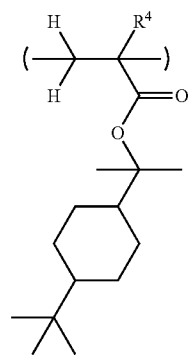 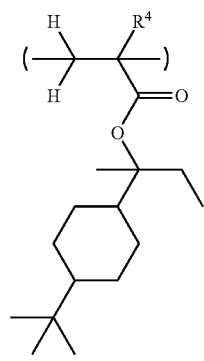
-continued
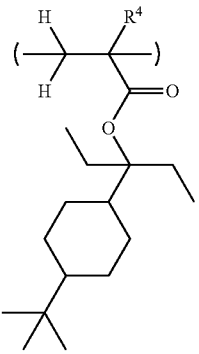 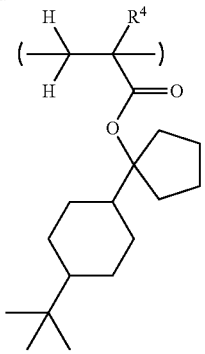
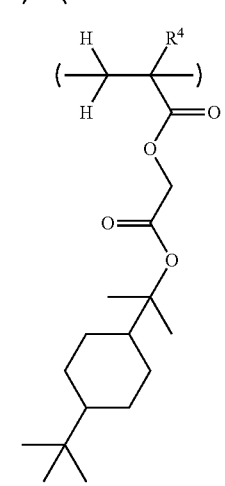 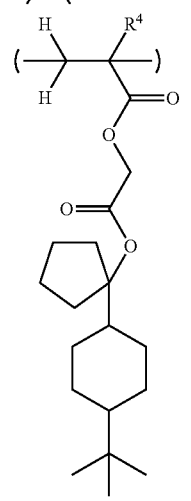
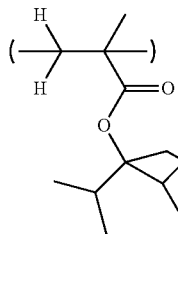
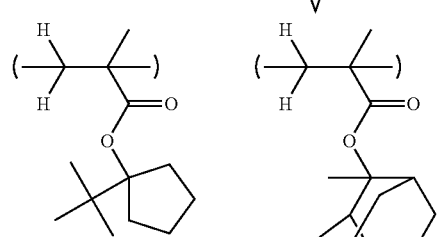
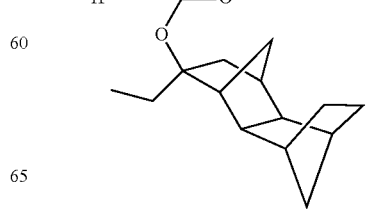
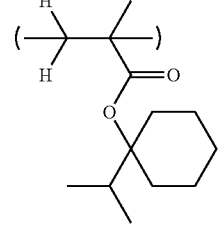

193
-continued
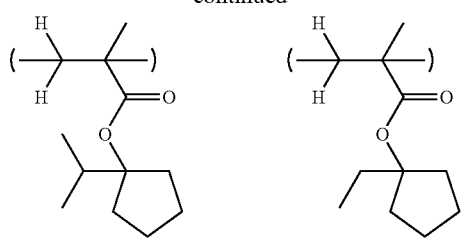
$R^4$ is as defined above.
12. The resist composition of claim 11, wherein the recurring unit containing a tertiary alkyl group is selected from the group consisting of the following formulae:
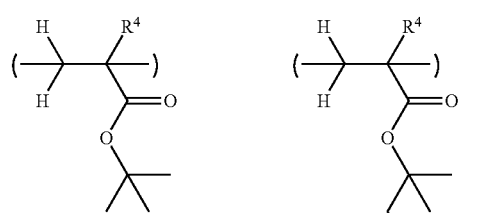
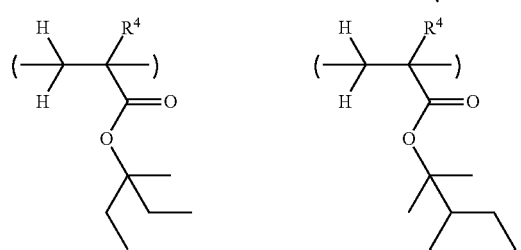
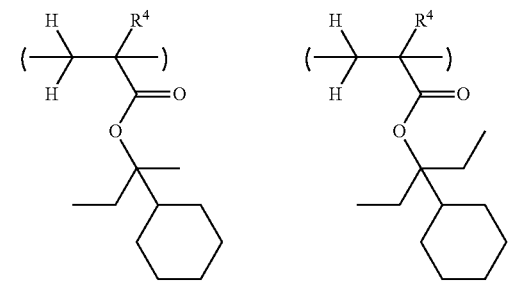
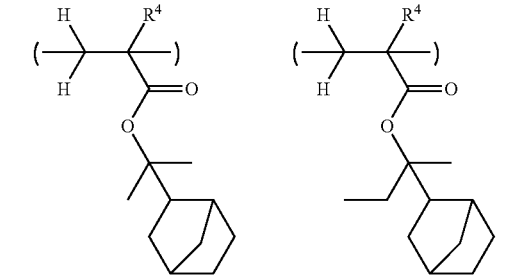
194
-continued
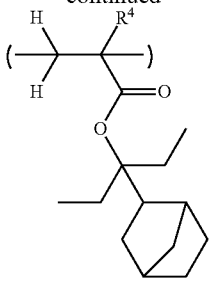
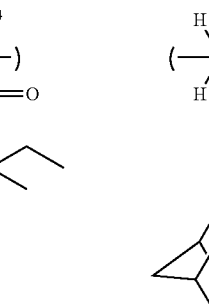
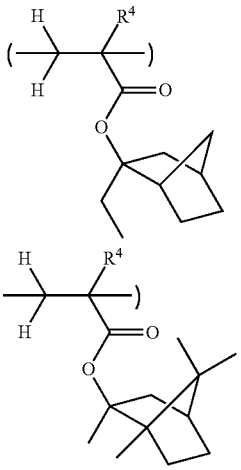
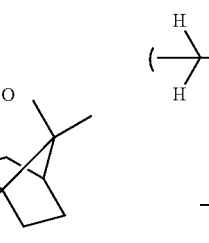
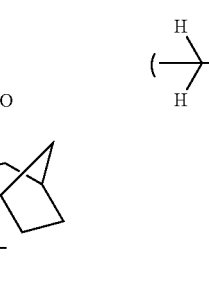

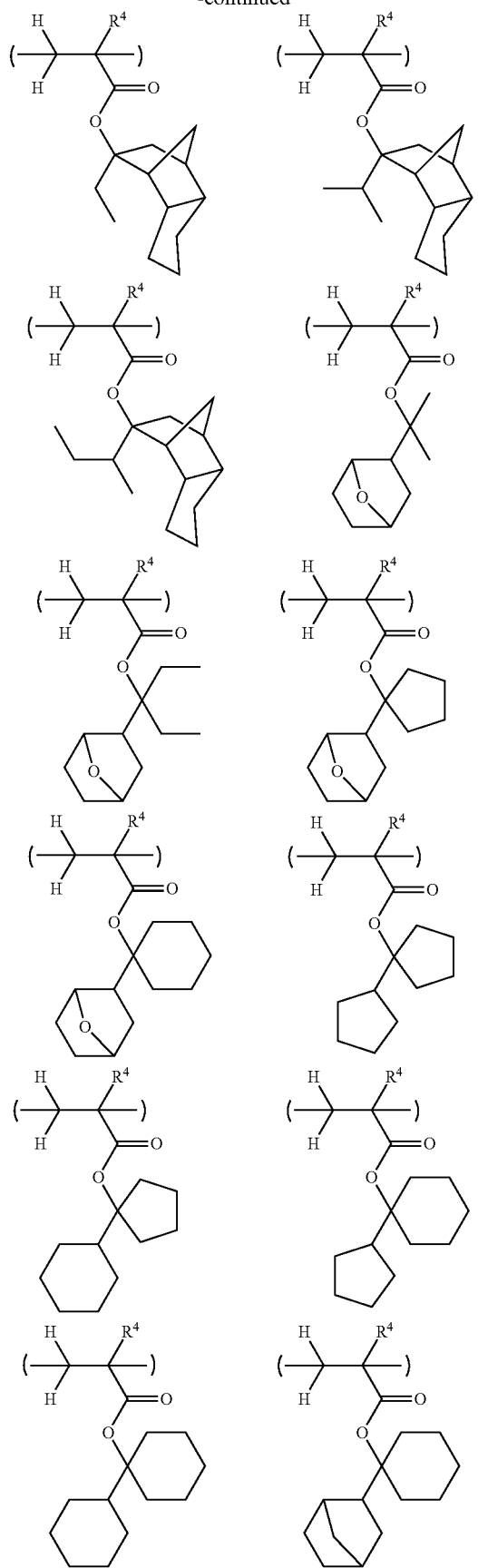
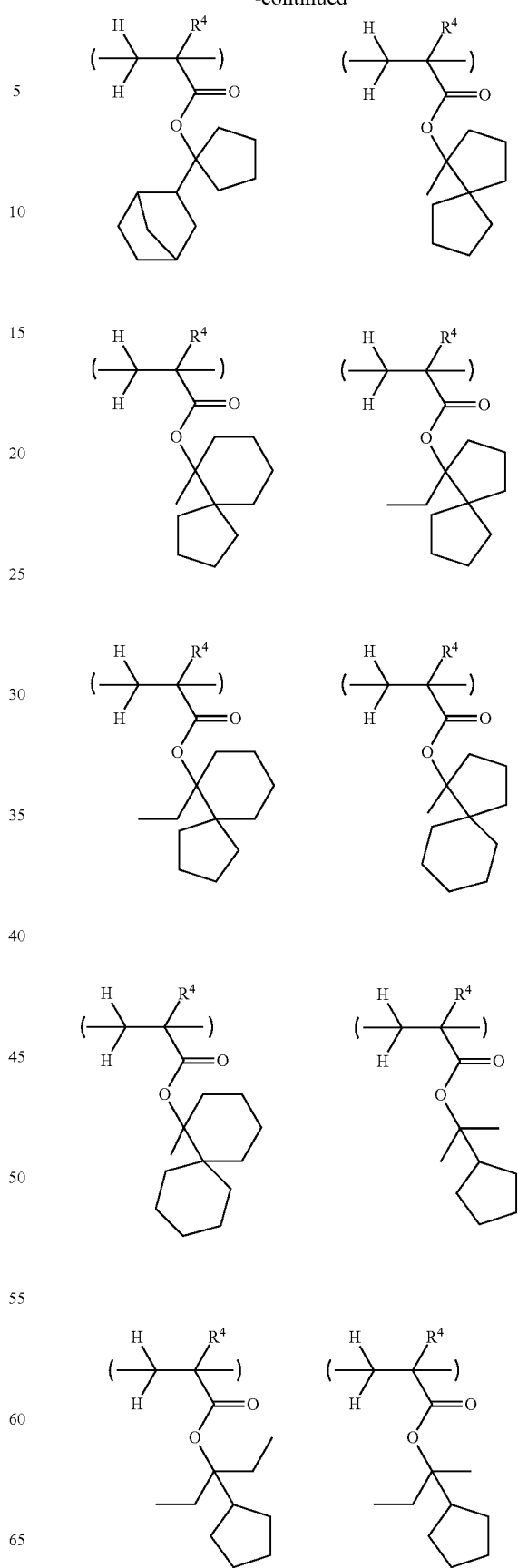

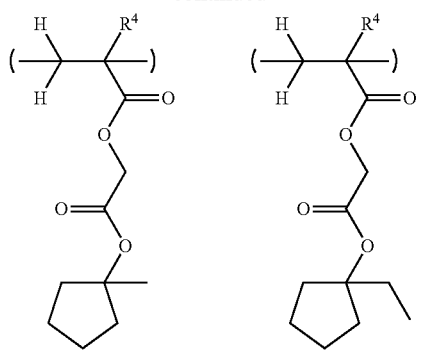
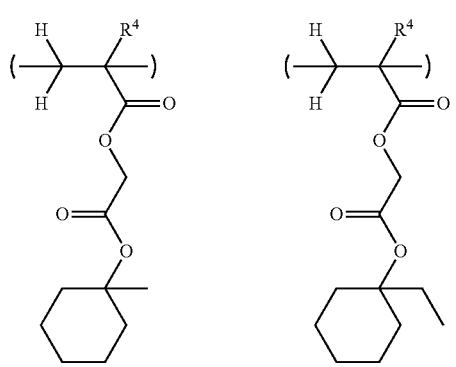
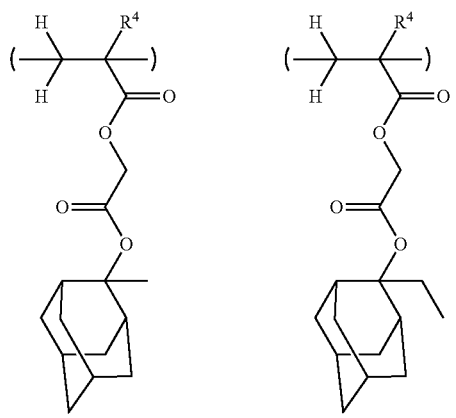
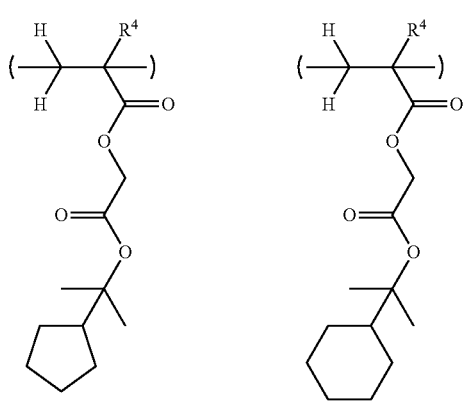
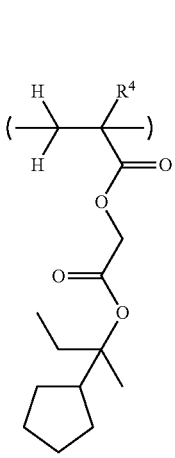
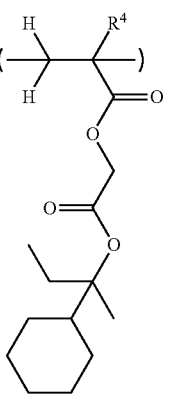
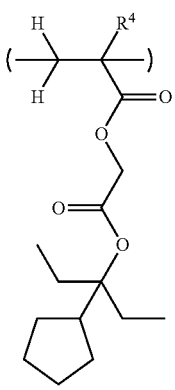
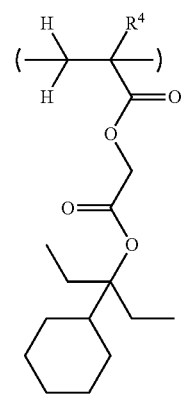
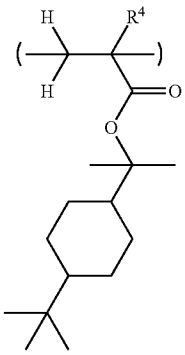
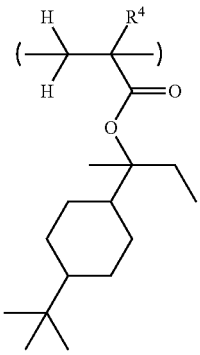
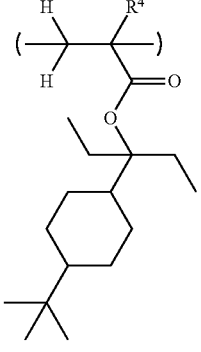
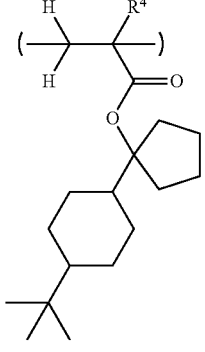

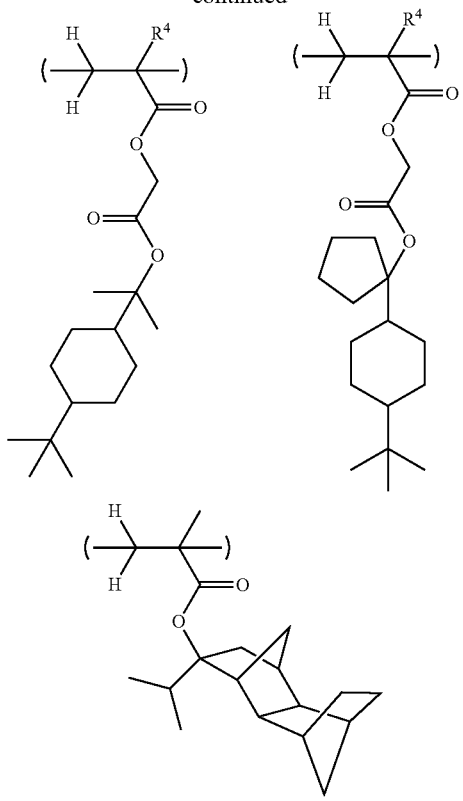
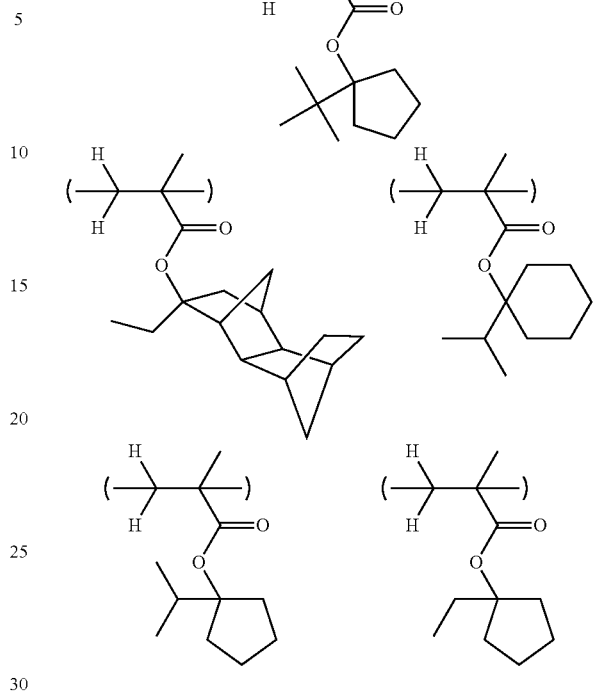
wherein R⁴ is as defined above.
* * * * *